US012744086B2

(12) United States Patent
Hsu

(10) Patent No.: US 12,744,086 B2
(45) Date of Patent: Sep. 22, 2026

(54) 3D CELL AND ARRAY STRUCTURES

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 155 days.

(21) Appl. No.: 18/735,147

(22) Filed: Jun. 5, 2024

(65) Prior Publication Data

US 2024/0404598 A1 Dec. 5, 2024

Related U.S. Application Data

(63) Continuation-in-part of application No. 18/424,700, filed on Jan. 26, 2024.

(Continued)

(51) Int. Cl.

| | |
|---|---|
| ***G11C 16/04*** | (2006.01) |
| ***G06N 3/063*** | (2023.01) |
| ***G11C 16/26*** | (2006.01) |
| ***H10B 12/00*** | (2023.01) |
| ***H10B 41/20*** | (2023.01) |

(Continued)

(52) U.S. Cl.

CPC ......... *G11C 16/0483* (2013.01); *G06N 3/063* (2013.01); *G11C 16/26* (2013.01); *H10B 12/20* (2023.02); *H10B 41/20* (2023.02); *H10B 43/20* (2023.02); *H10B 51/20* (2023.02);

(Continued)

(58) Field of Classification Search

CPC ..... G11C 16/0483; G11C 16/26; G11C 11/54; G11C 13/0002; G11C 13/0004; G11C 13/004; G06N 3/063; G06N 3/065; H10B 12/20; H10B 41/20; H10B 43/20;

(Continued)

(56) References Cited

U.S. PATENT DOCUMENTS

| | | | |
|---|---|---|---|
| 2003/0122181 | A1 | 7/2003 | Wu |
| 2018/0350823 | A1 | 12/2018 | Or-Bach et al. |

(Continued)

OTHER PUBLICATIONS

International Search Report, dated Sep. 18, 2024, for corresponding International Application No. PCT/US2024/032669 (2 pages).

(Continued)

*Primary Examiner* — Fernando Hidalgo
(74) *Attorney, Agent, or Firm* — INTELLECTUAL PROPERTY LAW GROUP LLP

(57) ABSTRACT

Various 3D cells, array structures, and processes are disclosed. In an embodiment, a memory cell array structure is provided that includes memory cells organized into rows and columns, input lines where each input line is connected to memory cells in a selected row, and the input lines form input line groups, and output lines where each output line is connected to memory cells in a selected column, and the output lines form output line groups. The array structure also includes a multiplexer having multiplexer inputs and multiplexer outputs such that the multiplexer inputs are connected to the output line groups, neuron circuits connected to the multiplexer outputs, and the memory cell array simulates a neural network in which the input lines simulate input layer neurons of the neural network, and the output lines simulate output layer neurons of the neural network.

14 Claims, 114 Drawing Sheets

Related U.S. Application Data

(60) Provisional application No. 63/645,713, filed on May 10, 2024, provisional application No. 63/643,920, filed on May 8, 2024, provisional application No. 63/644,262, filed on May 8, 2024, provisional application No. 63/644,391, filed on May 8, 2024, provisional application No. 63/642,798, filed on May 5, 2024, provisional application No. 63/639,904, filed on Apr. 29, 2024, provisional application No. 63/638,416, filed on Apr. 25, 2024, provisional application No. 63/636,755, filed on Apr. 20, 2024, provisional application No. 63/633,737, filed on Apr. 13, 2024, provisional application No. 63/572,288, filed on Mar. 31, 2024, provisional application No. 63/624,306, filed on Jan. 24, 2024, provisional application No. 63/620,856, filed on Jan. 14, 2024, provisional application No. 63/612,982, filed on Dec. 20, 2023, provisional application No. 63/470,987, filed on Jun. 5, 2023.

(51) Int. Cl.

| | |
|---|---|
| ***H10B 43/20*** | (2023.01) |
| ***H10B 51/20*** | (2023.01) |
| ***H10B 61/00*** | (2023.01) |
| ***H10B 63/00*** | (2023.01) |
| ***H10B 63/10*** | (2023.01) |
| ***H10B 69/00*** | (2023.01) |

(52) U.S. Cl.
CPC ............. *H10B 61/20* (2023.02); *H10B 63/10* (2023.02); *H10B 63/84* (2023.02); *H10B 69/00* (2023.02)

(58) Field of Classification Search
CPC ........ H10B 51/20; H10B 61/20; H10B 63/10; H10B 63/84; H10B 69/00
USPC .................................................... 365/185.01
See application file for complete search history.

(56) References Cited

U.S. PATENT DOCUMENTS

| | | | | |
|---|---|---|---|---|
| 2020/0026991 | A1 | 1/2020 | Lin et al. | |
| 2020/0342938 | A1 | 10/2020 | Tran et al. | |
| 2021/0232905 | A1* | 7/2021 | Dalgaty | G11C 11/54 |
| 2021/0366544 | A1 | 11/2021 | Harari | |
| 2021/0375381 | A1 | 12/2021 | Wu et al. | |
| 2022/0139472 | A1 | 5/2022 | Harari | |
| 2023/0027837 | A1 | 1/2023 | Petti et al. | |
| 2023/0138695 | A1* | 5/2023 | Kumar | G06N 3/048 706/25 |
| 2024/0120009 | A1 | 4/2024 | Tran et al. | |
| 2024/0153566 | A1 | 5/2024 | Ezzadeen et al. | |
| 2024/0242759 | A1 | 7/2024 | Chen et al. | |
| 2024/0419955 | A1* | 12/2024 | Vrudhula | G06N 3/045 |
| 2025/0078881 | A1* | 3/2025 | Huang | G06F 17/16 |

OTHER PUBLICATIONS

Written Opinion of the International Searching Authority, dated Sep. 18, 2024, for corresponding International Application No. PCT/US2024/032669 (5 pages).
International Search Report, dated May 23, 2024, for related International Application No. PCT/US2024/013252 (2 pages).
Written Opinion of the International Searching Authority, dated May 23, 2024, for related International Application No. PCT/US2024/013252 (7 pages).

* cited by examiner

3D CELL STRUCTURE

NOR-TYPE FLASH MEMORY CELL

| Gate 104a/b | FB Channel 102 | Gate dielectric layer 105a/b | S/D Electrodes BL101 AND SL103 |
|---|---|---|---|
| W | $SrTiO_3$ | $Sr_3O_4$ | TiN |
| Cr | $MoS_2$ | $Al_2O_3/HfO_2/Al_2O_3$ | — |
| Pt | PEDOT:PSS | $SiO_x$/Nafion | — |
| Au/Pd | $MoS_2$ | — | — |
| — | $Cu_2S$ | $HfO_2$ | — |
| — | $IGZO/Al_2O_3/TiO_2$ | $SiO_2$ | Al |
| — | $MoS_2/Nb_2O_5$ | $Al_2O_3$ | Au |
| — | $MoS_2/Nb_2O_5$ | $SiO_2$ | $NbSe_2$ |
| — | $MoS_2/ZrO_{2-x}$ | $Al_2O_3$ | — |

250
244
UNIT
240a
130a
BL
BL
130n
SL
243a
WL0-m
SG0-k
246
SL DECODER
241a
OUTPUT
CIRCUIT
241j
OUTPUT
CIRCUIT
240p
UNIT
243p
SL
245
BL DECODER
242a
INPUT
CIRCUIT
242i
INPUT
CIRCUIT 250
244
240a
130a
130n
243a
WL0-m
SG0-k
246
SL DECODER
242a
INPUT
CIRCUIT
242i
INPUT
CIRCUIT
240p
243p
245
BL DECODER
241a
241j 603a 630b 603b 630c 603c

Memory Array | Neuron circuit | Memory Array | Neuron circuit | Memory Array

INPUT Neuron circuit 630a | Neuron circuit 630d | Neuron circuit 630e

Memory Array 603d | Neuron circuit 630f | Memory Array 603e | Neuron circuit 630g | Memory Array 603f Neuron circuit 630h | Neuron circuit 630i | Neuron circuit 630j Memory Array | Neuron circuit | Memory Array | Neuron circuit | Memory Array 603g 630k 603h 630l 603i

| | | | | |
|---|---|---|---|---|
| Variation (%) | 50 | 25 | 12.5 | 6.3 |
| Cell number | 2 | 4 | 8 | 16 |

OUTPUT LINE GROUPS
Group' 0
Group' N
INPUT LINE GROUPS
INPUT LINES
683a
683b
683m
683n
GROUP 681a
680a
680b
Group 0
681b
680c
680b
Group 1
681m
680e
680f
Group M
682a
682n
MEMORY CELL
MUX
684
S1 SELECTOR
685
Neuron Circuits

3D CELL AND ARRAY STRUCTURES

CROSS-REFERENCE TO RELATED APPLICATIONS

This application is a continuation-in-part (CIP) of U.S. Patent application having application Ser. No. 18/424,700 filed on Jan. 26, 2024, and entitled "3D Cell and Array Structures."

This application claims the benefit of priority under 35 U.S.C. 119 (e) based upon the following U.S. Provisional Patent Applications all of which are incorporated by reference herein in their entireties:

App. No. Filing Date
63/470,987 Jun. 5, 2023
63/612,982 Dec. 20, 2023
63/620,856 Jan. 14, 2024
63/624,306 Jan. 24, 2024
63/572,288 Mar. 31, 2024
63/633,737 Apr. 13, 2024
63/636,755 Apr. 20, 2024
63/638,416 Apr. 25, 2024
63/639,904 Apr. 29, 2024
63/642,798 May 5, 2024
63/643,920 May 8, 2024
63/644,262 May 8, 2024
63/644,391 May 8, 2024
63/645,713 May 10, 2024

The application Ser. No. 18/424,700 claims the benefit of priority under 35 U.S.C. 119 (e) based upon U.S. Provisional Patent Application having Application No. 63/444,928 filed on Feb. 11, 2023, and entitled "3D Cell and Array Structures," and U.S. Provisional Patent Application having Application No. 63/445,299 filed on Feb. 14, 2023, and entitled "3D Cell and Array Structures," and U.S. Provisional Patent Application having Application No. 63/446,101 filed on Feb. 16, 2023, and entitled "3D Cell and Array Structures," and U.S. Provisional Patent Application having Application No. 63/446,570 filed on Feb. 17, 2023, and entitled "3D Cell and Array Structures," and U.S. Provisional Patent Application having Application No. 63/447,875 filed on Feb. 23, 2023, and entitled "3D Cell and Array Structures," all of which are incorporated by reference herein in their entireties.

FIELD OF THE INVENTION

The exemplary embodiments of the present invention relate generally to the field of memory, and more specifically to memory cells and array structures and associated processes.

BACKGROUND OF THE INVENTION

With the increasing complexity and density of electronic circuits, memory size, complexity, and cost are important considerations. One approach to increase memory capacity is to use three-dimensional (3D) array structures. The 3D array structure has been successfully used in NAND flash memory today. However, for dynamic random-access memory (DRAM), due to its special one-transistor-one-capacitor (1T1C) cell structure, a cost-effective 3D array structure has not been realized.

SUMMARY

In various exemplary embodiments, three-dimensional (3D) cells, array structures, and associated processes are disclosed. Embodiments of the invention are applicable to many technologies. For example, embodiments of the invention can be applied to dynamic random-access memory (DRAM), floating-body cell (FBC) memory, NOR-type flash memory, Ferroelectric random-access memory (FRAM), resistive random-access memory (RRAM), phase change memory (PCM), magneto-resistive random-access memory (MRAM), memristor-transistor (memtransistor), and split-gate NOR flash memory. Embodiments of the invention can also be used in applications such as in-memory-computing (IMC) and artificial neural networks (ANN), and any other suitable applications not listed.

In an exemplary embodiment, a three-dimensional (3D) array structure is provided that comprises a NOR-type memory cell array comprising one or more rows of memory cells, and each memory cell is configured to store data that controls a cell current for that memory cell. The structure also comprises bit lines connected to the one or more rows of memory cells, and each bit line is connected to one memory cell in each of the one or more rows of memory cells. The structure also comprises one or more source lines connected to the one or more rows of memory cells, respectively, and each source line is connected to all the memory cells of a corresponding row of memory cells. The structure is configured so that input signals applied to the bit lines cause one or more cell currents to flow through one or more memory cells, respectively, and in each row of memory cells, selected cell currents combine to form a row cell current that flows on the source line connected to that row of memory cells.

In an exemplary embodiment, a three-dimensional (3D) array structure is provided that comprises a NOR-type memory cell array comprising one or more rows of memory cells, and each memory cell is configured to store data that controls a cell current for that memory cell. The structure also comprises bit lines connected to the one or more rows of memory cells, and each bit line is connected to one memory cell in each of the one or more rows of memory cells. The structure also comprises one or more source lines connected to the one or more rows of memory cells, respectively, and each source line is connected to all the memory cells of a corresponding row of memory cells. The structure is configured so that input signals applied to the source lines cause one or more cell currents to flow through one or more memory cells, respectively, and for each bit line, selected cell currents combine to form a bit line cell current that flows on that bit line.

In an exemplary embodiment, a three-dimensional (3D) array structure is provided that comprises a NOR-type memory cell array comprising one or more rows of memory cells, and each memory cell is configured to store data that controls a cell current for that memory cell. The structure also comprises bit lines connected to the one or more rows of memory cells, and each bit line is connected to one memory cell in each of the one or more rows of memory cells. The structure also comprises one or more word lines connected to the one or more rows of memory cells, respectively, and each word line is connected to all the memory cells of a corresponding row of memory cells. The structure is configured so that input signals applied to the word lines cause one or more cell currents to flow through one or more memory cells, respectively, and for each bit line, selected cell currents combine to form a bit line cell current that flows on that bit line.

In an embodiment, a memory cell array structure is provided that includes memory cells organized into rows and columns, input lines where each input line is connected to memory cells in a selected row, and the input lines form input line groups, and output lines where each output line is connected to memory cells in a selected column, and the output lines form output line groups. The array structure also includes a multiplexer having multiplexer inputs and multiplexer outputs such that the multiplexer inputs are connected to the output line groups, neuron circuits connected to the multiplexer outputs, and the memory cell array simulates a neural network in which the input lines simulate input layer neurons of the neural network, and the output lines simulate output layer neurons of the neural network.

In one embodiment, a 3D cell structure is provided that comprises a plurality of blocks, where each block comprises an input buffer, an array, and a neuron circuit, and where each neuron circuit outputs an output data group, and a plurality of data buffers having buffer inputs and buffer outputs, where the plurality of buffers inputs are configured to receive the output data groups from the plurality of neuron circuits, respectively. The cell structure also comprises a plurality of activation circuits having circuit inputs and circuit outputs, where the plurality of circuit inputs are connected to the plurality of buffer outputs, respectively, and where the plurality of circuit outputs are configured to output activation results, and where the 3D cell structure simulates a neural network in which the plurality of input buffers simulate input neurons groups of the neural network, the plurality of data buffers simulate output neuron groups of the neural network, and the plurality of activation circuits simulate activation functions of the neural network.

Additional features and benefits of the exemplary embodiments of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Those of ordinary skilled in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators or numbers will be used throughout the drawings and the following detailed description to refer to the same or like parts.

In various exemplary embodiments, three-dimensional (3D) cells, array structures, and associated processes are disclosed. Embodiments of the invention are applicable to many technologies. For example, embodiments of the invention can be applied to dynamic random-access memory (DRAM), floating-body cell (FBC) memory, NOR-type flash memory, Ferroelectric random-access memory (FRAM), resistive random-access memory (RRAM), phase change memory (PCM), magneto-resistive random-access memory (MRAM), memristor-transistor (memtransistor), and split-gate NOR flash memory. Embodiments of the invention can also be used in applications such as in-memory-computing (IMC) and artificial neural networks (ANN), and any other suitable applications not listed.

Figure 1A:
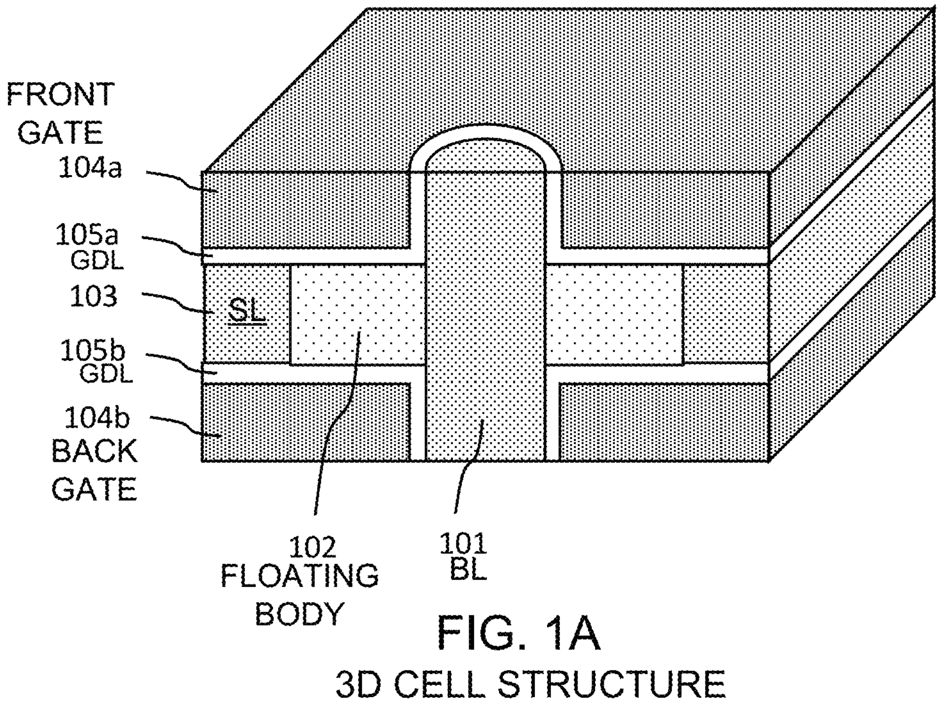
FIG. 1A show an embodiment of a three-dimensional (3D) cell structure according to the invention.

FIG. 1A show an embodiment of a three-dimensional (3D) cell structure according to the invention. In various embodiments, the cell structure is suitable for use as a memory cell or a synapse device (also called a synapse transistor) in neural network applications. The cell structure includes a bit line (BL) 101 comprising semiconductor material such as silicon or polysilicon material. The cell structure also includes a floating body 102 comprising semiconductor material such as silicon, polysilicon, silicon germanium (SiGe), indium gallium zinc oxide (IGZO), or any other suitable semiconductor materials. The cell structure also includes a source line (SL) (or layer) 103 comprising semiconductor material such as silicon or polysilicon material. The cell structure forms a dual-gate transistor that comprises a front gate (FG) 104*a* and a back gate (BG) 104*b*. The front gate 104*a* and the back gate 104*b* are formed of conductor material such as metal or polysilicon material. In one application, the front gate 104*a* and back gate 104*b* can be connected to word lines (WL) not shown.

The cell structure also includes gate dielectric layers (GDL) 105*a* and 105*b* that can be formed from many suitable materials. In various embodiments, each of the gate dielectric layers 105*a* and 105*b* are formed as a single-layer or multiple-layer structure. In one embodiment, the gate dielectric layers 105*a* and 105*b* comprise a thin oxide ($SiO_2$) layer or high-K material, such as a hafnium oxide (HfO2) layer, to form a floating body cell that is also referred to as a capacitor-less dynamic random-access memory (DRAM) cell.

Figure 1B:
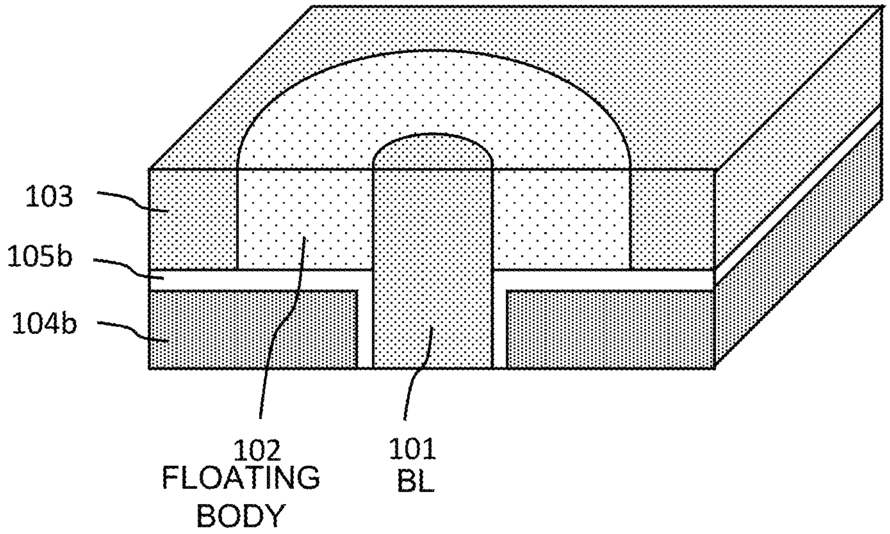
FIG. 1B shows the 3D cell structure shown in FIG. 1A with a front gate and a gate dielectric layer removed.

FIG. 1B shows the 3D cell structure shown in FIG. 1A with the front gate 104*a* and the gate dielectric layer 105*a* removed to show the inner structure of the cell. In one embodiment, the floating body 102 is formed as a donut shape as shown. Although this embodiment shows that the shapes of the bit line 101 and floating body 102 are circular, the bit line 101 and floating body 102 can be formed in other patterns or shapes, such as square, rectangular, triangular, hexagonal, etc. These variations are within the scope of the invention.

In various embodiments, the bit line 101, floating body 102, and source line 103 are formed of various materials to form different types of cells. For example, in one embodiment, the bit line 101 and source line 103 are formed of N+ type semiconductor material and the floating body 102 is formed of P-type semiconductor material. This configuration forms an N-channel junction transistor. In another embodiment, the bit line 101 and source line 103 are formed of P+ type semiconductor material and the floating body 102 is formed of N-type of semiconductor material. This configuration forms a P-channel transistor.

In another embodiment, the bit line 101 and source line 103 are formed of N+ type semiconductor material and the floating body 102 is formed of N+ or N-type semiconductor material. This configuration forms an N-channel junction-less transistor. In another embodiment, the bit line 101 and source line 103 are formed of P+ type semiconductor and the floating body 102 is formed of P+ or P-type semiconductor material. This configuration forms a P-channel junction-less transistor.

In another embodiment, the bit line 101 is formed of N+ type semiconductor material and the source line 103 is formed of P+ type semiconductor material. The floating body 102 is formed of intrinsic or lightly doped P- or N-type semiconductor material. This configuration forms a tunnel field-effect transistor (T-FET).

In another embodiment, the bit line 101 and source line 103 are formed of metal and the floating body 102 is formed of P-type or N-type semiconductor material. This configuration forms a tunnel Schottky junction transistor.

According to the invention, any suitable thickness can be used for the floating body 102. Depending on the thickness of the floating body 102, the cell forms different type of channels, as shown in FIGS. 1E-F.

Figure 1C:
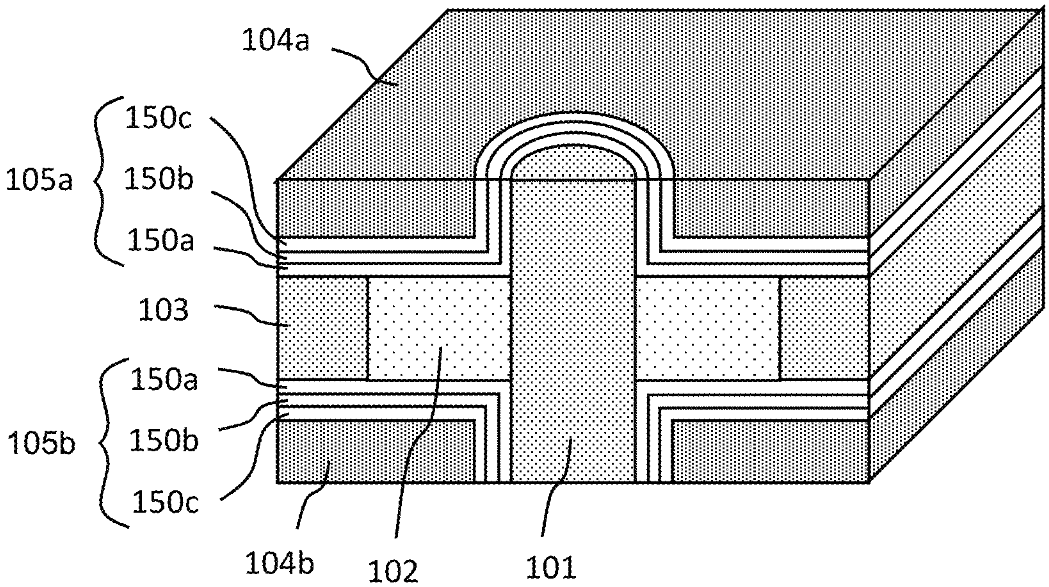
FIG. 1C shows a cell structure that is similar to the cell structure shown in FIG. 1A.

FIG. 1C shows a cell structure that is similar to the cell structure shown in FIG. 1A except that the gate dielectric layers 105*a* and 105*b* are formed by charge-trapping layers. In one embodiment, the charge-trapping layers comprise oxide-nitride-oxide (ONO) layers. The layer 150*a* is a tunnel oxide layer, which is thin enough to allow electrons to tunnel through when a high electric field is applied. The layer 150*b* is a nitride layer that traps electrons for data storage, and the layer 150*c* is a blocking oxide, which is thick enough to prevent electrons from tunneling through to gates 104*a* and 104*b*. The cell structure shown in FIG. 1C forms a non-volatile memory cell, such as a NOR-type flash memory cell.

In another embodiment, the tunnel oxide layer 150*a* shown in FIG. 1C is eliminated. Thus, the charge-trapping layers 105*a* and 105*b* will only comprise a nitride layer 150*b* and a blocking oxide layer 150*c*. This embodiment reduces the required voltage for programing and erasing the cell.

Figure 1D:
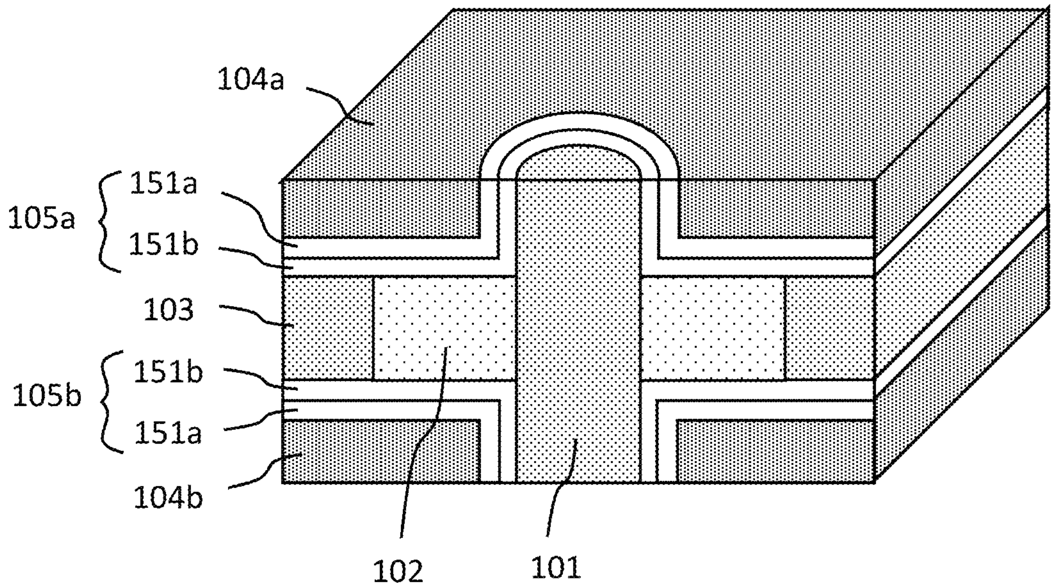
FIG. 1D shows a cell structure similar to the cell structure shown in FIG. 1A.
Figure 1E:
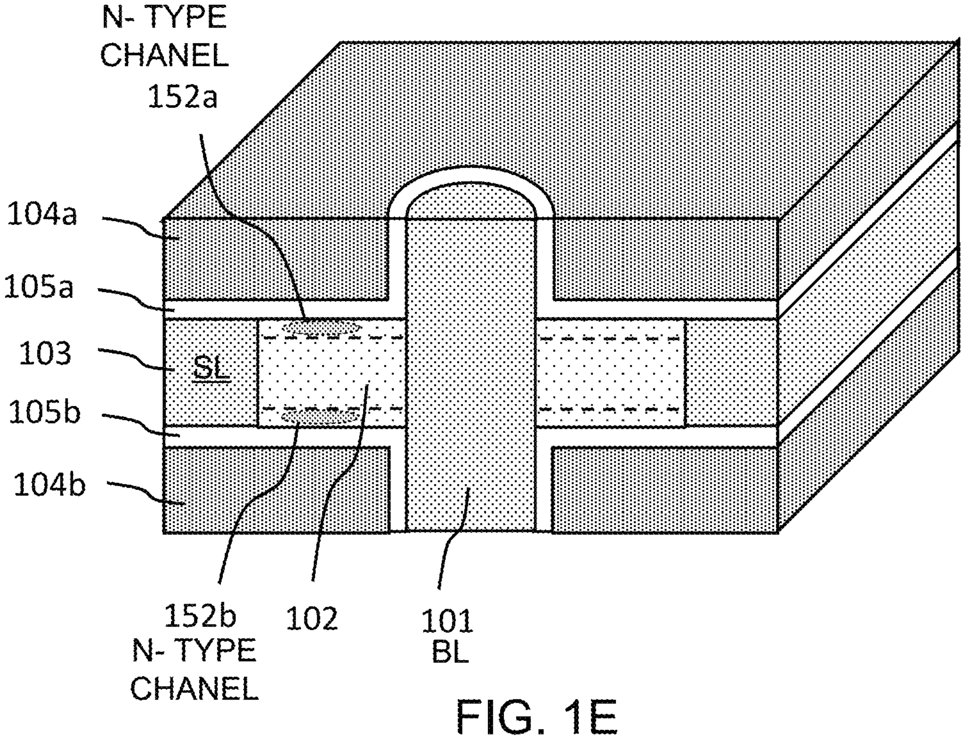
FIG. 1E shows an embodiment of a cell structure in which a floating body is thicker and lightly doped compared to previous embodiments.
Figure 1F:
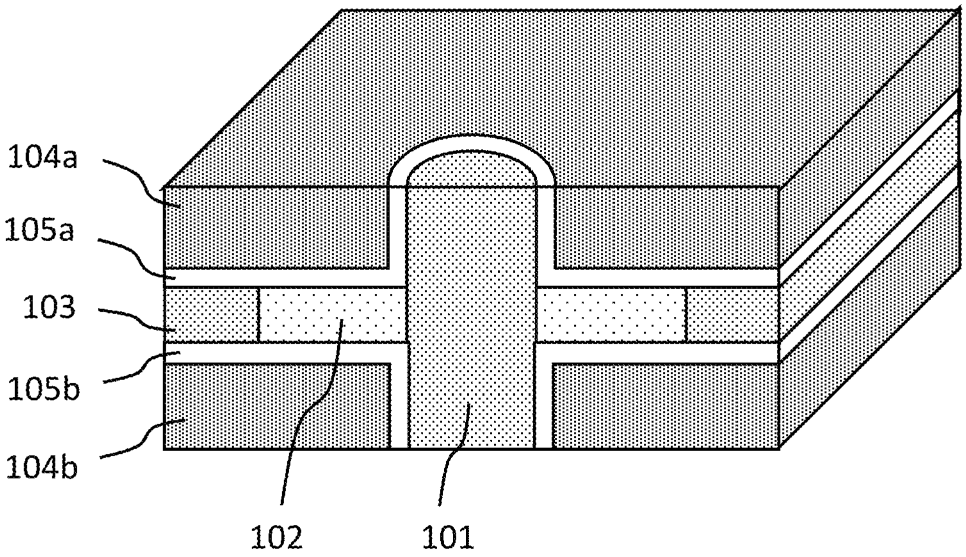
FIG. 1F shows an embodiment of a cell structure in which a floating body is thinner and heavily doped compared to previous embodiments.

FIG. 1D shows a cell structure similar to the cell structure shown in FIG. 1A except that the gate dielectric layers 105*a* and 105*b* are formed by at least one ferroelectric layer 151*a* comprising material such as lead zirconate titanate (PZT), fluorite-structured oxide such as hafnium oxide (HfO2) and zirconium oxide (ZrO2), hafnium oxide (HfO2) in orthorhombic crystal phase, or hafnium zirconium oxide (HfZrO2), and one dielectric layer 151*b* (or called an interfacial layer) comprising material such as SiO2, HfO2, $Al_2O_3$, SINX, SION, AION, ZrO2, and TiO2. The cell structure shown in FIG. 1D forms a ferroelectric random-access memory (FRAM) cell.

In another embodiment, the gate dielectric layers 105*a* and 105*b* comprise at least one adjustable resistive layer, such as hafnium oxide (HfOx), titanium oxide (TiOx), and tantalum oxide (TaOx) to form a resistive random-access memory (RRAM) cell. In one embodiment, the layer 151*a* is the above-mentioned adjustable resistive layer and the layer 151*b* is an insulating layer such as oxide or high-K material such as hafnium oxide ($SiO_2$) layer.

In another embodiment, the gate dielectric layers 105*a* and 105*b* comprise at least one phase-change layer, such as Germanium Antimony Tellurium alloy or chalcogenide glass, Ge2Sb2Te5 (GST) to form a phase-change memory (PCM) cell. In one embodiment, the layer 151*a* is the above-mentioned phase-change layer and the layer 151*b* is an insulating layer such as oxide or high-K material such as hafnium oxide ($SiO_2$) layer.

In another embodiment, the gate dielectric layers 105*a* and 105*b* comprise at least one ferromagnetic material, such as iron-nickel (NiFc) or iron-cobalt (CoFc) alloys to form a magneto-resistive random-access memory (MRAM) cell. In one embodiment, the layer 151*a* is the above-mentioned ferromagnetic layer and the layer 151*b* is an insulating layer such as oxide or high-K material such as hafnium oxide ($SiO_2$) layer.

It should be noted that the above-described materials forming the gate dielectric layers 105*a* and 105*b* are exemplary. The use of any other suitable materials to form the gate dielectric layers 105*a* and 105*b* are within the scope of the invention.

FIG. 1E shows an embodiment of a cell structure in which the floating body 102 is thicker and lightly doped compared to the cell embodiment shown in FIG. 1F. Using an N-channel cell for example, when a positive voltage is applied to the gates 104*a* and 104*b*, the applied voltage pushes away holes and attract electrons to form N-type channels 152*a* and 152*b* in the surface of the floating body 102 as shown. The channels 152*a* and 152*b* allow electrons to flow between the bit line 101 and the source line 103 for read and write operation. During storage, the gates 104*a* and 104*b* are supplied with a negative voltage. This will attract holes in the channel regions 152*a* and 152*b* to increase data retention time.

FIG. 1F shows an embodiment of a cell structure in which the floating body 102 is thinner compared to previous embodiments. In this configuration, the thin floating body 102 itself is used as the channel, which forms a thin-film transistor. The thin body increases the controllability of the gates 104*a* and 104*b* to the channels. This enhances the cell's performance and increase the data retention time. The thin body also reduces the short-channel effect and reduce the gate-induced drain leakage (GIDL) current.

It should be noted that the thicknesses of the cell structures shown in FIGS. 1E-F depend on many factors, such as the gate voltage, doping concentration, and the materials that form the floating body, gate, and gate dielectric layer. In one application, the proper thickness of the floating body 102 can be determined by using device simulations.

Figure 1G:
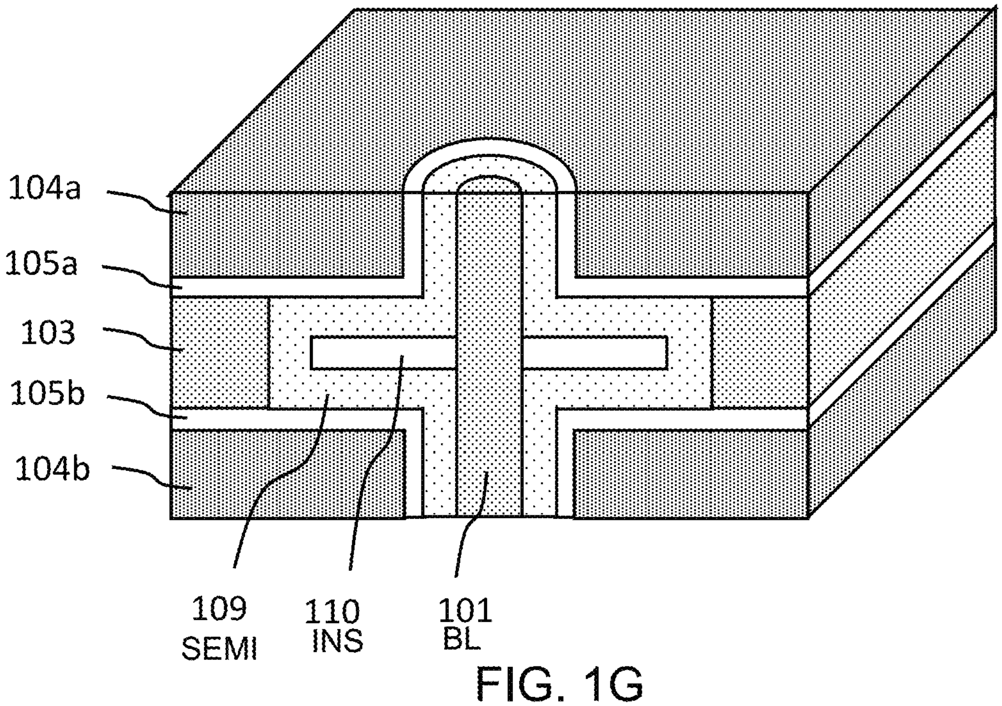
FIGS. 1G-P show embodiments of cell structures according to the invention.

FIG. 1G shows an embodiment of a cell structure according to the invention. This embodiment is similar to the embodiment shown in FIG. 1A except that the channel of the cell transistor is formed using a thin semiconductor layer (SEMI) 109 comprising material such as silicon, polysilicon, silicon germanium (SiGe), indium gallium zinc oxide (IGZO), or any other suitable semiconductor materials. Depending on the material, the semiconductor layer 109 is formed by using epitaxial growth, thin-film deposition, atomic layer deposition, or any other suitable process. The bit line 101 is formed of conductor material such as metal or heavily doped polysilicon material. The cell structure also includes an insulator (INS) 110 comprising material such as oxide or nitride material, or an air gap, or a vacuum space.

Figure 1H:
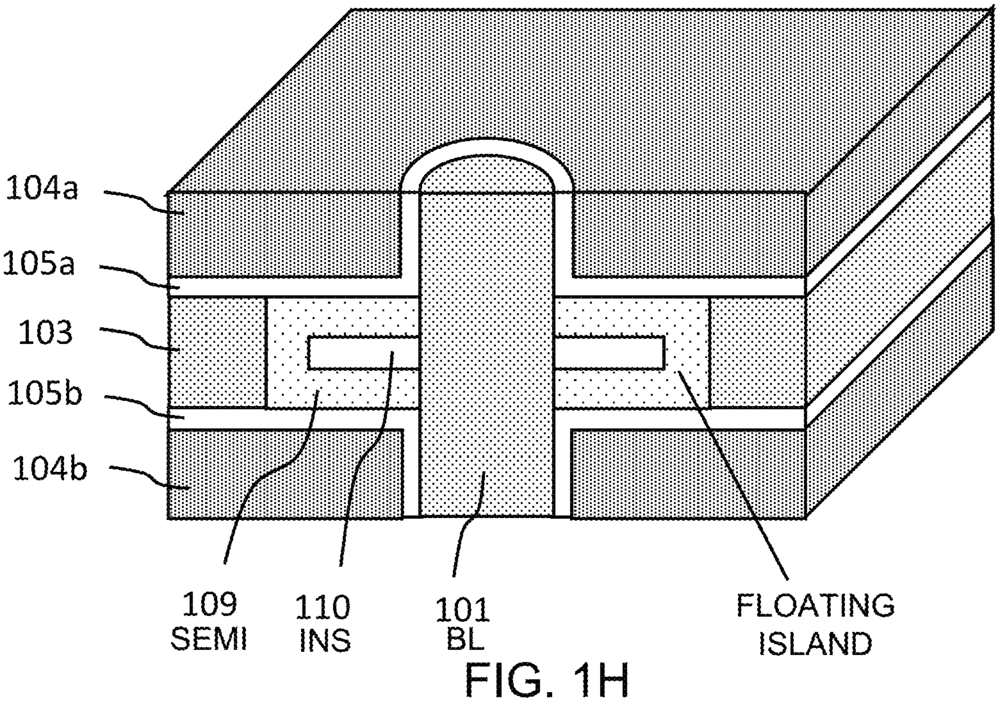

FIG. 1H shows an embodiment of a cell structure according to the invention. This embodiment is similar to the embodiment shown in FIG. 1G except that portions of the semiconductor layer 109 on the sidewall of the vertical bit line 101 are removed. Therefore, the semiconductor layer 109 forms a floating island for each cell. The portions of the semiconductor layer 109 that were located on the sidewall of the vertical bit line 101 are removed by using an anisotropic etching process, such as dry etching, before the material of the bit line 101 is deposited.

Figure 1I:
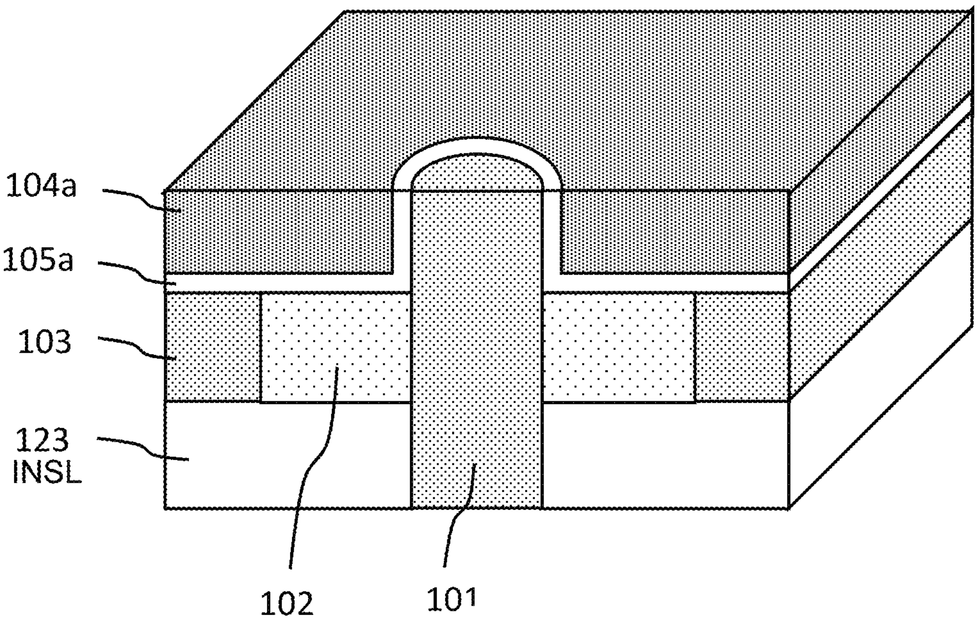

FIG. 1I shows an embodiment of a cell structure according to the invention. This embodiment is similar to the embodiment shown in FIG. 1A except that the back gate 104*b* shown in FIG. 1A is replaced with an insulating layer (INSL) 123 comprising material such as oxide or nitride material. As a result, this cell structure forms a single-gate transistor cell.

Figure 1J:
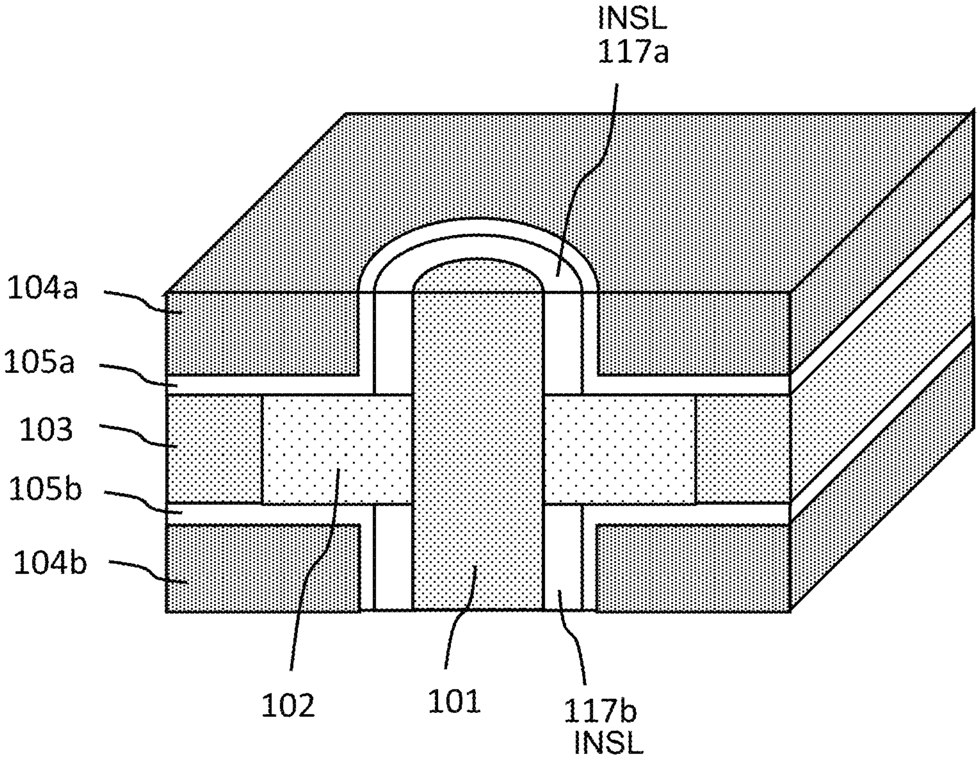

FIG. 1J shows an embodiment of a cell structure according to the invention. This embodiment is similar to the embodiment shown in FIG. 1A except that additional insulating layers 117*a* and 117*b* comprising material such as oxide or nitride material are formed on portions of the bit line 101 to reduce the parasitic capacitance of the bit line 101 and the capacitance-coupling between the bit line 101 and the gates 104*a* and 104*b*. The structures shown in FIGS. 1I-J can be applied to all the other cell embodiments shown in FIGS. 1A-7B.

Figure 1K:
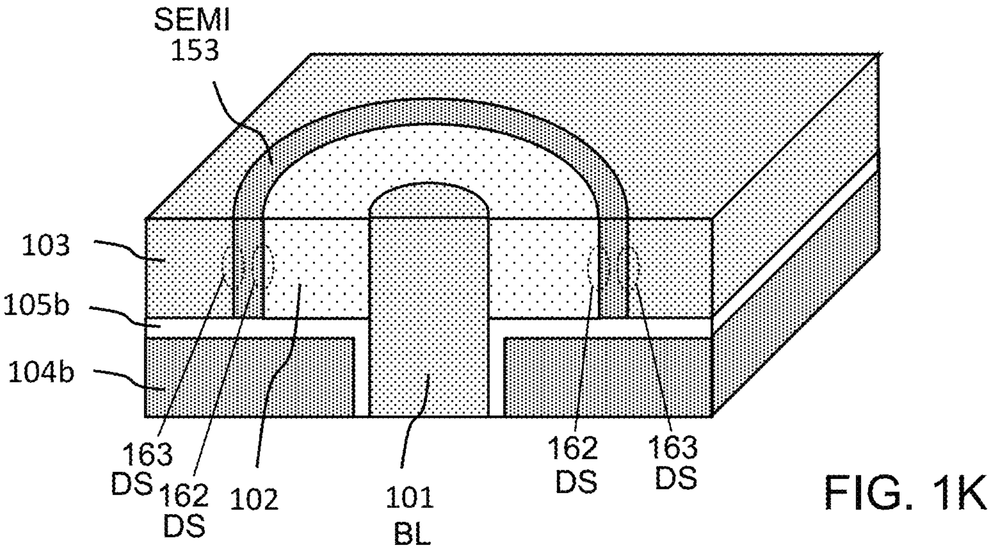

FIG. 1K shows an embodiment of a cell structure according to the invention. For case of description and clarity, the front gate 104*a* and the gate dielectric layer 105*a* are removed to show the inner structure of the cell. This embodiment is similar to the embodiment shown in FIGS. 1A-B except that a diode structure (DS) 162 is formed between the source line 103 and the floating body 102. This structure prevents the bit line 101 voltage from leaking to the source line 103 during program operations.

As an example, it will be assumed the cell structure in FIG. 1K forms an N-channel cell to describe program operations. When the gate 104*b* is supplied with a positive voltage, the selected bit line 101 is supplied with a low voltage for programing, and the other unselected bit lines are supplied with a high voltage to inhibit the programming. The source line 103 is supplied with a voltage equal to or higher than the unselected bit line voltage to turn off the diode structure 162. This configuration prevents current leakage between the selected bit line 101 and the unselected bit lines through the source line 103.

Referring again to FIG. 1K, in one embodiment, a semiconductor layer 153 comprising material such as silicon or polysilicon material is formed between the source line 103 and the floating body 102. The semiconductor layer 153 is formed by using a diffusion, epitaxial growth, or polysilicon deposition process. In one embodiment, the semiconductor layer 153 has the opposite type of heavy doping as the floating body 102. For example, in one embodiment, if the floating body 102 has P-type doping, the semiconductor layer 153 has N+ type doping. This forms a diode structure 162 between the floating body 102 and the semiconductor layer 153. The source line 103 is formed of conductor material such as metal or polysilicon material with the same type of heavy doping as the semiconductor layer 153.

In another embodiment, the semiconductor layer 153 has the same type of heavy doping as the floating body 102, and the source line 103 is formed of the opposite type of heavily doped semiconductor material such as polysilicon material. For example, in one embodiment, the semiconductor layer 153 is formed of P+ type of silicon or polysilicon material, and the source line 103 is formed of N+ type of polysilicon material. This configuration forms a diode structure 163 between the semiconductor layer 153 and the source line 103.

Figure 1L:
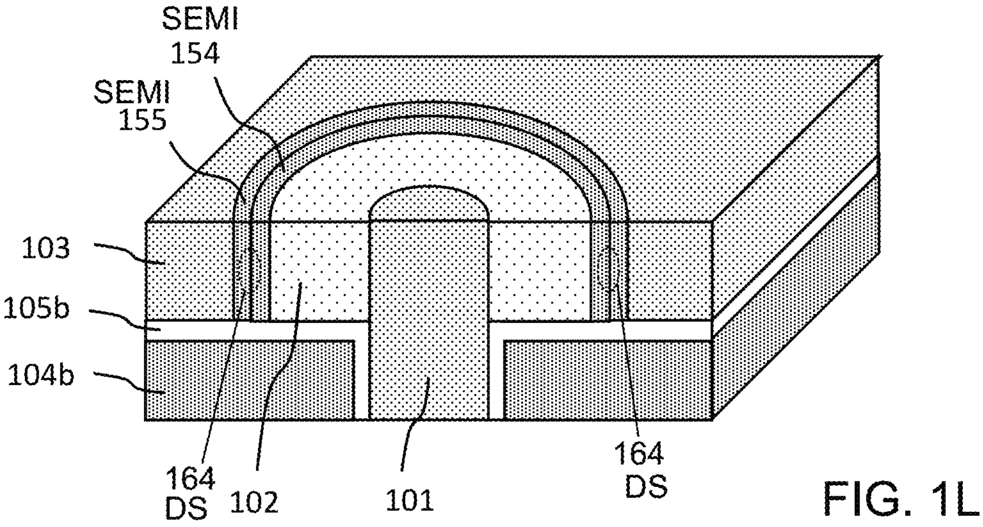

FIG. 1L shows an embodiment of a cell structure according to the invention. In this embodiment, a diode structure 164 between the source line 103 and the floating body 102 is formed by two semiconductor layers 154 and 155 comprising material such as silicon or polysilicon material.

In one embodiment, the semiconductor layer 154 has the same type of heavy doping as the floating body 102, and the semiconductor layer 155 has the opposite type of heavy doping from the floating body 102. For example, in one embodiment, the floating body 102 has P-type doping, the semiconductor layers 154 and 155 have P+ and N+ type doping, respectively. This forms a diode structure 164 shown in FIG. 1L between the semiconductor layers 154 and 155. The source line 103 is formed of conductor material such as metal or polysilicon material having the same type of heavy doping as the semiconductor layer 155.

Figure 1M:
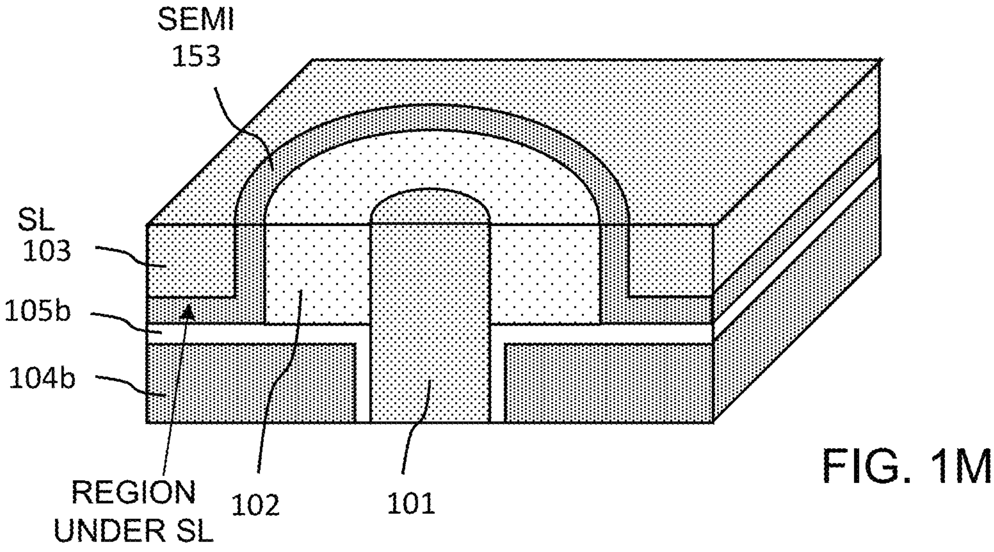

FIG. 1M shows an embodiment of a cell structure according to the invention. This embodiment is similar to the embodiment shown in FIG. 1K except that in this embodiment, the semiconductor layer 153 is formed to have the shape as shown that extends underneath the SL 103.

Figure 1N:
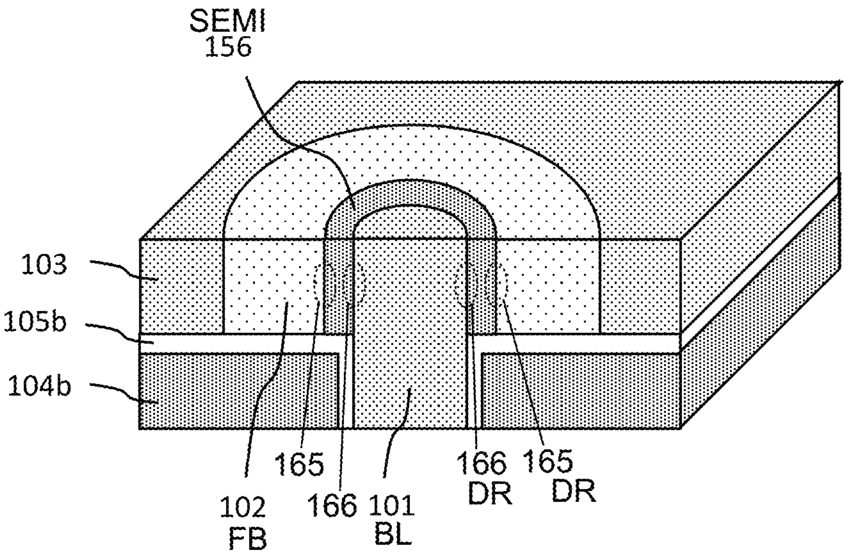
Figure 1O:
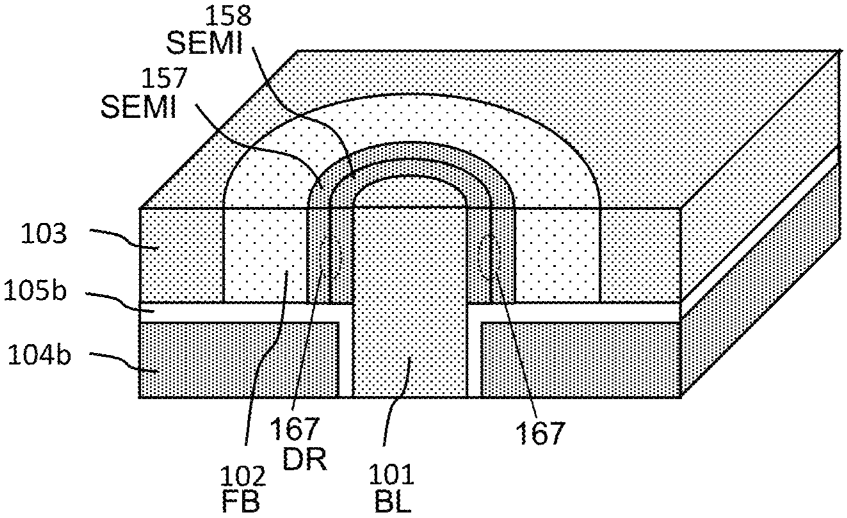
Figure 1P:
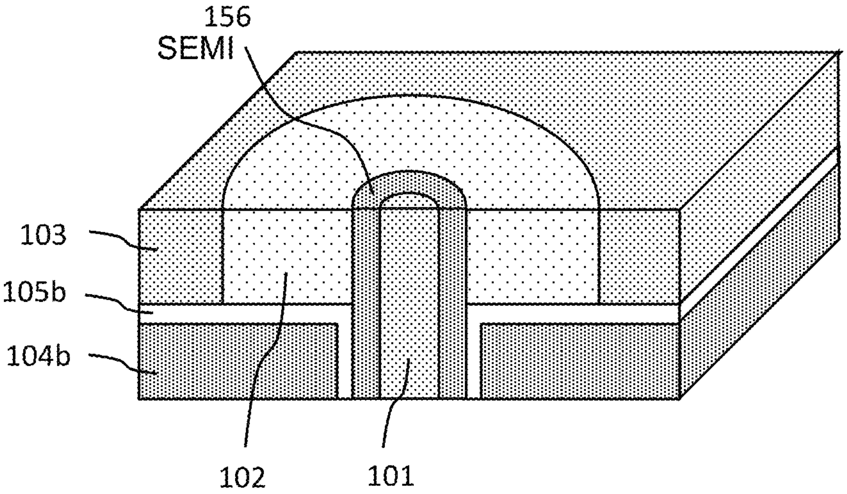

FIGS. 1N-P show embodiments of cell structures according to the invention. In these embodiments, a diode structure is formed between the bit line 101 and the floating body 102.

FIG. 1N shows an embodiment of a cell structure in which a semiconductor layer 156 comprising material such as silicon or polysilicon material is formed between the bit line 101 and the floating body (FB) 102. The semiconductor layer 156 is formed by using a diffusion, epitaxial growth, or polysilicon deposition process. In one embodiment, the semiconductor layer 156 has the opposite type of heavy doping as the floating body 102. For example, in one embodiment, if the floating body 102 has P-type doping, the semiconductor layer 156 has N+ type doping. This forms a diode structure (DS) 165 between the floating body 102 and the semiconductor layer 156. The bit line 101 is formed of conductor material such as metal or polysilicon material with the same type of heavy doping as the semiconductor layer 156.

In another embodiment, the semiconductor layer 156 has the same type of heavy doping as the floating body 102, and the bit line 101 is formed of the opposite type of heavily doped semiconductor material such as polysilicon material. For example, in one embodiment, the semiconductor layer 156 is formed of P+ type silicon or polysilicon and the bit line 101 is formed of N+ type polysilicon. This configuration forms a diode structure 166 between the semiconductor layer 153 and the bit line 101.

FIG. 1O shows an embodiment of a cell structure according to the invention. In this embodiment, a diode structure 167 between the bit line 101 and the floating body 102 is formed by two semiconductor layers 157 and 158 comprising material such as silicon or polysilicon material. In one embodiment, the semiconductor layer 157 has the same type of heavy doping as the floating body 102, and the semiconductor layer 158 has the opposite type of heavy doping as the floating body 102. For example, in one embodiment, if the floating body 102 has P-type doping, the semiconductor layers 157 and 158 have P+ and N+ type doping, respectively. This forms a diode between the semiconductor layers 157 and 158. The bit line 101 is formed of conductor material such as metal or polysilicon material with the same type of heavy doping as the semiconductor layer 158.

FIG. 1P shows an embodiment of a cell structure according to the invention. In this embodiment, the semiconductor layer 156 is formed to have the pattern or shape shown in FIG. 1P.

In another embodiment, the cell structures shown in FIG. 1A and FIG. 1I are formed as four-terminal and three-terminal memristor-transistors, respectively, also called 'memtransistor'. In this embodiment, the floating body 102 of the cell is formed of 'memristor' material. The resistance of the memristor is modulated through the formation or rupture of conductive filaments in the memristor. The conductive filaments are formed by the migration of dopants, ions, or defects. The memristor materials are sometimes called 'synapse' materials or 'phase-change' materials.

There are many memristor materials, such as $MoS_2$, $ReSe_2$, $ZrO_2$, GaSe, $WSe_2$, $WO_{3-x}$, $SrTiO_3$, $TiO_2$, $MoTe_2$, $Ta_2O_5$, $VO_2$, $VSiO_x$, $Cu_2S$, $In_2Se_3$, $C_{22}H_{14}$ (Pentacene), indium gallium zinc oxide (IGZO), Graphene, Carbon nanotube, van der Waals (vdW) materials such as $WSe_2$-$NbSe_2$, $Nb_2O_5$-$WSe_2$-$NbSe_2$ layers, or combinations of any of these materials. The gate dielectric layers 105*a* and 105*b* are formed of $SiO_2$, $HfO_2$, $Al_2O_3$, $TiO_2$, $Nb_2O_5$, $VSiO_x$, or a combination of any of these materials. The gates 104_a_ and 104_b_ are formed of suitable metal material such as W, Cr, Pt, Au, Pd, and many others.

It should be noted that the materials listed above for the memristor floating body 102, the gate dielectric layers 105_a_ and 105_b_, and the gates 104_a_ and 104_b_ are exemplary. It would be very difficult to list all possible suitable materials. However, using any other suitable memristor materials are within the scope of the invention.

Figure 2A:
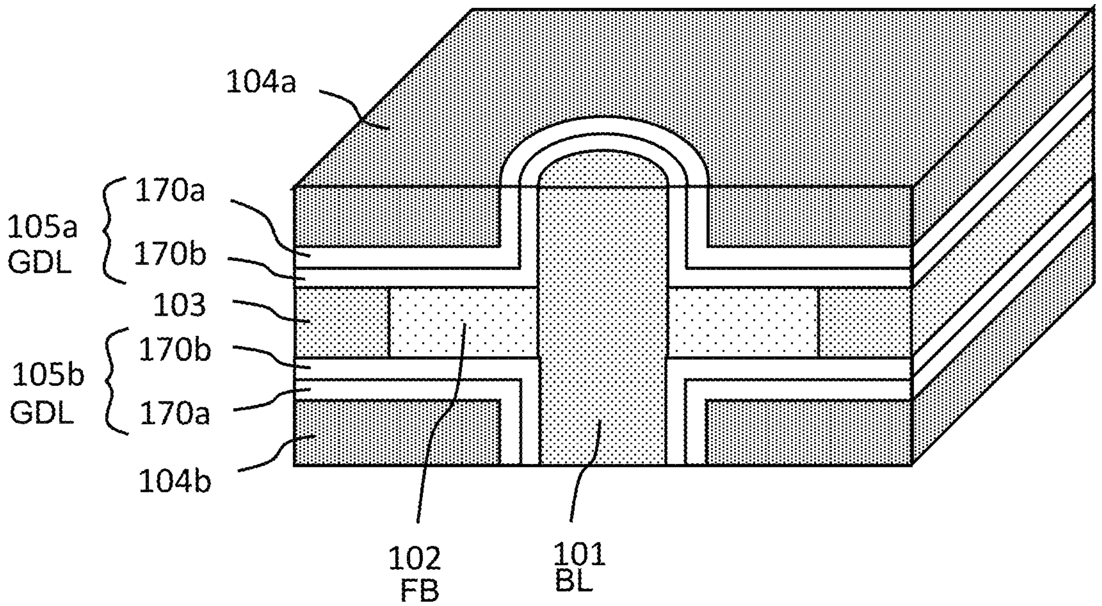
FIG. 2A shows an embodiment of a memristor-transistor cell structure according to the invention.

FIG. 2A shows an embodiment of a memristor-transistor cell structure according to the invention. This embodiment has a thin floating body 102 that is used as the channel of the cell similar to that described in FIG. 1F. The gate dielectric layers 105_a_ and 105_b_ comprises multiple layers such as layers 170_a_ and 170_b_. In one embodiment, the thin floating body 102 is formed of WSe2, and the gate dielectric layers 170_a_ and 170_b_ are formed of SiO2 and Nb2O5, respectively.

In another embodiment, the thin floating body 102 is formed of MoS2, and the gate dielectric layers 170_a_ and 170_b_ are formed of Al2O3 and ZrO2-x, respectively. In another embodiment, the thin floating body 102 is formed of MoS2, and the gate dielectric layers 170_a_ and 170_b_ are formed of Al2O3 and Nb2O5, respectively. In another embodiment, the thin floating body 102 is formed of SrTiO3, and the gate dielectric layers 170_a_ and 170_b_ are formed of SiO2 and Si3N4, respectively.

Figure 2B:
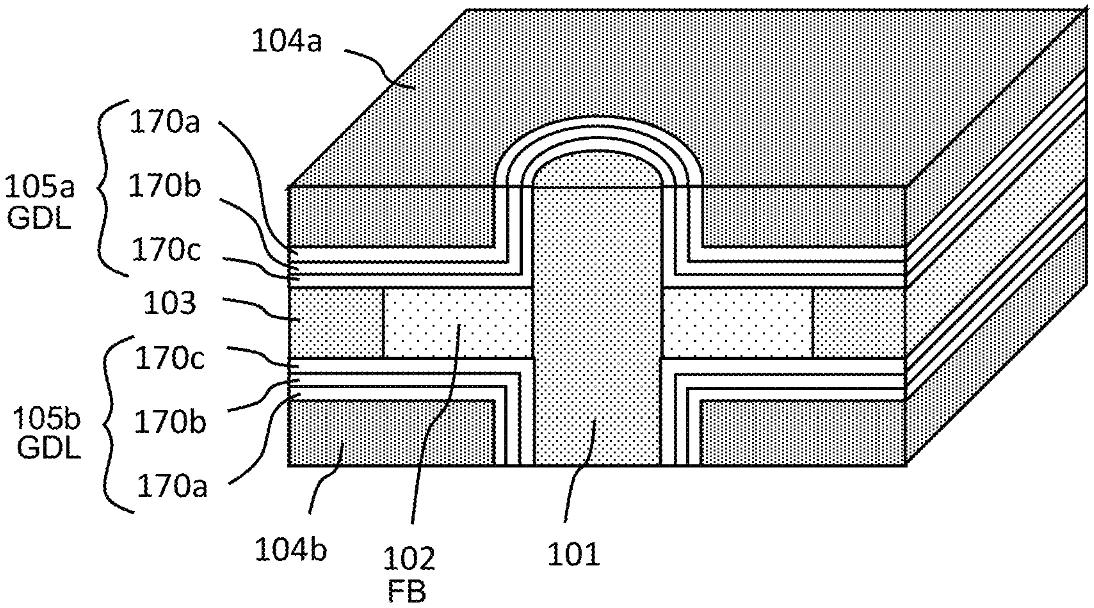
FIG. 2B shows an embodiment of a cell structure according to the invention.

FIG. 2B shows an embodiment of a cell structure according to the invention. In this embodiment, the gate dielectric layers 105_a_ and 105_b_ comprise three layers 170_a_ to 170_c_. The thin floating body 102 is formed of indium gallium zinc oxide (IGZO), and the gate dielectric layers (170_a_), (170_b_), and (170_c_) are formed of SiO2, TiO2, and Al2O3, respectively.

This cell structure combines the functions of a transistor and a memristor. The transistor can have dual gates as shown in FIG. 1A or a single gate as shown in FIG. 1I. The gate(s) modulate the formation and rupture of the conductive filament in the memristor material of the floating body 102. When the conductive filament is formed, it reduces the resistance between the bit line 101 and the source line 103, thus the cell becomes an on-cell. When the conductive filament is ruptured, it increases the resistance between the bit line 101 and the source line 103, thus the cell becomes an off-cell.

Depending on the switching mechanisms, the behaviors of the memristor can be bipolar, unipolar, threshold, diffusive, or complementary resistive switching.

Figure 2C:
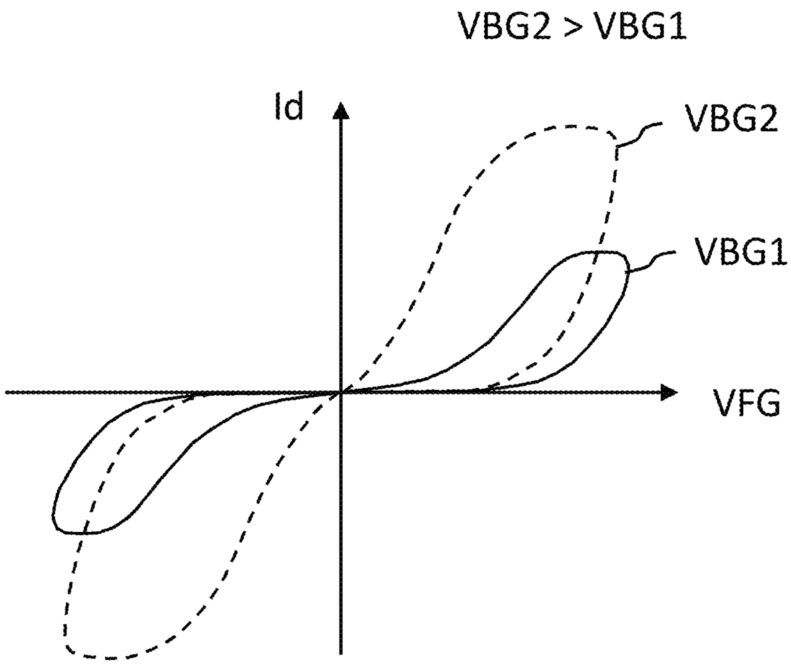
FIGS. 2C-E show examples of switching behaviors of a four-terminal memristor-transistor.
Figure 2D:
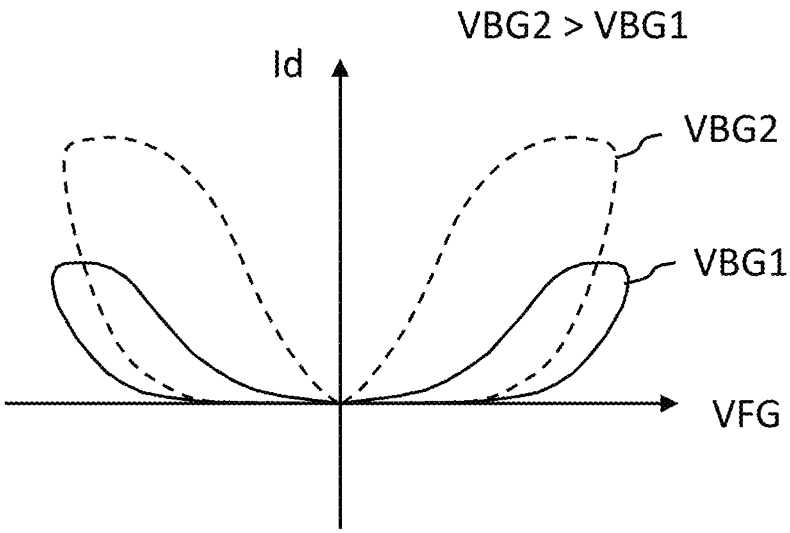
Figures 2E, 2F:
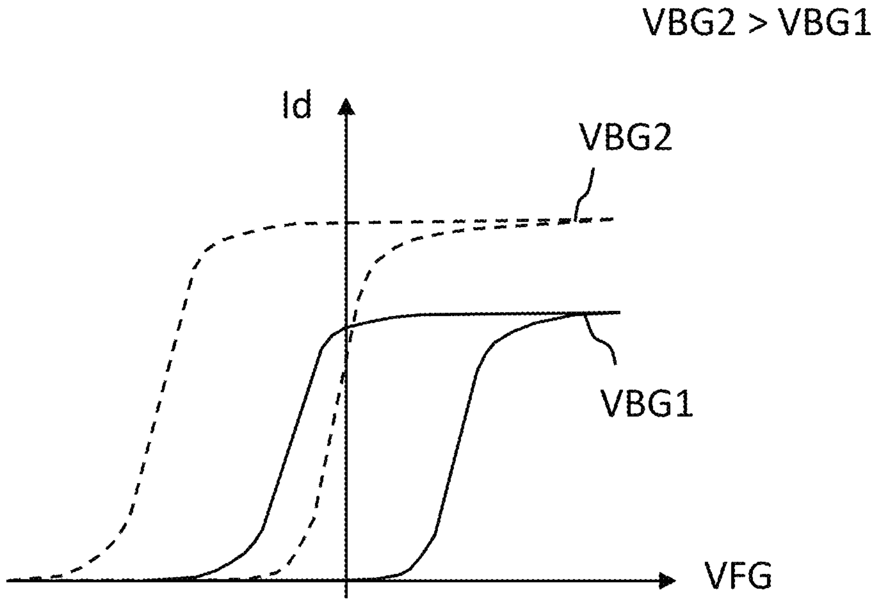
FIG. 2F shows a table that illustrates some exemplary materials for embodiments of a memristor-transistor cell according to the invention.

FIGS. 2C-E show examples of switching behaviors of a four-terminal memristor-transistor, such as the one shown in FIG. 1A. FIGS. 2C-D shows a bipolar switching mechanism. FIG. 2E shows a unipolar switching mechanism in which VFG, VBG, and Id stand for front gate voltage, back gate voltage, and drain current, respectively.

For some memristors, such as VO2 or SrTiO3 memristors, the resistance of the memristor is modulated by modifying the Schottky barriers at the contacts. For example, in one embodiment, the floating body 102 is formed of VO2 and the bit line 101 and the source line 103 are formed of TiN. When the front gate 104_a_ is supplied with a low voltage and the bit line 101 and the source line 103 are applied with a high voltage, the floating body 102 is depleted of V2+O and causes the contacts to be Schottky. Therefore, the cell is in a high-resistance state. When the front gate 104_a_ is supplied with a low voltage and the bit line 101 and the source line 103 are supplied with a high voltage, the floating body 102 is saturated with V2+O and causes the contacts to be ohmic.

FIG. 2F shows a table that illustrates some exemplary materials for embodiments of the memristor-transistor cell according to the invention. The table shows the materials for the gates 104_a_ and 104_b_, the floating body 102, the gate dielectric layers such as layers 105_a_ and 105_b_, and the source/drain electrodes such as the bit line 101 and the source line 103 shown in FIGS. 1A-B. The source and drain electrodes are the conductors used to form the source line 103 and bit line 101, respectively. It should be noted that some materials in the table are unspecified and shown by the symbol '-'. These unspecified materials comprise any suitable materials. For the gate and source/drain electrodes (e.g., BL 101 and SL 103), the suitable material may be conductor material such as metal or heavily doped polysilicon material. For the gate dielectric layer (e.g., GDL 105_a/b_), the suitable material may be insulator material such as oxide (SiO2) or high-K material such as silicon hafnium (HfO2). The materials described in FIG. 2F are exemplary and not limiting. It is virtually impossible to list all the possible materials. Using any other memristor materials is within the scope of the invention.

FIGS. 3A-7B show embodiments of cell structures according to the invention. In these embodiments, the gate dielectric layers 105_a_ and 105_b_ can be formed using any of the materials described with reference to FIGS. 1A-D. However, for simplicity, an embodiment using charge-trapping layers, such as oxide-nitride-oxide (ONO) layers, will be used as an example in the following description. It should be noted that using any other materials including but not limited to those materials described in FIGS. 1A-D is within the scope of the invention.

Figure 3A:
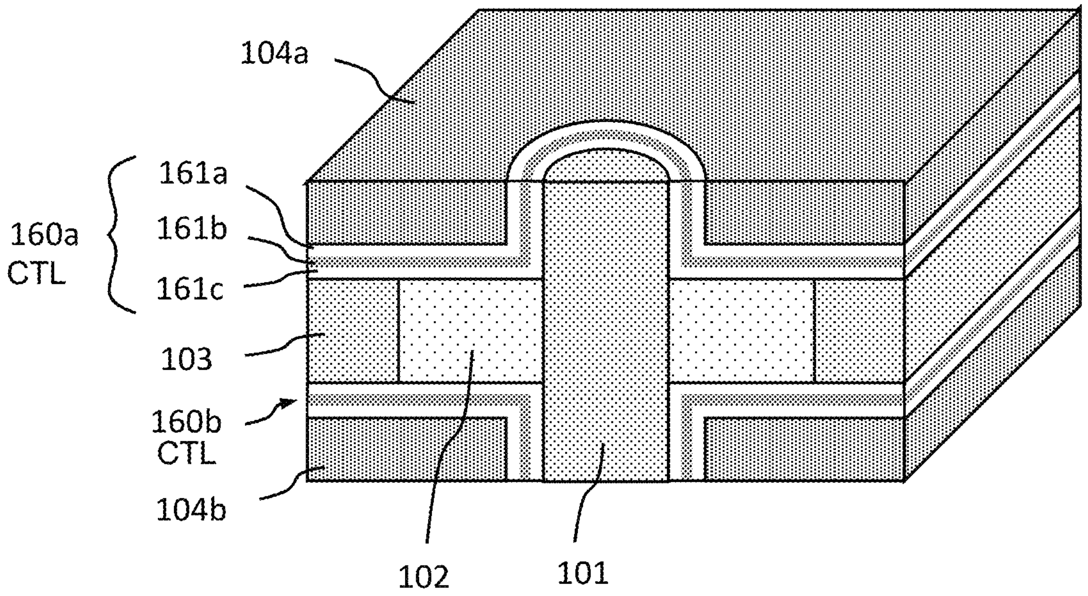
FIGS. 3A-7B show embodiments of cell structures according to the invention.

FIG. 3A shows an embodiment of a cell structure according to the invention. This embodiment is similar to the embodiment shown in FIG. 1A except that the gate dielectric layers 105_a_ and 105_b_ are replaced with memory material layers such as charge-trapping layers (CTL) 160_a_ and 160_b_. It should be noted that for clarity and ease of description, the layers of the charge-trapping layers 160_b_ are not shown in detail, but in various embodiments these layers are the same as the charge-trapping layers 160_a_.

In one embodiment, the charge-trapping layers 160_a_ and 160_b_ comprise multiple layers 161_a_ to 161_c_ such as oxide-nitride-oxide (ONO) layers. In one embodiment, the oxide layer 161_a_ is a tunnel oxide layer, which is thin enough to allow electrons to tunnel through when a high electric field is applied. In one embodiment, the nitride layer 161_b_ traps electrons for data storage. In one embodiment the oxide layer 161_c_ is a blocking oxide which is thick enough to prevent electrons from tunneling through to the gates 104_a_ and 104_b_. In another embodiment, the oxide layer 161_c_ is a tunnel oxide layer and the oxide layer 161_a_ is a blocking oxide layer. In this embodiment, during programming, electrons are injected from the selected gates 104_a_ or 104_b_ to the nitride layer 161_b_.

Although the ONO layers 161_a_ to 161_c_ are used as an example implementation for the charge-trapping layers 160_a_ and 160_b_, in other embodiments, the charge-trapping layers 160_a_ and 160_b_ comprise any suitable number of oxide layers and nitride layers. For example, in another embodiment, the charge-trapping layers 160_a_ and 160_b_ comprise oxide-nitride-oxide-nitride-oxide (ONONO) layers. In another embodiment, the charge-trapping layers 160_a_ and 160_b_ comprise only one oxide layer and one nitride layer (e.g., O—N) layers. These variations are within the scope of the invention.

Figure 3B:
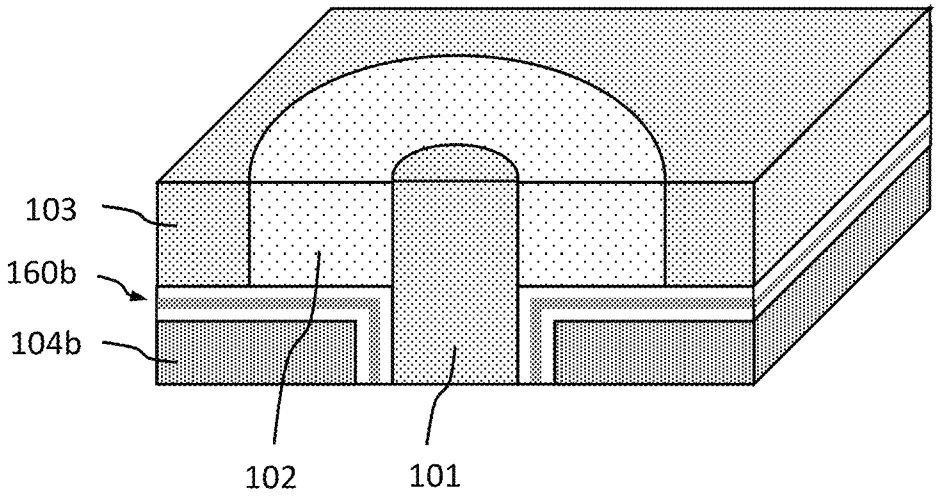

FIG. 3B shows the 3D cell structure shown in FIG. 3A with the front gate 104*a* and the charge-trapping layer 160*a* removed to show the inner structure of the cell.

Figure 4A:
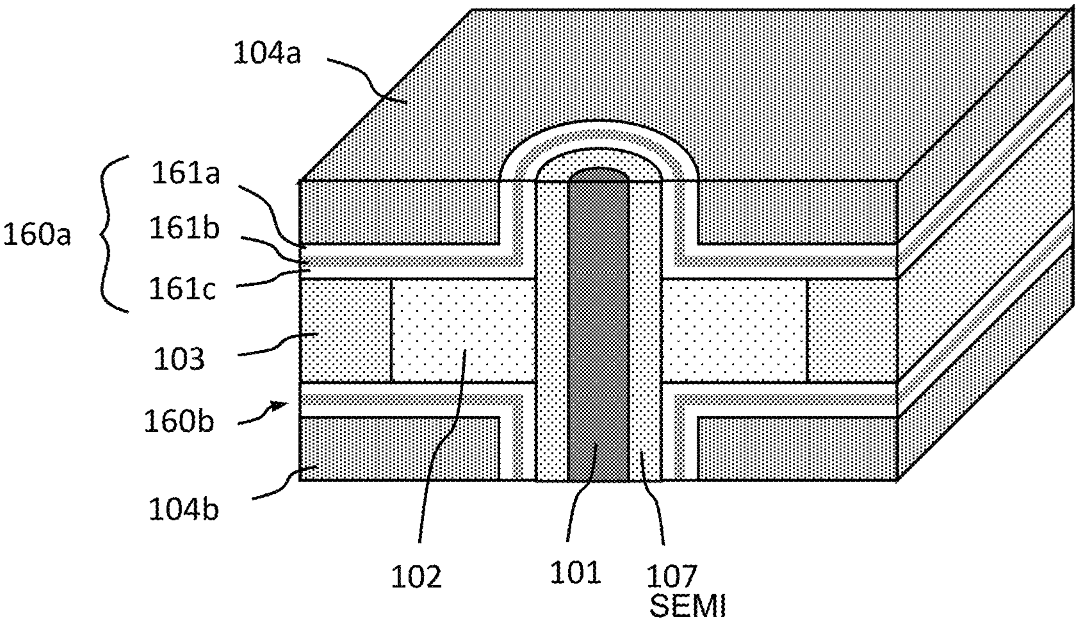

FIG. 4A shows an embodiment of a cell structure according to the invention. This embodiment is similar to the embodiment shown in FIG. 1A except that the bit line 101 is formed of metal to reduce the bit line resistance. A semiconductor layer 107 comprising material such as silicon or polysilicon material forms a drain region of the cell.

The semiconductor layer 107 that forms the drain region is formed by using an epitaxial growth process or a thin-film deposition process. In one embodiment, the semiconductor layer 107 is doped with the opposite type of heavy doping as the floating body 102 by using an in-situ doping process. The previously described process to form and dope the semiconductor layer 107 is exemplary and not limiting. Forming and doping the semiconductor layer 107 with other processes is within the scope of the invention. The metal bit line 101 and semiconductor layer 107 structure shown in this embodiment can be implemented in all the other embodiments of cell structures disclosed herein according to the invention.

Figure 4B:
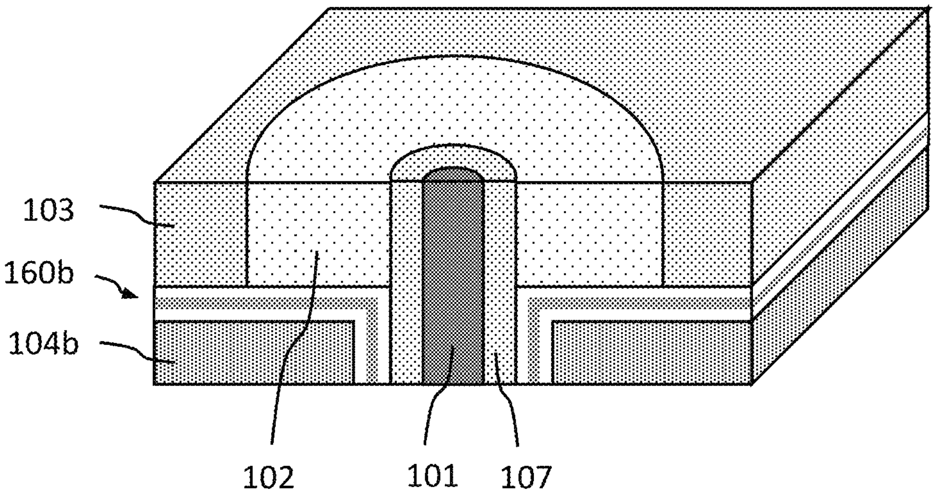

FIG. 4B shows the cell structure shown in FIG. 4A with the front gate 104*a* and charge-trapping layer 160*a* removed to show the inner structure of the cell.

Figure 4C:
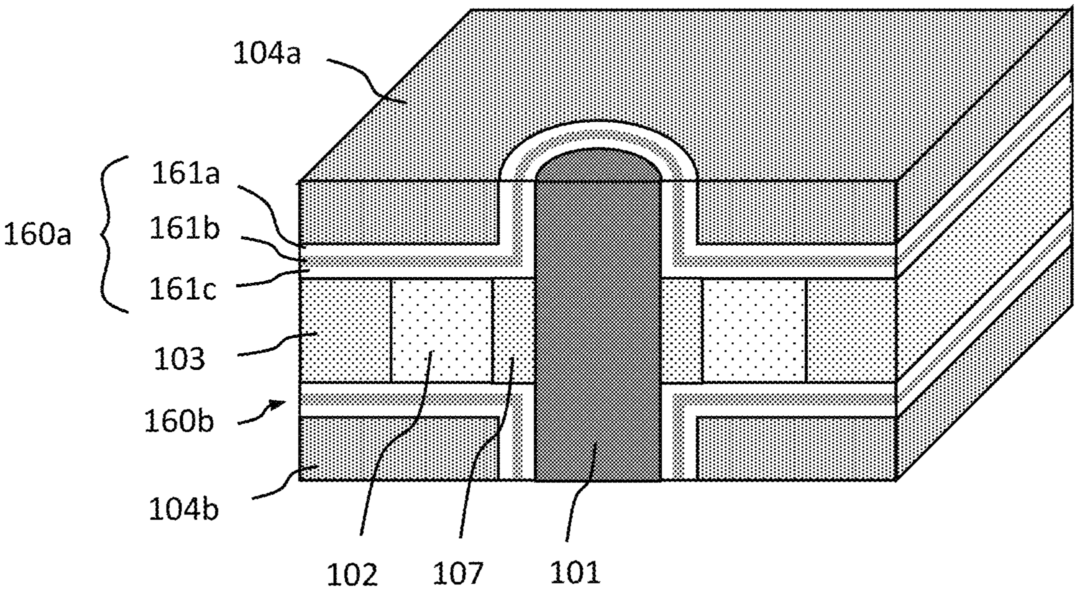

FIG. 4C shows an embodiment of a cell structure according to the invention. This embodiment is similar to the embodiment shown in FIG. 4A except that the semiconductor layer 107 is formed as a donut-shape island as shown. In one embodiment, the semiconductor layer 107 is formed by using a diffusion or plasma doping process to implant the opposite type of heavy dopants as used in the floating body 102. For example, assuming the floating body 102 has P- or N-type of doping, the semiconductor layer 107 is formed by implanting N type of dopants, such as phosphorous, or P type of dopants, such as boron, to form an N+ or P+ type of region, respectively.

In another embodiment, the semiconductor layer 107 is formed by using an isotropic etching process, such as wet etching, to form a recess in the floating body 102, and then filling the recess with a semiconductor material that has the opposite type of doping as the floating body 102 by using epitaxial growth or polysilicon deposition to form the semiconductor layer 107. The bit line 101 is formed of metal to reduce the bit line resistance. The previously described process to form and dope the semiconductor layer 107 are only examples. Forming and doping the semiconductor layer 107 using other processes are within the scope of the invention. The metal bit line 101 and semiconductor layer 107 structure shown in this embodiment can be applied to all the other disclosed embodiments of cell structures according to the invention.

Figure 4D:
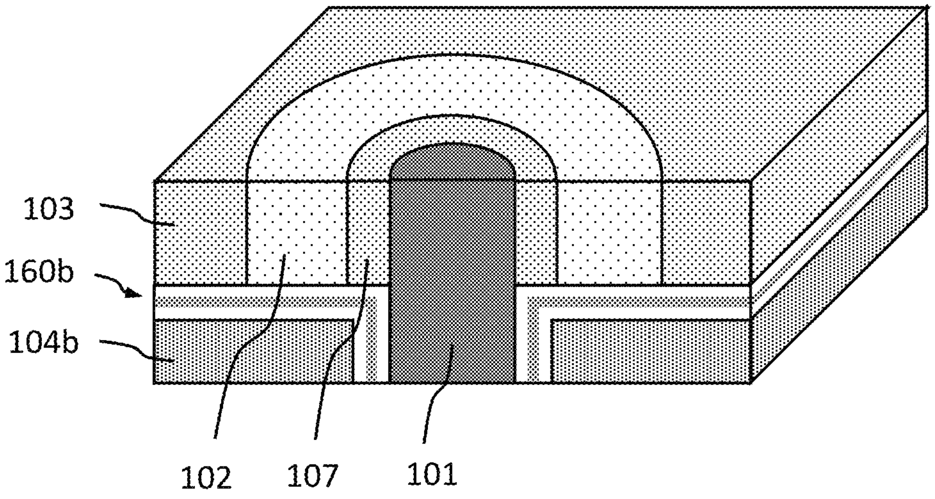

FIG. 4D shows the cell structure shown in FIG. 4C with the front gate 104*a* and charge-trapping layer 160*a* removed to show the inner structure of the cell.

Figure 5A:
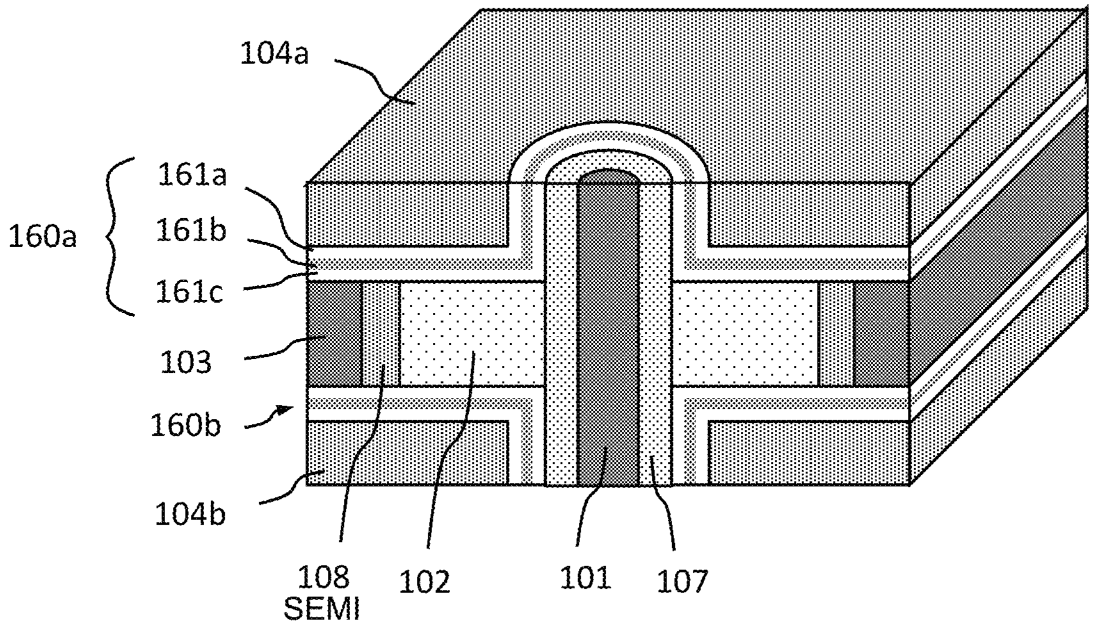

FIG. 5A shows an embodiment of a cell structure according to the invention. This embodiment is similar to the embodiment shown in FIG. 4A except that the source line 103 is formed of metal to reduce the source line resistance. A semiconductor layer 108 comprising material such as silicon or polysilicon material is formed between the source line 103 and the floating body 102 to form a source region.

The semiconductor layer 108 is formed by using a diffusion process or lateral ion implantation process to implant dopants into the floating body 102 through the space occupied by the source line 103 before the source line 103 is formed. In one embodiment, the semiconductor layer 108 is doped with the opposite type of heavy doping as the floating body 102 by using a diffusion process. The previously described processes to form and dope the semiconductor layer 108 are exemplary and not limiting. Forming and doping the semiconductor layer 108 using other processes are within the scope of the invention.

Figure 5B:
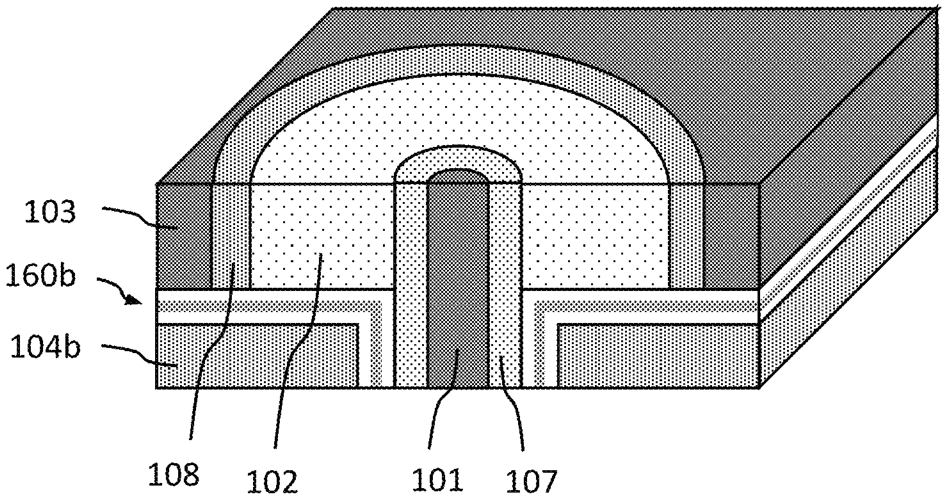

FIG. 5B shows the cell structure shown in FIG. 5A with the front gate 104*a* and the charge-trapping layer 160*a* removed to show the inner structure of the cell.

Figure 6A:
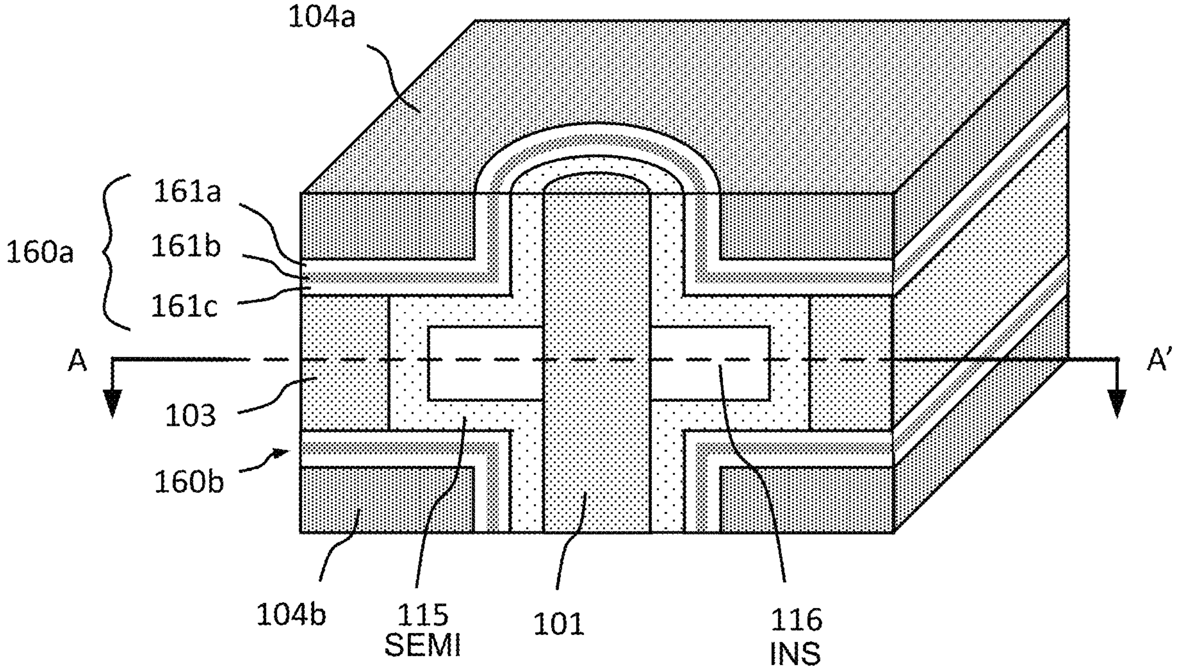

FIG. 6A shows an embodiment of a cell structure according to the invention. This embodiment is similar to the embodiment shown in FIG. 1A except that the cell shown in FIG. 6A is formed as a thin-film transistor instead of a junction transistor. A semiconductor layer 115 is formed comprising material such as silicon, polysilicon, silicon germanium (SiGe), indium gallium zinc oxide (IGZO), tungsten-doped indium oxide semiconductor, or any other suitable semiconductor materials. Also shown is an insulator 116 comprising material such as oxide or nitride material. The semiconductor layer 115 forms the channel of the cell transistor.

Figure 6B:
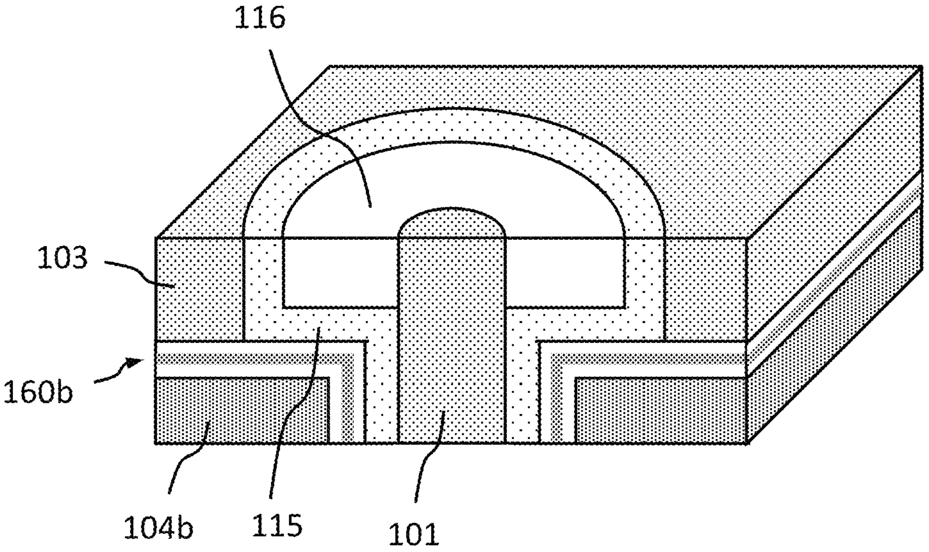

FIG. 6B shows a cross-section view of the cell structure shown in FIG. 6A taken along line A-A'.

Figure 7A:
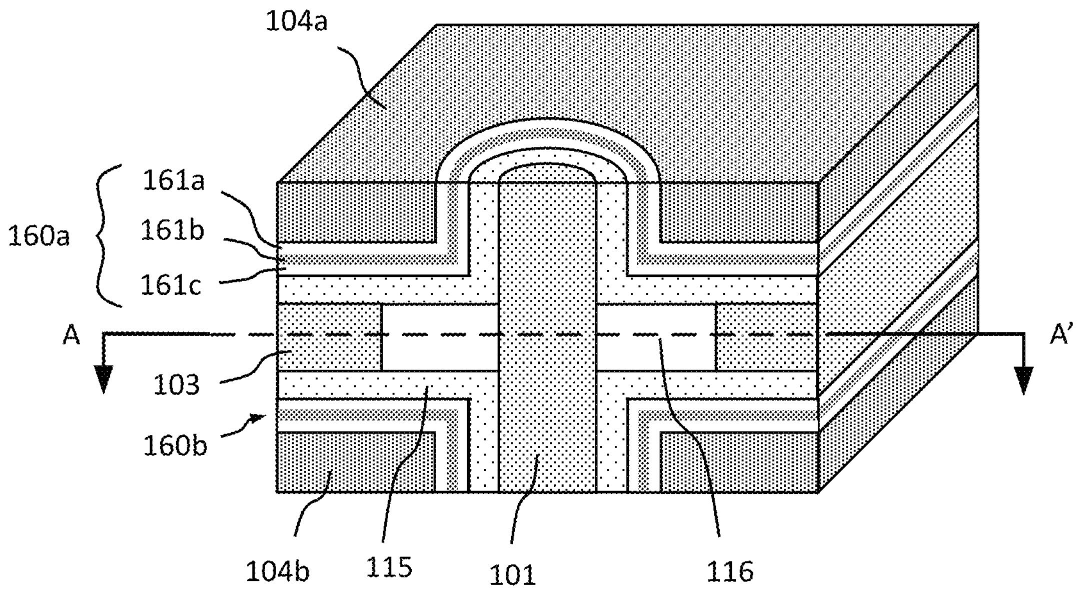

FIG. 7A shows an embodiment of a cell structure according to the invention. This embodiment is similar to the embodiment shown in FIG. 6A except that the semiconductor layer 115 is formed to have a different pattern or shape.

Figure 7B:
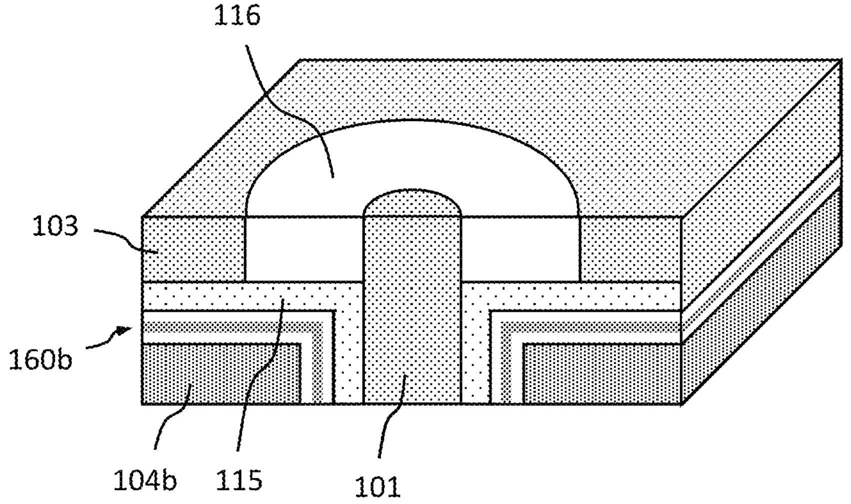

FIG. 7B shows a cross-section view of the cell structure shown in FIG. 7A taken along line A-A'.

FIGS. 8A-E show embodiments of 3D array structures according to the invention. In these embodiments, the cell structure shown in FIG. 1A is used to form an array structure as an example, however, all the embodiments of the 3D array structures shown in FIGS. 8A-E are applicable to and can be formed using any of the cell structures shown in FIG. 1A to FIG. 7B.

Figure 8A:
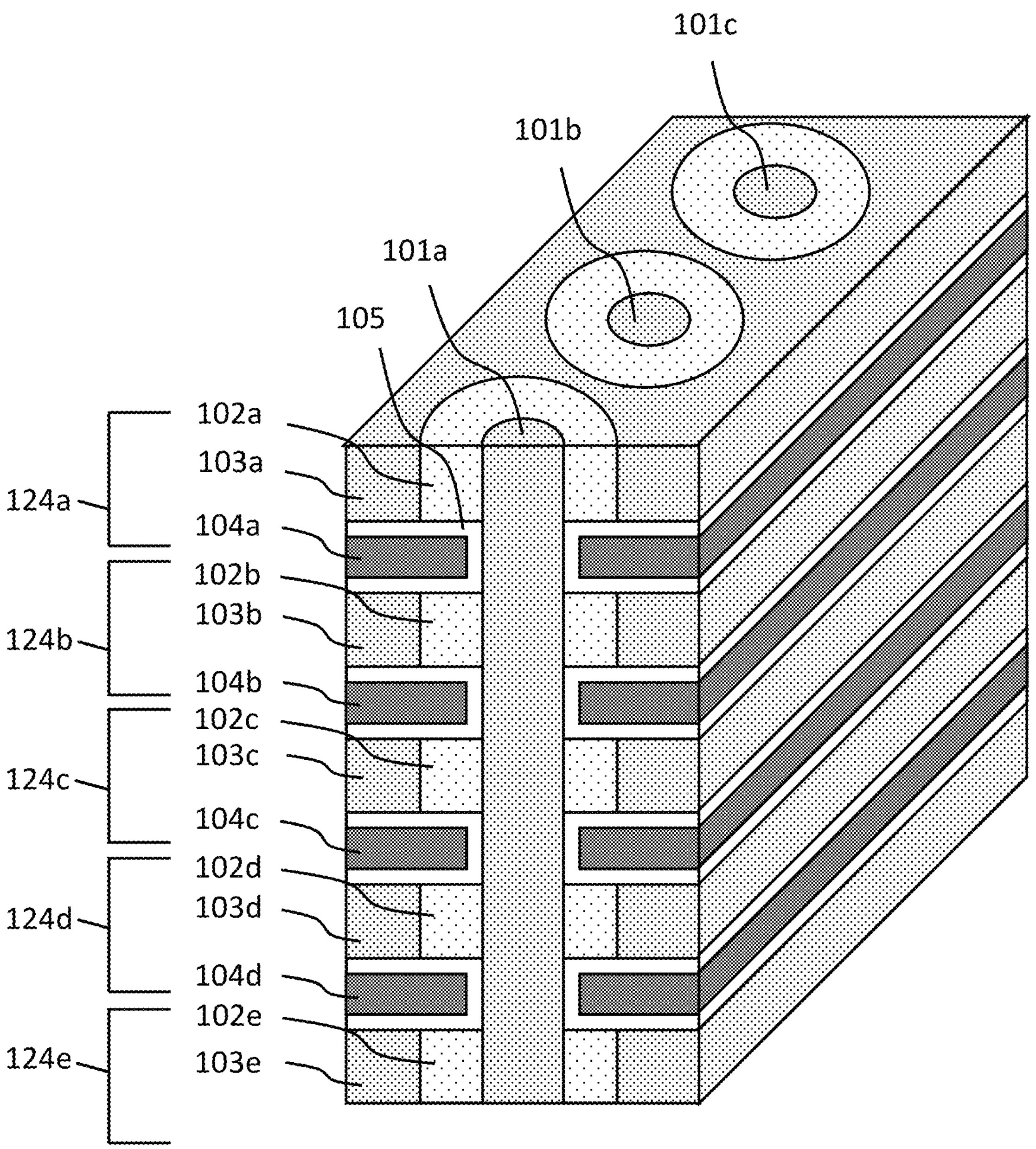
FIGS. 8A-E show embodiments of 3D array structures according to the invention.

FIG. 8A shows an embodiment of a 3D array structure formed using the cell structure shown in FIG. 1A. In this embodiment, five layers of cells 124*a* to 124*e* are shown as an example. The array structure also comprises vertical bit lines 101*a* to 101*c*, floating bodies 102*a* to 102*e*, and source lines 103*a* to 103*e*. The gates 104*a* to 104*d* form the word lines (WLs). Also shown are dielectric layers 105. In this embodiment, the cells are formed as dual-gate transistors. Each cell, such as cell 124*b*, is coupled to two gates 104*a* and 104*b*. Each gate, such as gate 104*a*, is shared by two adjacent cells, such as cells 124*a* and 124*b*.

Figure 8B:
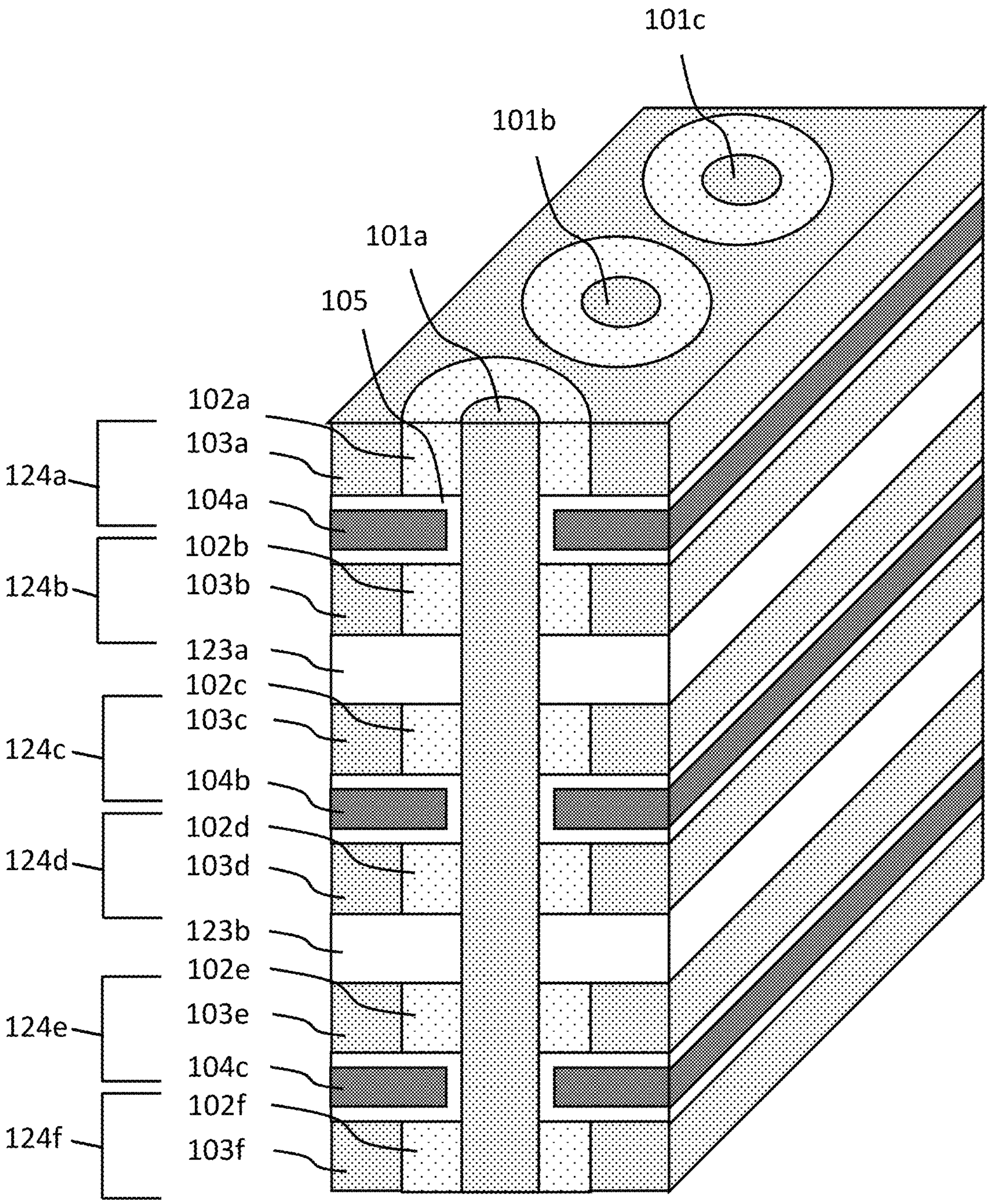

FIG. 8B shows an embodiment of a 3D array structure according to the invention. This embodiment includes six layers of cells 124*a* to 124*f* as an example. This embodiment is similar to the embodiment shown in FIG. 8A except that the cells are formed as single-gate transistors. Each cell, such as cell 124*b*, is coupled to only one gate, such as gate 104*a*. Also shown are insulating layers 123*a* and 123*b* comprising material such as oxide material to separate the cells. In this embodiment, each gate, such as gate 104*a*, is shared by two adjacent cells, such as cells 124*a* and 124*b*.

Figure 8C:
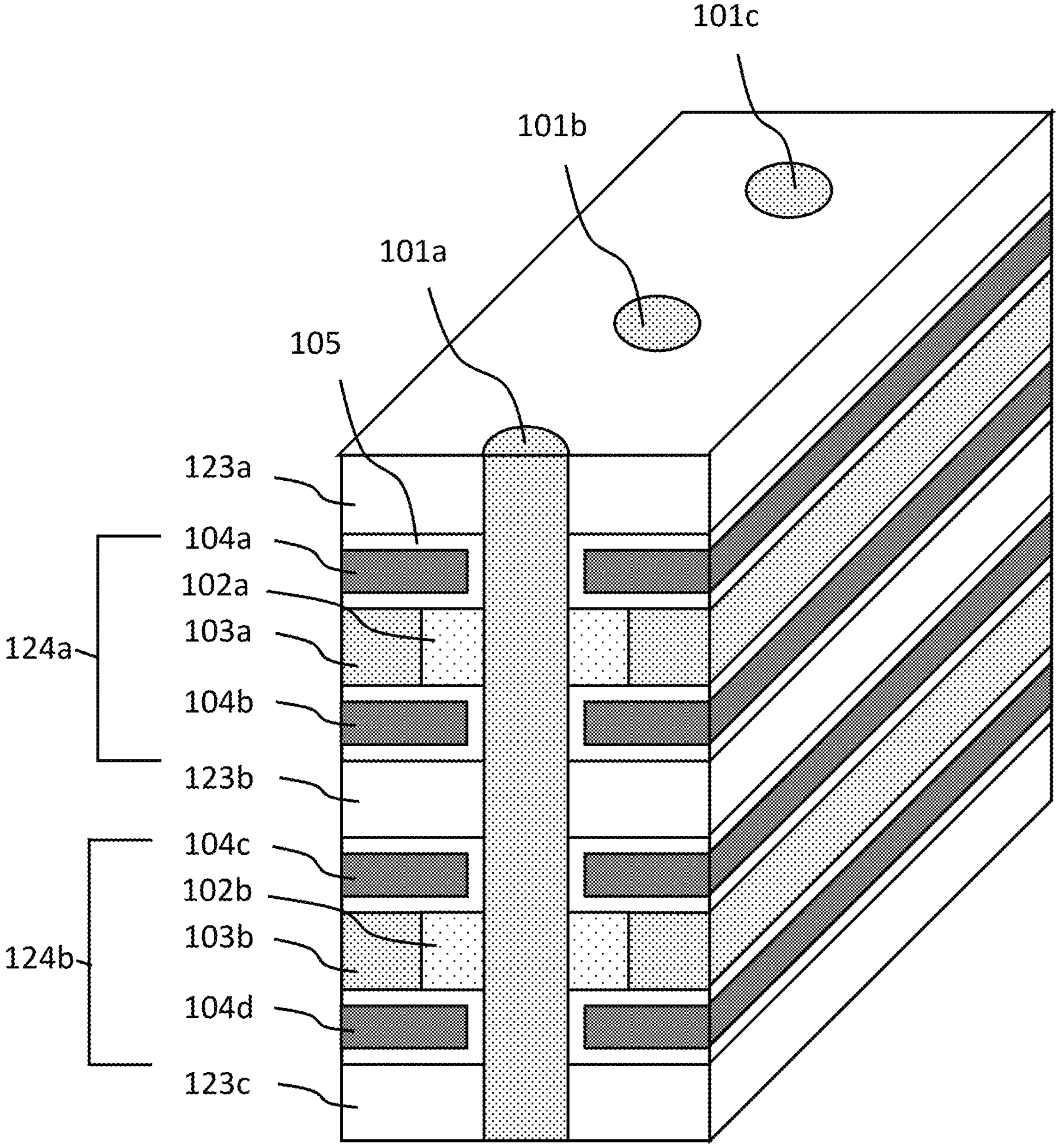

FIG. 8C shows an embodiment of a 3D array structure according to the invention. This embodiment includes two layers of cells 124*a* and 124*b* as an example. Insulating layers 123*a* to 123*c* comprising material such as oxide material are provided to separate the cells. This embodiment is similar to the embodiment shown in FIG. 8A except that the gates 104*a* to 104*d* are not shared. Each cell, such as cell 124*a*, is coupled to two gates, such as gates 104*a* and 104*b*. In one embodiment, the two gates coupled to a cell are separated to form a dual-gate transistor. In another embodiment, the two gates coupled to a cell are connected to form a single-gate transistor.

Figure 8D:
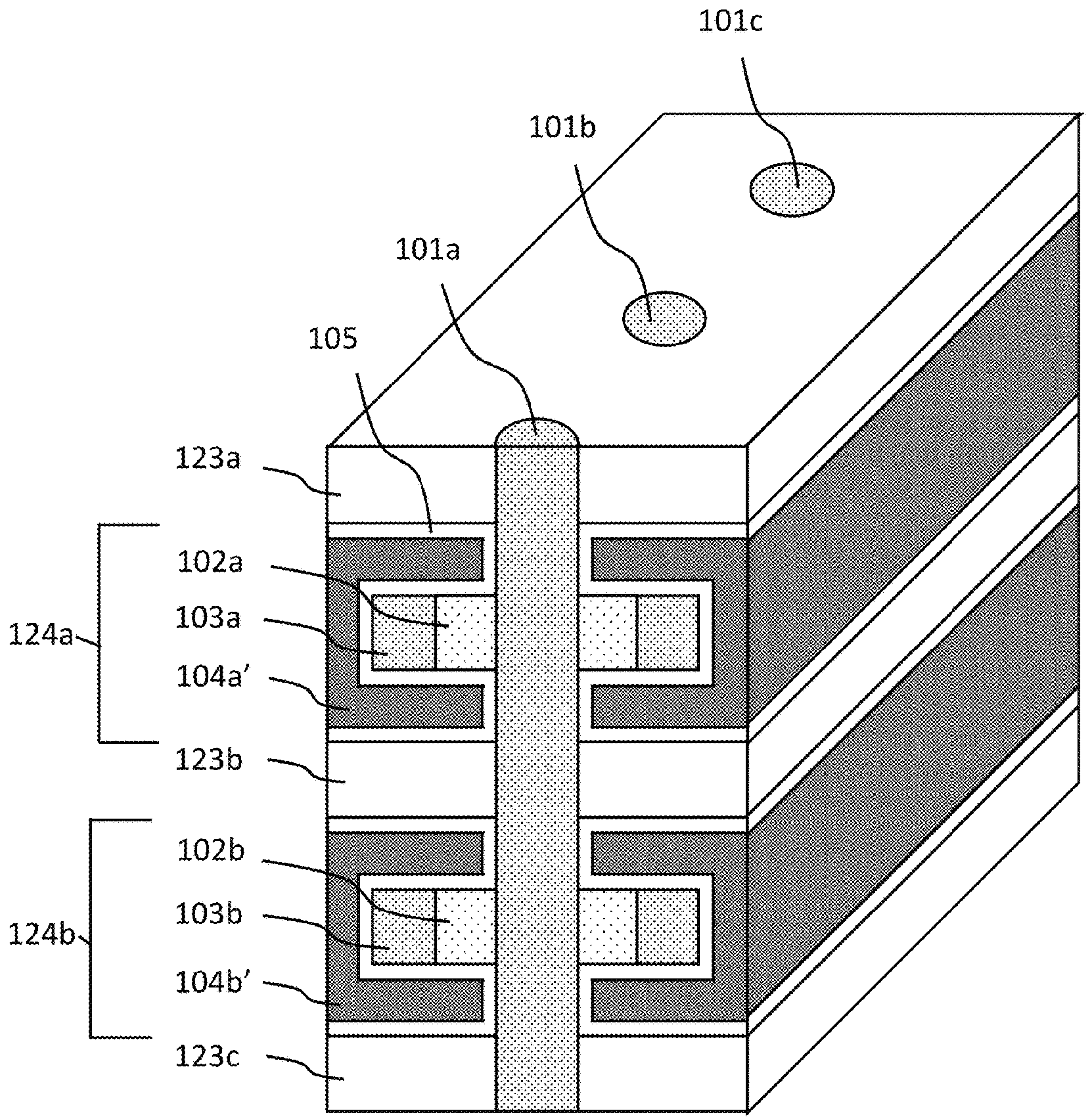

FIG. 8D shows an embodiment of a 3D array structure according to the invention. In this embodiment, two layers of cells 124*a* and 124*b* are shown as an example. Insulating layers 123*a* to 123*c* comprising material such as oxide material are provided to separate the cells. This embodiment is similar to the embodiment shown in FIG. 8C except that the two gates coupled to a cell, such as cell 104*a* and 104*b*, shown in FIG. 8C are connected to form a gate, such as gate 104*a*' and 104*b*' shown in FIG. 8D. This configuration forms a single-gate transistor.

Figure 8E:
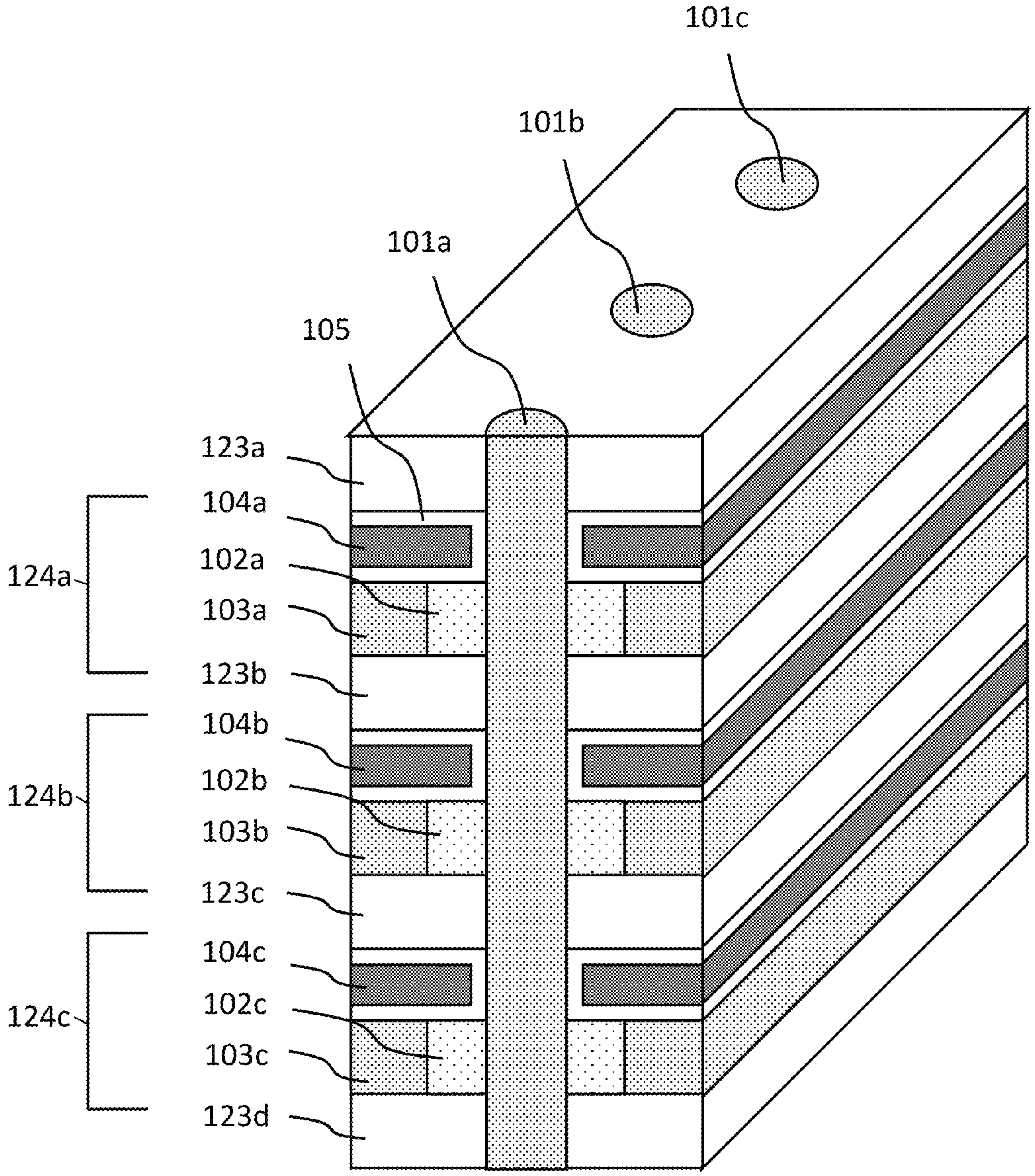

FIG. 8E shows an embodiment of a 3D array structure according to the invention. Three layers of cells 124*a* to 124*c* are shown as an example. Insulating layers 123*a* to 123*d* comprising material such as oxide material are provided to separate the cells. This embodiment is similar to the embodiment shown in FIG. 8C except that each cell, such as cell 124*a*, is only coupled to one gate, such as gate 104*a*. This configuration forms an array of single-gate transistors.

Figure 9A:
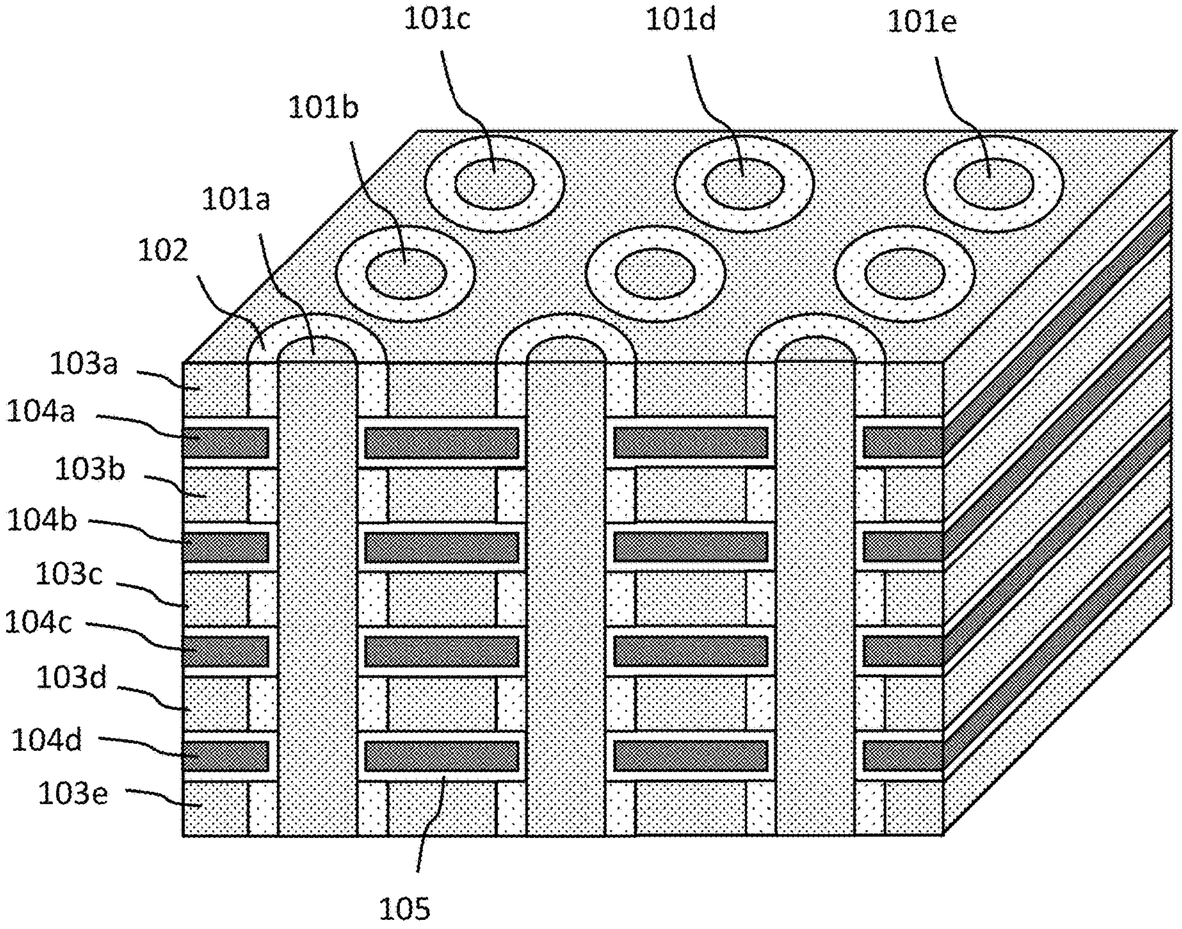
FIGS. 9A-C shows embodiments of 3D array structures according to the invention.
Figure 9B:
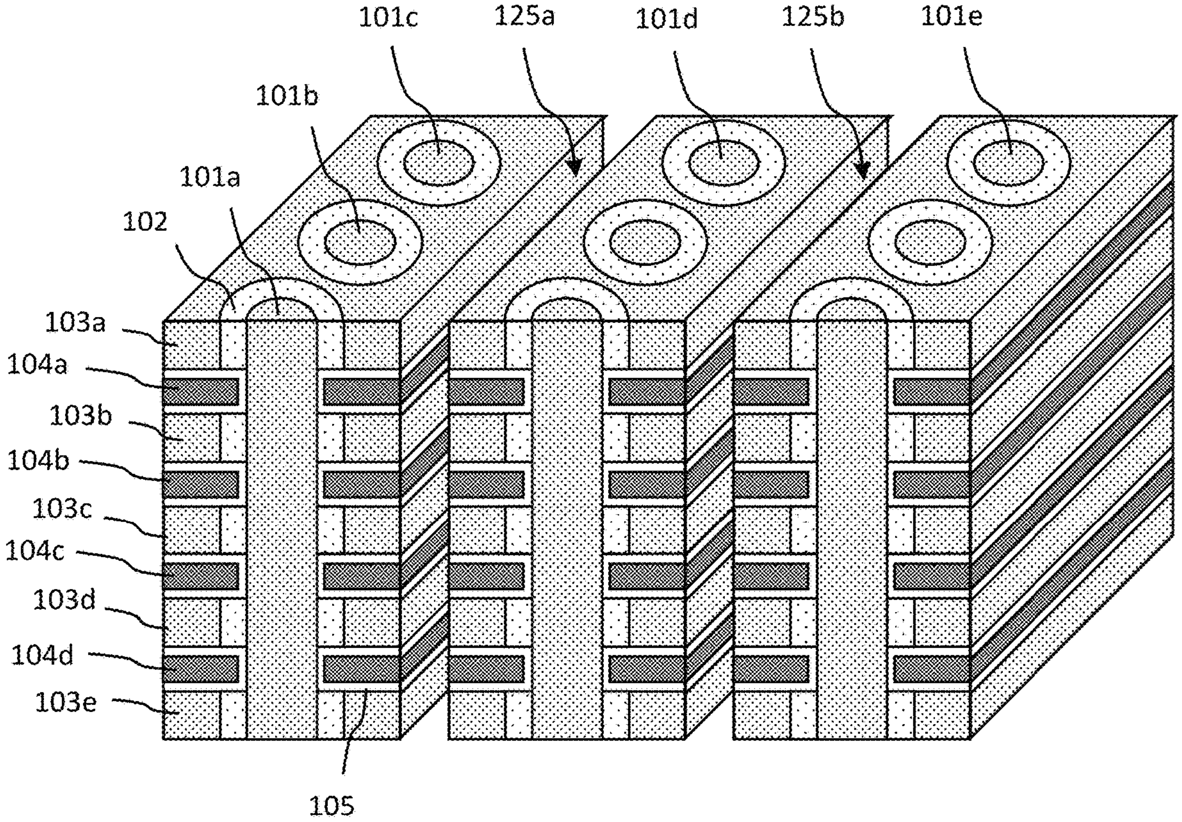
Figure 9C:
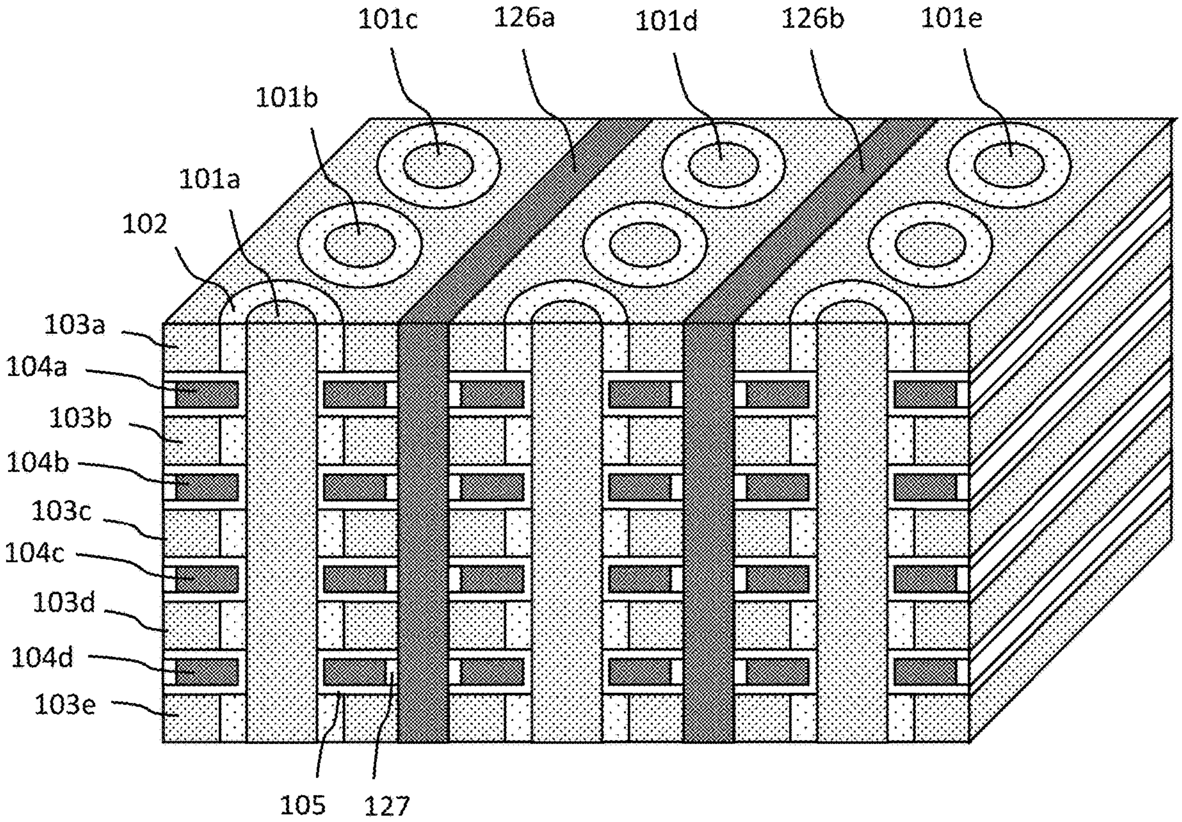

FIGS. 9A-C shows embodiments of 3D array structures according to the invention. As an example, the cell structure shown in FIG. 1A is used to form the array structure, however, all the embodiments of the 3D array structures shown in FIGS. 9A-C can be formed using any of the cell structures shown in FIG. 1A to FIG. 7B.

FIG. 9A shows an embodiment of a 3D array structure based on the cell structure shown in FIG. 1A as an example. This array structure includes vertical bit lines 101*a* to 101*e*, word line layers 104*a* to 104*d*, and source lines 103*a* to 103*e*. Also shown are the floating body 102 and gate dielectric layer 105.

FIG. 9B shows an embodiment of a 3D array structure formed using the cell structure shown in FIG. 1A as an example. This embodiment is similar to the embodiment shown in FIG. 9A except that the array is separated into multiple stacks by vertical slits, such as slits 125*a* and 125*b*. The word lines 104*a* to 104*d* in each stack can be connected to different word line decoder signals. In one embodiment, the slits 125*a* and 125*b* are filled with insulator material, such as oxide material.

FIG. 9C shows an embodiment of a 3D array structure formed using the cell structure shown in FIG. 1A as an example. This embodiment is similar to the embodiment shown in FIG. 9B except that the vertical slits 125*a* and 125*b* are filled with conductor material such as metal or polysilicon material to form vertical source line layers 126*a* and 126*b*. The vertical source line layers 126*a* and 126*b* are connected to the source lines, such as source lines 103*a* to 103*e*. The vertical source line layers 126*a* and 126*b* can be connected to a common source line voltage such as 0V, for example. Insulating layers, such as insulating layer 127, are formed on the sidewall of the word lines to prevent the word lines from shorting to the vertical source line layers 126*a* and 126*b*.

Figure 10A:
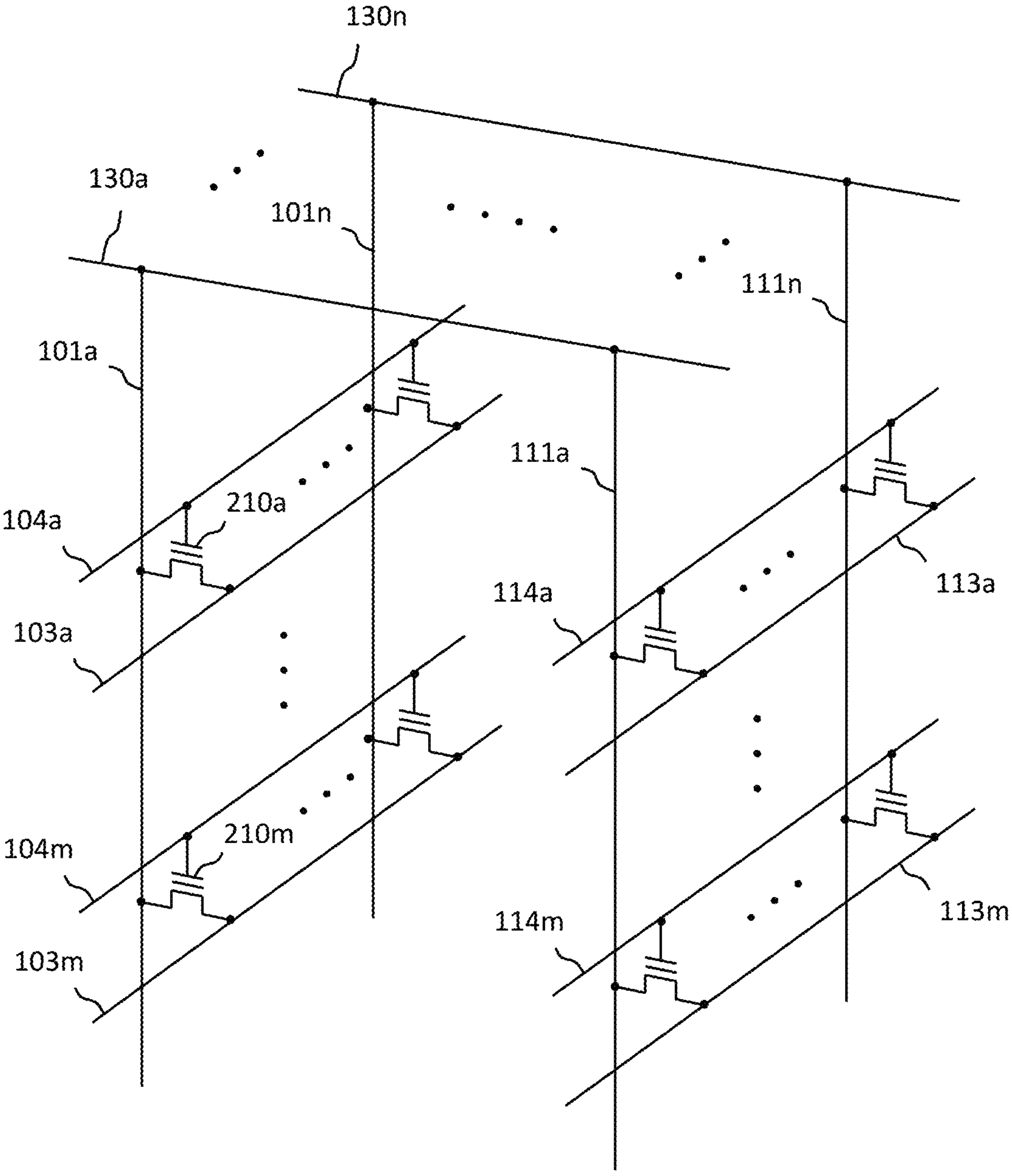
FIG. 10A-B show embodiments of equivalent circuits of a 3D NOR-type array architecture according to the invention.

FIG. 10A shows an embodiment of an equivalent circuit of a 3D NOR-type array architecture according to the invention. The equivalent circuit includes memory cells 210*a* to 210*m* that comprise any of the embodiments of memory cells shown in FIGS. 1A-7B. For illustration, this embodiment uses NOR-type flash memory cells as an example. However, the embodiments can use any other type of memory cells, such as FRAM, RRAM, MRAM, PCM, and memristor-transistor (memtransistor) cells, all of which are within the scope of the invention.

The circuit shown in FIG. 10A also includes vertical bit lines 101*a-n* and 111*a-n*, word lines 104*a-m* and 114*a-m*, and source lines 103*a-m* and 113*a-m*. The vertical bit lines 101*a-n* and 111*a-n* are connected to horizontal bit lines 130*a-n* as shown. The horizontal bit lines 130*a-n* can be located at the bottom or on the top of the array. In this embodiment, because the bit lines 101*a-n* and 111*a-n* are connected to the same horizontal bit lines 130*a-n*, the word lines 104*a-m* and 114*a-m* cannot be connected. Instead, each of the word lines 104*a-m* and 114*a-m* are connected to a word line decoder. The source lines 103*a-m* and 113*a-m* are connected to individual source line decoders (not shown) or to a common source line voltage source.

Figure 10B:
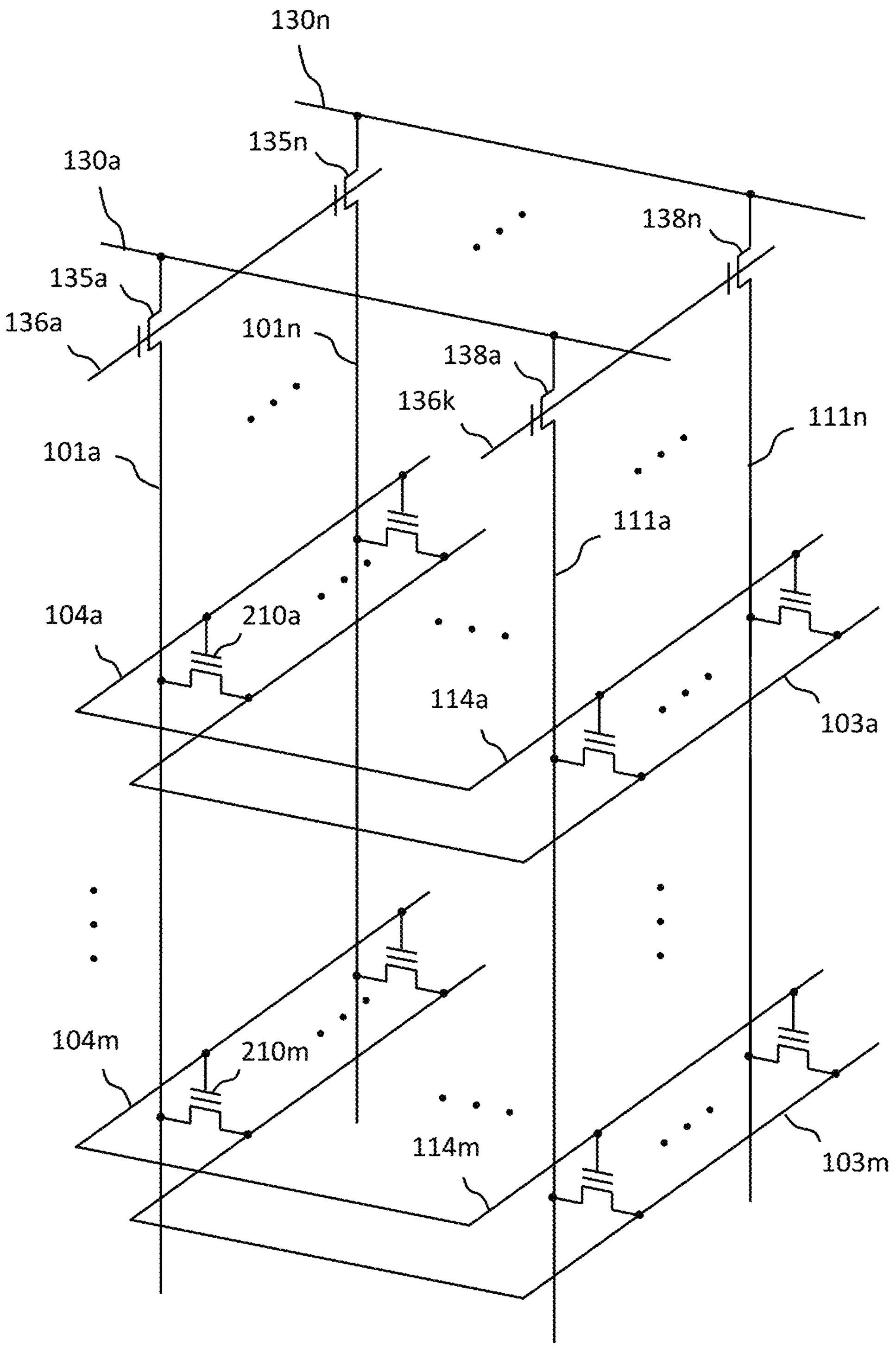

FIG. 10B shows an embodiment of an equivalent circuit of a 3D NOR-type array architecture according to the invention. This embodiment is similar to the embodiment shown in FIG. 10A except that additional select gates 135*a-n* and 138*a-n* are added. The vertical bit lines 101*a-n* and 111*a-n* are connected to the horizontal bit lines 130*a-n* through the select gates 135*a-n* and 138*a-n*, respectively. The select gate signals 136*a-k* are connected to gates terminals of the select gates 135*a-n* and 138*a-n*, respectively. The select gate signals 136*a-k* select which set of vertical bit lines are to be coupled to the horizontal bit lines 130*a-n*. The horizontal bit lines 130*a-n* and the select gates 135*a-n* and 138*a-n* are located on the top or at the bottom of the array. Adding the select gates 135*a-n* and 138*a-n* enables the multiples word lines in the same layer, such as word lines 104*a* and 114*a* and word lines 104*m* and 114*m* to be connected. This greatly reduces the number of word line decoders needed. The source lines 103*a* to 103*m* are connected to individual source line decoders (not shown) or a common source line voltage source.

Figure 11A:
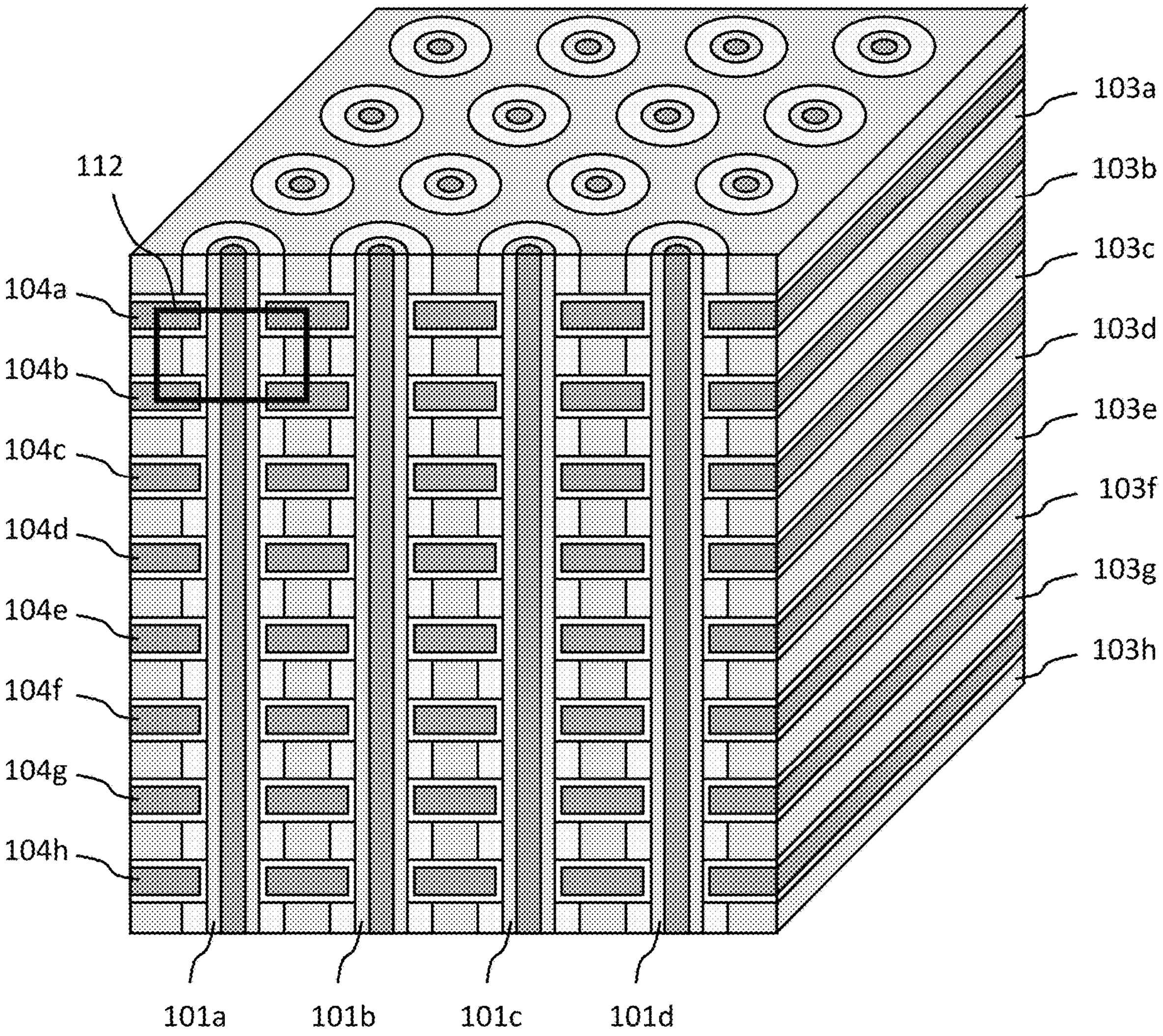
FIGS. 11A-B show embodiments of 3D array structures according to the invention.
Figure 11B:
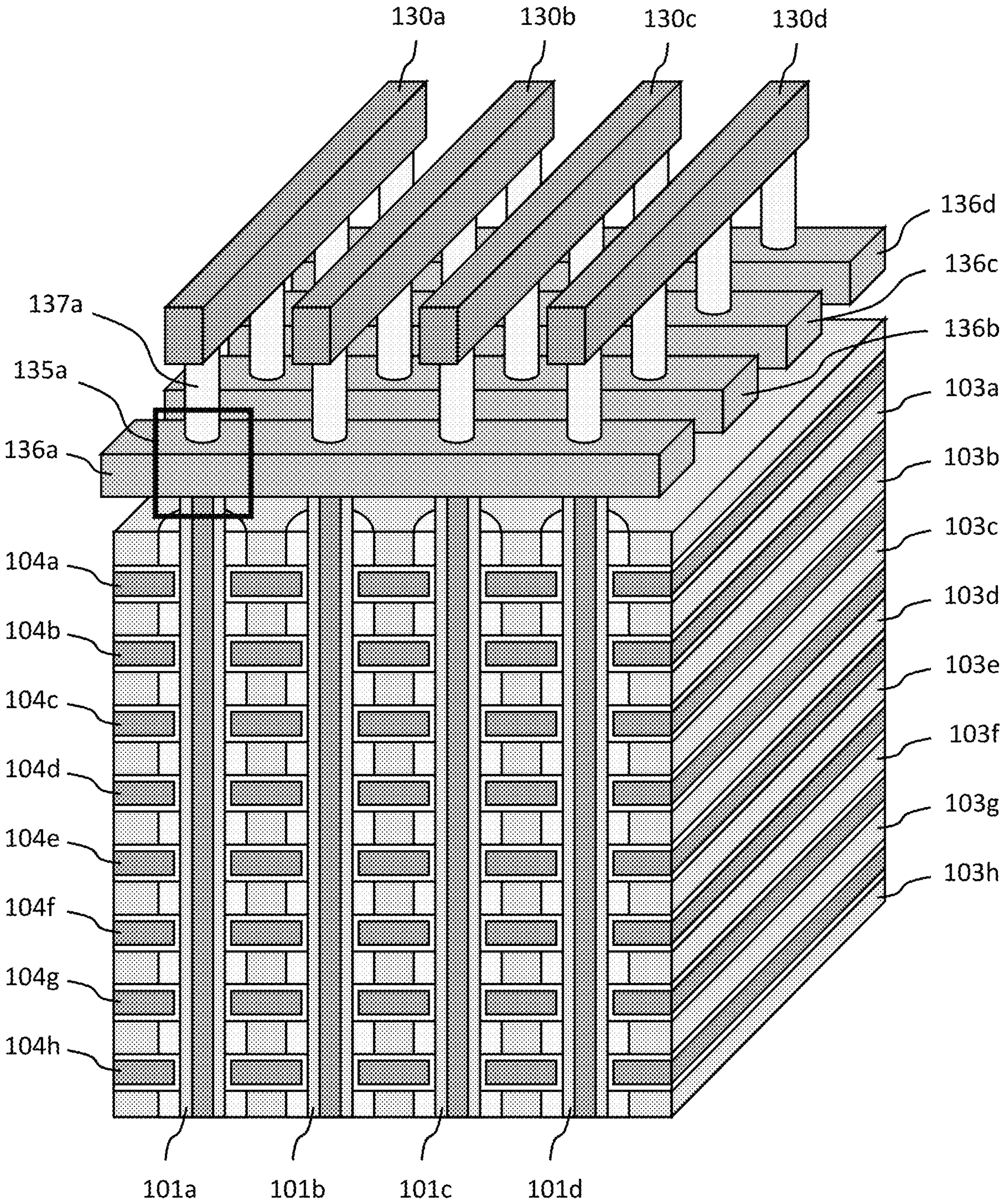

FIGS. 11A-B show embodiments of 3D array structures according to the invention.

FIG. 11A shows an embodiment of a 3D array formed using the cell structure shown in FIG. 4A as an example. In other embodiments, the 3D array structure can be formed using any of the other cell structures shown in FIGS. 1A-7B. The 3D array structure comprises multiple word line layers 104*a-h*, multiple source line layers 103*a-h*, and multiple vertical bit lines such as 101*a-d*. Each intersection of the bit lines 101*a-d* and source lines 103*a-h* forms a cell, such as cell 112.

FIG. 11B shows an embodiment of bit line connections of a 3D array structure according to the invention. In one embodiment, the vertical bit lines 101*a-d* are connected to horizontal bit lines 130*a-d* through select gates, such as select gate 135*a*, and contacts, such as contact 137*a*. The horizontal bit lines 130*a-d* are formed of conductor material, such as metal or heavily doped polysilicon material. The select gates, such as select gate 135*a*, are formed of vertical-channel transistors. In one embodiment, select gate lines 136*a-d* are connected to the control gates of the vertical-channel select gates, such as gate 135*a*.

In one embodiment, the word line layers 104*a-h* and source line layers 103*a-h* are connected to word line decoders not shown and source line voltage generators not shown, respectively, by forming staircase structures for the word lines and the source lines at the edge of the array similar to a conventional 3D NAND flash memory.

Figure 12A:
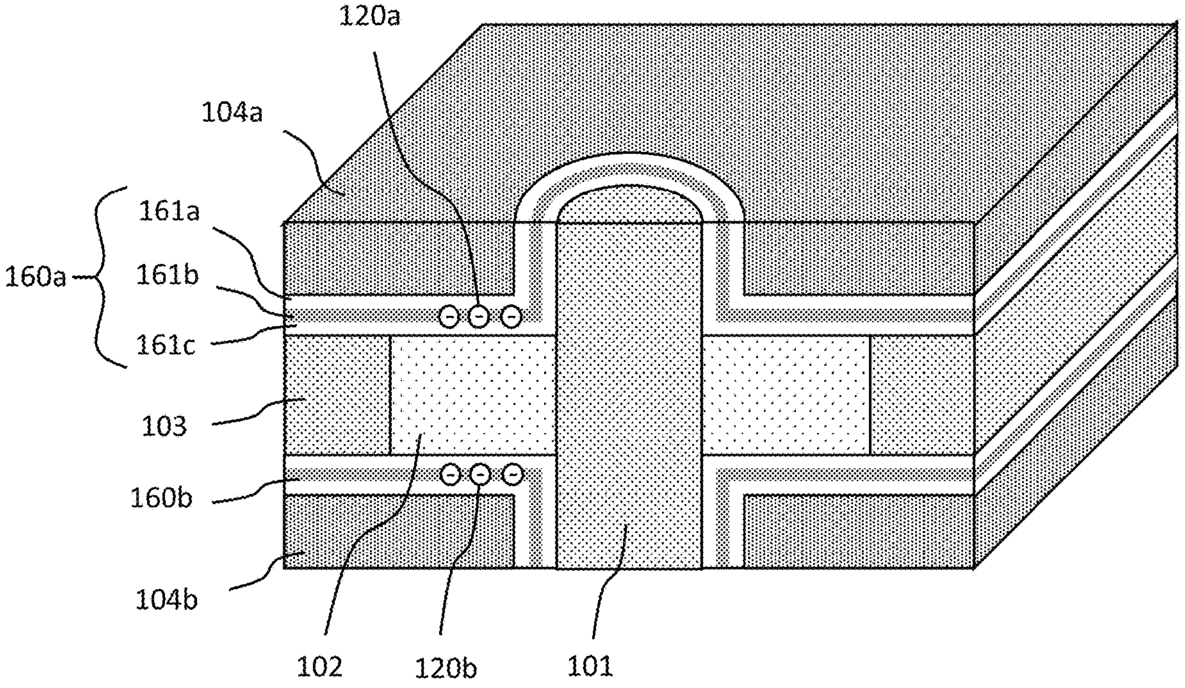
FIG. 12A shows an embodiment of a cell structure for NOR-type flash memory as shown in FIG. 3A according to the invention.

FIG. 12A shows an embodiment of a cell structure for NOR-type flash memory as shown in FIG. 3A according to the invention. The reader is referred to FIG. 3A for a detailed description of the cell structure.

Figure 12B:
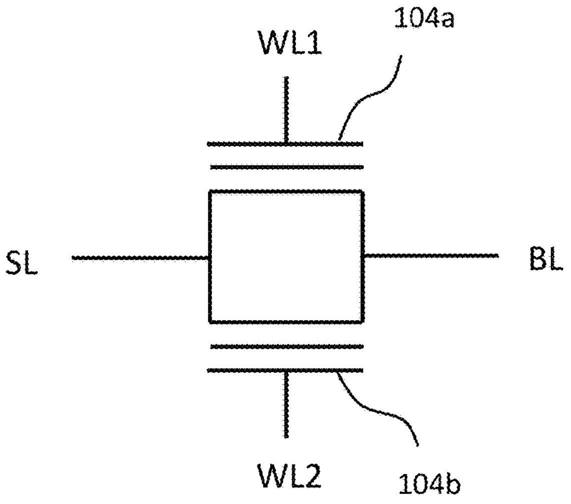
FIG. 12B shows a symbolic representation of a NOR-type flash memory cell.

FIG. 12B shows a symbolic representation of a NOR-type flash memory cell. The cell comprises two gates 104*a* and 104*b* that can be connected to two different word lines (WL1 and WL2).

Referring to FIG. 12A, in one embodiment, the charge-trapping layers 160*a* and 160*b* comprise multiple layers 161*a* to 161*c*, such as oxide-nitride-oxide ONO layers. The data is stored in term of electrons 120*a* and 120*b* trapped in the nitride layer 161*b* of the charge-trapping layers 160*a* and 160*b* by using a programming operation. Because of the programming operation, the electrons 120*a* and 120*b* can be independently controlled by the gates 104*a* and 104*b*, respectively. The cell stores two data bits to increase the storage capacity. In another embodiment, the cell programs electrons (either 120*a* or 120*b*) in only one side (either 160*a* or 160*b*) to perform single-data storage.

For N-channel cells, the electrons trapped in the charge-trapping layers 160*a* and 160*b* increase the threshold voltage (Vt) of the cell. For P-channel cells, the electrons trapped in the charge-trapping layers 160*a* and 160*b* decrease the threshold voltage (Vt) of the cell. When the gates 104*a* and 104*b* are supplied with a read voltage, the cell current is determined by the threshold voltage of the cell. A cell having a higher threshold voltage will have higher impedance and conduct lower cell current. A cell having a lower threshold voltage will have lower impedance and conduct higher cell current. The impedance of the cell represents the 'weight' of a synapse in the artificial neural network array.

The embodiment shown in FIG. 12A can be programmed and erased by using conventional program and erase mechanisms, such as channel hot-electron (CHE) injection, Fowler-Nordheim (FN) tunneling, channel hot-hole injection, band-to-band tunneling (BTBT), gate-induced-drain-leakage (GIDL) assisted injection, or any other suitable programming mechanisms.

Figure 12C:
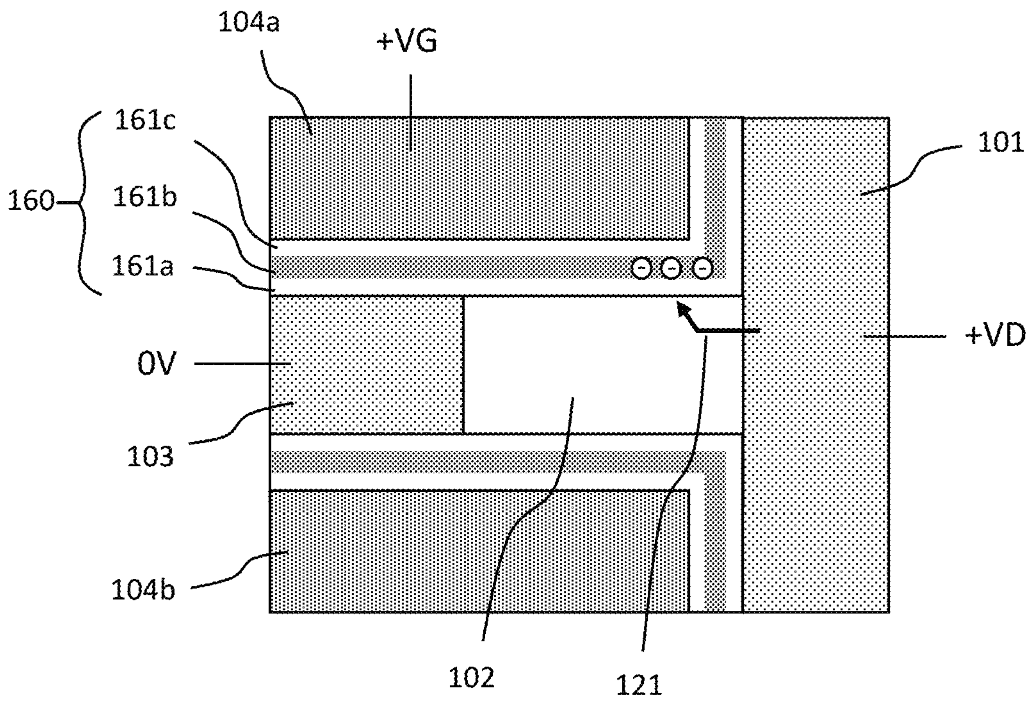
FIGS. 12C-E show embodiments of preferred program and erase operations according to the invention.
Figure 12D:
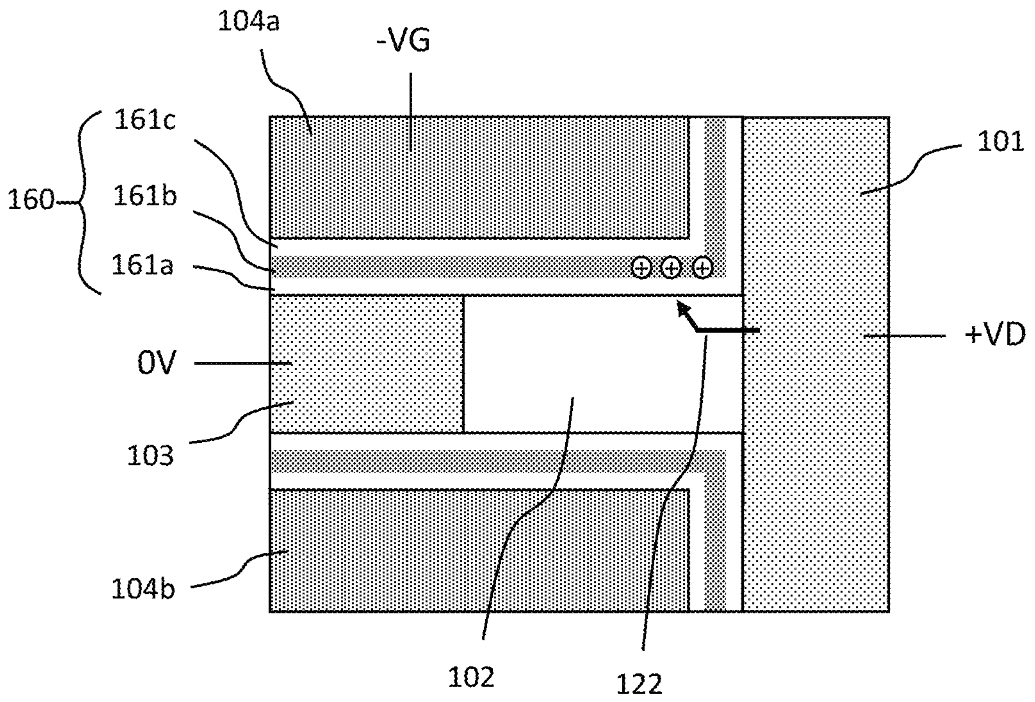
Figure 12E:
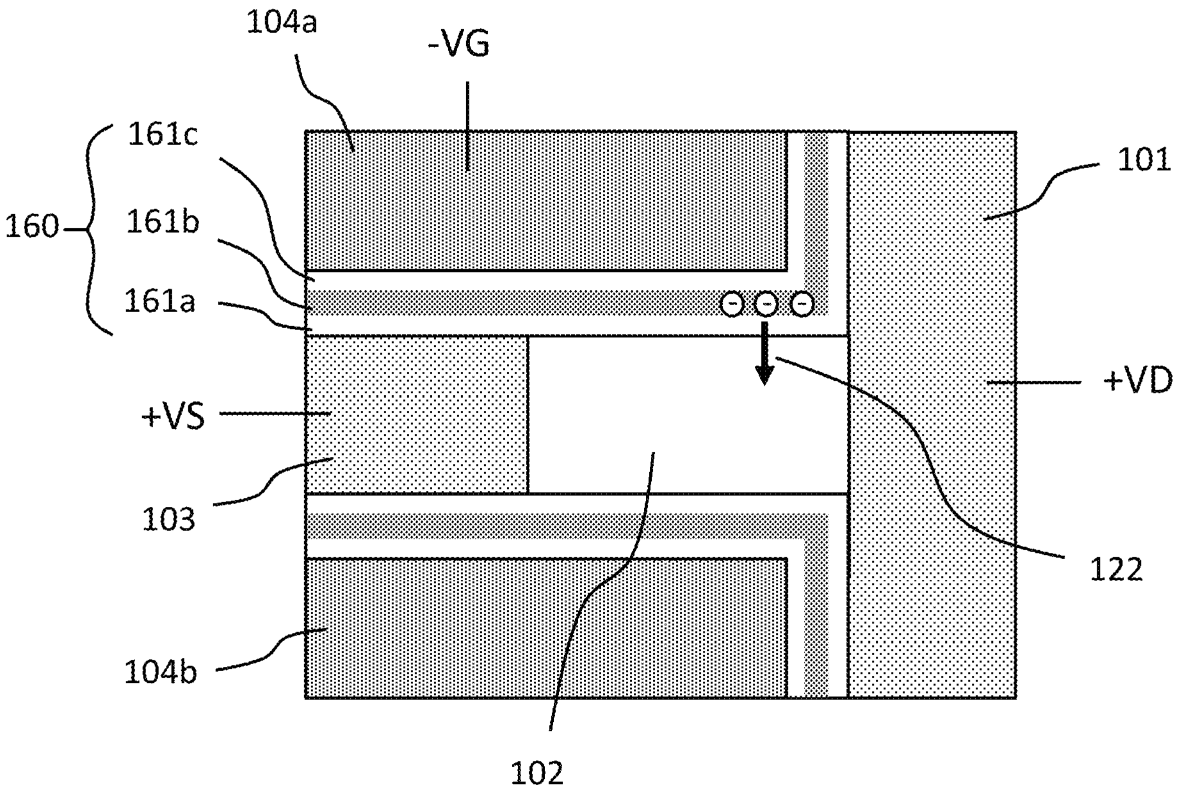

FIGS. 12C-E show embodiments of preferred program and erase operations according to the invention. However, other program and erase mechanisms can be used with the cell structures disclosed herein within the scope of the invention.

FIG. 12C shows an embodiment of a cell structure that illustrates programming operations using channel hot electron (CHE) injection. The word line 104*a* and bit line 101 are supplied with positive voltage +VG and +VD, such as 10V and 5V, respectively. The source line 103 is supplied with a low voltage, such as 0V. This configuration will cause current to flow through the channel and cause electrons to be injected into the charge-trapping layer 160 due to the high electric field applied to the word line 104*a*, as shown by the arrow 121. The electrons are trapped in the nitride layer 161*b* near the bit line 101 side to increase the threshold voltage of the cell.

FIG. 12D shows an embodiment of a cell structure that illustrates erase operations using hot-hole injection (HHI). The word line 104*a* and bit line 101 are supplied with a negative voltage (−VG), such as −5V and a positive voltage (+VD), such as +5V, respectively. The source line 103 is supplied with a low voltage such as 0V. This configuration will turn off the channel and cause band-to-band tunneling (BTBT) to occur in the drain side and cause holes to be injected to the charge-trapping layer 160 due to the high electric field applied to the word line 104*a*, as shown by the arrow 122. The holes neutralize the electrons trapped in the nitride layer 161*b* near the bit line 101 side to decrease the threshold voltage of the cell.

Because the program and erase operations shown in FIGS. 12C-D both occurred on the bit line 101 side, the threshold voltage of the channel near the source line 103 side remains positive (Vt>0V), which is also known as an 'enhancement channel'. The enhancement channel will prevent the cell's Vt from being erased to below 0V which causes channel leakage current, known as the 'over-erase' problem. Therefore, the known 'over-erase' problem of the conventional NOR flash memory is eliminated by the enhancement channel.

FIG. 12E shows an embodiment of a cell structure that illustrates an erase operation using Fowler-Nordheim (FN) tunneling. In this embodiment, the word line, such as word line 104*a* is supplied with 0V or a negative voltage −VG, such as −5V to −10V. The bit line 101 and the source line 103 are supplied with the same positive high voltages +VD and +VS, such as +10V to +20V, respectively. The high voltage applied to the bit line 101 and source line 103*a* punches through the channel and passes the voltage to the floating body 102*a*. This creates a high electric field to cause the electrons stored in the nitride layer 160*b* to tunnel through the tunnel oxide layer 160*a* to the floating body 102*a*, as shown by the arrow 122. This configuration reduces the cell's threshold voltage.

In another embodiment, a positive high voltage, such as +10V to +20V is supplied to only one of the bit line 101 or source line 103. The other line is left floating. The high voltage punches through the channel to reach the floating line. Since the line is floating, there is no current flowing after the floating line is fully charged. The high voltage punched through to the floating body 102 causes FN tunneling to occur to erase the cell as described above.

In another embodiment, the cell structure shown in FIG. 12A is used in dual-mode application for both volatile and non-volatile data storage. For volatile data storage, the input data is stored in the floating bodies 102*a* and 102*b*. This increases the programming speed. Next, the data is programmed to the charge-trapping layer 160 for non-volatile data storage.

In accordance with embodiments of the invention, the 3D cell and array structures shown in the previous embodiments are used to implement a 3D neural network array for artificial intelligence (AI) applications.

Figure 13A:
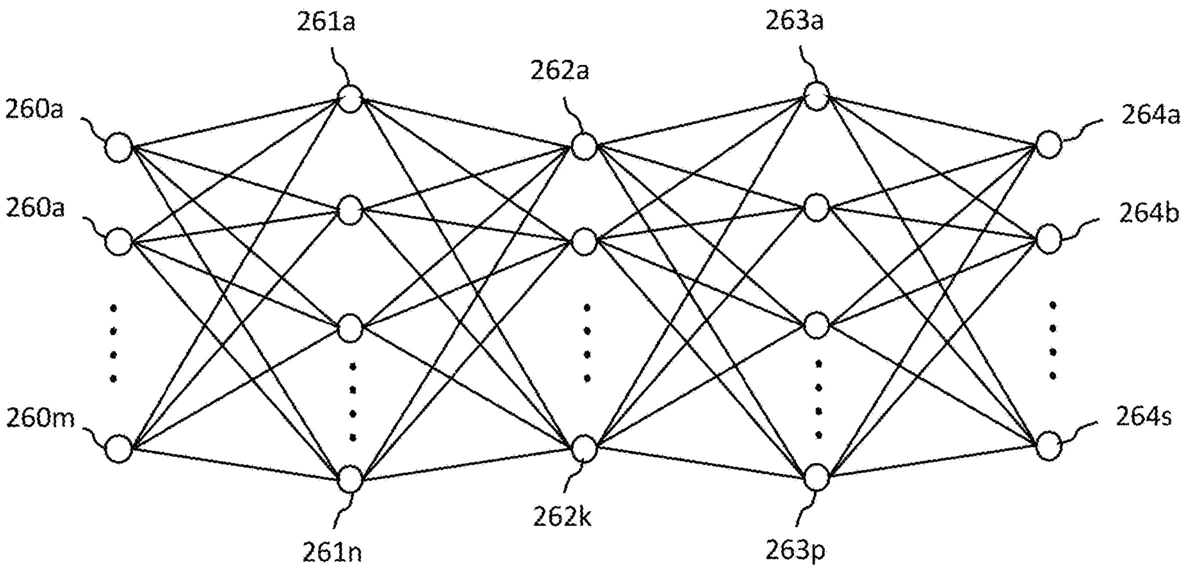
FIG. 13A shows an exemplary architecture for a neural network.

FIG. 13A shows an exemplary architecture for a neural network. The neural network comprises multiple layers of neurons 260*a-m* that form an input layer. The neural network also comprises neurons 264*a-s* that form an output layer. In one embodiment, multiple layers of neurons, such as neurons 261*a-n*, 262*a-k*, and 263*a-p* are provided as hidden layers between the input layer and the output layer. Each layer may have various numbers of neurons.

Figure 13B:
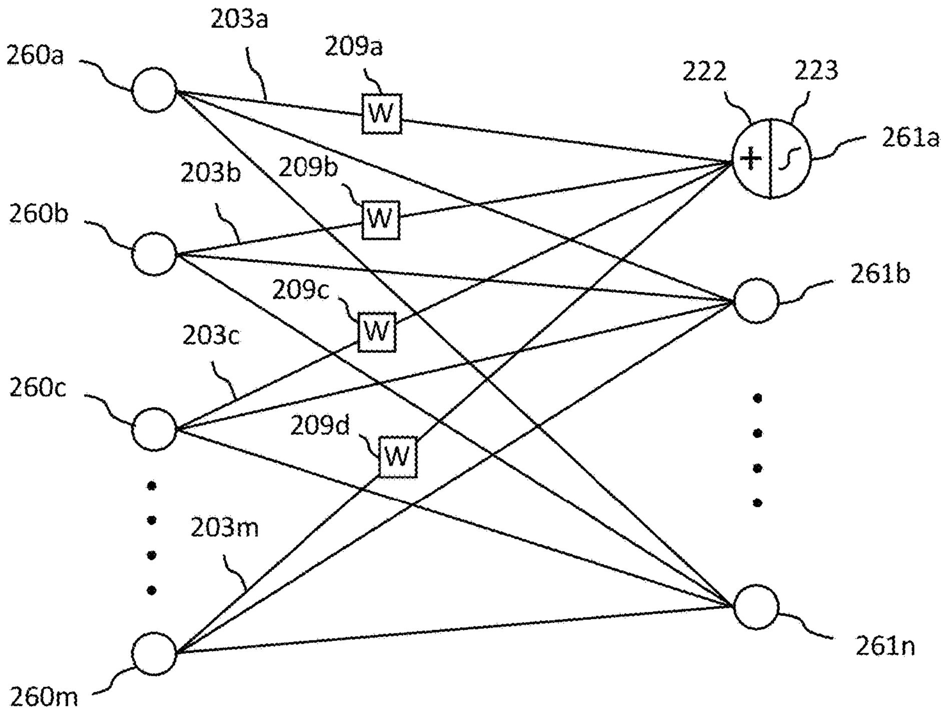
FIG. 13B shows one layer of a neural network that comprises input neurons and output neurons.

FIG. 13B shows one layer of a neural network that comprises input neurons 260*a-m* and output neurons 261*a-n*. Each of the output neurons 261*a-n* is connected to all the input neurons 260*a-m* through synapses 203*a-m*. Each synapse represents a value called a 'weight', such as weights 209*a-d*. The weight determines effects on the signal from the input neuron to the output neuron. The value of the weight may be positive, called a 'positive weight', or negative, called a 'negative weight'. The basic operation of neural networks includes three functions. The first function is 'multiplication' of the inputs 260*a-d* and the weights 209*a-d*. The second function is 'summation' 222 of the multiplication results. The third function is an 'activation function' 223 that converts linear inputs to non-linear outputs, such as a sigmoid function or other suitable functions. In one embodiment, the summation and activation are performed inside the output neurons 261*a-n*.

An artificial neural network array comprises multiple neuron layers. The outputs of each layer are fed into the inputs of the next layer. The neural network can be trained to learn special tasks by changing the weights of each synapse through a training process.

Figure 13C:
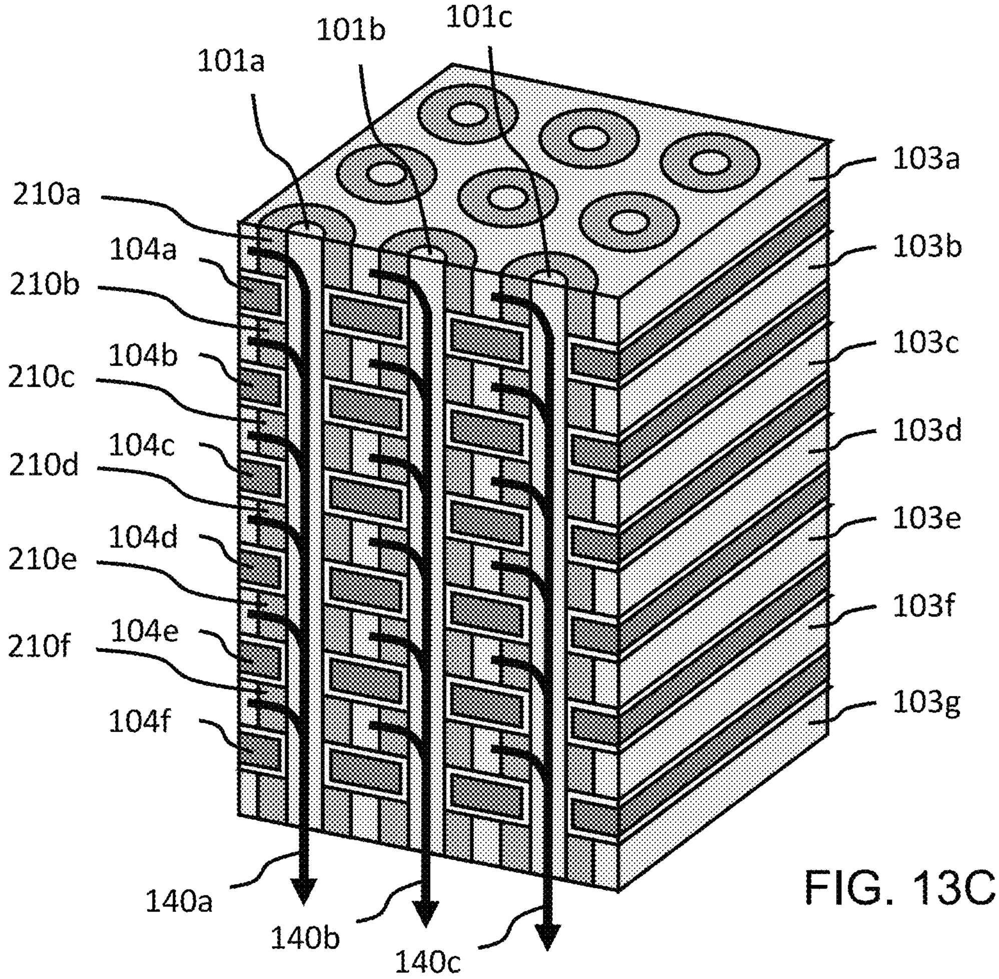
FIGS. 13C-D shows embodiments that demonstrate how a 3D cell array shown in FIG. 13C emulates the neural network shown in FIG. 13D.
Figure 13D:
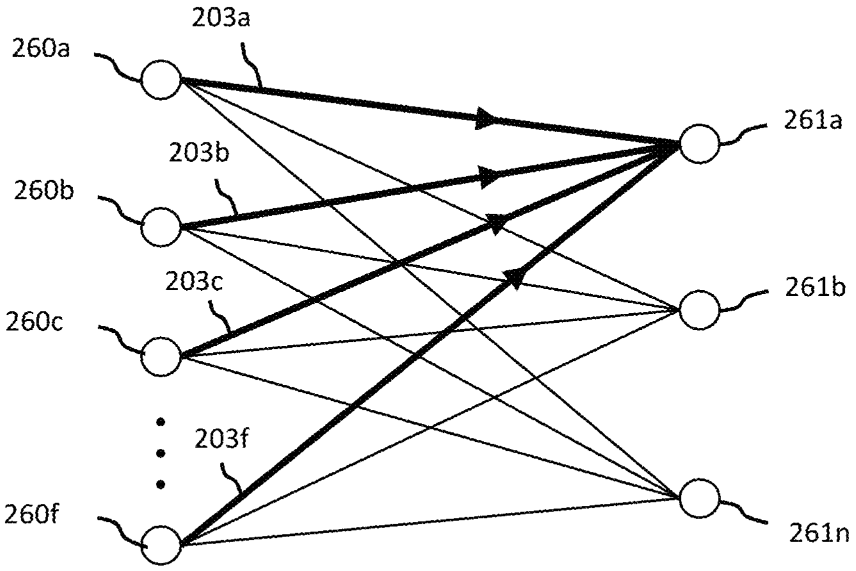

FIGS. 13C-D shows embodiments that demonstrate how the 3D NOR-type cell array shown in FIG. 13C emulates the neural network shown in FIG. 13D.

As illustrated in FIG. 13C, the word lines 104*a* to 104*f* represent the input neurons 260*a* to 260*f* shown in FIG. 13D. The vertical bit lines 101*a* to 101*c* represent the output neurons 261*a* to 261*c*. The cells 210*a* to 210*f* represent the synapses 203*a* to 203*f*. The data stored in the cells 210*a* to 210*f* represent the 'weights' of the synapses 203*a* to 203*f*.

When the 3D array receives the input data, the word lines 104*a* to 104*f* are supplied with voltages according to the input data. For example, data 1 will supply a high voltage to turn on cells 210*a* to 210*f*, and data 0 will supply a low voltage to turn off cells 210*a* to 210. The data stored in cells 210*a* to 210*f* will determine the cell currents. For example, if the data is 1, the cell will conduct high current. If the data is 0, the cell will conduct low current.

The cell currents are summed in vertical bit line 101*a*, as illustrated by the arrow 140*a* shown in FIG. 13C. This emulates the summation function of output neuron 261*a*, as illustrated by the arrows shown in FIG. 13D.

Similarly, the cell currents summed in the vertical bit lines 101*b* and 101*c*, as illustrated by the arrows 140*b* and 140*c*, emulate the summation function of output neurons 261*b* and 261*c*. As a result, the function of the neural network shown in FIG. 13D are emulated by the 3D cell array shown in FIG. 13C.

Figure 14A:
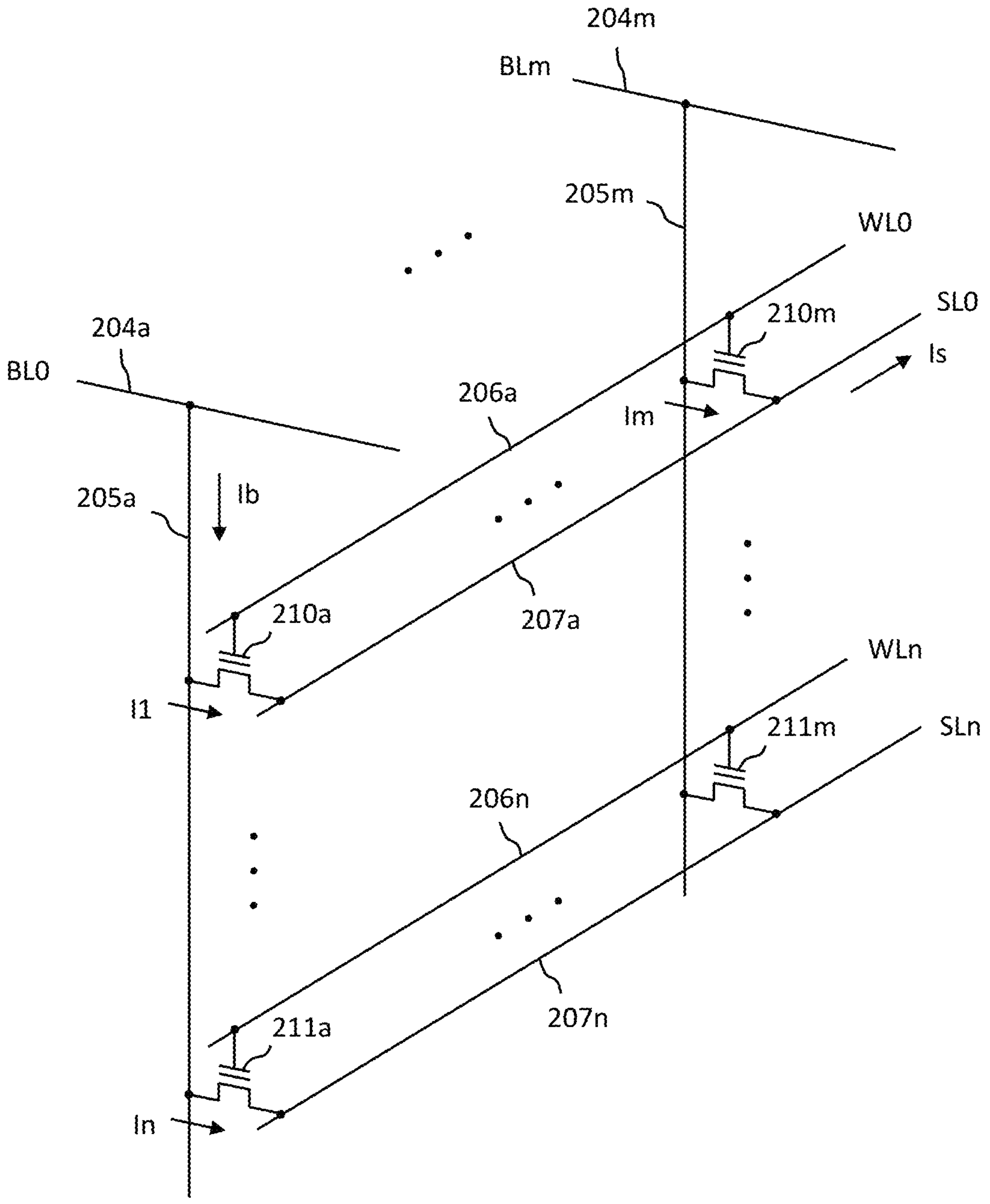
FIG. 14A shows an embodiment of a neural network array that is formed using the 3D array structure shown in FIG. 10A.

FIG. 14A shows an embodiment of a neural network array that is formed using the 3D NOR-type array structure shown in FIG. 10A. In one embodiment, horizontal bit lines 204*a-m* are connected to input neuron circuits (not shown). The input neuron circuits apply various voltages to the horizontal bit lines 204*a-m* according to the input data. The horizontal bit lines 204*a-m* are connected to multiple vertical bit lines 205*a-m*. The vertical bit lines 205*a-m* are connected to the source line 207*a* through multiple cells 210*a-m*. The word lines 206*a-n* are supplied with a constant read voltage to turn on the cells 210*a-m*. The source lines 207*a-n* are connected to output neuron circuits (not shown). The cells 210*a-m* represent the synapse. The threshold voltages of the cells 210*a-m* represent the weights of the synapses.

It will be assumed that the input data is applied to the bit lines 204*a-m* and that the word line 206*a* is selected. Electric current will flow from the bit lines 204*a-m* through the cells 210*a-m* to the source line 207*a*. The current flowing through the cells 210*a-n* depends on the threshold voltage of the cells. When the threshold voltage of the cells 210*a-n* is higher (or lower), the current flowing through the cells 210*a-n* is lower (or higher), respectively.

It will be assumed that the current flowing through the cells 210*a-m* is 'I1' to 'Im', respectively. The current flowing to the source line 207*a* is 'Is'. The source line current 'Is' will be equal to the sum of 'I1' to 'Im'. This configuration performs a summation function for in-memory-computing and neural network applications. By using this function, the array performs the calculations for in-memory-computing or forms an artificial neural network as shown in FIG. 13B. The horizontal bit lines 204*a-m* represent the input neurons 260*a-m* shown in FIG. 13B. The cells 210*a-m* represent the synapses 203*a-n* shown in FIG. 13B. The source lines 207*a-n* represent the output neurons 261*a-n* shown in FIG. 13B.

In another embodiment, the inputs are applied to the word lines 206*a-m* instead of the horizontal bit lines 204*a-m*. In this embodiment, the source lines 207*a-n* are supplied with a constant voltage, such as VDD or 0V. The word lines 206*a-b* are supplied with various voltages according to the input data. The word line voltages turn on the cells 210*a-a* to conduct cell current 'I1' to 'In', respectively. Assuming the current flow to or from the bit line 205*a* is 'Ib', the bit line current 'Ib' will equal to the sum of the cell currents 'I1' to 'In'. This performs a summation function for in-memory-computing and neural network application. By using this function, the array may be used to perform the calculations for in-memory-computing or for forming an artificial neural network as shown in FIG. 13B. In this embodiment, the word lines 206*a-n* represent the input neurons, and the horizontal bit lines 204*a-b* represents the output neurons.

In another embodiment, the inputs are applied to the source lines 207*a-n*. In this embodiment, the word lines 206*a-n* are supplied with a constant read voltage. The source lines 207*a-b* are supplied with various voltages according to the input data. The word line voltage turns on the cells 210*a-a* to conduct cell current 'I1' to 'In', respectively. It will be assumed that current flow to or from the bit line 205*a* is 'Ib'. The bit line current 'Ib' will equal to the sum of the cel currents 'I1' to 'In'. This configuration performs a summation function for in-memory-computing and neural network applications. By using this function, the array performs calculations for in-memory-computing or forms an artificial neural network as shown in FIG. 13B. In this embodiment, the source lines 207*a-n* represent the input neurons, and the horizontal bit lines 204*a-b* represent the output neurons.

Figure 14B:
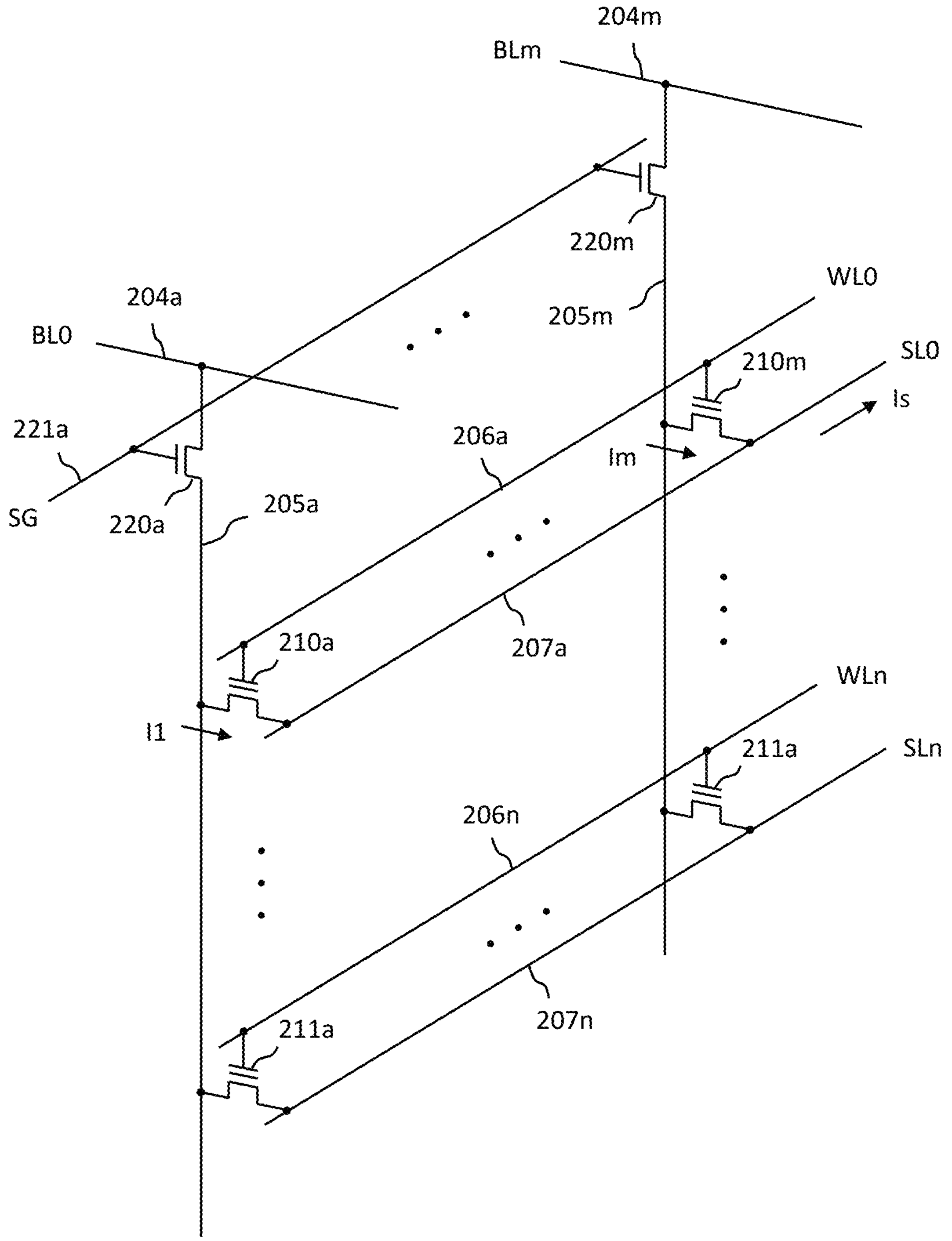
FIG. 14B shows an embodiment of a neural network array using the 3D array structure shown in FIG. 10B.

FIG. 14B shows an embodiment of a neural network array using the 3D array structure shown in FIG. 10B. This embodiment is similar to the embodiment shown in FIG. 14A except that the horizontal bit lines 204*a-m* are connected to the vertical bit lines 205*a-m* through the select gates 220*a-m*. This embodiment allows the word lines in the same layer to be connected as described in FIG. 10B. This greatly reduces the number of the word line decoders.

In another embodiment, the inputs are applied to the select gate signals 136*a-k* as shown in FIG. 10B. The select gate signals 136*a-k* are supplied with various voltages according to the input data. The horizontal bit lines 130*a-n* are connected to a constant voltage, such as VDD or 0V. The word lines 104*a-m* are supplied with a constant read voltage. Referring to FIG. 14B, the voltage of the select line 221*a* controls the current flowing through the select gates 220*a-m*. Then, current flows through the cells 210*a-m* to the source line 207*a*. The current flowing through the cells 210*a-n* depends on the threshold voltage (Vt) of the cells. When the threshold voltage of the cells 210*a-n* is higher (or lower), the current flowing through the cells 210*a-n* is lower (or higher), respectively.

Assuming the current flowing through the cells 210*a-m* is 'I1' to 'Im', respectively. The current flowing to the source line 207*a* is 'Is'. The source line current 'Is' will equal to the sum of 'I1' to 'Im'. This performs a summation function for in-memory-computing and neural network applications. By using this function, the array performs the calculations for in-memory-computing or forms an artificial neural network as shown in FIG. 13B. In this embodiment, the select lines, such as select line 221*a* represent the input neurons, and the source lines 207*a-n* represents the output neurons.

Figure 15A:
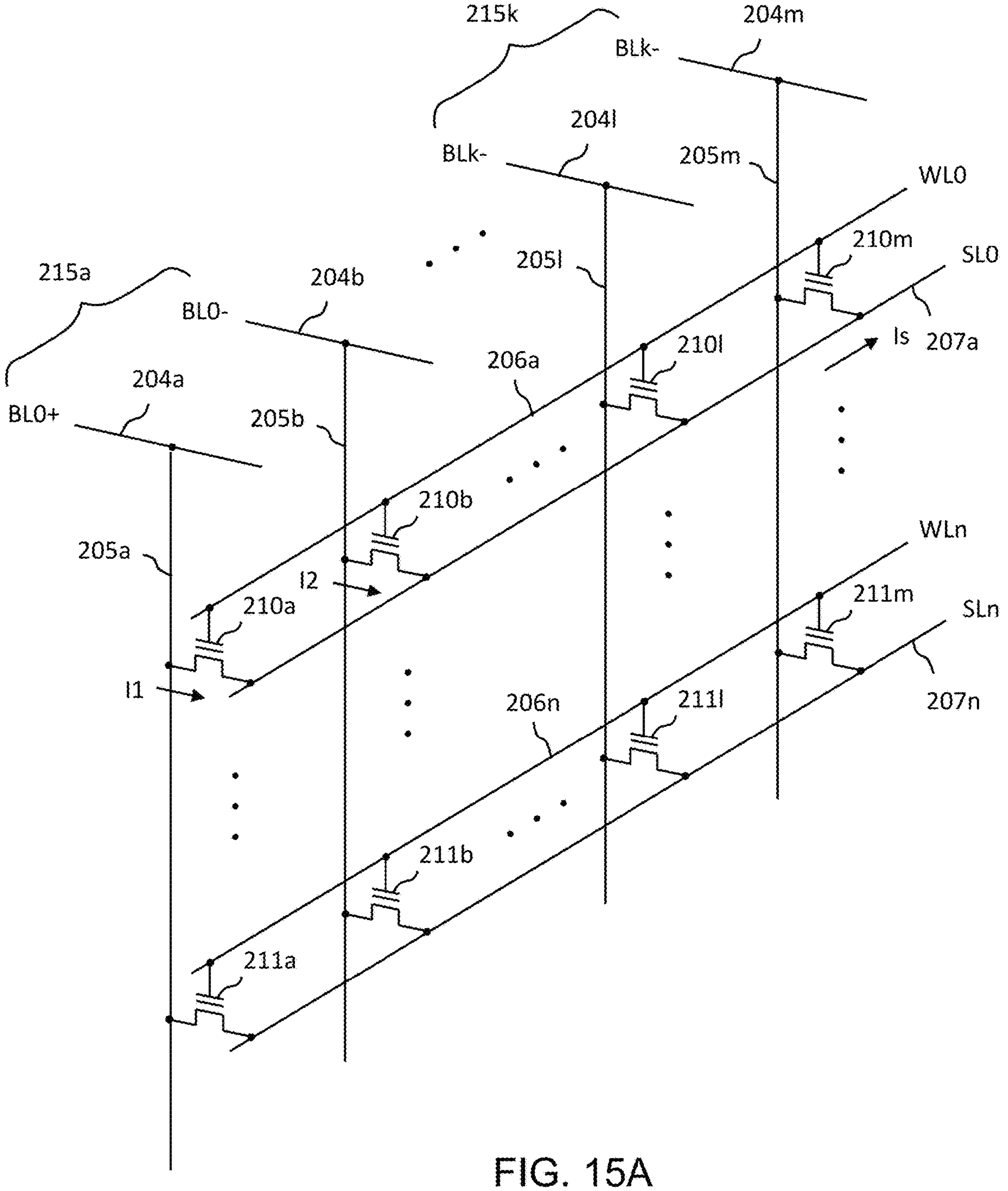
FIG. 15A shows an embodiment of a neural network array that provides 'negative' weights for the synapses of the neural network.

FIG. 15A shows an embodiment of a neural network array that provides 'negative' weights for the synapses of the neural network. The embodiment uses the 3D NOR-type array structure shown in FIG. 14A as an example. Aspects of this embodiment can be applied to the array structure shown in FIG. 14B as well.

As illustrated in FIG. 15A, the horizontal bit lines 204*a-m* are divided into multiple pairs 215*a-k*. Each pair of the bit lines are connected to an input neuron circuit (not shown) to apply complementary input voltages BL0+ and BL0− according to the input data to the bit line pair, such as bit line pair 204*a* and 204*b*, respectively. For example, assuming the input data is 1, the voltages applied to the bit lines 204*a* and 204*b* is VDD and 0V, respectively. Assuming the input data is 0, the voltages applied to the bit lines 204*a* and 204*b* is 0V and VDD, respectively.

The selected word line, such as word line 206*a*, is supplied with a read voltage to turn on the cells 210*a* and 210*b* to cause current to flow from the bit line pair 204*a* and 204*b* through the cells 210*a* and 210*b* to the source line 207*a*. Because the bit lines 204*a* and 204*b* are supplied with complementary voltages BL0+ and BL0−, the cells 210*a* and 210*b* represent a 'positive weight' and a 'negative weight' for the synapse, respectively.

For example, assuming that the current flowing through the cells 210*a* and 210*b* are 'I1' and '12', respectively. It will also be assumed that the bit lines 204*a* and 204*b* are supplied with VDD and 0V, respectively. When 'I1' is higher, the voltage of the source line 207*a* becomes higher. Therefore, the cell 210*a* represents a positive weight. On contrary, when 'I2' is higher, the voltage of the source line 207*a* becomes lower. Therefore, the cell 210*b* represents a negative weight.

As described in FIG. 14A, the current 'Is' flowing to the source line 207*a* equals to the sum of the currents flowing through the cells 210*a-m*. This configuration performs a summation function for in-memory-computing and neural network applications. The source lines 207*a-n* can be connected to output circuits (not shown) to perform in-memory-computing or to provide an output to output neuron circuits (not shown) to perform neural network functions.

Please notice, in another embodiment, the input and output direction are reversed. The source lines 207*a-n* are connected to the input neuron circuits to apply various voltages to the source lines 207*a-n* according to the input data. The bit lines 204*a-m* are connected to the output neuron circuits. The bit line pairs such as 204*a* and 204*b* are connected to the positive and negative inputs of the neuron circuit shown in FIG. 16B, respectively. In this way, the even cells, such as cells 210*a* and 210*l* represent positive weights and the odd cells, such as cells 211*b* to 210*m* represent the negative weights.

Figure 15B:
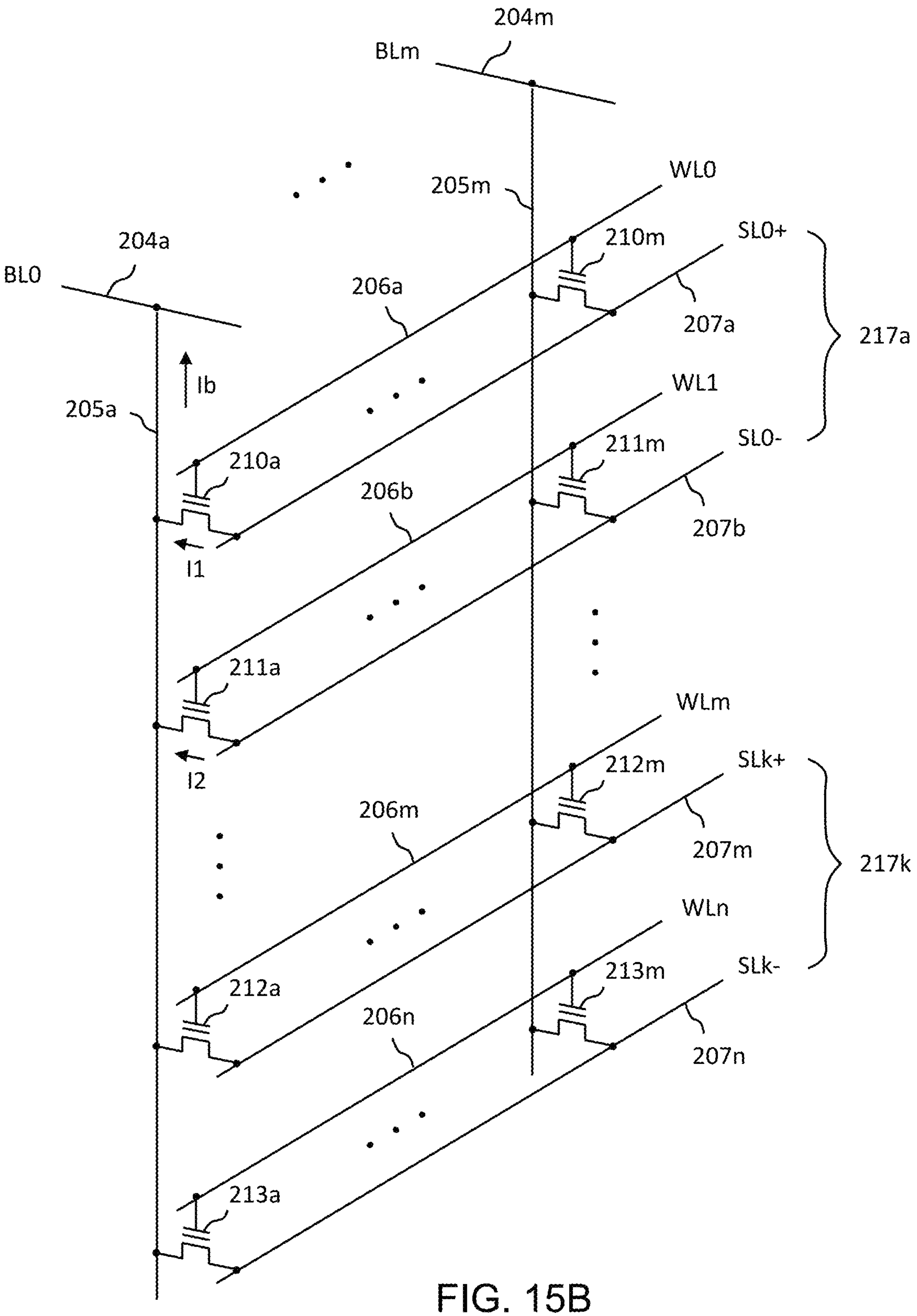
FIG. 15B shows an embodiment of a neural network array that provides 'negative' weights for the synapses of the neural network.

FIG. 15B shows an embodiment of a neural network array that provides 'negative' weights for the synapses of the neural network. The embodiment uses the 3D array structure shown in FIG. 14A as an example. Aspects of this embodiment are also applicable to the array structure shown in FIG. 14B as well.

In this embodiment, the source lines 207*a-n* are divided into multiple pairs 217*a-k*. Each pair of the source lines are connected to an input neuron circuit not shown to apply complementary input voltages SL0+ and SL0− according to the input data to the source line pair, such as source line pair 207*a* and 207*b*, respectively. For example, assuming the input data is 1, the voltages applied to the source lines 207*a* and 207*b* are VDD and 0V, respectively. Assuming the input data is 0, the voltages applied to the source lines 207*a* and 207*b* are 0V and VDD, respectively.

The word lines 206*a* and 206*b* are supplied with a read voltage to turn on the cells 210*a* and 211*a* to cause current to flow from the source line pair 207*a* and 207*b* through the cells 210*a* and 211*a* to the bit line 204*a*. Because the source lines 207*a* and 207*b* are supplied with complementary voltages SL0+ and SL0−, the cells 210*a-m* and 211*a-m* represent 'positive weights' and 'negative weights', respectively.

For example, assuming the current flowing through the cells 210*a* and 211*a* are 'I1' and 'I2', respectively. Also assume that the source lines 207*a* and 207*b* are supplied with VDD and 0V, respectively. When 'I1' is higher, the voltage of the bit line 204*a* becomes higher. Therefore, the cell 210*a* represents a positive weight. Alternatively, when 'I2' is higher, the voltage of the bit line 204*a* becomes lower. Therefore, the cell 211*a* represents a negative weight.

The current 'Ib' flowing to the bit line 204*a* equals to the sum of the current flowing through the cells 210*a*, 211*a*, . . . , 212*a*, to 213*a*. This configuration performs a summation function for in-memory-computing and neural network applications. The bit lines 204*a-m* can be connected to output circuits not shown to perform in-memory-computing or to output neuron circuits not shown to perform neural network functions.

In another embodiment, the input and output direction are reversed. The bit lines 204*a-m* are connected to the input neuron circuits to apply various voltages to the bit lines 204*a-m* according to the input data. The source lines 207*a-n* are connected to the output neuron circuits. The source line pairs, such as source line pairs 207*a* and 207*b* are connected to the positive and negative inputs of the neuron circuit shown in FIG. 16B, respectively. In this way, the cells 210*a-m* represent positive weights and the cells 211*a-m* represent negative weights.

Figure 15C:
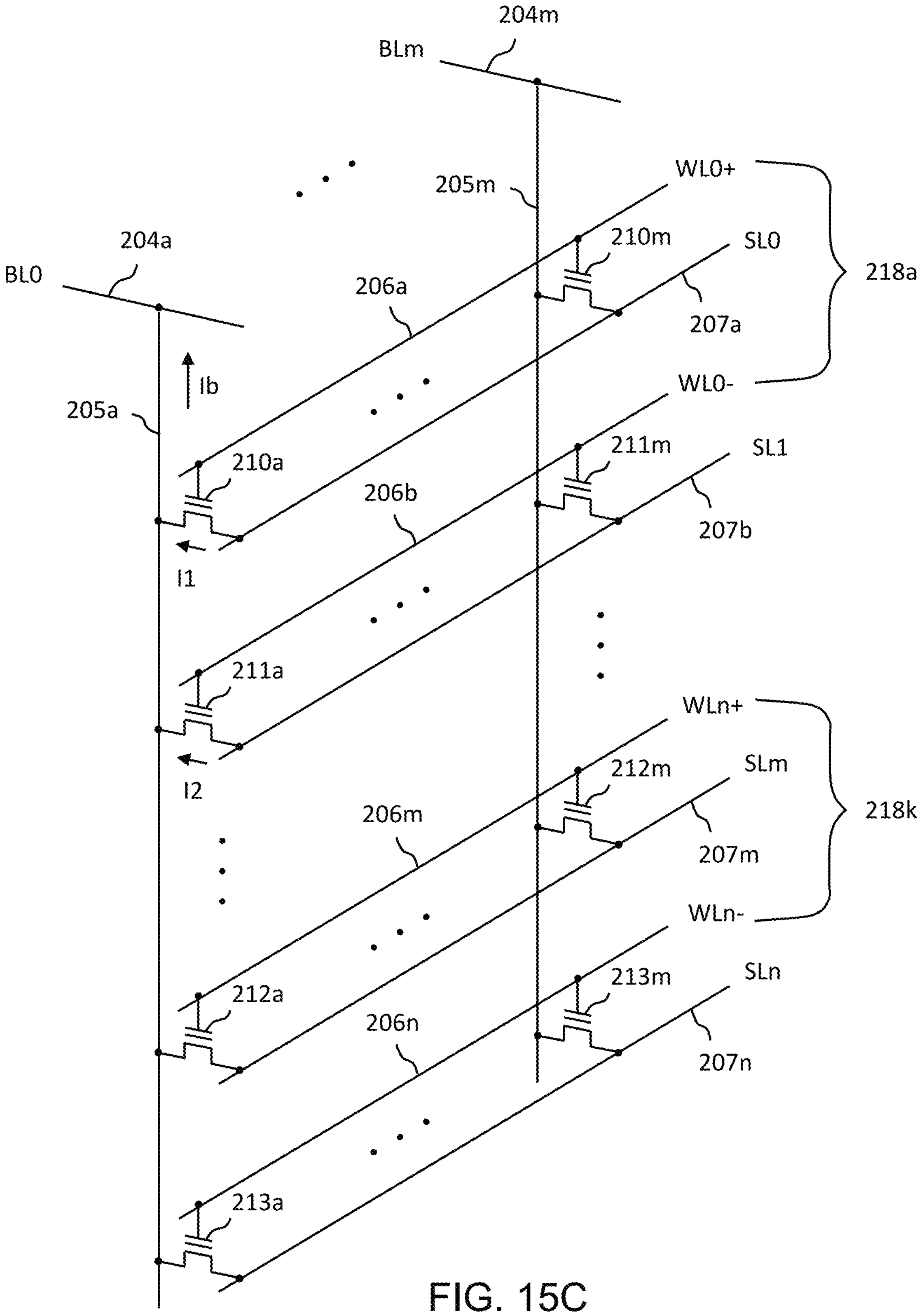
FIG. 15C shows an embodiment of a neural network array that provides 'negative' weights for the synapses of the neural network.

FIG. 15C shows an embodiment of a neural network array that provides 'negative' weights for the synapses of the neural network. This embodiment uses the 3D array structure shown in FIG. 14A as an example. Aspects of this embodiment are applicable to the array structure shown in FIG. 14B as well.

In this embodiment, the word lines 206*a-n* are divided into multiple pairs 218*a-k*. Each pair of the word lines are connected to an input neuron circuit not shown to supply complementary input voltages WL0+ and WL0− according to the input data to the word line pair, such as word line pair 206*a* and 206*b*, respectively. For example, assuming the input data is 1, the voltages supplied to the word lines 206*a* and 206*b* are VDD and 0V, respectively. Assuming the input data is 0, the voltages supplied to the word lines 206*a* and 206*b* are 0V and VDD, respectively.

For example, assuming the current flowing through the cells 210*a* and 211*b* are 'I1' and 'I2', respectively. The word lines 206*a* and 206*b* are supplied with voltages WL0+ and WL0− according to the input data, respectively. When the input data is higher, the cell current 'I1' becomes higher, and the voltage of the bit line 204*a* becomes higher. Therefore, the cell 210*a* represents a positive weight. Alternatively, when the input data is higher, the cell current 'I2' becomes lower, the voltage of the bit line 204*a* becomes lower. Therefore, the cell 211*a* represents a negative weight.

The current 'Ib' flowing to the bit line 204*a* is equal to the sum of the current flowing through the cells 210*a* to 213*a*. This configuration performs a summation function for in-memory-computing and neural network applications. The bit lines 204*a-m* can be connected to output circuits not shown to perform in-memory-computing or to output neuron circuits not shown to perform neural network functions.

In another embodiment, the input and output directions are reversed. The bit lines 204*a-m* are connected to the input neuron circuits to apply various voltages to the bit lines 204*a-m* according to the input data. The source lines 207*a-n* are connected to the output neuron circuits. In this configuration, the cells 210*a-m* represent positive weights and the cells 211*a-m* represent negative weights.

FIGS. 16A-D show embodiments of output circuits for in-memory-computing or for forming an output neuron circuit of a neural network.

Figure 16A:
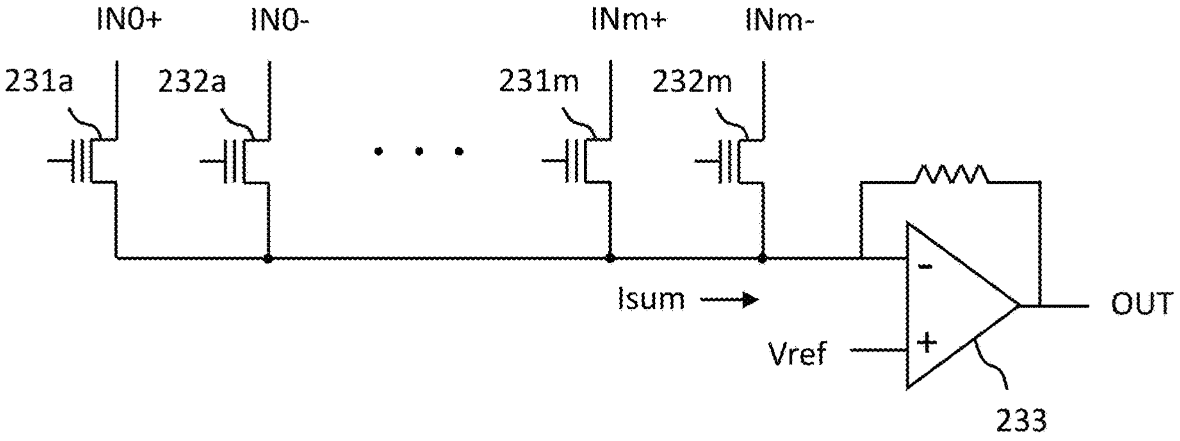
FIGS. 16A-D show embodiments of output circuits for in-memory-computing or for forming an output neuron circuit of a neural network.

FIG. 16A shows an embodiment of an output circuit using a single-input comparator 233. The cells 231*a-m* and 232*a-m* are described in the array embodiments shown in FIGS. 15A-C. The input data in divide into two groups, the original input data IN0+ to INm+ and their complementary data IN0− to INm−. The cells 231*a-m* are connected to input data IN0+ to INm+ and the cells 232*a-m* are connected to the complementary input data IN0− to INm−, respectively. When the input is higher, the cells 231*a-m* make the output lower, and the cells 232*a-m* make the output higher. Therefore, the cells 231*a-m* represent negative weights and the cells 232*a-m* represent positive weights, respectively. The summation of the cell current 'Isum' shown by the arrow is fed into the input of the comparator 233 to generate the output. In neural network applications, the output can be used as the input to the next layer.

Figure 16B:
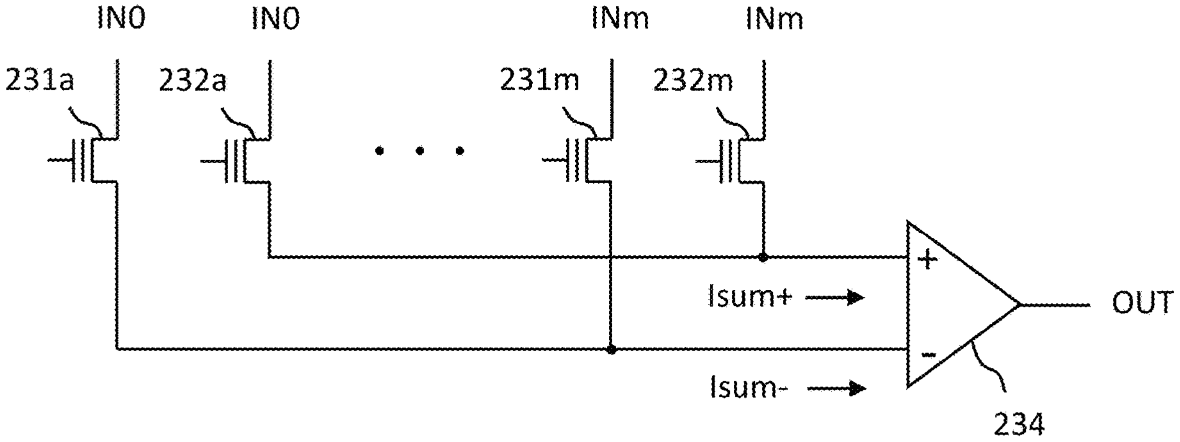

FIG. 16B shows an embodiment of an output circuit using a dual-input comparator 234. In this embodiment, both groups of the cells 231*a-m* and 232*a-m* are connected to the input data IN0 to INm. The outputs of the cells 231*a-m* are connected to the negative input of the comparator 234 and the outputs of the cells 232*a-m* are connected to the positive input of the comparator 234. When the input is higher, the cells 231*a-m* make the output lower, and the cells 232*a-m* make the output higher. Therefore, the cells 231*a-m* represent negative weights and the cells 232*a-m* represent positive weights, respectively. The summations of the cell current 'Isum+' and 'Isum-' (shown by the arrows) is fed into the positive and negative inputs of the comparator 234, respectively, to generate the output. In neural network applications, the output can be used as an input to the next layer.

Figure 16C:
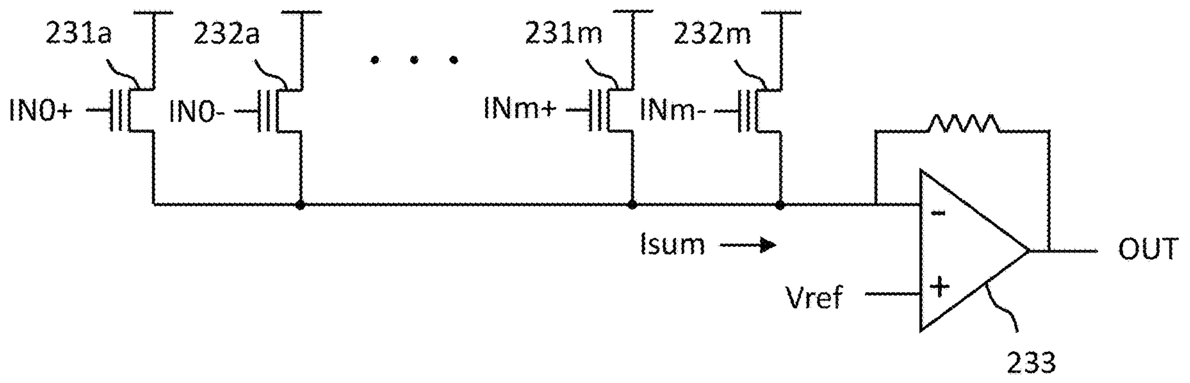

FIG. 16C shows another embodiment of an output circuit using a single-input comparator 233. This embodiment is similar to the embodiment shown in FIG. 16A except that the complementary inputs IN0+ to INm+ and IN0− to INm− are applied to the gates of the cells 231*a-m* and 232*a-m*, respectively. The source of the cells 231*a-m* and 232*a-m* are connected to a constant voltage, such as VDD. When the input is higher, the cells 231*a-m* make the output lower, and the cells 232*a-m* make the output higher. Therefore, the cells 231*a-m* represent positive weights and the cells 232*a-m* represent negative weights, respectively. The summation of the cell current 'Isum' (shown by the arrow) is fed into the input of the comparator 233 to generate the output. In neural network applications, the output can be used as an input to the next layer.

Figure 16D:
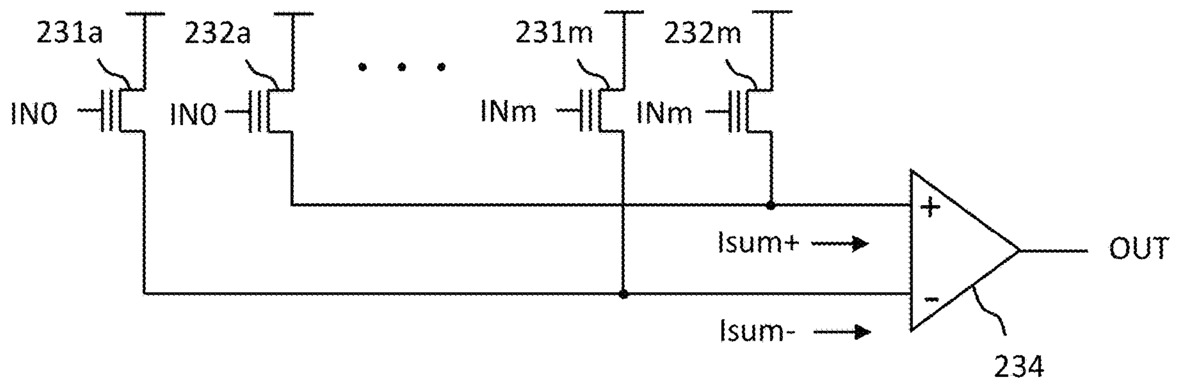

FIG. 16D shows an embodiment of an output circuit using a dual-input comparator 234. This embodiment is similar to the embodiment shown in FIG. 16B except that the complementary inputs IN0+ to INm+ and IN0− to INm− are applied to the gates of the cells 231*a-m* and 232*a-m*, respectively. The source of the cells 231*a-m* and 232*a-m* are connected to a constant voltage, such as VDD. The outputs of the cells 231*a-m* are connected to the negative input of the comparator 234 and the outputs of the cells 232*a-m* are connected to the positive input of the comparator 234. When the input is higher, the cells 231*a-m* make the output lower, and the cells 232*a-m* make the output higher. Therefore, the cells 231*a-m* represent negative weights and the cells 232*a-m* represent positive weights, respectively. The summations of the cell current 'Isum+' and 'Isum−' (shown by the arrows) is fed into the positive and negative inputs of the comparator 234, respectively, to generate the output. In neural network applications, the output can be used as an input to the next layer.

Figure 17A:
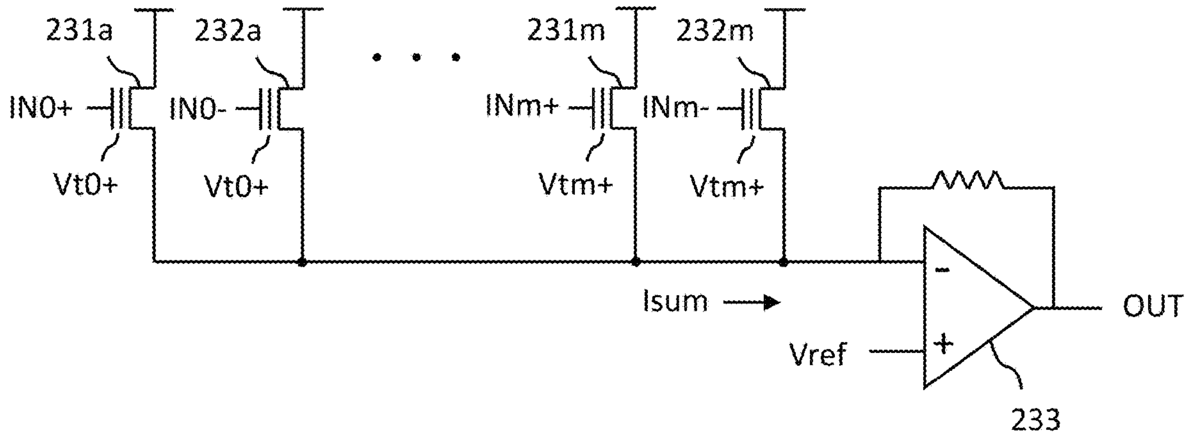
FIGS. 17A-B shows an embodiment of an output circuit that performs an analog matching function for in-memory computing applications.
Figure 17B:
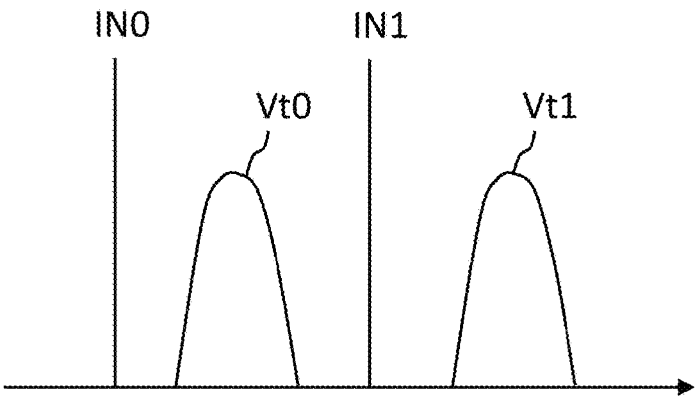

FIGS. 17A-B shows an embodiment of an output circuit that performs an analog matching function for in-memory computing applications, such as content-addressable memory (CAM) applications. This embodiment is similar to the embodiment shown in FIG. 16C except that the cells 231*a-m* are programmed to threshold voltages Vt0+ to Vtm+ to represent the stored data, and the cells 232*a-m* are programmed to threshold voltages Vt0− to Vtm− to represent the complementary stored data. During the operation, the gates of the cells 231*a-m* are supplied with the input data IN0+ to INm+ and the gates of the cells 232*a-m* are supplied with the complementary input date IN0− to INm− to match the data stored in the cells.

FIG. 17B shows a relationship between threshold voltages and input voltage. In this relationship, Vt0 and Vt1 show threshold voltage distributions of data 0 and 1 stored in the cells, respectively. Also shown are voltages IN0 and IN1 applied to the gates of the cells for data 0 and 1, respectively. It will be assumed that the cells 231*a* and 232*a* shown in FIG. 17A store data 0 and the complementary data 1, respectively. The threshold voltages of the cells 231*a* and 232*a* will be Vt0 and Vt1, respectively, as shown in FIG. 17B.

If the input data is 0, the gates of the cells 231*a* and 232*a* are supplied with IN0 and IN1, respectively. This configuration turns off both the cells 231*a* and 232*a*, thus the output of the comparator 233 becomes higher. This indicates that the input data matches the data stored in the cells. Similarly, when the cells store data 1 and the input data is 1, both the cells 231*a* and 232*a* will be turned off to pull high the output of the comparator 233.

If the input data is 1, the gates of the cells 231*a* and 231*b* are supplied with IN1 and IN0, respectively. This turns on the cell 231*a* because its gate is supplied with IN1 and its threshold voltage is Vt0. Therefore, the output of the comparator 233 will become lower. This indicates that the input data mismatches the data stored in the cells. Similarly, when the cells stored data 1 and the input data is 0, the cell 231*b* will be turned on to pull low the output of the comparator 233.

In one embodiment, the summation of the cell current 'Isum' shown by the arrow is fed into the input of the comparator 233 to generate the output. When more input data matches the data stored in the cells, the output of the comparator 233 becomes higher.

Although the embodiment shown in FIG. 17A use the circuit shown in FIG. 16C to implement the analog matching function, it is obvious that the other circuit shown in FIGS. 16A-D can be used with minor modifications. For simplicity, these examples will not be shown in separate drawings. It should also be noted that many other functions for in-memory computing, such as OR, NOR (not-OR), AND, NAND (not-AND), XOR (exclusive-OR), XNOR (exclusive-NOR), adding, and subtracting can be implemented by using the embodiments shown in FIGS. 16A-D and FIGS. 17A-B. For simplicity, these modifications will not be shown and described in detail. However, these modifications and variations shall remain on the scope of the invention.

Figure 18A:
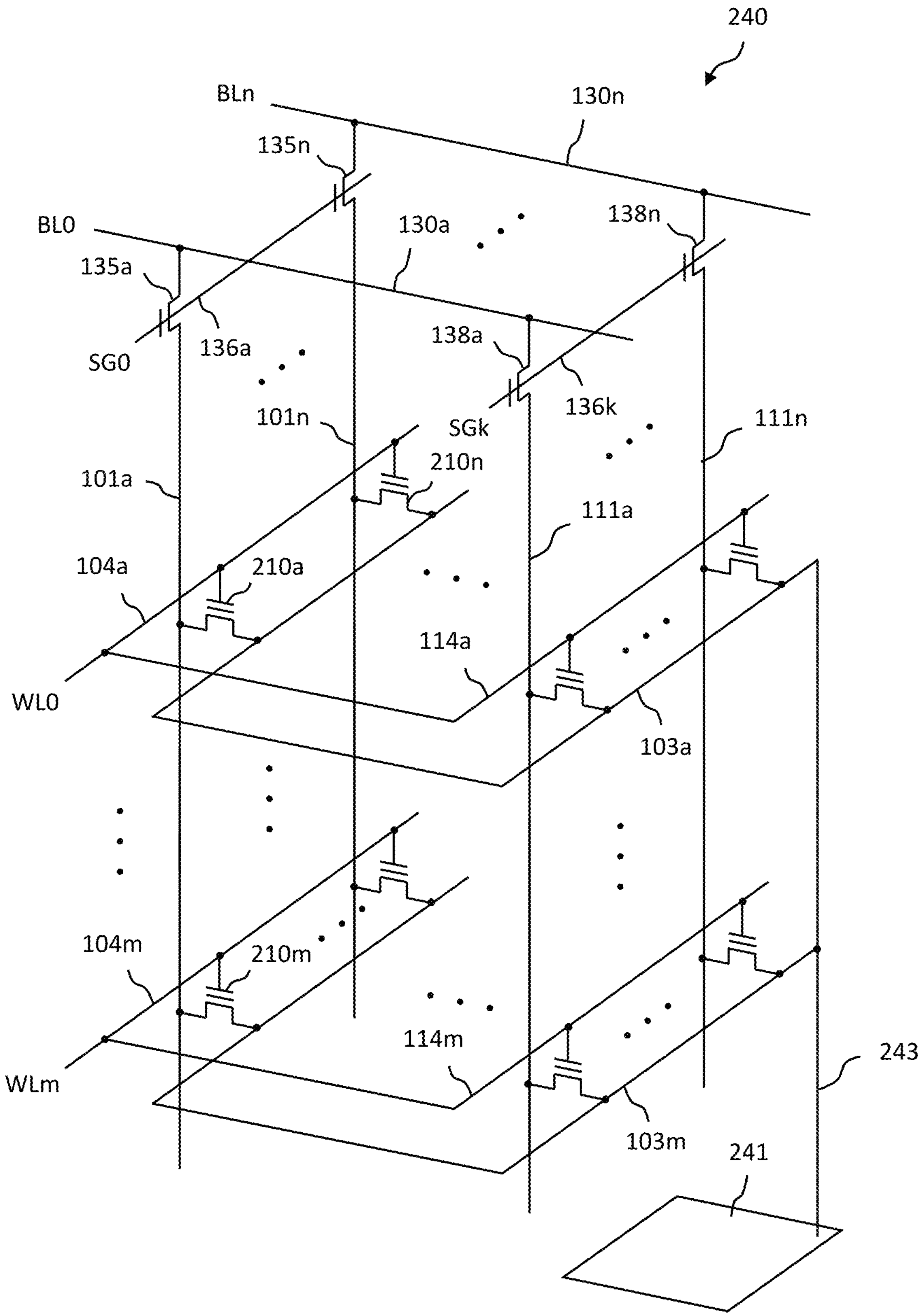
FIG. 18A shows an embodiment of a 3D array for in-memory-computing or neural network applications according to the invention.

FIG. 18A shows an embodiment of a 3D array for in-memory-computing or neural network applications according to the invention. The 3D array structure comprises a basic unit 240. The unit 240 is similar the 3D array shown in FIG. 10B except that it includes an output circuit 241 connected to the source lines 114a-m through a common source line 243. The output circuit 241 comprises a comparator, such as comparators 233 or 234 shown in FIGS. 16A-D. The output circuit 241 performs the function for in-memory computing or the function of the output neuron of neural networks.

The vertical bit lines 101a-n and 111a-n are connected to the horizontal bit lines 130a-n through the select gates 135a-n and 138a-n, respectively. The select gate signals 136a-k are connected to the gates of the select gates 135a-n and 138a-n, respectively. The select gate signals 136a-k select which set of vertical bit lines are to be coupled to the horizontal bit lines 130a-n. The horizontal bit lines 130a-n and the select gates 135a-n and 138a-n are located on the top or at the bottom of the array. Adding the select gates 135a-n and 138a-n enables the multiples word lines in the same layer, such as word lines 104a and 114a, and 104m and 114m to be connected. This greatly reduces the number of the word line decoders. The source lines 103a-m are connected to an output circuit 241. In one embodiment, the output circuit 241 is located under the 3D array to reduce the die size.

Figure 18B:
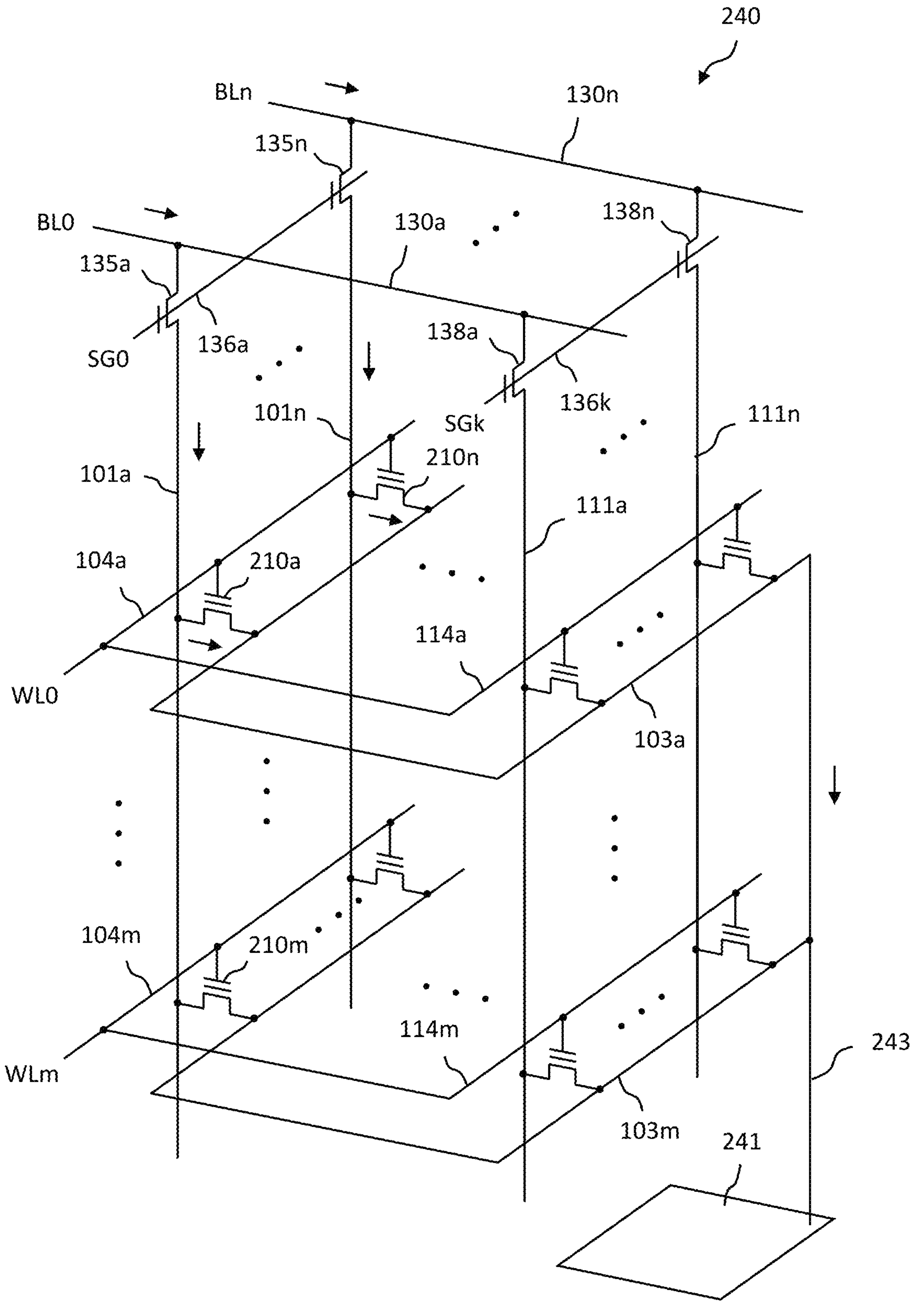
FIG. 18B shows a unit in which signal flow is indicated by arrows.

FIG. 18B shows a unit 240 in which signal flow during operation of the unit 240 is indicated by arrows. In one embodiment, the input data is applied to the bit lines 130a-n. Assuming the select gate lines 136a is selected, current flows from the bit lines 130a-n through the select gates 135a-n to the vertical bit lines 101a-n. Assuming the word line 104a is selected, current flows through the cells 210a-n to the source line 103a. The current flowing through the cells 210a to 210n depends on the threshold voltage of the cells. When the threshold voltage of the cells 210a-n is higher (or lower), the current flowing through the cells 210a-n is lower (or higher), respectively. Next, the sum of the current flowing through the cells 210a-n is applied to the output circuit 241 through the common source line 243. The output circuit 241 perform in-memory-computing functions or output neuron functions as shown in FIGS. 16A-D and FIGS. 17A-B.

Figure 19A:
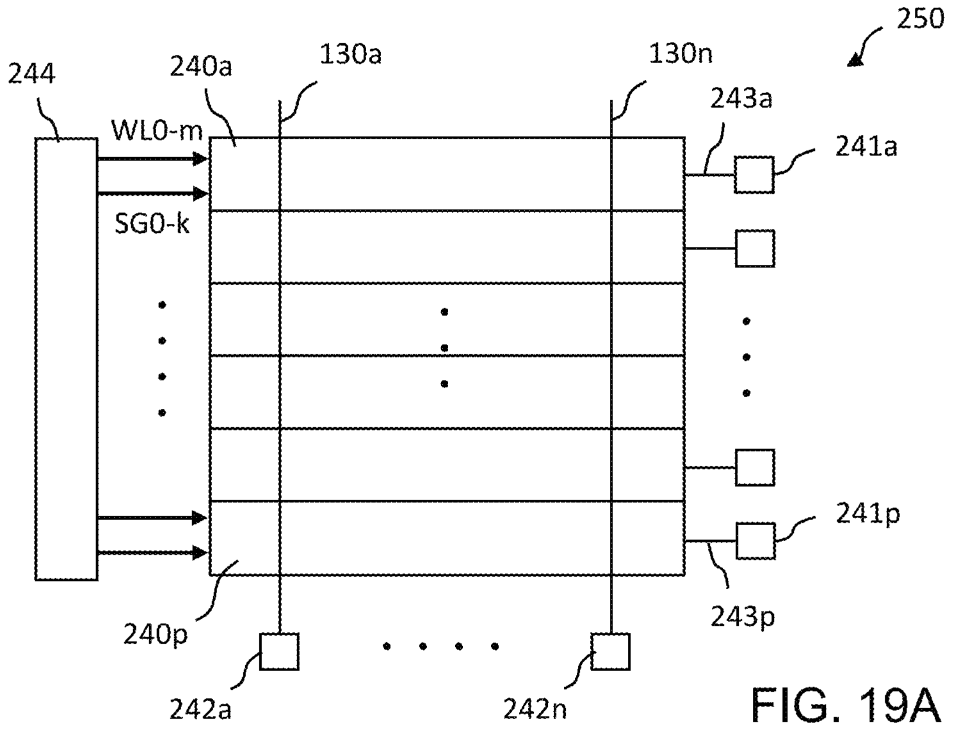
FIG. 19A shows an embodiment of an array architecture according to the invention.

FIG. 19A shows an embodiment of an array architecture 250 according to the invention. The array comprises multiple units 240a-p as shown in FIG. 18A. The source lines 243a-p of the units 240a-p are connected to output circuits 241a-p as shown in FIG. 18A. The units 240a-p are connected to the bit lines 130a-n. The bit lines 130a-n are connected to input circuits 242a-n. The word lines WL0-WLm, such as word lines 104a-m shown in FIG. 18A and the select gate signals SG0-SGk, such as select gates 136a-k shown in FIG. 18A of each unit 240a-p are connected to a word line and select gate decoder circuit 244.

Figure 19B:
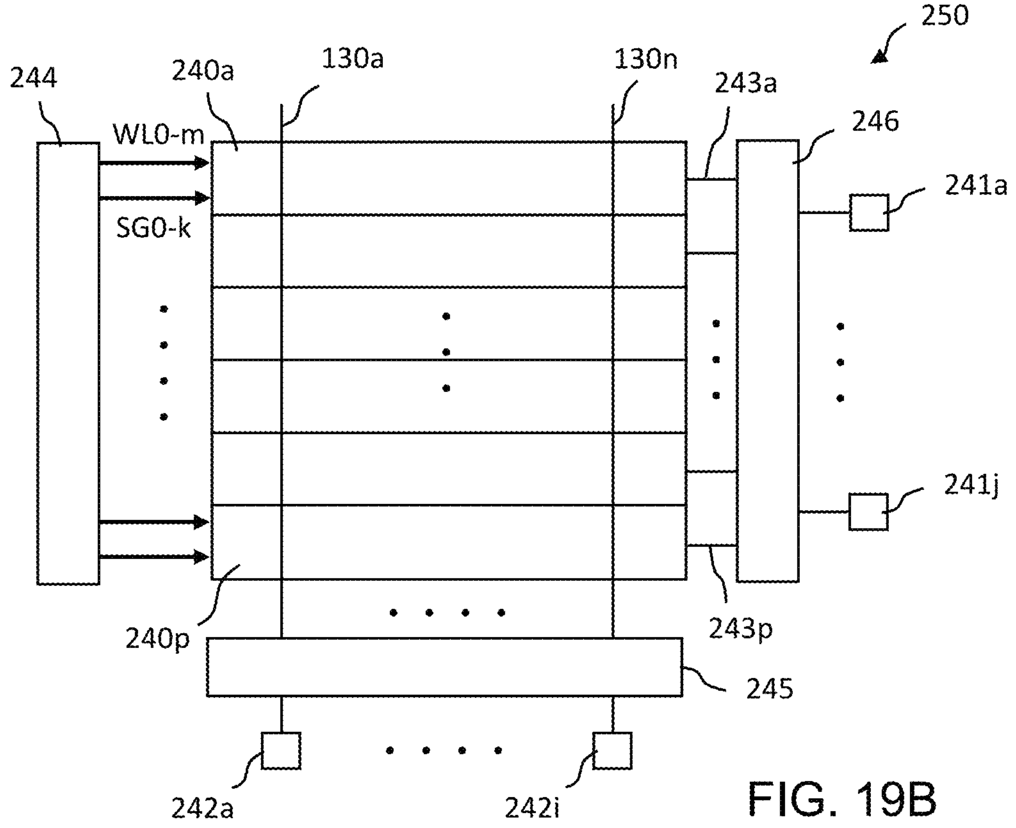
FIG. 19B shows an embodiment of an array architecture according to the invention.

FIG. 19B shows an embodiment of an array architecture 250 according to the invention. This embodiment is similar to the embodiment shown in FIG. 19A except that a bit line decoder 245 and a source line decoder 246 are added. The bit line decoder 245 selects partial bit lines 130a-n to be connected to the input circuits 242a-i. The source line decoder 246 selects partial source lines 243a-p to be connected to the output circuits 241a-j. This configuration reduces the number of the input circuits 242a-j and the output circuits 241a-j to reduce the die size.

According to the invention, the word line and select gate decoder 244, bit line decoder 245, and source line decoder 246 have multiple-select functions. They select any number of the units, bit lines, and source lines in any locations according to required tasks.

During operation, the word line and select gate decoder 244 select multiple units. The word line and select gate decoder 244 select one word line and one select gate in each selected unit. The input circuits 242a-i supply inputs to the selected bit lines 130a-n through the bit line decoder 245 to the selected units 240a-p to generate the outputs. The outputs are sent to the output circuits 241a-j selected by the source line decoder 246. By using this configuration, in-memory-computing can be performed or a neural network with any number of inputs and outputs can be implemented.

Figure 20A:
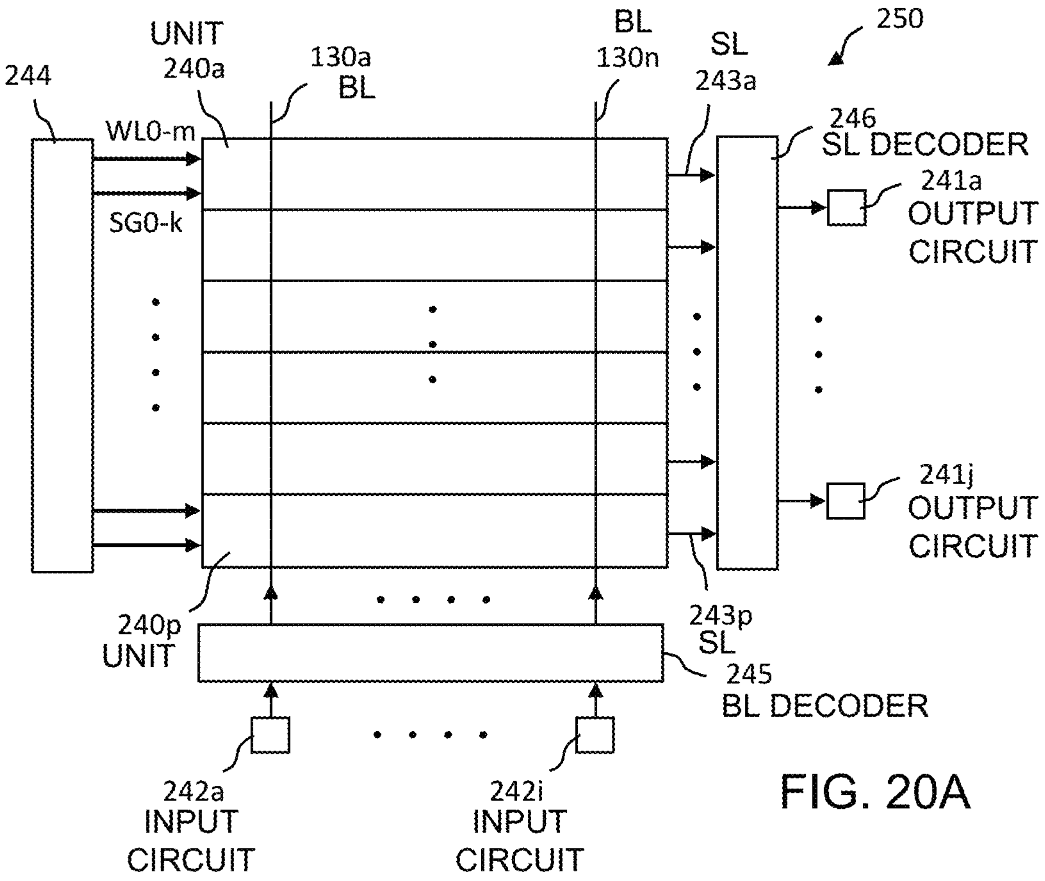
FIG. 20A shows signal flow of an embodiment of an array architecture according to the invention.

FIG. 20A shows signal flow of an embodiment of an array architecture comprising units 240a-p according to the invention. For example, the units 240a-p represent embodiments of the unit 240 shown in FIG. 18B. As shown by the arrows, the signals flow from the input circuits 242a-i through the bit line decoder 245 to the selected bit lines 130a-n to selected units 240a-p. The output signals flow from selected units 240a-p through the source lines 243a-p to the source line decoder 246 to the output circuits 241a-j.

Figure 20B:
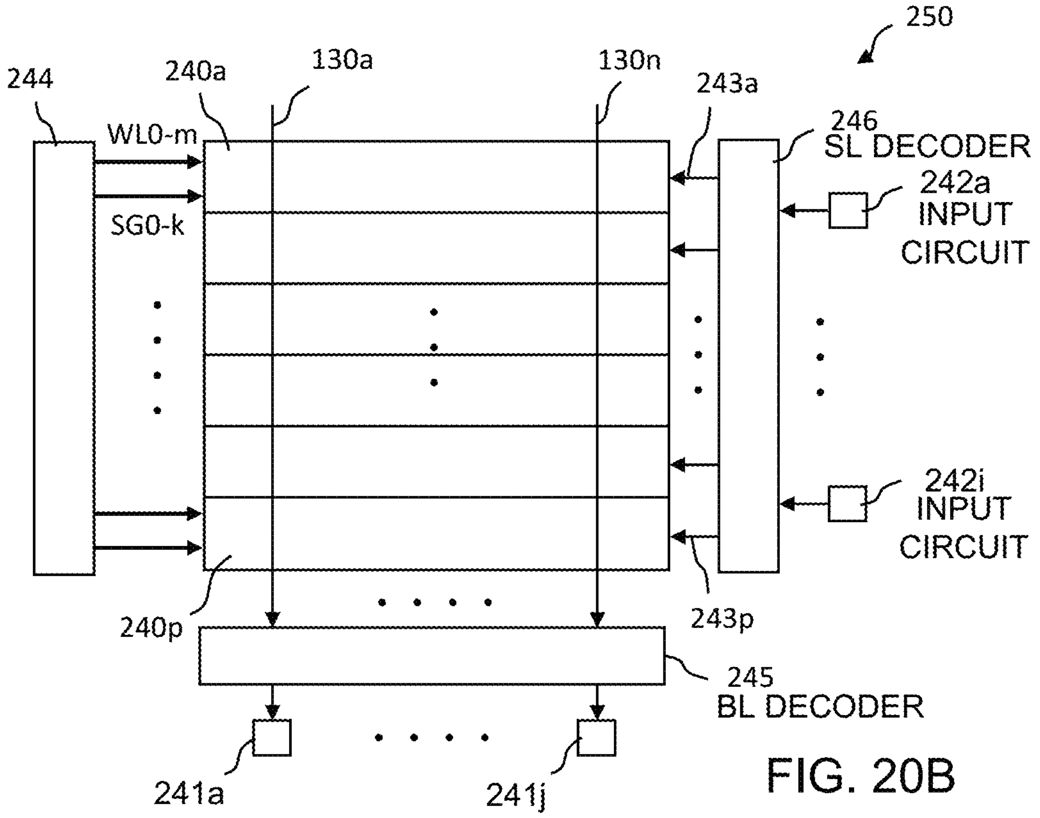
FIG. 20B shows an embodiment of an array architecture in which the signal flow is reversed.

FIG. 20B shows an embodiment of an array architecture in which the signal flow is reversed. In this embodiment, the input circuits 242a-i are connected to the source line decoder 246 and the output circuits 241a-j are connected to the bit line decoder 245. As shown by the arrows, the signals flows from the input circuits 242a-i through the source line decoder 246 to the selected source lines 243a-p to the selected units 240a-p. The output signals flow from the selected units 240a-p through the bit lines 130a-n through the bit line decoder 245 to the output circuits 241a-j.

It should be noted that for neural network applications, signals usually flow in two directions, called 'forward-propagation' and 'back-propagation'. The forward-propagation is used to generate the output based on the current weights of the synapses. The back-propagation is used to calculate the output error of each neuron for adjusting the weights of the synapses during the training operations. For this application, the input circuits 242a-i and the output circuits 241a-j are designed to allow the signals to flow in both directions. Then, the signal flows shown in FIG. 20A and FIG. 20B are used in the forward-propagation and back-propagation operations, respectively.

Figure 20C:
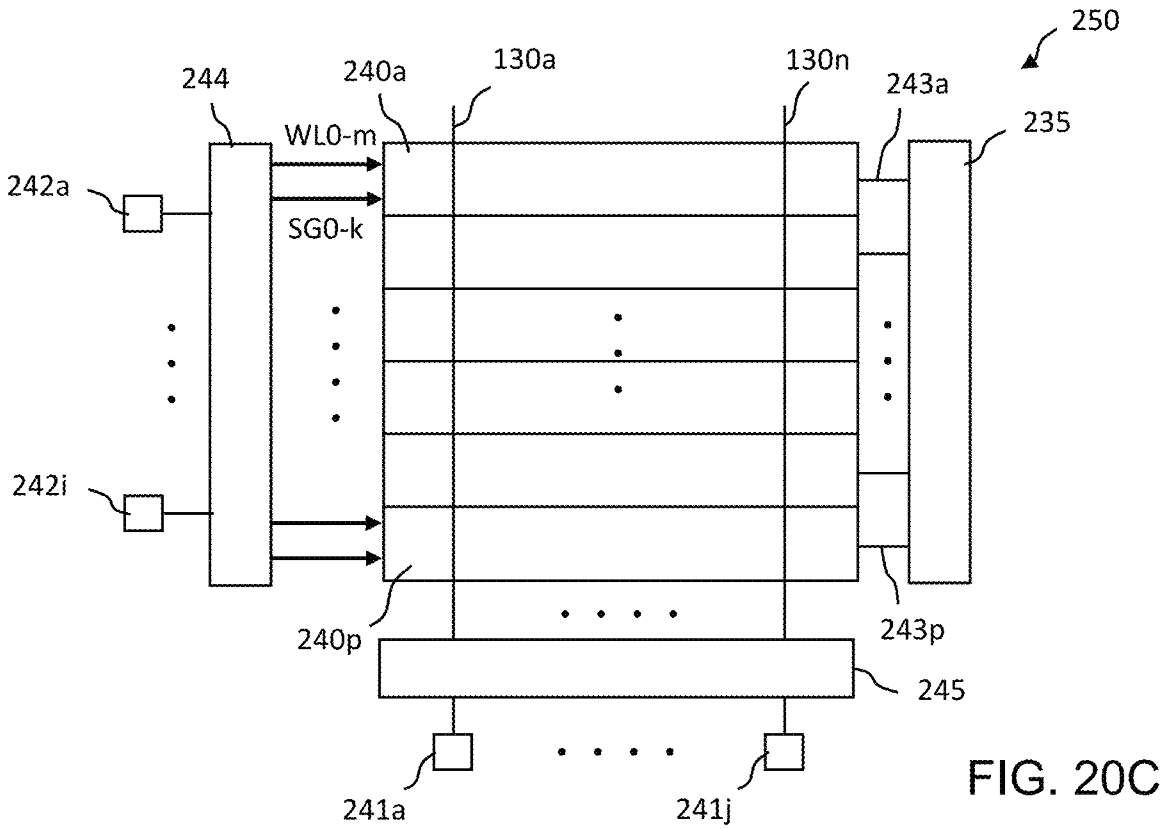
FIG. 20C shows an embodiment of an array architecture according to the invention.

FIG. 20C shows an embodiment of an array architecture 250 according to the invention. This embodiment is similar to the embodiment shown in FIG. 19B except that the input circuits 242a to 242i are connected to the word line and select gate decoder 244. The word line and select gate decoder 244 selects multiple word lines to be connected to the input circuits 242a to 242i. The input neurons 242a to 242i supply inputs to the selected word lines to perform the operations shown in FIG. 15C. The source line driver 235 applies a current to the selected source lines 243a to 243p. The current flows through the selected cells to the bit lines 130a to 130n and the bit line decoder 245 to the output circuits 241a to 241j.

Figure 20D:
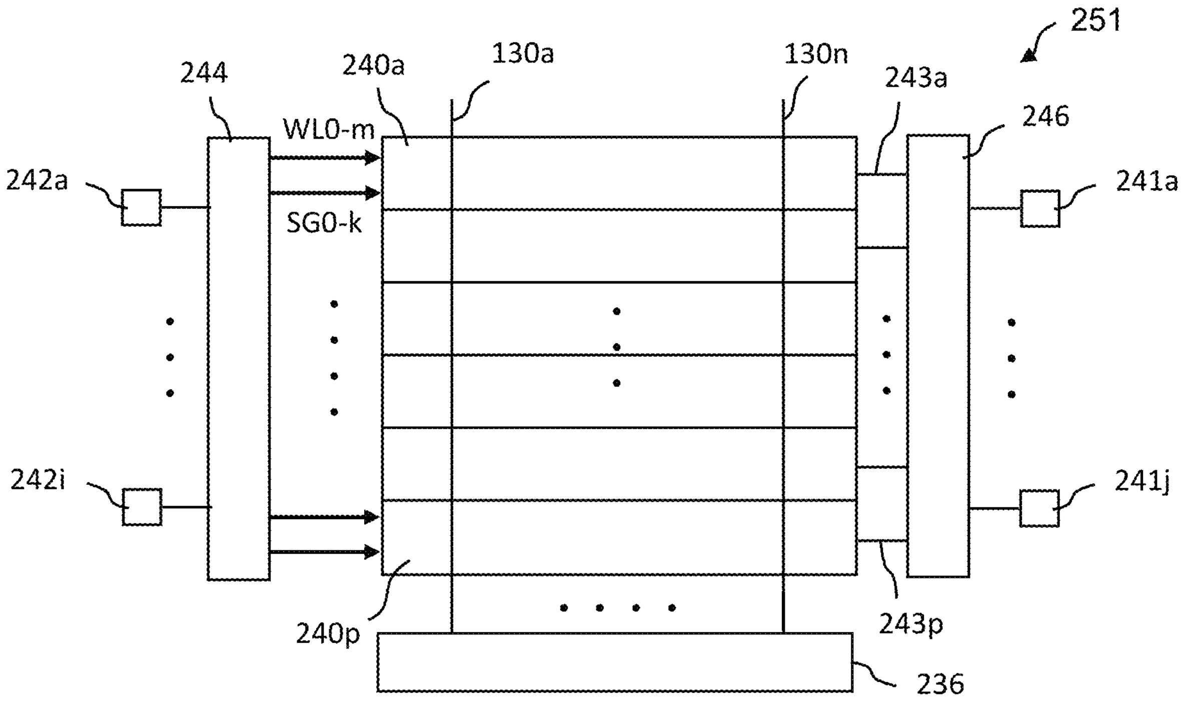
FIG. 20D shows an embodiment of the array architecture according to the invention.

FIG. 20D shows an embodiment of the array architecture 251 according to the invention. This embodiment is similar to the embodiment shown in FIG. 20C except that the output circuits 241a to 241j are connected to the source line decoder 246 instead of the word line and select gate decoder 244. The source line decoder 246 selects multiple source lines 243a to 243p to be connected to the output circuits 241a to 241j. The input neurons 242a to 242i apply inputs to the selected word lines to perform the operations shown in FIG. 15C. The bit line driver 236 applies a current to the selected bit lines 130a to 130n. The current flows through the selected cells to the source lines 243a to 243p and the source line decoder 246 to the output circuits 241a to 241j.

Figure 21A:
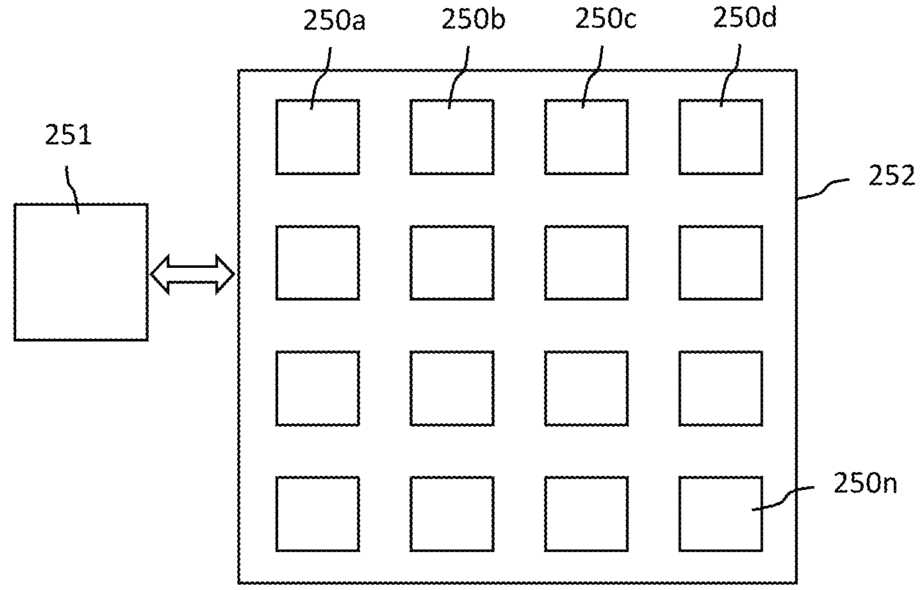
FIGS. 21A-C show embodiments of architectures of a neural network chip or an in-memory-computing chip according to the invention.
Figure 21B:
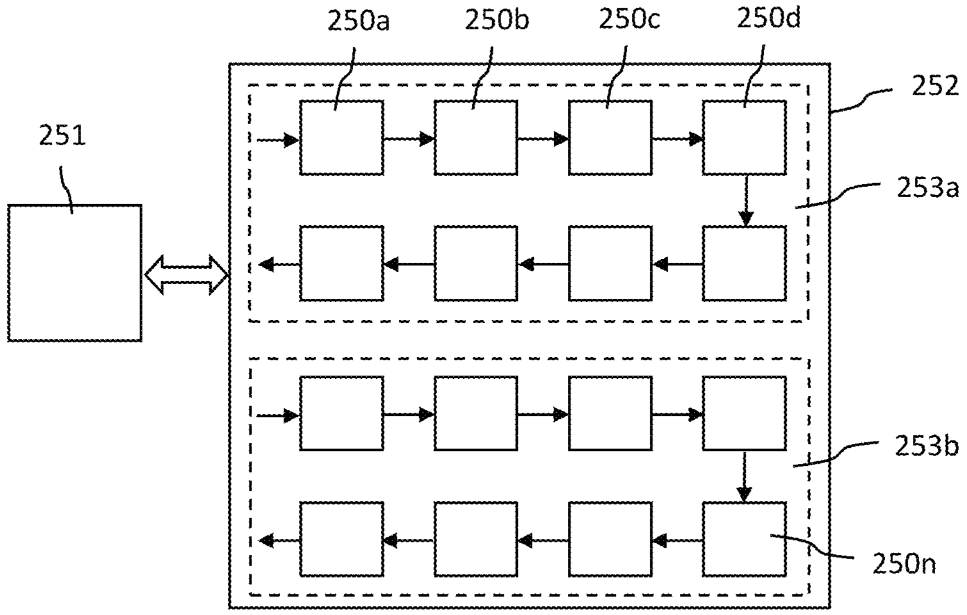
Figure 21C:
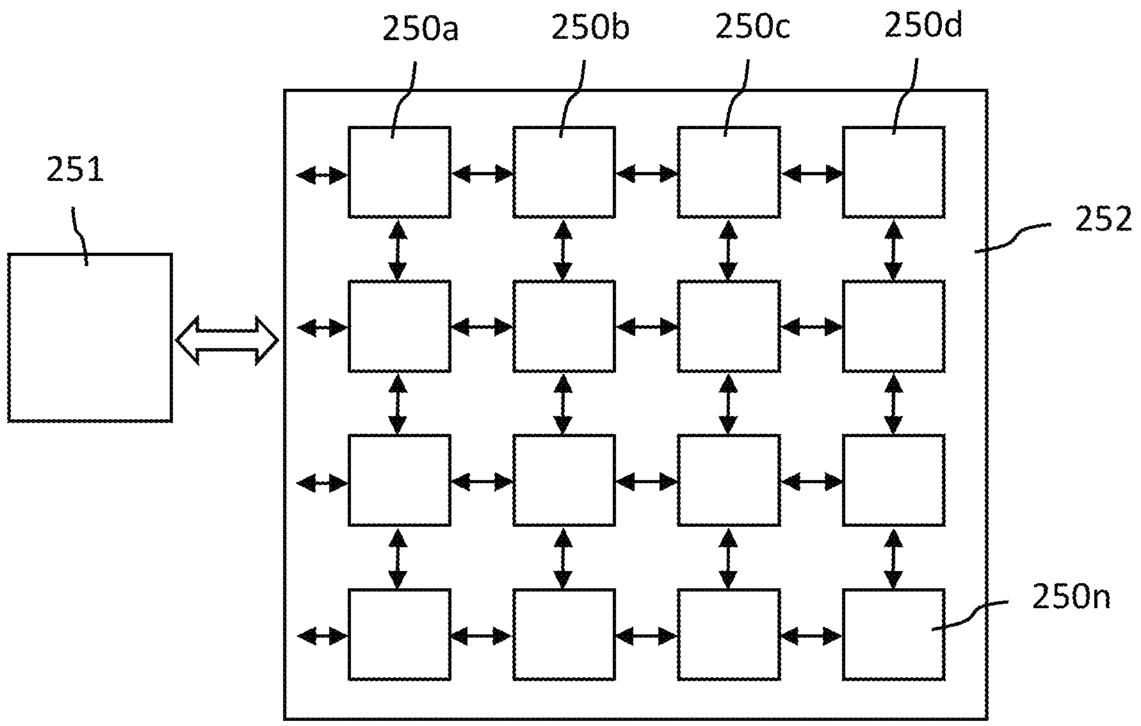

FIGS. 21A-C show embodiments of architectures of a neural network chip or an in-memory-computing chip according to the invention.

FIG. 21A shows an embodiment of an architecture for an in-memory-computing chip. In one embodiment, the chip comprises a logic unit 251 and a computing unit 252. The logic unit 251 comprises the input/output (I/O), data registers, control logic, decoders, voltage generator, center processing unit (CPU), arithmetic-logic unit (ALU), program memory, and any other units that control the basic operations of the chip.

The computing unit 252 comprises multiple arrays 250*a-n*, such as the one shown in FIG. 19A or FIG. 19B. The logic unit 251 feeds the data into the computing unit 252 to perform in-memory computing operations and then returns the output data to the logic unit 251. The multiple arrays 250*a-n* allows large quantity of data to be computed in parallel to enhance the performance of the chip.

FIG. 21B shows an embodiment of an architecture for a neural network chip. The chip comprises a logic unit 251 and a computing unit 252 like the one shown in FIG. 21A. The computing unit 252 comprises multiple arrays 250*a-n*, such as the one shown in FIG. 19A or FIG. 19B. The multiple arrays 250*a-n* are connected to form multi-layer neural networks, such as 253*a* and 253*b*. This architecture allows large quantity of the data to be processed in parallel to enhance the performance of the chip.

FIG. 21C shows an embodiment of an architecture for a neural network chip. This embodiment is similar to the embodiment shown in FIG. 21B except that the multiple arrays 250*a-n* are connected using bi-directional input/output, as shown by the arrows. The conventional bi-directional input/output buffers are used between the adjacent arrays 250*a-n* to implement this architecture. The direction of the input/output of each array 250*a-n* is freely configured by the control of the logic unit 251. This allows the arrays 250*a-n* to form multi-layer neural networks with any number of the layers and any direction of signal flow. This greatly increases the flexibility of the configuration of neural networks.

Figure 22:
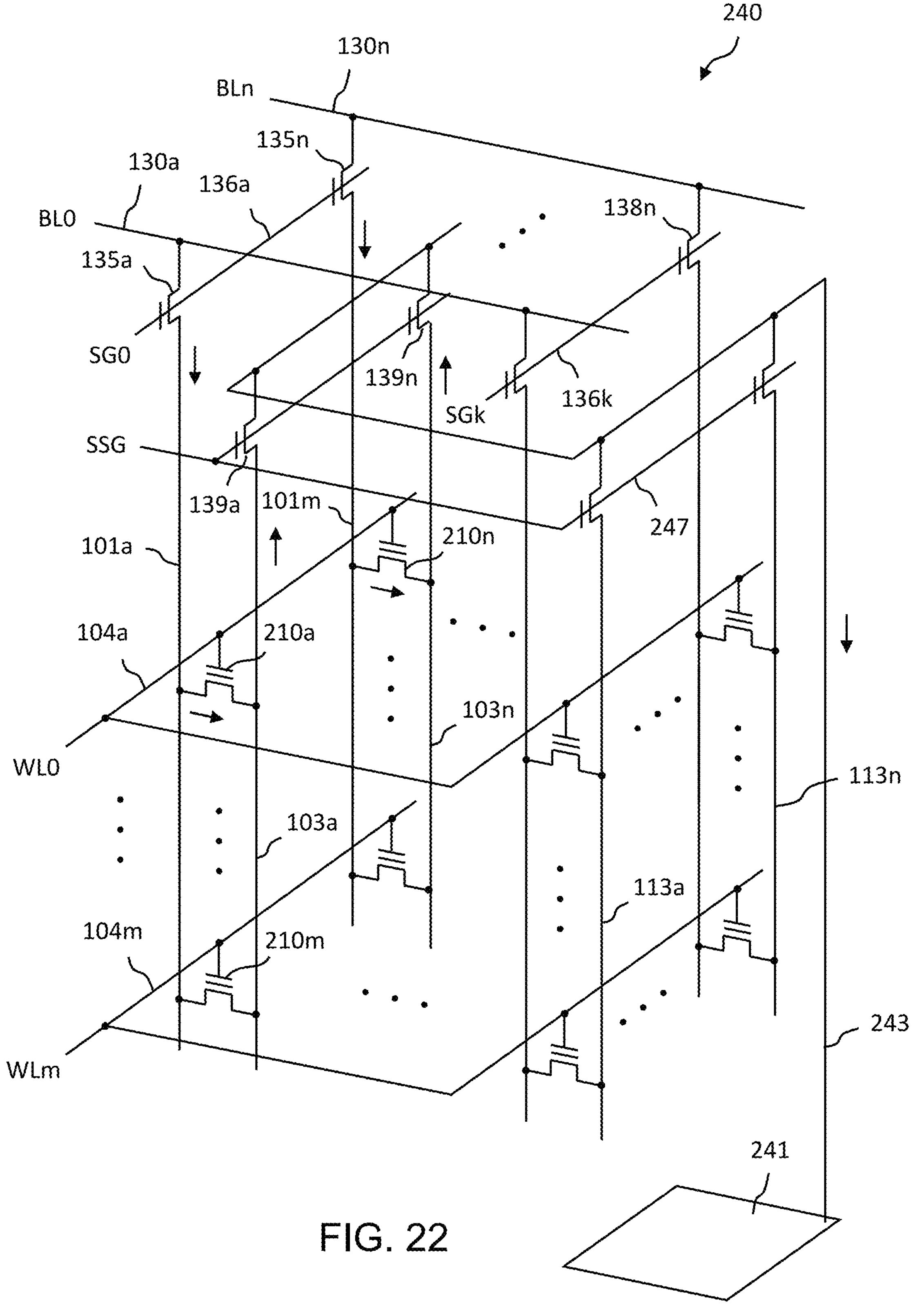
FIG. 22 shows an embodiment of a 3D array unit for in-memory-computing or neural network applications according to the invention.

FIG. 22 shows an embodiment of a 3D array unit 240 for in-memory-computing or neural network applications according to the invention. This array unit 240 is similar to the embodiment shown in FIG. 18A except that the source lines 103*a-m* and 113*a-m* are formed in a vertical direction instead of a horizontal direction. This array structure with parallel bit lines 101*a-m* and source lines 103*a-m* is also known as a 'AND' array.

The arrows show the signal flows of this embodiment during operation. In one embodiment, the input data are applied to the bit lines 130*a-n*. Assuming the select gate line 136*a* is selected, the current flows from the bit lines 130*a-n* through the select gates 135*a-n* to the vertical bit lines 101*a-n*. Assuming the word line 104*a* is selected, the current flows through the cells 210*a-n* to the source lines 103*a-m*. The source line select gate signal 247 is selected to turn on the source line select gates 139*a-n* to pass the current from the source lines 103*a-m* to the common source line 243. The common source line 243 is connected to the output circuit 241 to perform the in-memory-computing function or the output neuron functions as shown in FIGS. 16A-D and FIGS. 17A-B.

The current flowing through the cells 210*a* to 210*n* depends on the threshold voltage of the cells. When the threshold voltage of the cells 210*a-n* is higher (or lower), the current flowing through the cells 210*a-n* is lower (or higher), respectively. Then, the sum of the current flowing through the cells 210*a-n* is applied to the output circuit 241 through the common source line 243. The output circuit 241 performs the in-memory-computing functions or the output neuron functions shown in FIGS. 16A-D and FIGS. 17A-B.

Figure 23:
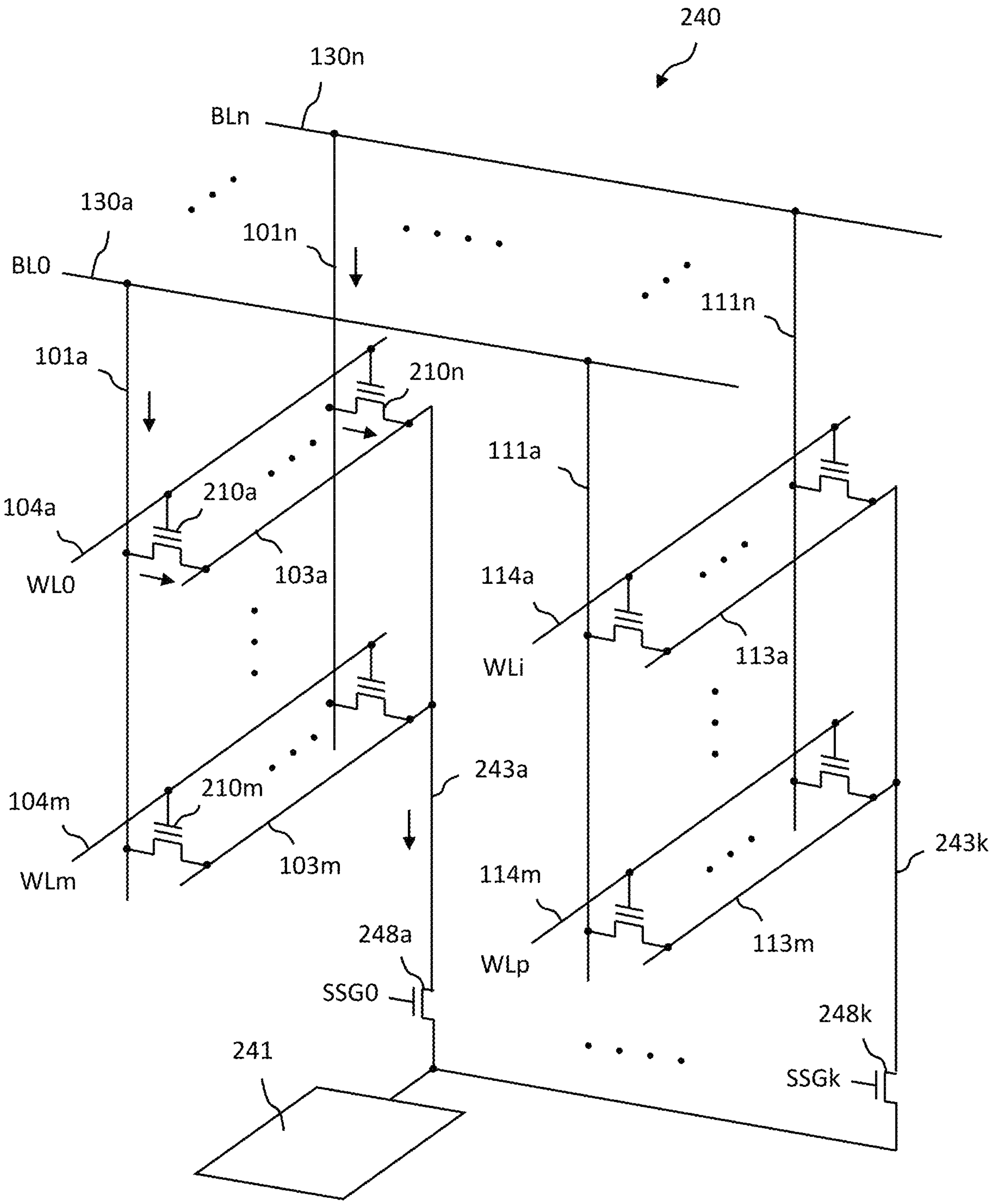
FIG. 23 shows an embodiment of a 3D array unit for in-memory-computing or neural networks according to the invention.

FIG. 23 shows an embodiment of a 3D array unit 240 for in-memory-computing or neural networks according to the invention. In this embodiment, the array structure shown in FIG. 10A is used. The word lines in the same level are not connected. For example, the word lines 104*a-m* and the word lines 114*a-m* are connected to word line different decoders.

The arrows show the signal flow of this embodiment during the operation. In one embodiment, the input data is applied to the bit lines 130*a-n*. Assuming the word line 104*a* is selected, the current flows through from the bit lines 130*a-m* through the vertical bit lines 101*a-n* and the cells 210*a-n* to the source lines 103*a*. The source line 103*a* are connected to the output circuit 241 through the common source line 243*a* and the source line select gate 248*a* to perform the in-memory-computing functions or the output neuron functions as shown in FIGS. 16A-D and FIGS. 17A-B.

Figure 24A:
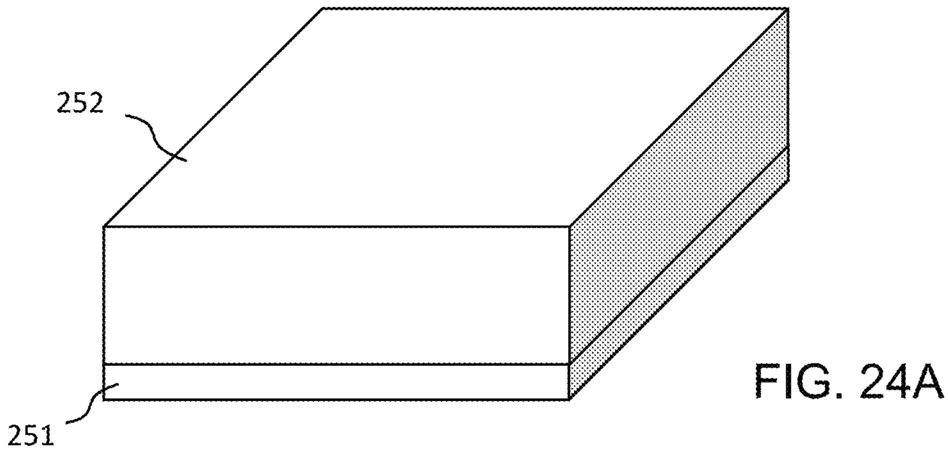
FIGS. 24A-C shows embodiments of a structure of a neural network chip according to the invention.
Figure 24B:
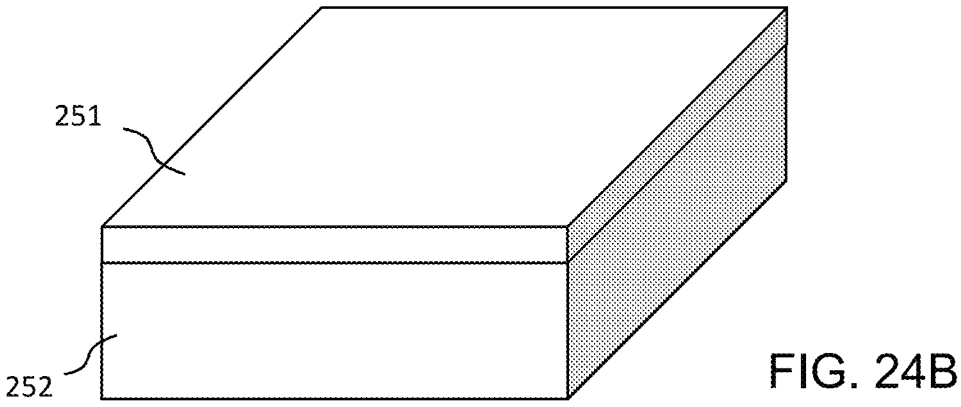
Figure 24C:
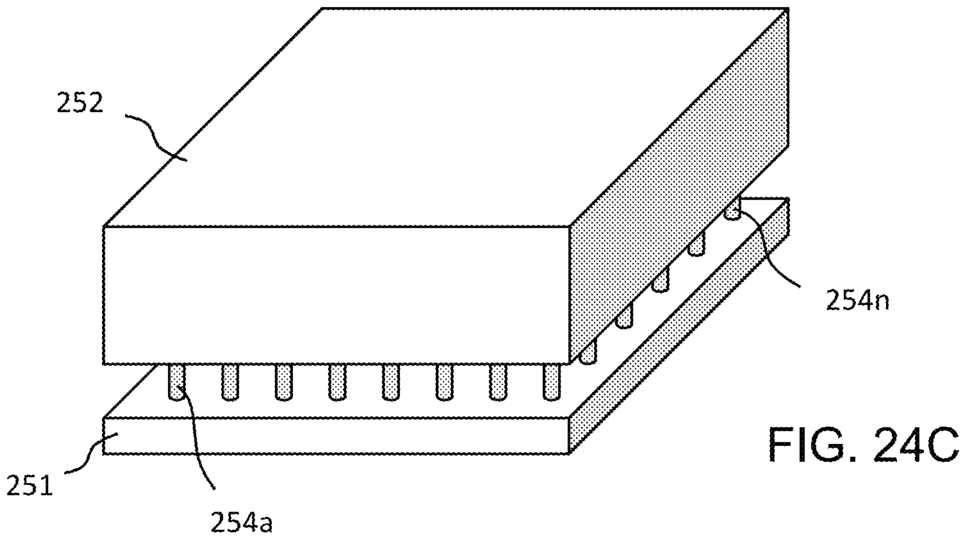

FIGS. 24A-C shows embodiments of a structure of a neural network chip according to the invention. In the embodiment shown in FIG. 24A, a computing unit 252 is located on top of a logic unit 251. This configuration reduces the die size to reduce the manufacturing cost and the footprint of the chip. The computing unit 252 and the logic unit 251 are formed in the same wafer, which is also known as a 'monolithic integrated chip (IC)'.

The structure shown in FIG. 24A can be formed by using any suitable 3D integration technologies. For example, in one embodiment, the structure is formed by forming the logic unit 251 on top of the substrate of a wafer, and then forming the computing unit 252 on top of the logic unit 251. In another embodiment shown in FIG. 24B, the logic unit 251 is located on top of the computing unit 252. For this embodiment, the computing unit 252 is formed on top of the substrate of the wafer first, and then the logic unit 251 is formed on top of the computing unit 252.

In another embodiment shown in FIG. 24C, the neural network chip structure is formed by using wafer-to-wafer bonding. Two wafers comprise the computing unit 252 and the logic unit 251 are placed on top of substrate wafers, respectively. The two wafers are then bonded face-to-face to connect the computing unit 252 and the logic unit 251 by using any suitable 3D wafer integration technologies, such as through-silicon via (TSV), micro-bump, and many others, as shown by indicators 254*a* to 254*n*.

Figure 25A:
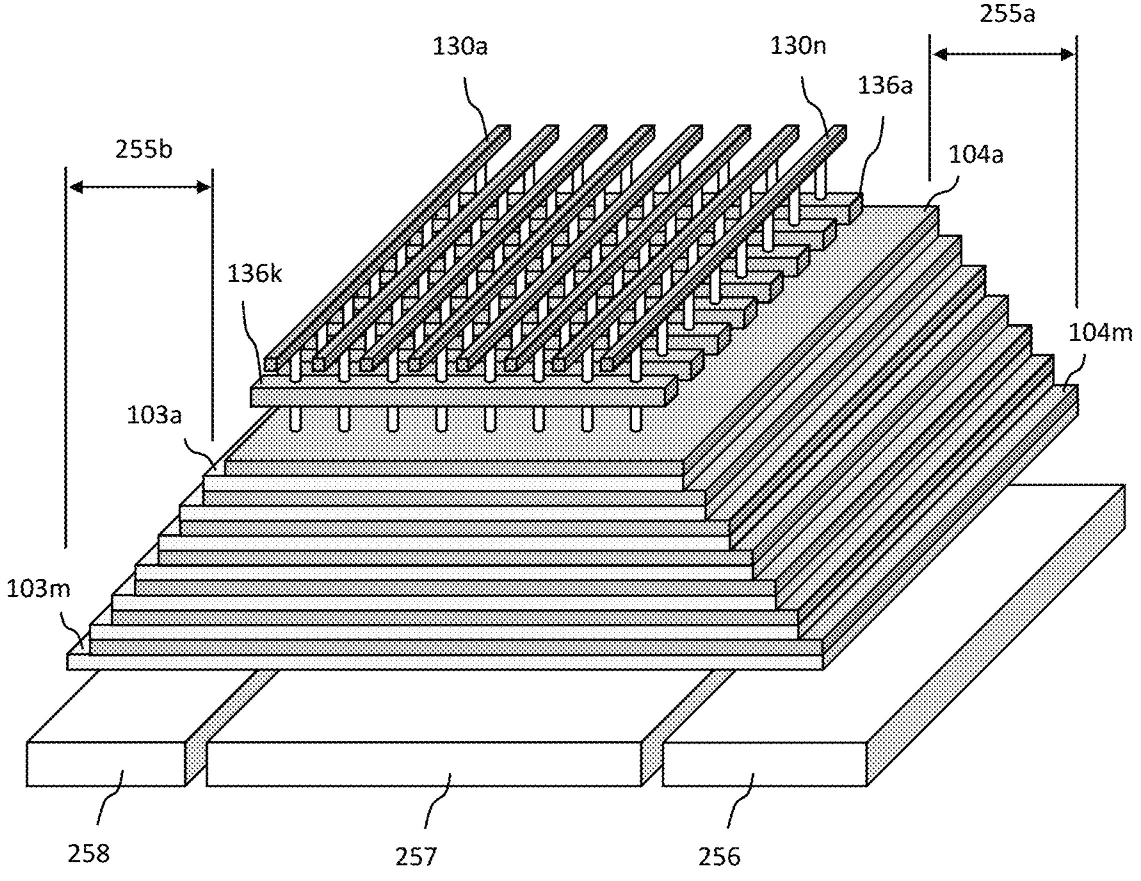
FIG. 25A shows an embodiment of a 3D array structure unit that implements the unit shown in FIG. 18B.

FIG. 25A shows an embodiment of a 3D array structure unit that implements the unit 240 shown in FIG. 18B. The 3D array structure comprises horizontal bit lines 130*a* to 130*n* and select gates lines 136*a* to 136*k* for the select gates 135*a* to 135*k* shown in FIG. 18B. Also shown are horizontal word line layers 104*a* to 104*m* and horizontal source line layers are 103*a* to 103*m*. A staircase structure 255*a* for the word line layers 104*a* to 104*m* and a staircase structure 255*b* for the source line layers 103*a* to 103*m* are formed at the edges of the array as shown.

The staircase structures 255*a* and 255*b* are formed by using a conventional pull-back etching process used in producing 3D NAND flash memory, or by using the process disclosed in U.S. patent application Ser. No. 18/492,625 entitled "3D Array Structures and Processes" and filed on Oct. 23, 2023 by the same inventor of this invention. The staircase structures 255*a* and 255*b* allow the word line layers

104*a* to 104*m* and the source line layers 103*a* to 103*m* to be connected to the word line circuits 256 and the source line circuits 258, respectively.

In one embodiment, the word line circuits 256, bit line circuits 257, and source line circuits 258 are located under the 3D array as shown to reduce the die size. In another embodiment, the word line circuits 256, bit line circuits 257, and source line circuits 258 are located on the edges of the array. Depending on the array architecture, the word line circuits 256 comprise the word line and select gate decoder 244 and input circuits 242*a* to 242*i* as shown in FIGS. 19A-20D. The bit line circuits 257 comprise a bit line decoder 245, output circuits 241*a* to 241*j*, and bit line drive circuit 236 as shown in FIGS. 19A-20D. The source line circuits 258 comprise the source line decoder 246 and output circuits 241*a* to 241*j* as shown in FIGS. 19A-20D.

Figure 25B:
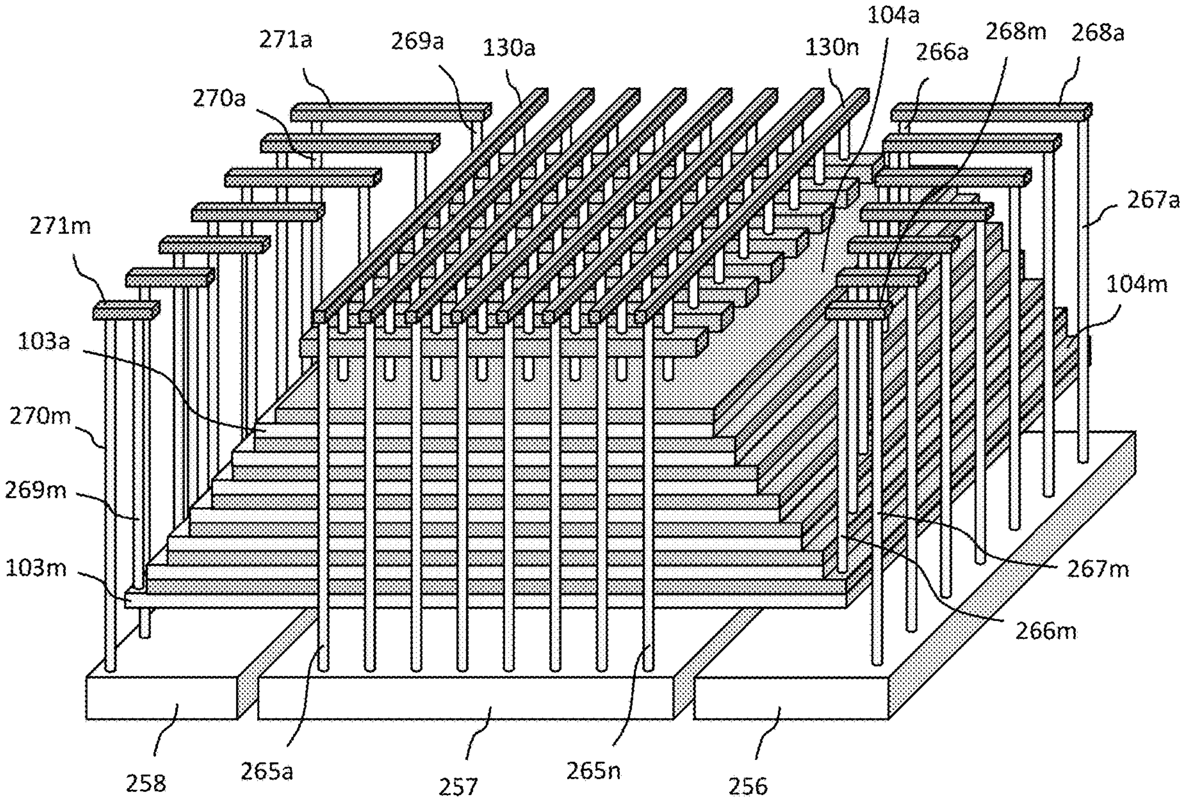
FIG. 25B shows an embodiment of connections to the bit lines, word line layers, and source line layers of the 3D array structure unit shown in FIG. 25A.

FIG. 25B shows an embodiment of connections to the bit lines 130*a* to 130*n*, word line layers 104*a* to 104*m*, and source line layers 103*a* to 103*m* of the 3D array structure unit shown in FIG. 25A. In this embodiment, the bit lines 130*a* to 130*n* are connected to the bit line circuits 257 by using contacts 265*a* to 265*n*. The contacts 265*a* to 265*n* are formed by using a high-aspect deep trench process to etch through a thick insulating layer, such as an oxide layer to form contact holes, and then filling the contact holes with metal, such as tungsten (W), titanium (Ti), and titanium nitride (TiN).

The word lines layers 104*a* to 104*m* are connected to the word line circuits 256 by using contacts, such as contacts 266*a* to 266*m* and contacts 267*a* to 267*m* and the metal lines 268*a* to 268*m*. The source line layers 103*a* to 103*m* are connected to the source line circuits 258 by using the contacts, such as contacts 269*a* to 269*m* and contacts 270*a* to 270*m* and the metal lines 271*a* to 271*m*. In one embodiment, the contacts 266*a* to 266*m*, 267*a* to 267*m*, 269*a* to 269*m*, and 270*a* to 270*m* are formed by using the same processes and materials used to form the previously described contacts 265*a* to 265*n*.

Figure 25C:
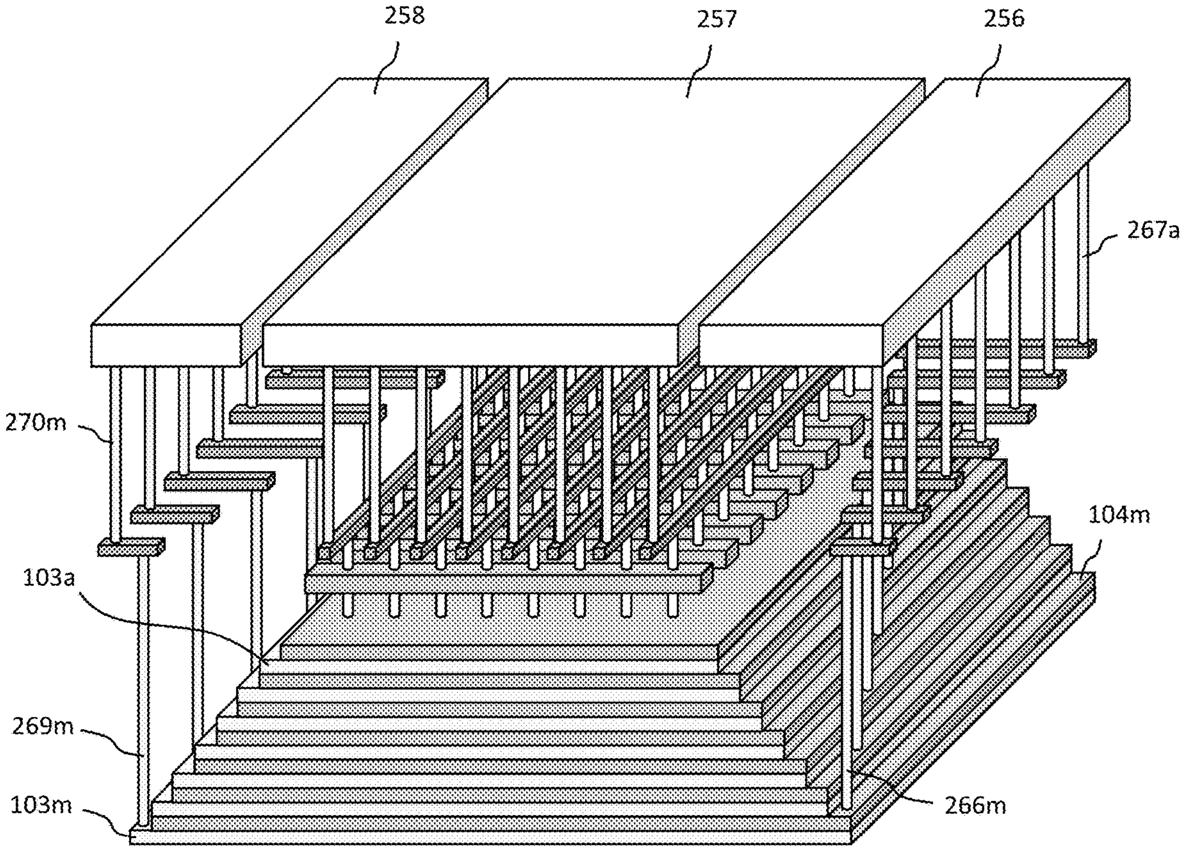
FIG. 25C shows an embodiment of connections to the bit lines, word line layers, and source line layers of the 3D array structure unit shown in FIG. 25A.

FIG. 25C shows another embodiment of connections to the bit lines 130*a* to 130*n*, word line layers 104*a* to 104*m*, and source line layers 103*a* to 103*m* of the 3D array structure unit shown in FIG. 25A. This embodiment is similar to the embodiment shown in FIG. 24B except that the word line circuits 256, bit line circuits 257, and source line circuits 258 are located on top of the 3D array.

Figure 26A:
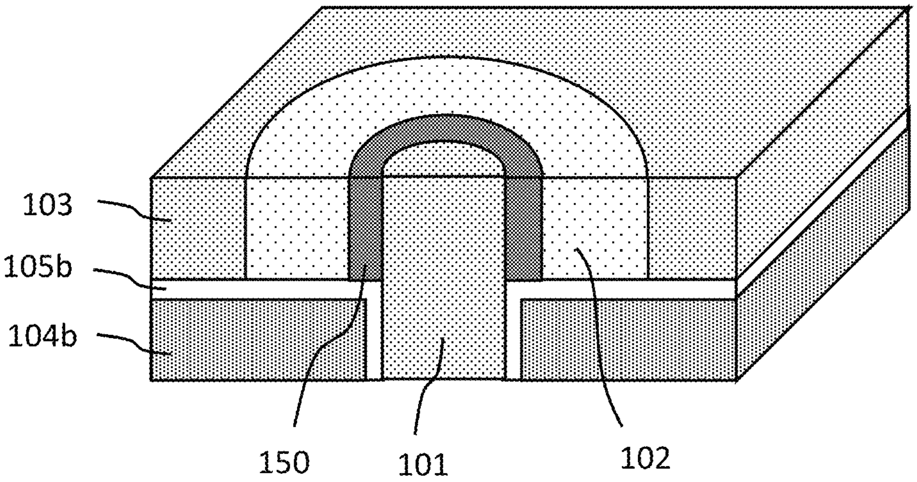
FIG. 26A-D show embodiments of 3D array cell structures and equivalent circuits according to the invention.

FIG. 26A shows an embodiment of a 3D array cell structure according to the invention. This embodiment is similar to the embodiment shown in FIGS. 1A-B except that a resistive memory layer or phase-change memory layer 150 is added to the bit line 101 side of the cell to form a 3D resistive random-access memory (RRAM) cell or a 3D phase-change memory (PCM) cell, respectively.

FIG. 26A shows an inner cell structure with the front gate 104*a* and the gate dielectric layer 105*a* removed. The resistance of the resistive memory layer or phase-change memory layer 150 is changed by applying the proper bias conditions to the cell's front gate 104*a*, back gate 104*b*, bit line 101, and source line 103.

Figure 26B:
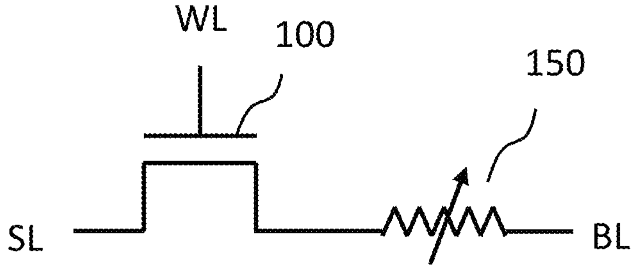

FIG. 26B shows an embodiment of an equivalent circuit of the cell structure shown in FIG. 26A. The transistor 100 is a transistor formed by the gate 104*b*, gate dielectric layer 105*b*, and floating body 102. Also shown is a resistive memory layer or phase-change layer 150.

Figure 26C:
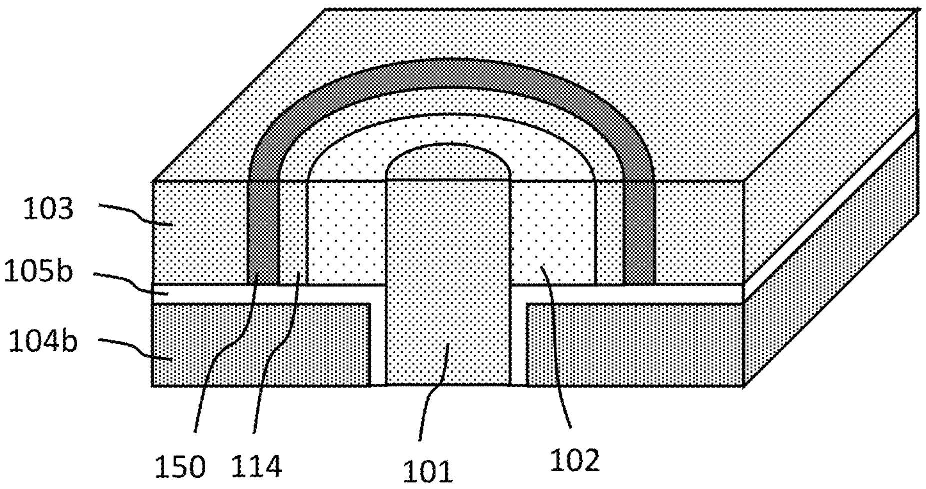

FIG. 26C shows an embodiment of a 3D RRAM or PCM cell according to the invention. This embodiment is similar to the embodiment shown in FIG. 26A except that the resistive memory layer or phase-change memory layer 150 is added to the source line 103 side of the cell.

Figure 26D:
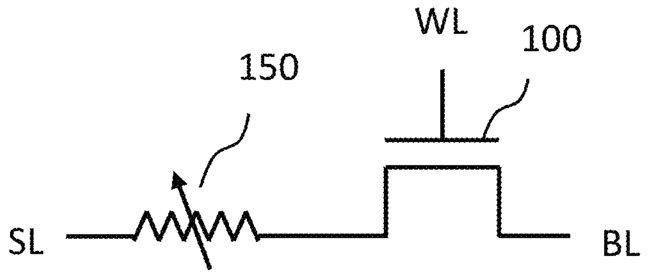

FIG. 26D shows an embodiment of an equivalent circuit of the cell structure shown in FIG. 26C. The transistor 100 is a transistor formed by the gate 104*b*, gate dielectric layer 105*b*, and floating body 102. Also shown is the resistive memory layer or phase-change layer 150.

In one embodiment, the memory layer 150 is implemented by using resistive memory materials such as special metal-oxide layers, such as HfOx, TiOx, TaOx, AlOx, NiOx, WOx, ZrOx, NbOx, CuOx, CrOx, MnOx, MoOx, SiOx, etc. The metal-oxide layer is formed between two metal electrodes. The metal electrodes are formed of specific metals, such as titanium (Ti), tantalum (Ta), platinum (Pt), tungsten (W), copper (Cu), chromium (Cr), ruthenium (Ru), aluminum (Al), nickel (Ni), praseodymium (Pr), silver (Ag), etc.

When a proper bias condition is applied to the metal electrodes, conducting filaments are formed inside the metal-oxide layers to allow current to flow through. Therefore, the metal-oxide is set to a low-resistive state. By applying another bias condition, the filaments are destructed to reset the metal-oxide layer to a high-resistive state.

In another embodiment, the memory layer 150 is implemented by using phase-change memory (PCM) material, such as chalcogenide, Ge2Sb2Te5 (GST), GeTe—Sb2Te3, Al50Sb50, etc. By applying proper bias conditions to the cell, the phase-change material is changed between an amorphous phase and a polycrystalline phase to represent a high resistivity state and a low resistivity state, respectively.

Figure 27:
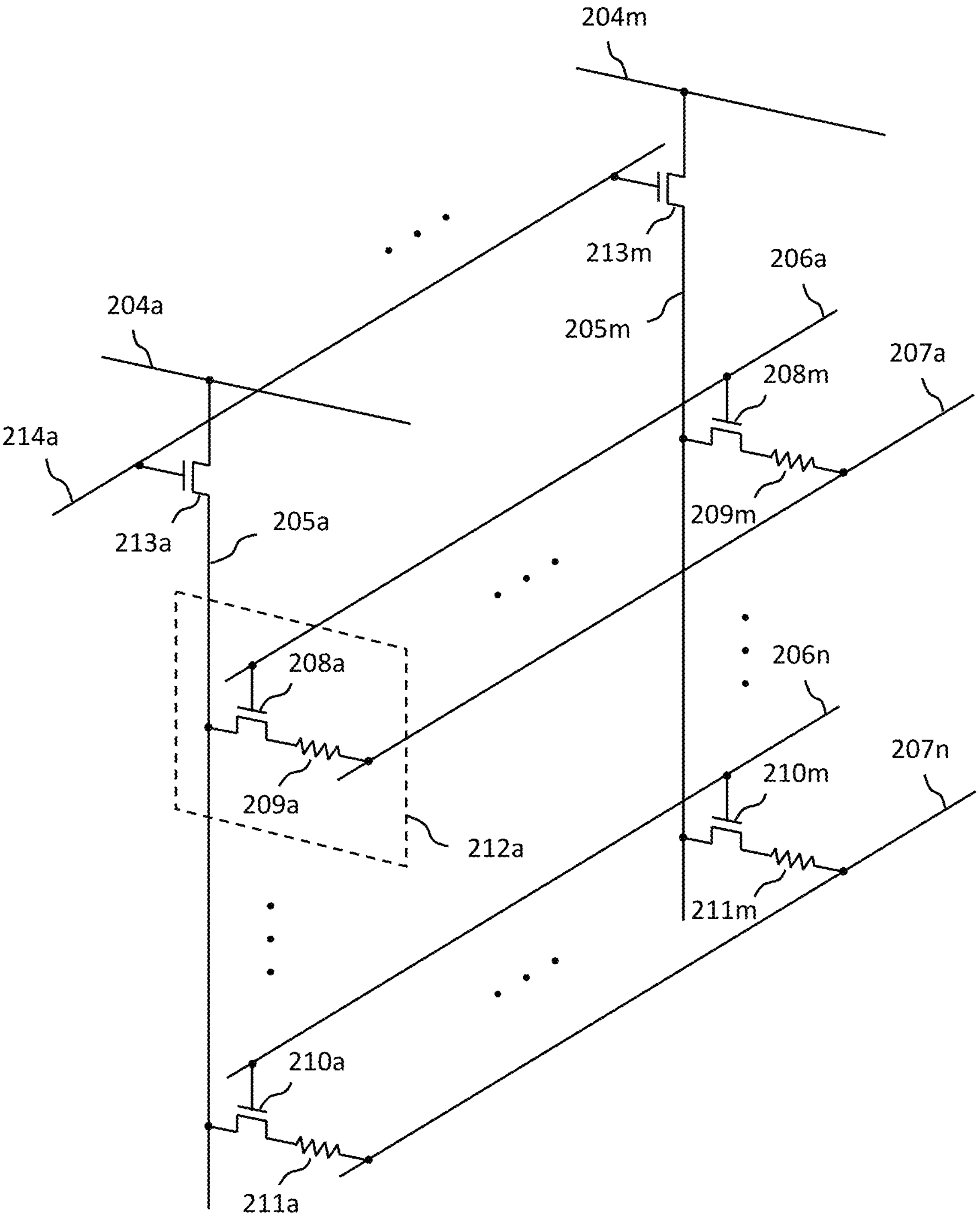
FIG. 27 shows an embodiment of a neural network array using the 3D cell structure shown in FIGS. 26A-D.

FIG. 27 shows an embodiment of a neural network array using the 3D cell structure shown in FIGS. 26A-D. This embodiment is similar to the embodiment shown in FIG. 14B except that the cell structures are different. The array shown in FIG. 27 includes multiple horizontal bit lines 204*a-m* that connect to input neuron circuits (not shown). The horizontal bit lines 204*a-m* are located on top of the array or at the bottom of the array. The horizontal bit lines 204*a-m* are connected to multiple vertical bit lines 205*a-m* through bit line select gates 213*a-m*. The gates of the bit line select gates 213*a-m* are connected to a select gate line 214*a*.

Each vertical bit line such as 205*a* is connected the multiple source lines 207*a-n* through cells, such as cell 212*a*. Each cell, such as cell 212*a* comprises a cell transistor 208*a* and a resistive memory element 209*a*. The cell transistor 208*a* is connected to a word line, such as word lines 206*a-n*. The resistive memory element, such as element 209*a* represents the 'weight' of the cell 212*a*.

Figure 28A:
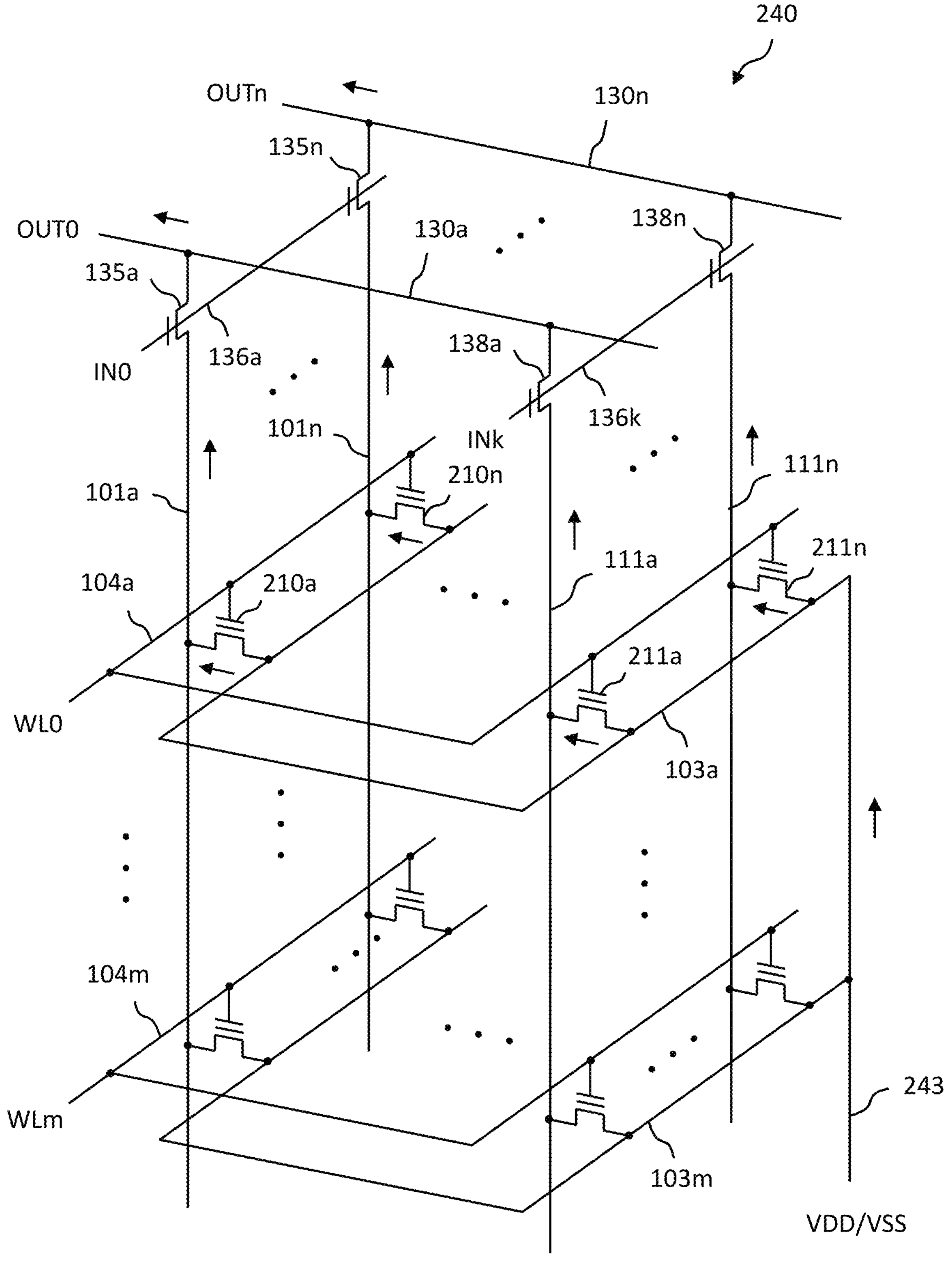
FIG. 28A shows an embodiment of a 3D array structure for in-memory-computing or neural network applications according to the invention.

FIG. 28A shows an embodiment of a 3D array structure 240 for in-memory-computing or neural network applications according to the invention. The structure 240 represents a basic unit of the 3D array structure. This embodiment is similar to the embodiment shown in FIG. 18A except that the inputs IN (0-k) are applied to the select gate lines 136*a-k* instead of to the bit lines 130*a-n*. The common source line 243 is connected to a voltage source, such as VDD or VSS 0V, for example.

It will be assumed that the common source line 243 is connected to VDD. During operations, one of the word lines 104*a-m* may be selected. Assuming the word line 104*a* is selected, it will be supplied with a voltage to turn on the cells 210*a-n* and 211*a-n* to allow current to flow from the common source line 243 through the cells 210*a-n* and 211*a-n* to the vertical bit lines 101*a-n* and 111*a-n*, respectively. The current flowing through the cells 210*a-n* and 211*a-n* is determined by the threshold voltage of the cells.

Depending on the input data IN0 to INK applied to the select gate lines 136*a-k*, the select gates 135*a-n* and 138*a-n* are turned on or turned off to pass the current from the vertical bit lines 101*a-n* and 111*a-n* to the horizontal bit lines 130*a-n*. Then, the sum of the current is applied to the output circuits not shown connected to the horizontal bit lines 130*a-n*. The arrows show the direction of the current flow.

Figure 28B:
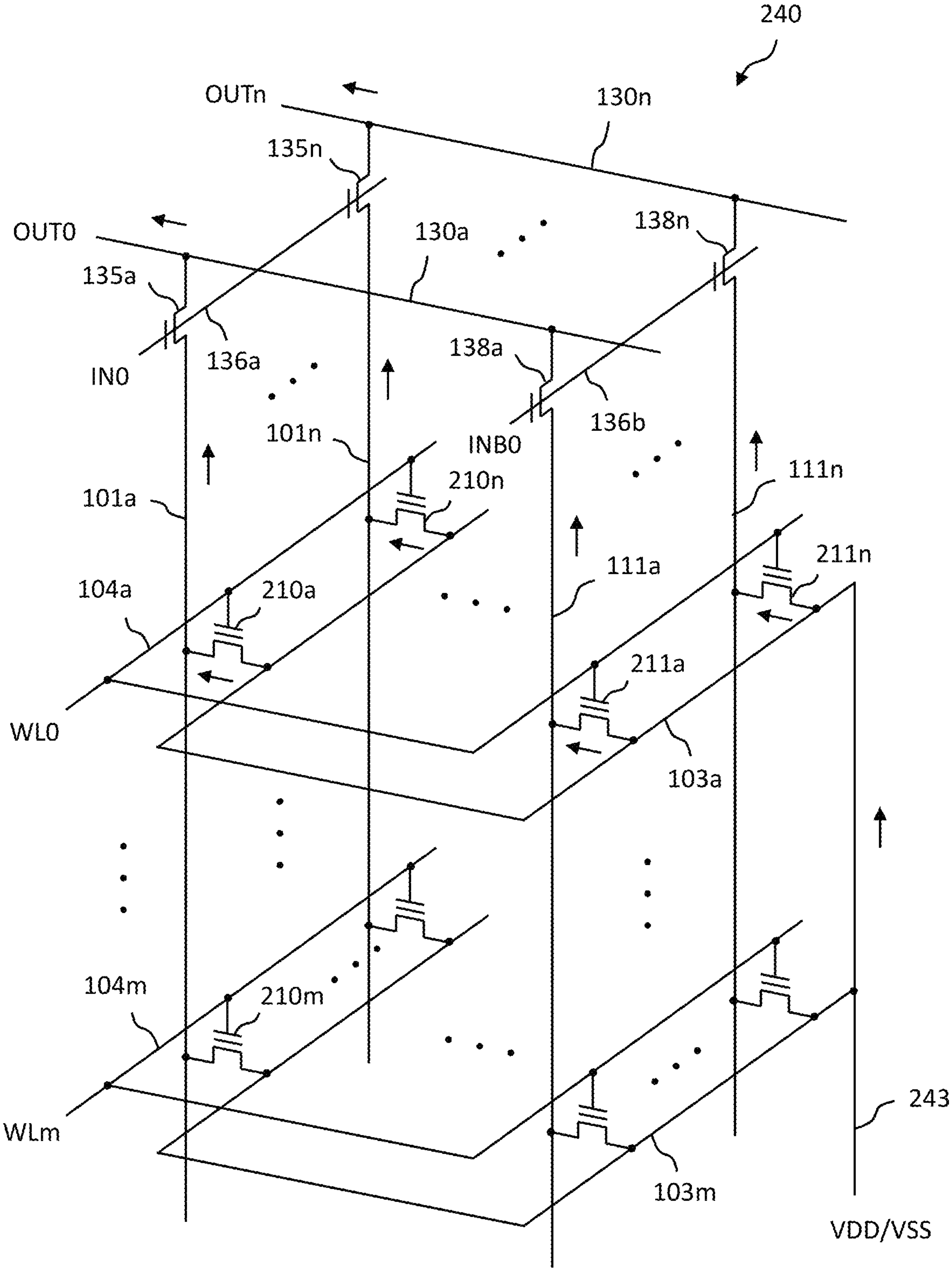
FIG. 28B shows an embodiment of a 3D array structure that illustrates how select gates lines are divided into two groups.
Figure 28C:
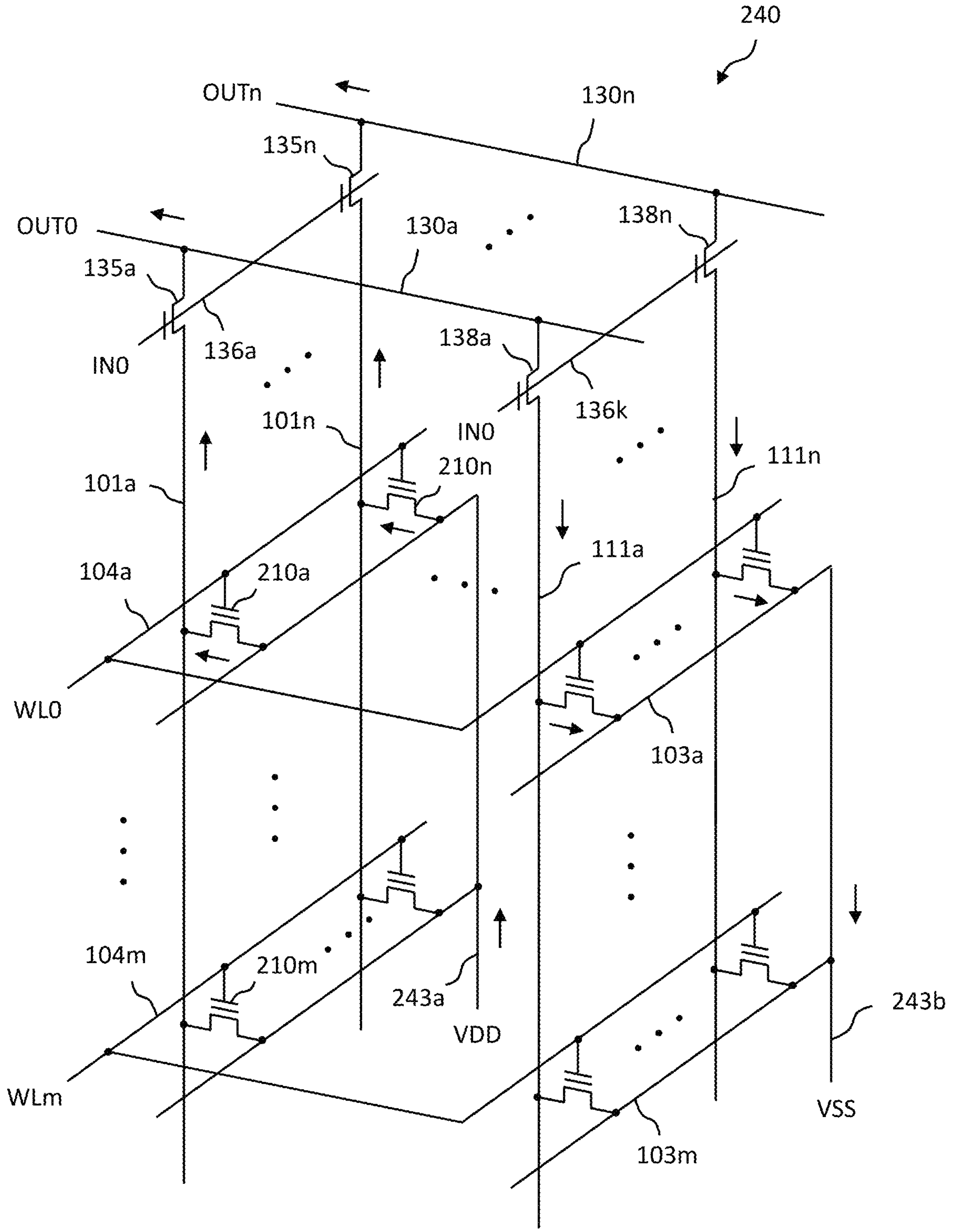
FIGS. 28C-D shows embodiments of 3D arrays that implement negative weight according to the invention.
Figure 28D:
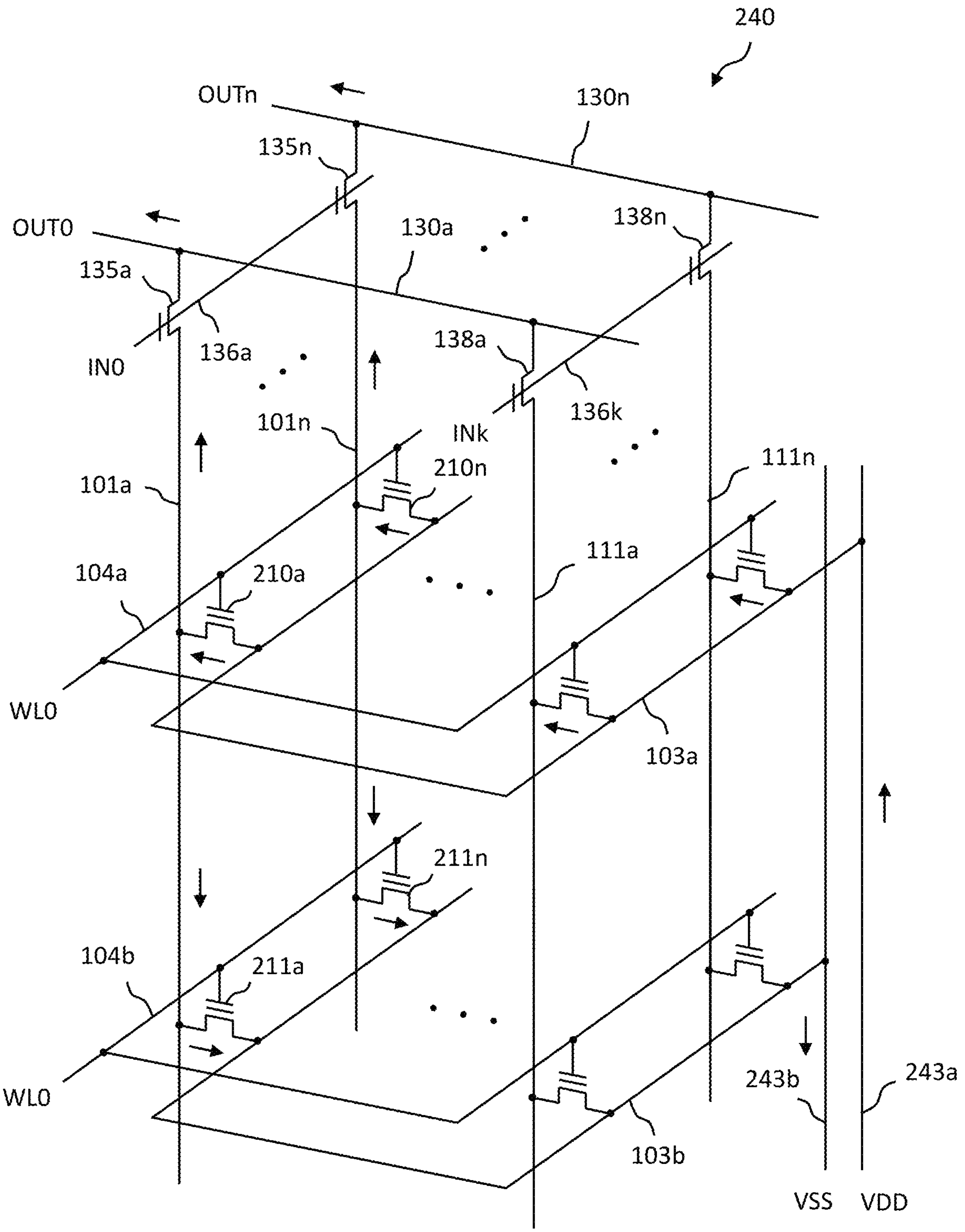

The embodiment shown in FIG. 28A implements 'positive weights' while the embodiments shown in FIGS. 28B-D implement 'negative weights.'

FIG. 28B shows an embodiment that illustrates how the select gates lines may be divided into two groups. For illustration, only two select gate lines 136*a-b* are shown for this example. The first group of the select gate lines, such as select gate lines 136*a* are supplied with the input data, such as input data IN0. The second group of the select gate lines, such as select gate lines 136*b* are supplied with the complementary input data INB0. The common source line 243 is connected to a voltage source, such as VDD or VSS, for example.

If the input data IN0 is 1, it turns on the select gates 135*a-n* to allow current to flow from the common source line 243*a* through the cells 210*a-n* to the vertical bit lines 101*a-n* and then through the select gates 135*a-n* to the horizontal bit lines 130*a-n*. Assuming the common source line 243 is connected to VDD, this will pull high the voltage of the horizontal bit lines 130*a-n*. Therefore, the cells 210*a-n* represent 'positive weights.'

If the input data IN0 is 0, the complementary input data INB0 will be 1. This configuration will turn on the select gates 138*a-n* to allow current to flow from the common source line 243 through the cells 211*a-n* to the vertical bit lines 111*a-n* and then through the select gates 138*a-n* to the horizontal bit lines 130*a-n*. Therefore, the cells 211*a-n* represent 'negative weights.'

FIG. 28C shows an embodiment of a 3D array according to the invention for negative weight implementation. This embodiment is similar to the embodiment shown in FIG. 28B except that the same input data, such as input data IN0 is applied to the two groups of the select gate lines such as 136*a* and 136*b*. Therefore, when the input data IN0 is 1, it will turn on the select transistors of the two groups such as 135*a-n* and 138*a-n*.

The common source lines are also divided into two groups, such as groups 243*a* and 243*b*, and are connected to voltage sources, such as VDD and VSS 0V, respectively. The current flowing from the common source line 243*a* through the cells 210*a-n* to the horizontal bit lines 130*a-n* pull high the voltages of the horizontal bit lines 130*a-n*. Therefore, the cells 210*a-n* represent 'positive weights.' The current flowing from the common source line 243*b* through the cells 211*a-n* to the horizontal bit lines 130*a-n* pull low the voltages of the horizontal bit lines 130*a-n*. Therefore, the cells 211*a-n* represent 'negative weights.'

FIG. 28D shows an embodiment of the 3D array according to the invention for negative weight implementation. This embodiment is similar to the embodiment one shown in FIG. 28A except that two word lines, such as word lines 104*a* and 104*b* are selected together. For illustration, only two word lines 104*a* and 104*b* are shown for an example. The even source lines, such as source line 103*a*, and the odd source lines, such as source line 103*b* are connected to common source lines 243*a* and 243*b*, respectively. The common source lines 243*a* and 243*b* are connected to voltage sources such as VDD and VSS (0V), respectively.

The input data IN0 to INK are applied to the select gate lines 136*a-k*. Assuming the input data IN0 is 1, it may turn on one or more of the select gates 135*a-n*. When two word lines such as 104*a* and 104*b* are selected, both the word lines 104*a* and 104*b* are supplied with a voltage to turn on the cells 210*a-n* and 211*a-n*. Because the cells 210*a-n* are connected to the common source line 243*a*, the current flowing from the common source line 243*a* through the cells 210*a-n* pulls high the voltages of the horizontal bit lines 130*a-n*. Therefore, the cells 210*a-n* represent 'positive weights.' To the contrary, the current flowing from the common source line 243*b* through the cells 211*a-n* to the horizontal bit lines 130*a-n* pulls low the voltages of the horizontal bit lines 130*a-n*. Therefore, the cells 211*a-n* represent 'negative weights.'

Although the embodiments shown in FIGS. 21A-D use NOR-type flash memory cells for example, it is obvious that all the embodiments can be applied to other memory cell structures, such as floating-body cell (FBC), Ferroelectric random-access memory (FRAM), resistive random-access memory (RRAM), phase change memory (PCM), magneto-resistive random-access memory (MRAM), memristor-transistor (memtransistor), and split-gate NOR flash memory. The array structure and the operation may be slightly modified according to the type of the memory cells, but these applications and modification shall remain in the scope of the invention.

Figure 29A:
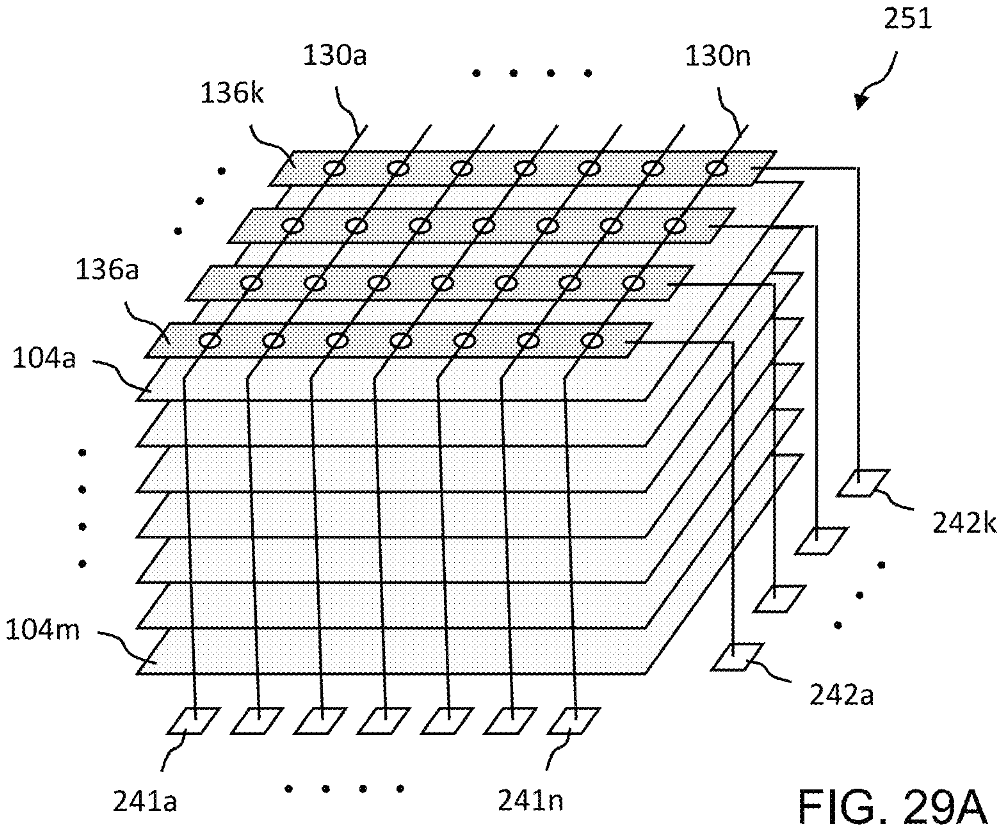
FIG. 29A shows an embodiment of a 3D array structure based on a circuit embodiment shown in FIGS. 28A-D.

FIG. 29A shows an embodiment of a 3D array structure 251 using the circuit embodiment shown in FIG. 28A-D. The select gate lines 136*a-k* are connected to the input circuits 242*a-k*. The bit lines 130*a-n* are connected to the output circuits 241*a*-1. The word lines 104*a-m* are connected to word line decoders not shown. The input circuits 242*a-k*, output circuits 241*a-n*, and the word line decoders not shown are located under the 3D array to reduce the die size.

Figure 29B:
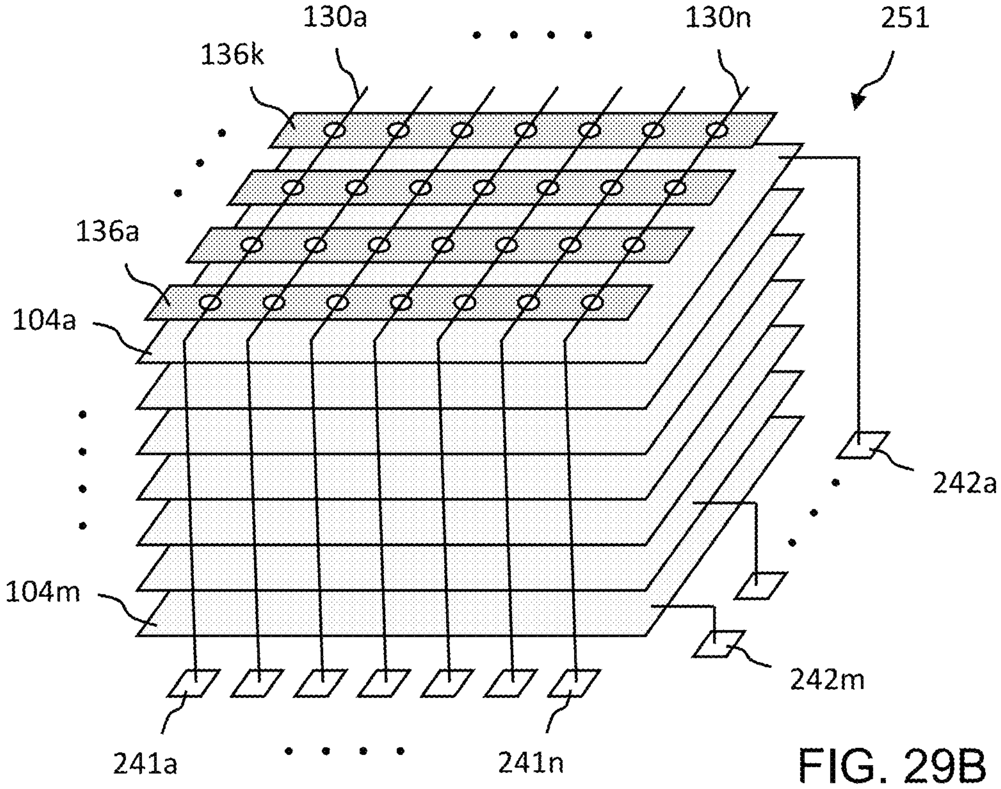
FIG. 29B shows another embodiment of the 3D array structure according to the invention.

FIG. 29B shows another embodiment of the 3D array structure 251. In this embodiment, the word lines 104*a-m* are connected to the input circuits 242*a-k*. The bit lines 130*a-n* are connected to the output circuits 241*a*-1. The select gate lines 136*a-k* are connected to select gate decoders not shown. In one embodiment, the input circuits 242*a-k*, output circuits 241*a-n*, and the select gate decoders not shown are located under the 3D array to reduce the die size.

Figure 30A:
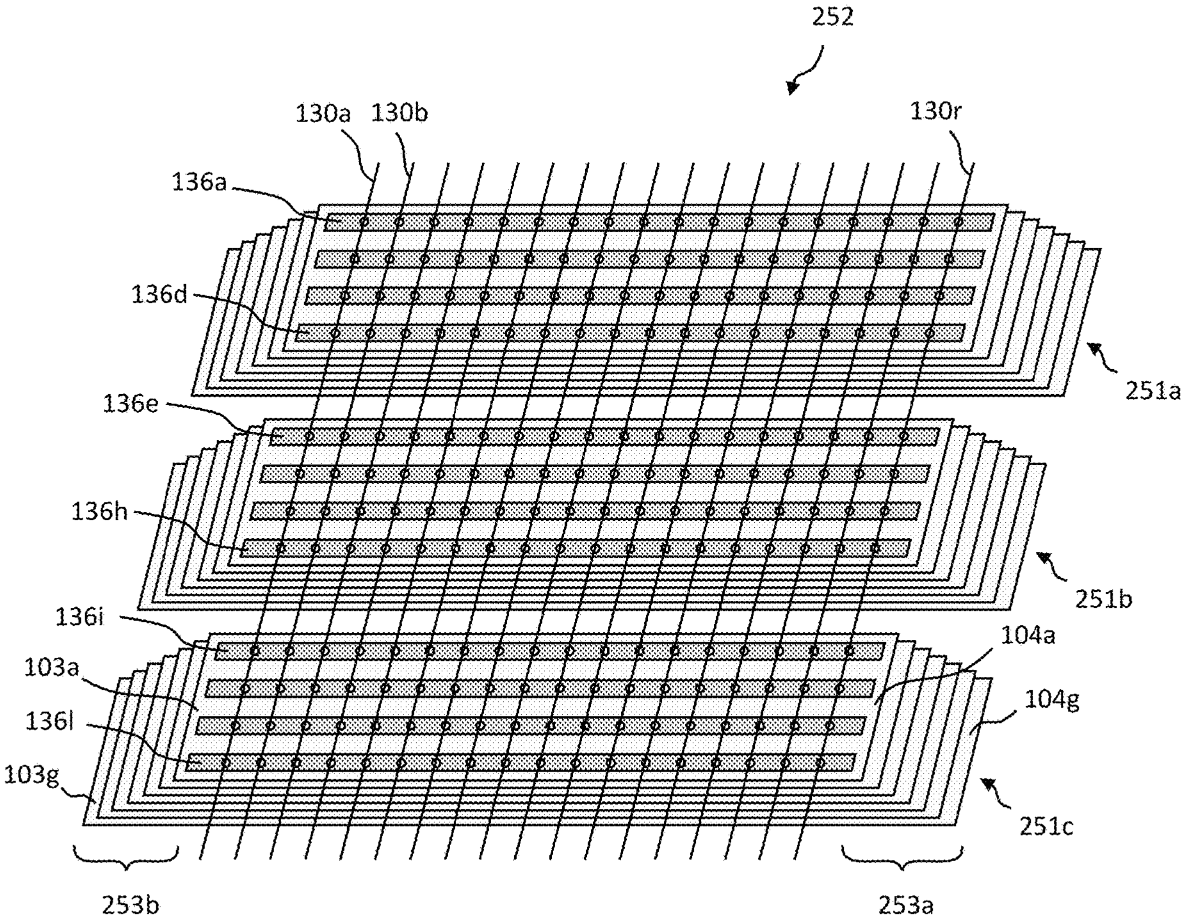
FIG. 30A shows an embodiment of a 3D array structure according to the invention.

FIG. 30A shows an embodiment of a 3D array structure 252 according to the invention. The 3D array 252 comprises multiple 3D arrays structures 251*a-c* as shown in FIG. 29A-B. The number of the 3D arrays 251*a-c* shown in FIG. 30A is just an example and not limiting. The 3D array structure 252 comprises any suitable number of the 3D array 251, for example, as shown by 3D arrays 251*a-c*.

The array 252 shown in FIG. 30A includes horizontal bit lines 130*a-r*, word line layers 104*a-g*, and select gate lines 136*a-l* that are connected to select gates 135*a-n* to 138*a-n* as shown in FIG. 28A. The staircase structures 253*a* and 253*b* are formed on word line layers 104*a-g* and source line layers 103*a-g*, respectively. The word lines layers 104*a-g* and the source line layers 103*a-g* are connected to circuits not shown located under the 3D array through the contacts connected to the staircase structures 205*a* and 205*b*, respectively.

Figure 30B:
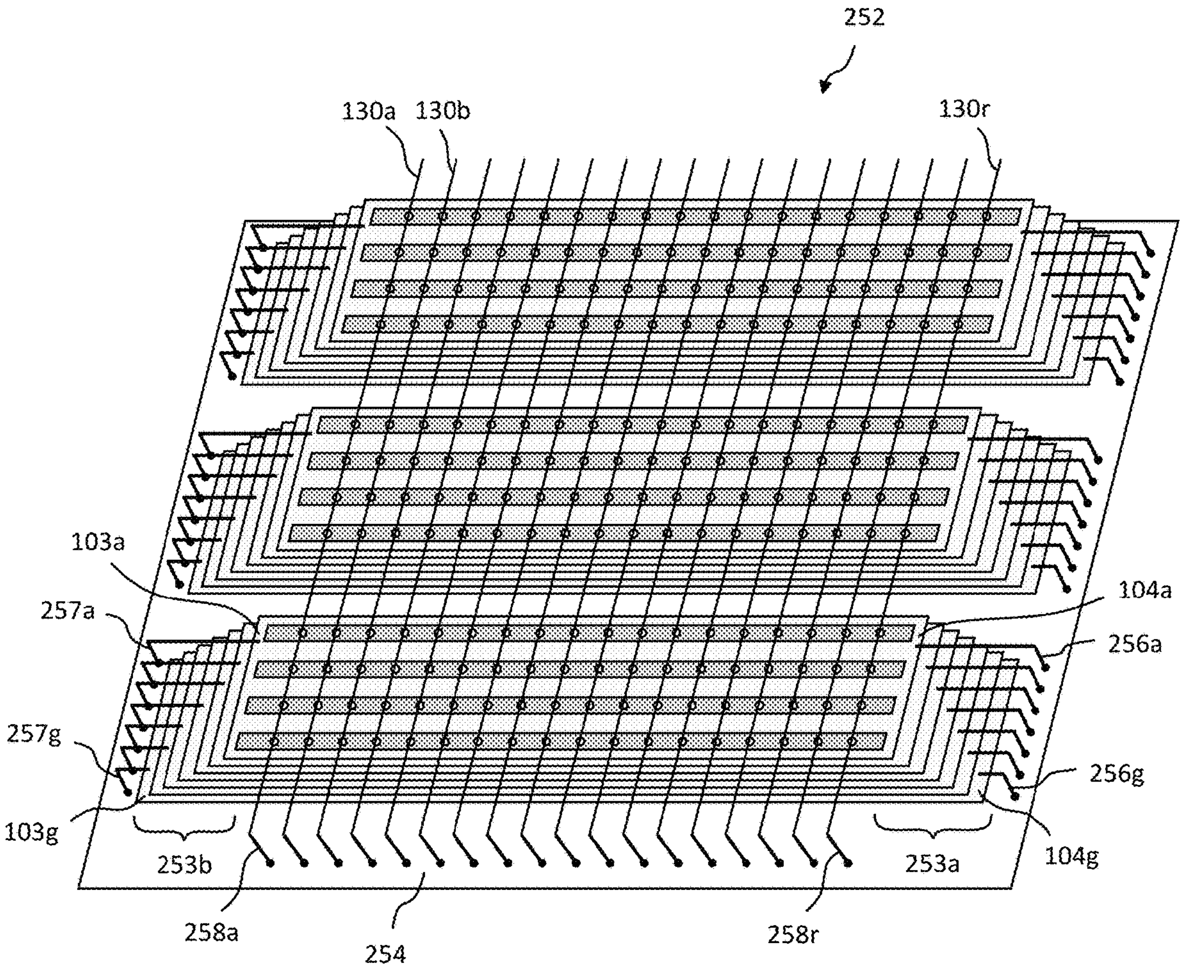
FIG. 30B illustrates how word line layers and source line layers are connected to circuits located under a 3D array to reduce die size.

FIG. 30B illustrates how the word line layers 104*a-g* and the source line layers 103*a-g* are connected to circuits 254 located under the 3D array to reduce the die size. The circuits 254 and the 3D array are separated by insulating layers, comprising material such as oxide material. The word line layers 104*a-g* in the staircase structure 253*a* are connected to the word line control circuits, such as word line drivers or word line decoders located in 254 through contacts 256*a-g* and metal lines. The source line layers 103*a-g* in the staircase structure 253*b* may be connected to the source line control circuits such as source line drivers or source line decoders located in the circuit 254 through contacts 257a-g and metal lines. The horizontal bit lines 130a-r may be connected to the bit line control circuits such as sense amplifiers and data read/write buffers located in the circuits 254 through contacts 258a-r. The contacts 256a-g, 257a-g, and 258a-r are formed by using a deep trench process to form holes in the insulating layers, and then filling the holes with conductor material, such as metal.

Figure 31:
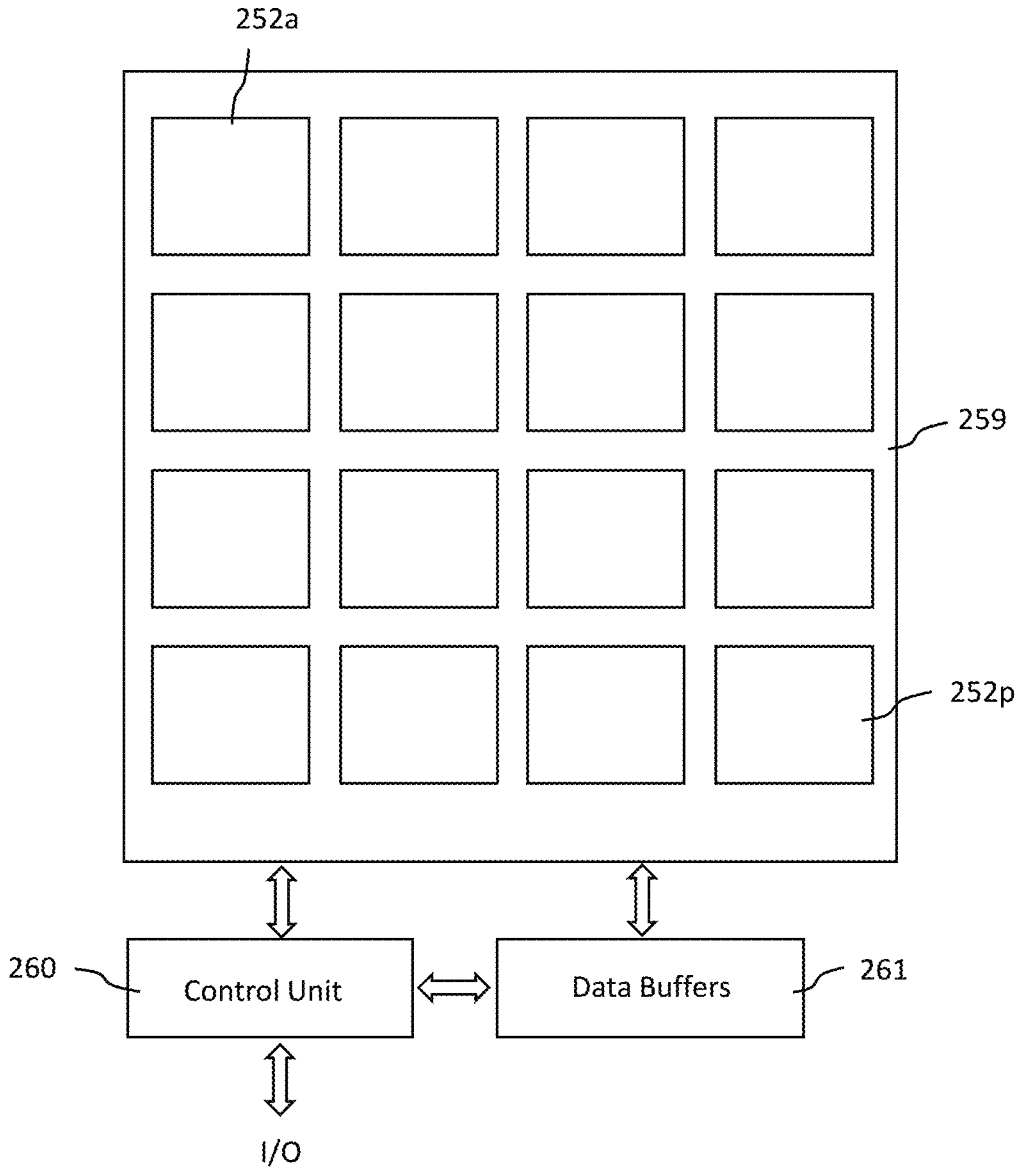
FIG. 31 shows an embodiment of a 3D memory chip, 3D in-memory-computing chip, or 3D artificial intelligence AI chip according to the invention.

FIG. 31 shows an embodiment of a 3D memory chip or 3D in-memory-computing chip or 3D artificial intelligence AI chip according to the invention. The chip comprises one or multiple arrays 259. The array 259 comprises multiple 3D array structures 252a-p as shown in FIG. 30B. A control unit 260 comprises control logic, a central processing unit CPU or a state machine, data buffers, input/output I/O buffers, timing control units, voltage control units, error correction code ECC circuits, address mapping unit, read and write algorithm units, and/or any other circuits. The control unit 260 communicates with the external system through an input/output I/O bus, and transfer data to and from the data buffers 261. The data buffers 261 are connected to the data read/write circuits of each of the 3D array structures 252a-p through the internal data bus.

Various 3D neural network arrays constructed according to the invention are implemented as 'digital' neural networks or 'analog' neural networks. Referring to the embodiment shown in FIG. 28A as an example of a digital neural network, the data stored in the memory cells, such as cells 210a-n, are digital data having values such as 1 and 0. For analog neural networks, the data stored in memory cells, such as cells 210a-n comprises analog values.

Figure 32A:
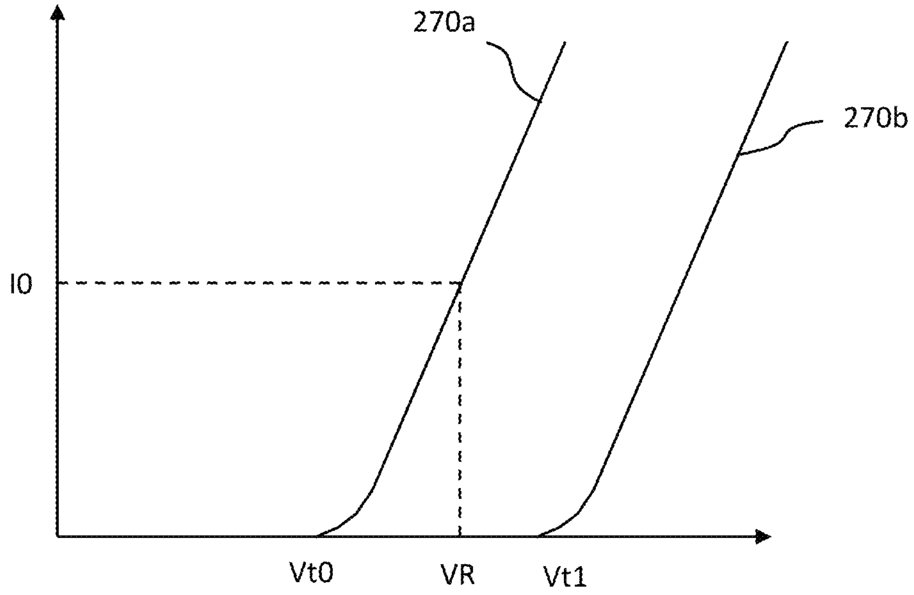
FIG. 32A shows an embodiment of I-V (current-voltage) curves associated with digital neural networks.

FIG. 32A shows an embodiment of I-V (current-voltage) curves associated with digital neural networks. The cells of the network may be written using two threshold voltage levels Vt0 and Vt1, as shown by plots 270a and 270b. During read operations, the selected cell is supplied with a read voltage VR between Vt0 and Vt1. If the Vt of the cell is Vt0, it will turn on the cell to conduct a cell current, I0, to represent data '0'. If the Vt of the cell is Vt1, the cell will be turned off and conduct zero current to represent data '1'.

Figure 32B:
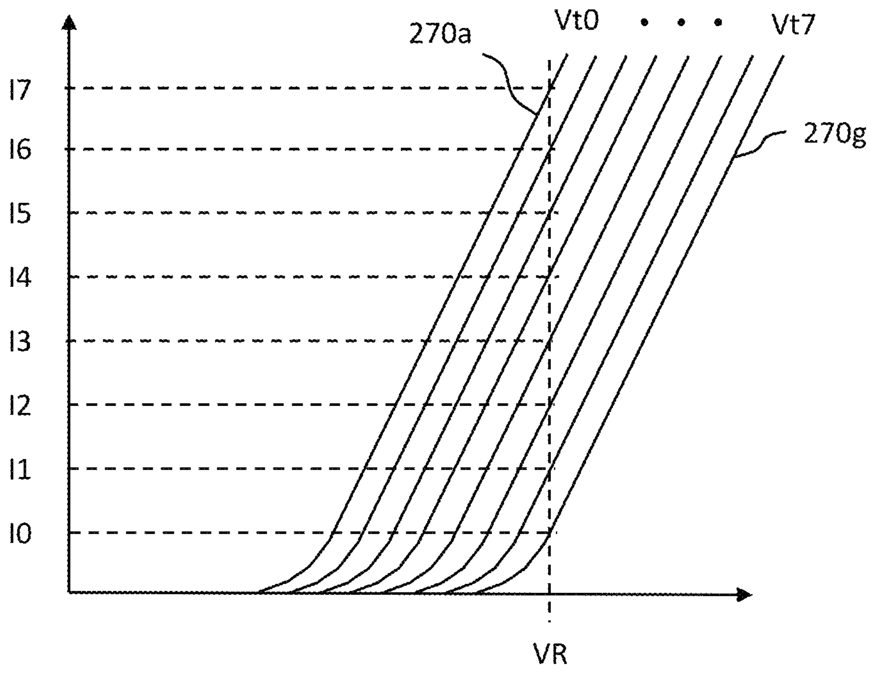
FIG. 32B shows an embodiment of I-V curves associated with analog neural networks.

FIG. 32B shows an embodiment of I-V curves associated with analog neural networks. The cells of the network may be programmed to different threshold voltages Vt0-Vt7, as shown by plots 270a-g. For demonstration, eight Vt levels are used as an example in FIG. 32B. It is obvious that any other suitable number of Vt levels may be used. During read operations, the word line is supplied with the proper voltage such as VR. This will turn on the cell and cause the cell to conduct different currents I0-I7 according to the Vt level of the cell. Therefore, the output current of the cell represents an analog value. This embodiment can be implemented by non-volatile memories such as flash memory, Ferroelectric random-access memory (FRAM), resistive random-access memory (RRAM), phase change memory (PCM), magneto-resistive random-access memory (MRAM), memristor-transistor (memtransistor), and other types of memories.

Figure 32C:
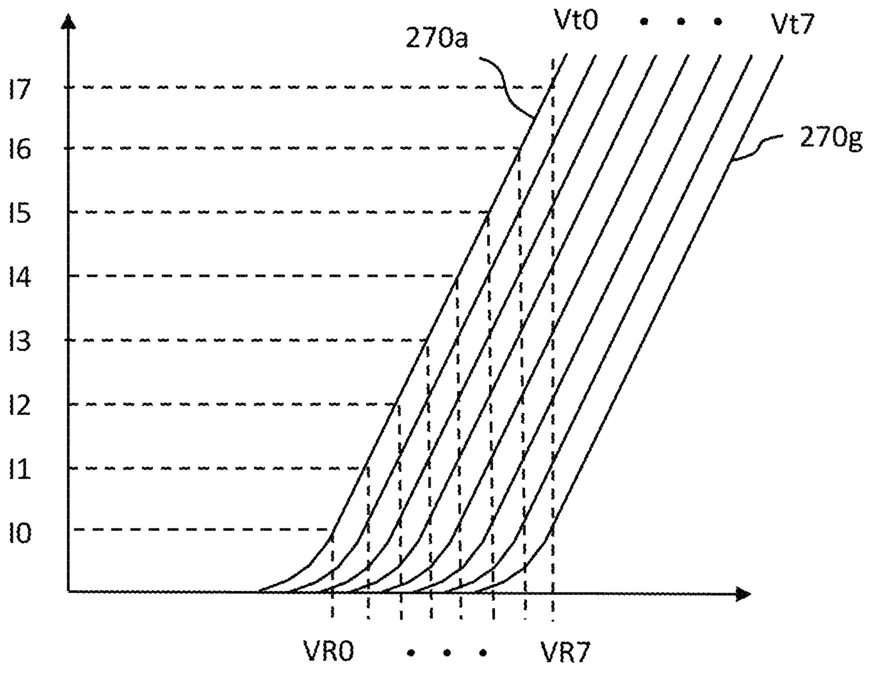
FIG. 32C shows an embodiment of I-V curves associated with analog neural networks.

FIG. 32C shows an embodiment of I-V curves associated with analog neural networks. The word line is supplied with analog input voltages VR0-VR7 as shown FIG. 32C. This will turn on the cells to generate analog output current. For example, for the cell with threshold voltage Vt0 270a, applying analog input voltages VR0-VR7 will cause the cell to generate output currents I0-I7.

Figure 32D:
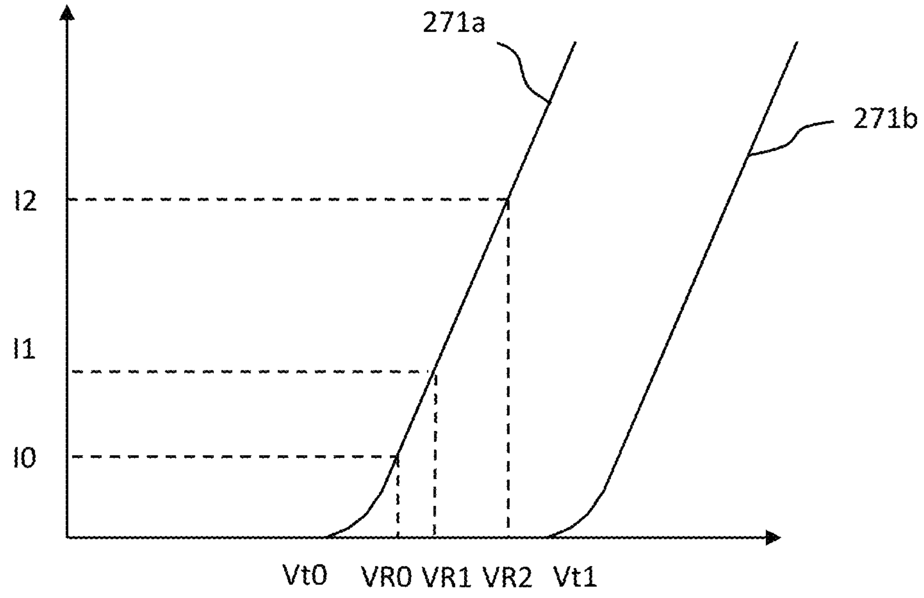
FIG. 32D shows an embodiment of an analog neural network using memory cells that can only store two Vt levels.

FIG. 32D shows another embodiment of implementing analog neural network using memory cells that can only store two Vt levels Vt0 and Vt1, as shown by plots 271a and 271b. This embodiment may be implemented floating body cell (FBC) or non-volatile memory cells mentioned above. Referring to the 3D neural network array shown in FIG. 21A, in this embodiment, the word line layers 104a-m may be divided into groups. Each group may consist of three word line layers such as 104a to 104b for three bits of data. For demonstration, three bits of data are used as an example. It is obvious that any other suitable number of bits may be used. Referring to FIG. 25D, during read operations, the three word line layers 104a to 104b of the selected group may be applied with different voltages VR0-VR2. This will cause the cell with Vt0 271a to conduct currents I0-I1, respectively. The voltages VR0-VR2 are properly selected so that they will cause that I2 is two times of I1, and I1 is two times of I0. Therefore, the current I0, I1, and I2 will represent the current of 20, 21, and 22 bits. If the selected cell is Vt1 271b, the cell current will be zero. By using this way, the three selected cells on the word line layers 104a to 104b will generate an analog current according to the three-bit data stored in the cells.

FIGS. 33A-D shows embodiments of output neuron circuits, such as the circuits 241a-p shown in FIGS. 19A-20D.

Figure 33A:
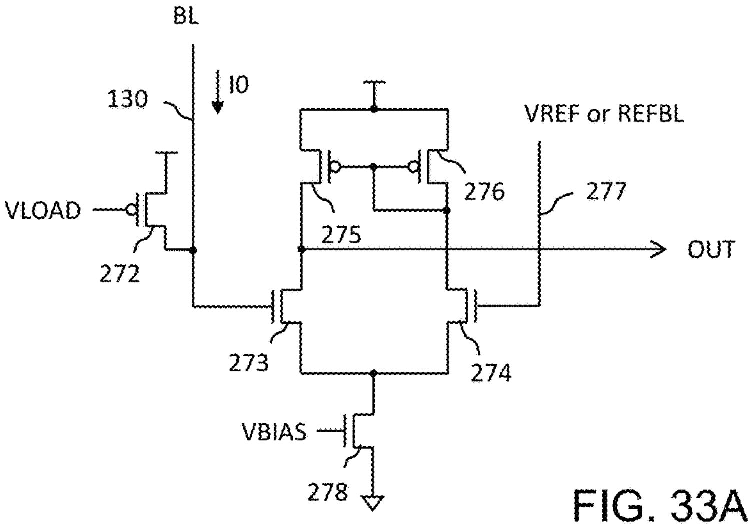
FIGS. 33A-D shows embodiments of output neuron circuits.

FIG. 33A shows an embodiment of an output neuron circuit that takes analog input current, I0, and generate analog output voltage, OUT. The devices 275, 276, 273, 274, and 278 form a comparator. The devices 273 and 274 are the input devices of the comparator.

The bit line 130 is connected to the gate of the input device 273 of the comparator. The input voltage of the input device 273 is determined by the ratio of the cell current, I0, from the bit line 130 and the loading current of the device 272. The gate of the loading device 272 is connected to a constant voltage, VLOAD, to generate a constant loading current. The gate of another input device 274 is connected to a reference voltage, VREF, or a reference bit line, REFBL. The comparator will compare the input voltages of the input devices 273 and 274 to generate an analog output voltage, OUT.

Figure 33B:
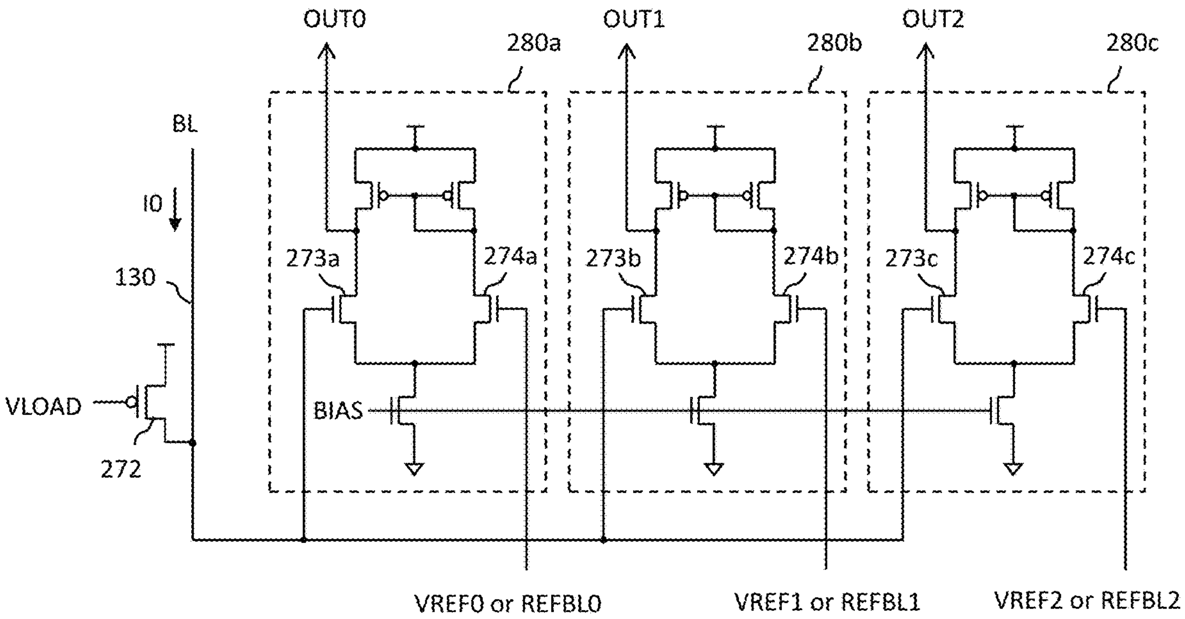

FIG. 33B shows an embodiment of an output neuron circuits, such as circuits 241a-p shown in FIGS. 19A-20D. This embodiment is similar to the embodiment shown in FIG. 33A except that the bit line 130 is connected to the input devices 273a-c of three comparators 280a-c. The gates of the other input devices 274a-c of the three comparators 280a-c are connected to three reference voltages, VREF(0-2), or three reference bit lines, REFBL(0-2), respectively. The three comparators 280a-c form an ADC analog-to-digital converter to convert the analog input current from the bit line 130 to three-bit output voltage data, OUT(0-2).

Figure 33C:
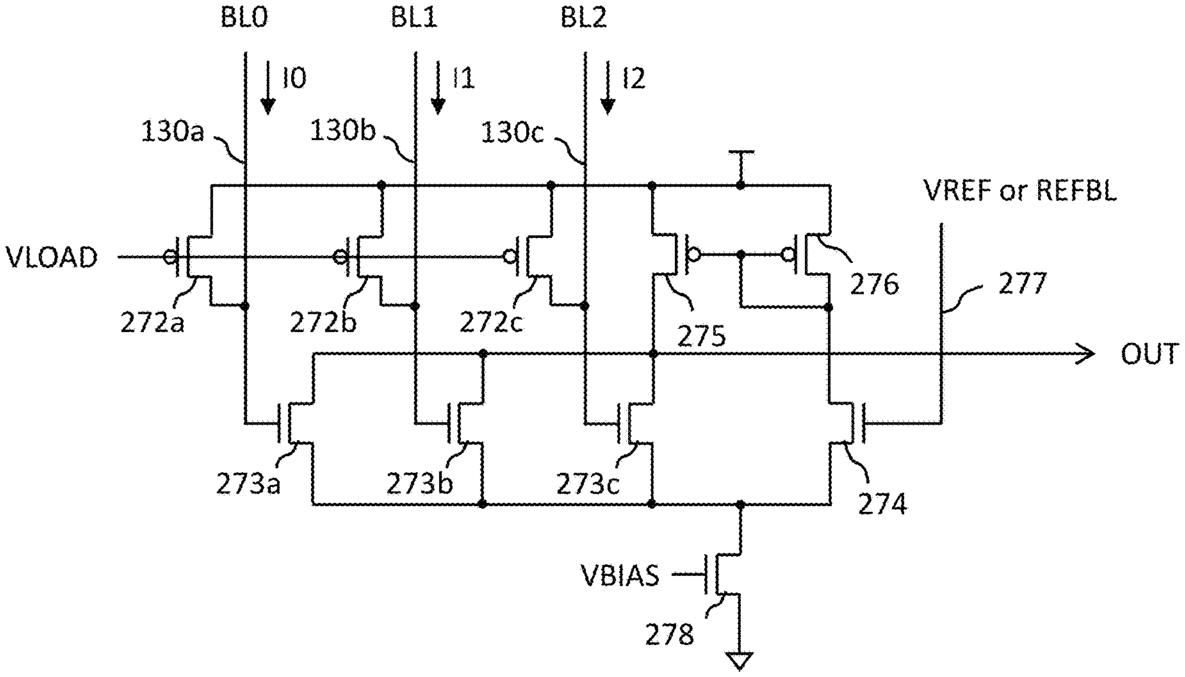

FIG. 33C shows an embodiment of an output neuron circuit, such as circuits 241a-p shown in FIGS. 19A-20D. This embodiment is similar to the embodiment shown in FIG. 33A except that the bit lines 130a to 130c are connected to an digital-to-analog convertor (DAC). In this embodiment, the memory cells store digital data as shown in FIG. 32A. The gates of the input devices 273a-c of the comparator are connected to three bit lines 130a-c. The three bit lines 130a-c are connected to three loading devices 272a-c. The input voltages are determined by the ratio between the cell currents, I0-I2, from the bit lines 130a-c and the loading current from the loading devices 272a-c.

The ratio of the width of the input devices 273a, 273b, and 273c is 1:2:4, respectively. This configuration will amplify the currents of I0-I2 by 1, 2, and 4 times, respectively. Therefore, the data stored in the bit lines 130a, 130b, and 130c represents the data for 20, 21, and 22 bits, respectively. The comparator will compare the inputs with the reference voltage, VREF, or reference bit line, REFBL, applied to the gate of the other input device 274 to generate an analog output, OUT.

The circuits shown on FIG. 33A-C are examples to demonstrate the operation and function of the output neuron circuits. It would be obvious to one with skill in the art that these circuits may be modified or implemented using other circuit designs. These variations and modifications shall remain in the scope of the invention.

Figure 33D:
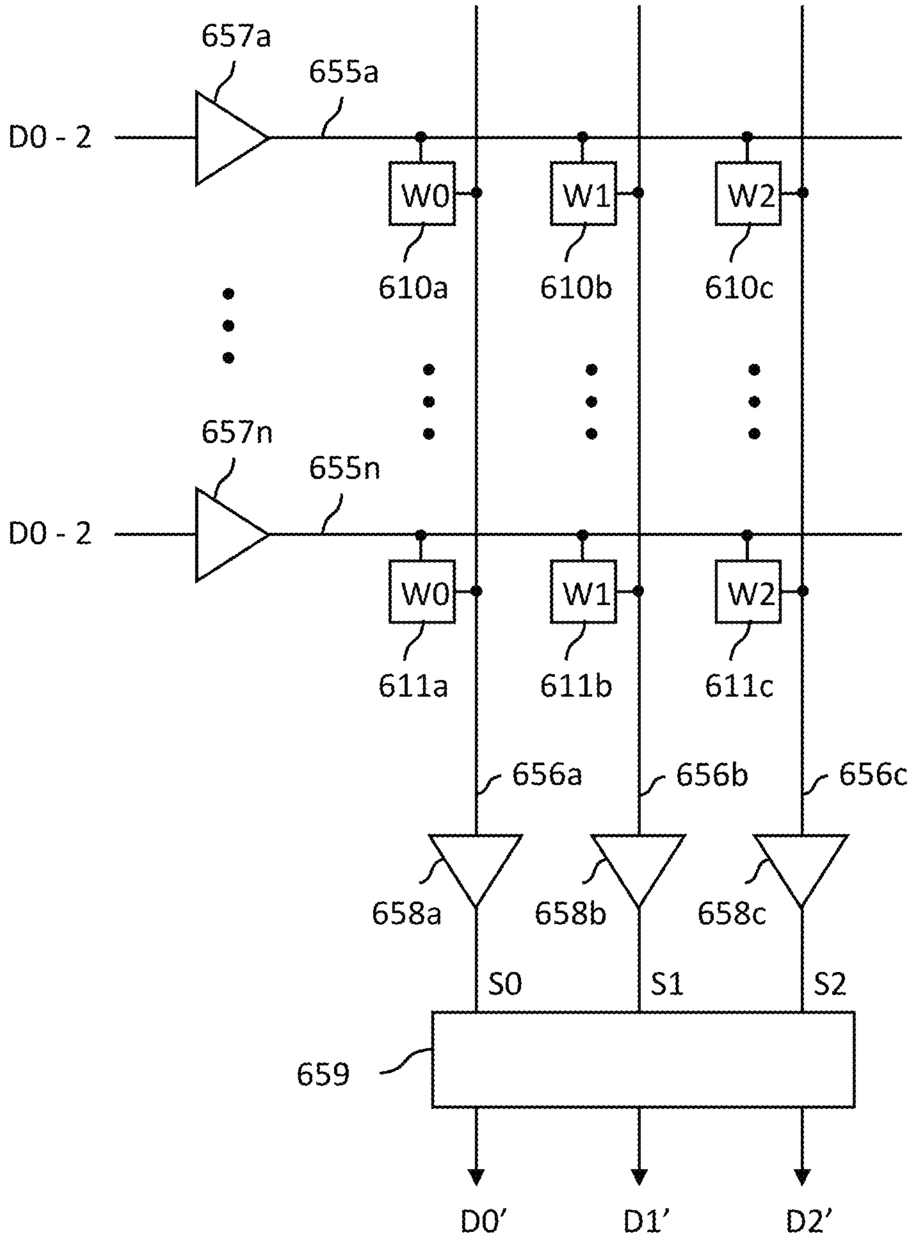

FIG. 33D shows an embodiment of one implementation of analog neural networks using digital input data and weights. This embodiment uses three digital bits D0, D1, D2 to represent eight levels of analog data and weights as an example. It will be assumed that three bits of digital weights W0, W1, W2 are stored in cells 610*a* to 610*c* and 611*a* to 611*c*, respectively. Also shown are input neuron circuits 657*a-n* or input drivers, and output neuron circuits 658*a-c*. In one embodiment, the output neuron circuits 658*a-c* are implemented by using comparators, such as comparators 233 or 234 shown in FIGS. 16A-B.

During operations, the three digital inputs D0 to D2 are sequentially fed into the input neuron circuits 657*a-n* to generate three input signals for the input lines 655*a-n*. The input signals may be a voltage level such as VR shown in FIG. 32A for data 1 and 0V for data 0. The input signals turn on or turn off the cells 610*a-c* according to the weights stored in the cells.

When D0 bit is fed to the input neuron circuits 657*a-n*, the corresponding output neuron circuit 658*a* is enabled to sense the current on the output line 656*a*. This configuration allows the output neuron circuit 658*a* to sense the current flowing through the cells 610*a* and 611*a* that store W0 to generate the output S0. Next, when the D1 bit is fed to the input neuron circuits 657*a-n*, the corresponding output neuron circuit 658*b* is enabled to sense the current on the output line 656*b*. This configuration allows the output neuron circuit 658*b* to sense the current flowing through the cells 610*a* and 611*a* that store W1 to generate the output S1. Next, when D2 bit is fed to the input neuron circuits 657*a-n*, the corresponding output neuron circuit 658*c* is enabled to sense the current on the output line 656*c*. This configuration allows the output neuron circuit 658*c* to sense the current flowing through the cells 610*a* and 611*a* that store W2 to generate the output S2. A data converter 659 converts S0-S2 to three digital output bits D0'-D2'. By using this process, analog neural networks can be implemented by using digital data and digital weights.

Figure 34A:
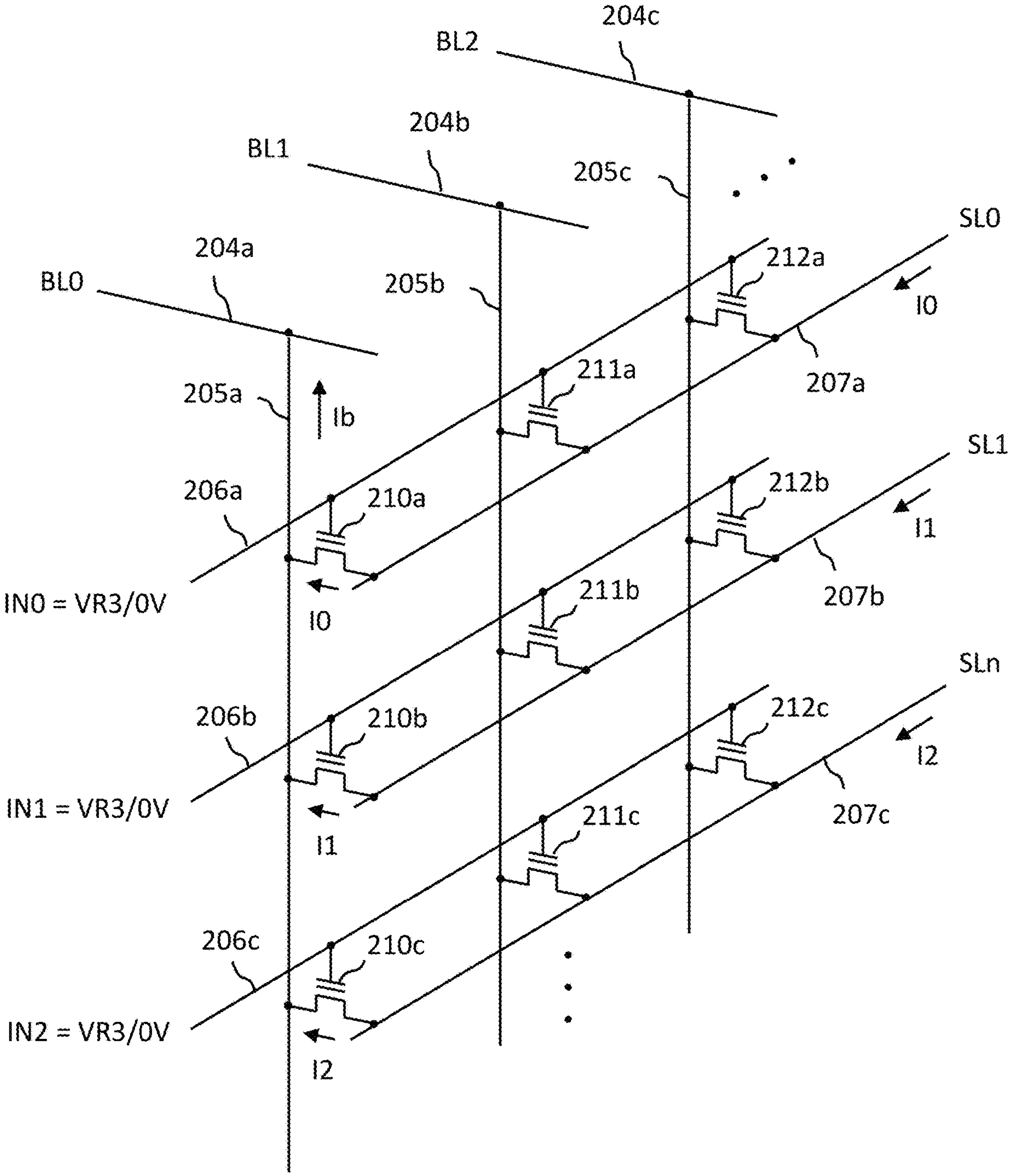
FIGS. 34A-B show embodiments of analog neural networks using memory cells that can only have two Vt levels.
Figure 34B:
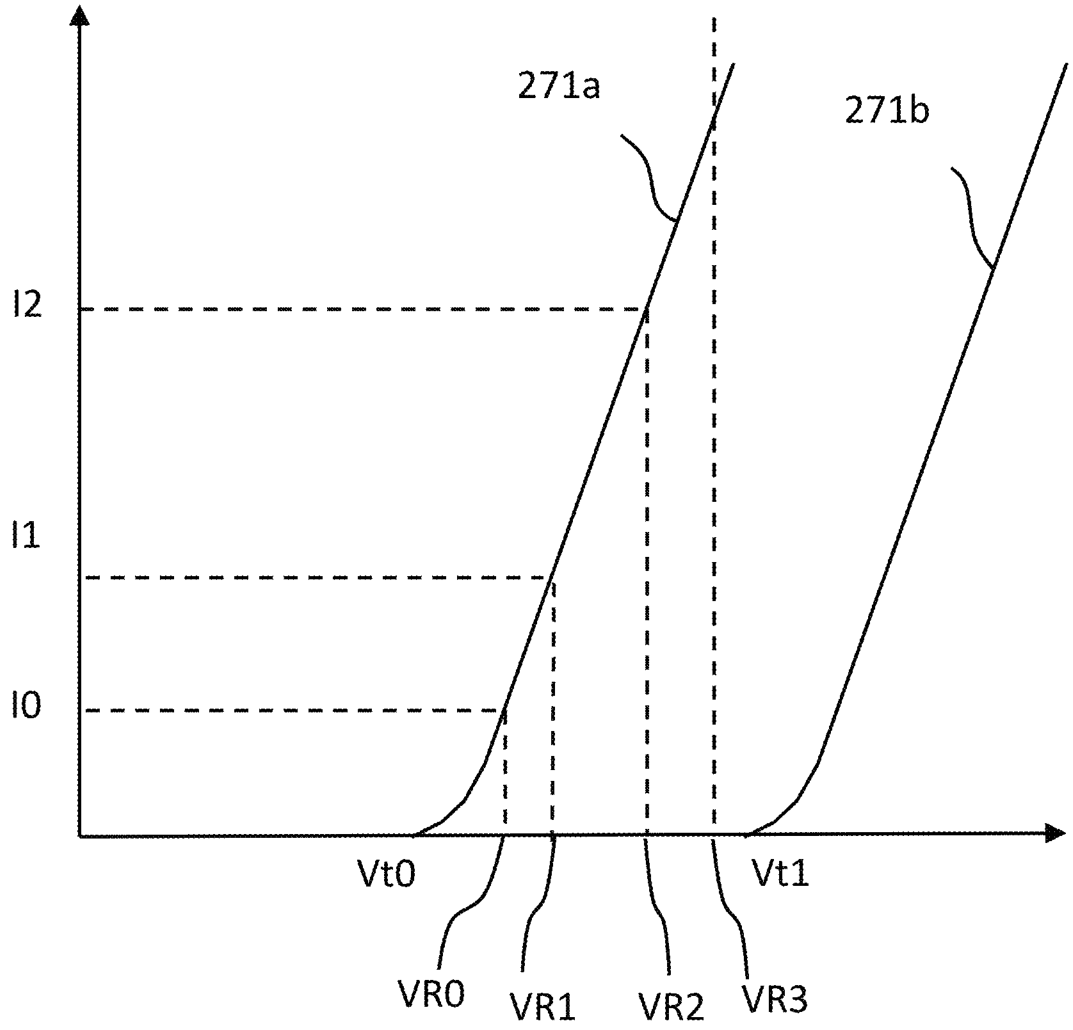

FIGS. 34A-B show embodiments implementing analog neural networks using memory cells that can only have two Vt levels, such as DRAM or floating body cells according to the invention. For illustration, an example using three data bits to represent eight analog levels is used.

FIG. 34A shows an embodiment in which the word lines 206*a-c* are connected to input neuron circuits and the bit lines 204*a-c* are connected to output neuron circuits. Assuming three memory cells 210*a-c* are used to store D0 to D1 bits, each cell stores a digital bit 1 or 0.

FIG. 34B show graphs having plots of cell current versus gate voltage. For example, the plots 271*a* and 271*b* in FIG. 34B show cell current versus gate voltage for data 1 and data 0, respectively.

Referring again to FIG. 34A, the three memory cells 210*a-c* are located in three word lines 206*a-c*. The three word lines are supplied with three inputs, IN0 to IN2, which represent three-bit data of an input signal. If the input data bit is 1, the word line will be supplied with voltage VR3 shown in FIG. 34B. If the input data bit is 0, the word line will be supplied with 0V to turn off the cell.

The three source lines 207*a-c* are supplied with three currents I0, I1, and I2, respectively. FIG. 34B shows the current levels of I0, I1, and I2, where I1 equals 2 times I0 and I2 equals 2 times I1. Therefore, I0, I1, and I2 represent three current levels for the three-bit data D0, D1, and D2.

It will be assumed that VR0, VR1, and VR2 are the gate voltage that will cause the cell to conduct current I0, I1, and I2, respectively. The voltage VR3 applied to the word lines 206*a* to 206*c* must be higher than VR2. This makes the word line voltage VR3 able to turn on the cells 210*a*-210*c* to pass the currents I0-I2.

If the data stored in the cells 210*a-c* is 1, the cells will be turned on to pass the current I0-I2 from the source lines 207*a-c* to the bit line 205*a*. If the data stored in the cells 210*a-c* is 0, the cells will be turned off. The currents passed through the cells 210*a-c* will be combined in the bit line 205*a* to form current 'Ib'. The current Ib is sent to an output neuron circuit.

Similarly, the currents I0-I2 flow through the cells 211*a-c* depending on the data stored in the cells 211*a-c* and combine in the bit line 205*b*. Similarly, the current I0-I2 flow through the cells 212*a-c*, depending on the data stored in the cells 212*a-c*, and combine in the bit line 205*c*. The bit lines 204*a-c* are connected to the output neuron circuits.

In another embodiment, the current direction is reversed to flow from the bit lines 204*a-c* to the source lines 207*a-c*. In this embodiment, the three-level currents I0, I1, and I2 are applied to three bit lines 204*a-c*, respectively. The currents will flow through the cells and combine in the source lines 207*a-c*.

Figure 34C:
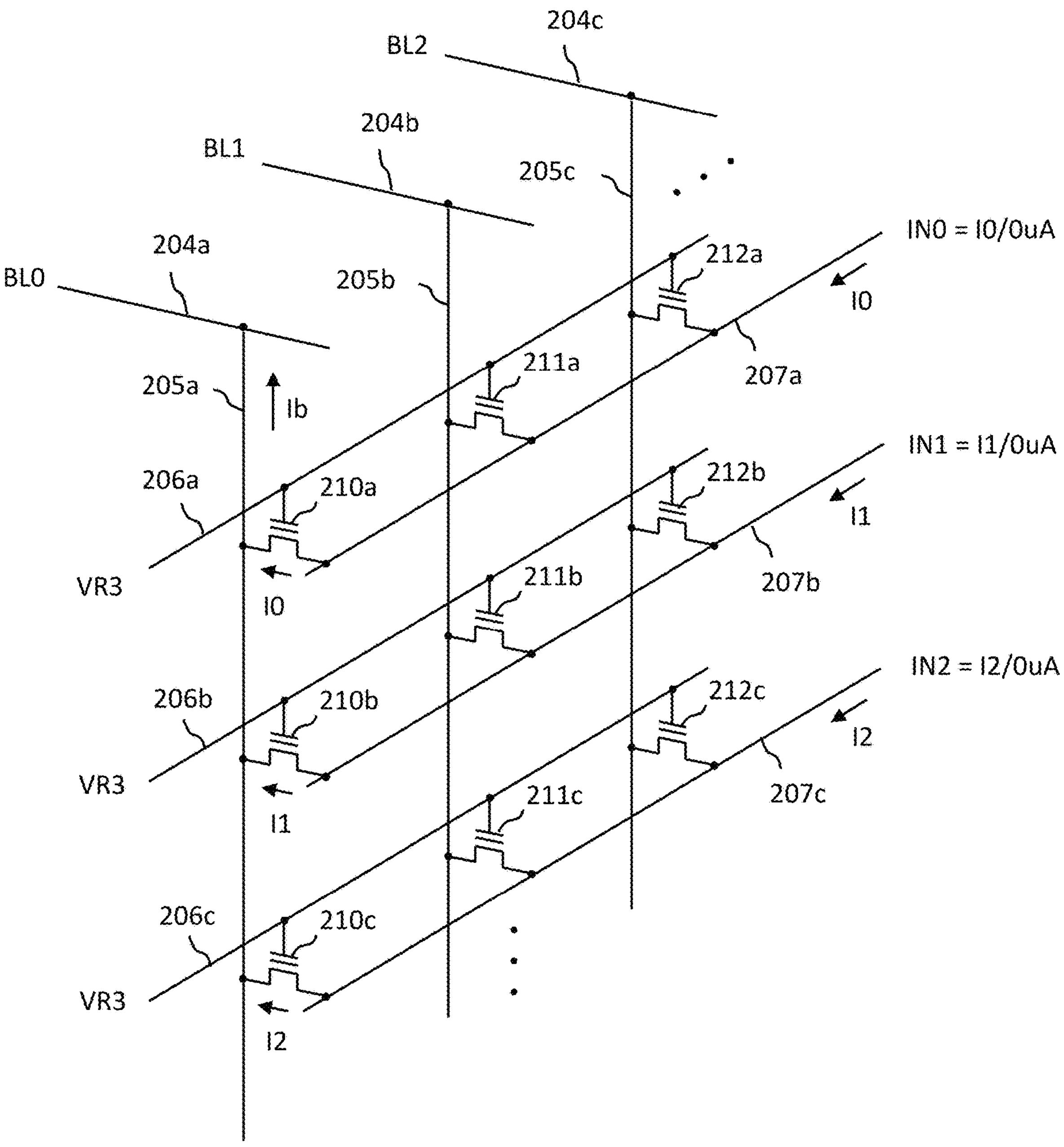
FIG. 34C shows an embodiment according to the invention.

FIG. 34C shows an embodiment according to the invention. This embodiment is similar to the embodiment shown in FIG. 34A except that the input neuron circuits are connected to the source lines 207*a-c* rather than the word lines 206*a-c*. The three source lines 207*a-c* are supplied with IN0-IN2, respectively, to represent the three-bit data of the input signal. The source lines 207*a-c* are supplied with three current levels, I0, I1, and I2, respectively. The graph in FIG. 34B shows the current levels of I0, I1, and I2. If the input data bit is 0, the source lines 207*a-c* will be supplied with zero current no current.

The three word lines 206*a-c* are supplied with voltage VR3, which is higher than VR2 as shown in FIG. 34B. Therefore, if the data stored in the cells 210*a-c* is 1, the word line voltage VR3 will turn on the cells 210*a-c* to pass the currents I0-I2 from the source lines 207*a-c* to the bit line 205*a*. If the data stored in the cells 210*a-c* is 0, the cell will be turned off. The currents passed through the cells 210*a-c* will be combined in the bit line 205*a* to form current 'Ib'. The current 'Ib' will be sent to an output neuron circuit.

Similarly, the current I0-I2 flows through the cells 211*a-c*, depending on the data stored in the cells 211*a-c*, and combines in the bit line 205*b*. Similarly, the current I0-I2 flow through the cells 212*a-c*, depending on the data stored in the cells 212*a-c*, and combines in the bit line 205*c*. The bit lines 204*a-c* are connected to the output neuron circuits.

In another embodiment, the current direction is reversed to flow from the bit lines 204*a-c* to the source lines 207*a-c*. In this embodiment, the three-level currents I0, I1, and I2 are applied to three bit lines 204*a-c*, respectively. The currents will flow through the cells and combine in the source lines 207*a-c*.

Figure 34D:
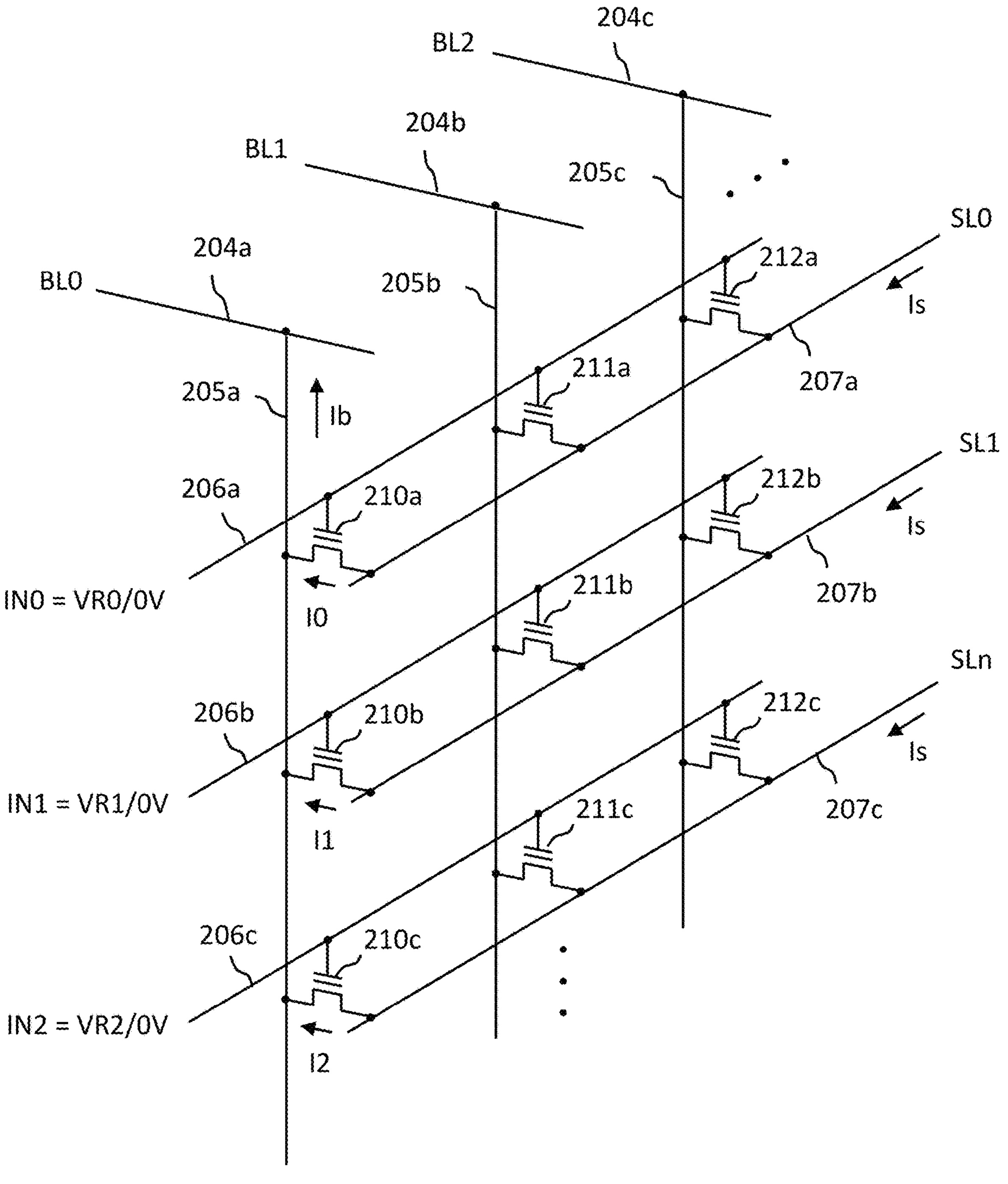
FIG. 34D shows another embodiment according to the invention.

FIG. 34D shows another embodiment according to the invention. This embodiment is similar to the embodiment shown in FIG. 34A except that the word lines 206*a-c* are supplied with three different voltages VR0, VR1, and VR2 to represent the three input data bits. This configuration will turn on data 1 cells to conduct three current levels, I0, I1, and I2, as shown in FIG. 34B. If the input data bit is 0, the word lines 206a-c will be supplied with 0V to turn off the cells.

The source lines 207a-c are supplied with a current 'Is', which is higher than I2. Therefore, if the data stored in the cells 210a-c is 1, the word line voltages VR0 to VR2 will turn on the cells 210a-c to conduct currents I0 to I2 from the source lines 207a-c to the bit line 205a. If the data stored in the cells 210a-c is 0, the cell will be turned off. The currents passed through the cells 210a-c will be combined in the bit line 205a to form current 'Ib'. The current 'Ib' will be sent to an output neuron circuit.

Similarly, the current I0-I2 may flow through the cells 211a-c, depending on the data stored in the cells 211a-c, and combine in the bit line 205b. Similarly, the current I0-I2 may flow through the cells 212a-c, depending on the data stored in the cells 212a-c, and combine in the bit line 205c. The bit lines 204a-c are connected to the output neuron circuits.

In another embodiment, the current direction is reversed to flow from the bit lines 204a-c to the source lines 207a-c. In this embodiment, the current 'Is' is supplied to three bit lines 204a-c. The currents will flow through the cells and combine in the source lines 207a-c.

Figure 35:
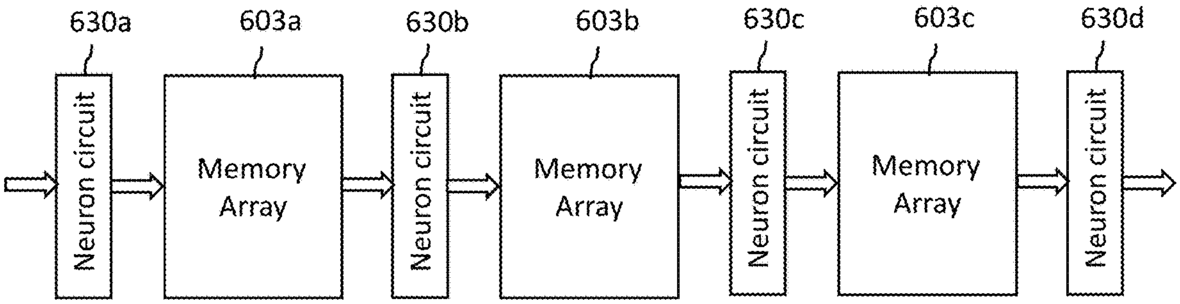
FIG. 35 shows an embodiment of a neural network architecture according to the invention.

FIG. 35 shows an embodiment of a neural network architecture according to the invention. The neural network architecture comprises multiple memory arrays 603a-c to simulate multiple layers of synapses of neural networks. The memory arrays 603a-c are connected by the neuron circuits 630a-d. Each memory array, such as array 603b receives inputs from the previous neuron circuit 630b, which is called an input neuron circuit, and generates outputs to the next neuron circuit 630c called an output neuron circuit.

Figure 36A:
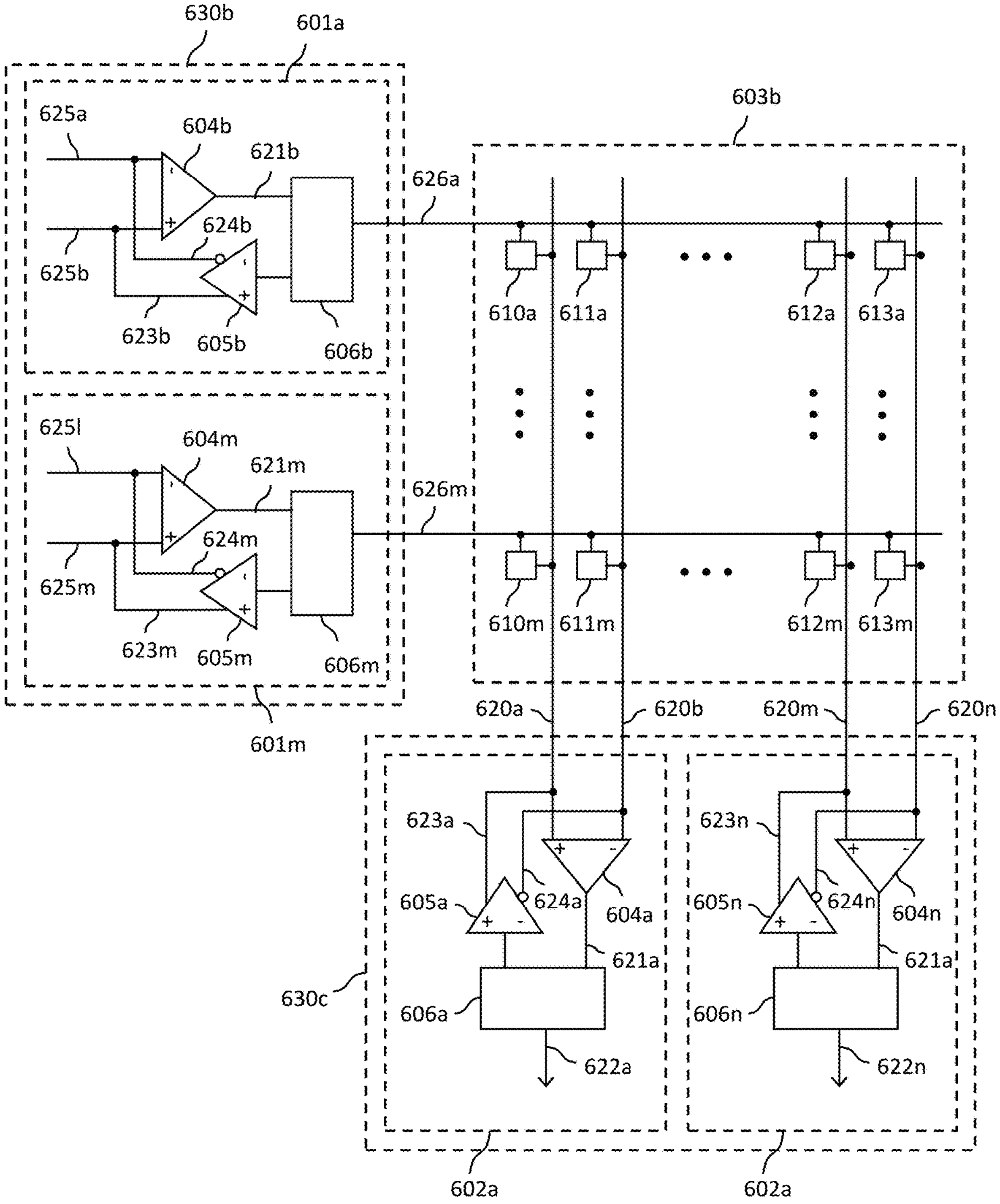
FIG. 36A shows embodiments of a memory array, input neuron circuit, and output neuron circuit shown in FIG. 35.

FIG. 36A shows a detailed embodiment of the memory array 603b, input neuron circuit 630b, and output neuron circuit 630c shown in FIG. 35. The input neuron circuit 630b comprises multiple input neuron circuits 601a-m. The output neuron circuit 630c comprises multiple output neuron circuits 602a-n.

The memory array 603b comprises multiple memory cells 610a to 613m. The memory cells 610a to 613m store data to represent the 'weights' of the synapses in neural networks. The memory cells 610a to 613m are connected to input lines 626a-m and output lines 620a-n. In one embodiment, the input lines 626a-m are the source lines 103a-m shown in FIG. 10B and the output lines 620a-n are the bit lines 130a-n shown in FIG. 10B, respectively. In another embodiment, the input lines 626a-m are the bit lines 130a-n shown in FIG. 18A and the output lines 620a-n are the source lines 103a-m shown in FIG. 18A, respectively.

The input lines 626a-m are connected to the input neuron circuits 601a-m. The output lines 620a-n are connected to the output neuron circuits 602a-n. The memory cells 610a-m and 611a-m are connected to bit line 620a and 620b, respectively. The bit lines 620a and 620b are connected to the positive input and the negative input of the comparator 604a, respectively. When the value of the data stored in the cells 610a-m becomes higher, the output 621a of the comparator 604a becomes higher. When the data stored in the cells 611a-m is higher, the output 621a of the comparator 604a becomes lower. Therefore, the memory cells 610a-m represent 'positive weights' and the memory cells 611a-m represent 'negative weights'.

Each output neuron circuit such as circuit 602a comprises an output comparator 604a, a feedback comparator 605a, and a control circuit 606a. The output comparator 604a is used for forward propagation and the feedback comparator 605a is used for back-propagation. During forward propagation, the input neuron circuits 601a-m apply inputs to the input lines 626a-m. The inputs will cause current to flow from the input lines 626a-m through the memory cells 610a to 613m to the output lines 620a-n. The current is dependent on the inputs and the data weights stored in the memory cells 610a to 613m. The current flowing through the cells 610a-m will be summed in the output line 620a. The current flowing through the cells 611a-m will be summed in the output line 620b.

The output comparator 604a receives inputs from the bit lines 620a and 620b to generate an output 621a. The output comparator 604a performs some kind of activation function of neurons in neural networks, like sigmoid, ReLU, Binary, Tanh, or any other activation function. The control circuit 606a passes the output 621a of the output comparator 604a to the output 622a. The output 622a may be used as the input of the next memory array.

After the above process, the forward propagation described above may be performed in the next memory array to generate the output for the next memory array. This forward propagation may be repeated until the output of the last memory array is generated.

Back-propagation is used to 'train' the neural network. During the training process, training data is applied to the neural network using forward propagation to generate the output. The output is compared with a 'target' output to determine the 'error'. Then, a back-propagation process is performed to update the data (weights) stored in the memory cells according to the error. The forward propagation and the back-propagation can be alternatively performed for many iterations. The goal is to minimize the error through this training process.

During back-propagation, the control circuit 606a feeds the target from the output 622a and compares the target with the output 621a of the output comparator 604a to generate the error. Then, the control circuit 606a feeds the error to the feedback comparator 605a to generate complementary outputs 623a and 624a. The complementary outputs 623a and 624a are applied to the output lines 620a and 620b to change the data of the memory cells 610a-m and 611a-m. A proper bias condition for write operation is applied to the memory cells 610a-m to change the data of the cells.

For example, if the output is lower than the target, the control circuit 606a generates a positive error to the feedback comparator 605a. The feedback comparator 605a will generate complementary outputs 623a and 624b to increase the data weights of the memory cells 610a-m and decrease the data weights of the memory cells 611a-m. This process will make the output 621a of the output comparator 604a higher to reduce the error between the output and the target.

Next, the control circuit 606a applies the target to the feedback comparator 605a to generate new outputs 623a and 624a. This will cause current to flow from the bit lines 620a-n through the memory cells 610a to 613m and summed in the input lines 626a-m. The current is dependent on the new outputs 623a and 624a and the data weights stored in the memory cells 610a to 613m. The control circuits 606b-m will convert the currents from the input lines 626a-m to voltages. These voltages become the targets of the input neuron circuits 601a-m.

The control circuits 606b-m compare the targets with the outputs 621b and 621m from the output comparators 604b-m to generate the errors. Then, the control circuits 606b-m feed the errors to the feedback comparators 605b-m to generate complementary outputs 623b-m and 624b-m. The complementary outputs 623*b-m* and 624*b-m* are sent to the output lines 625*a-m* of the previous memory array to update the data of the memory cells in the previous memory array. This back-propagation process is repeated until all the data stored in the memory cells of every memory array are updated.

Figure 36B:
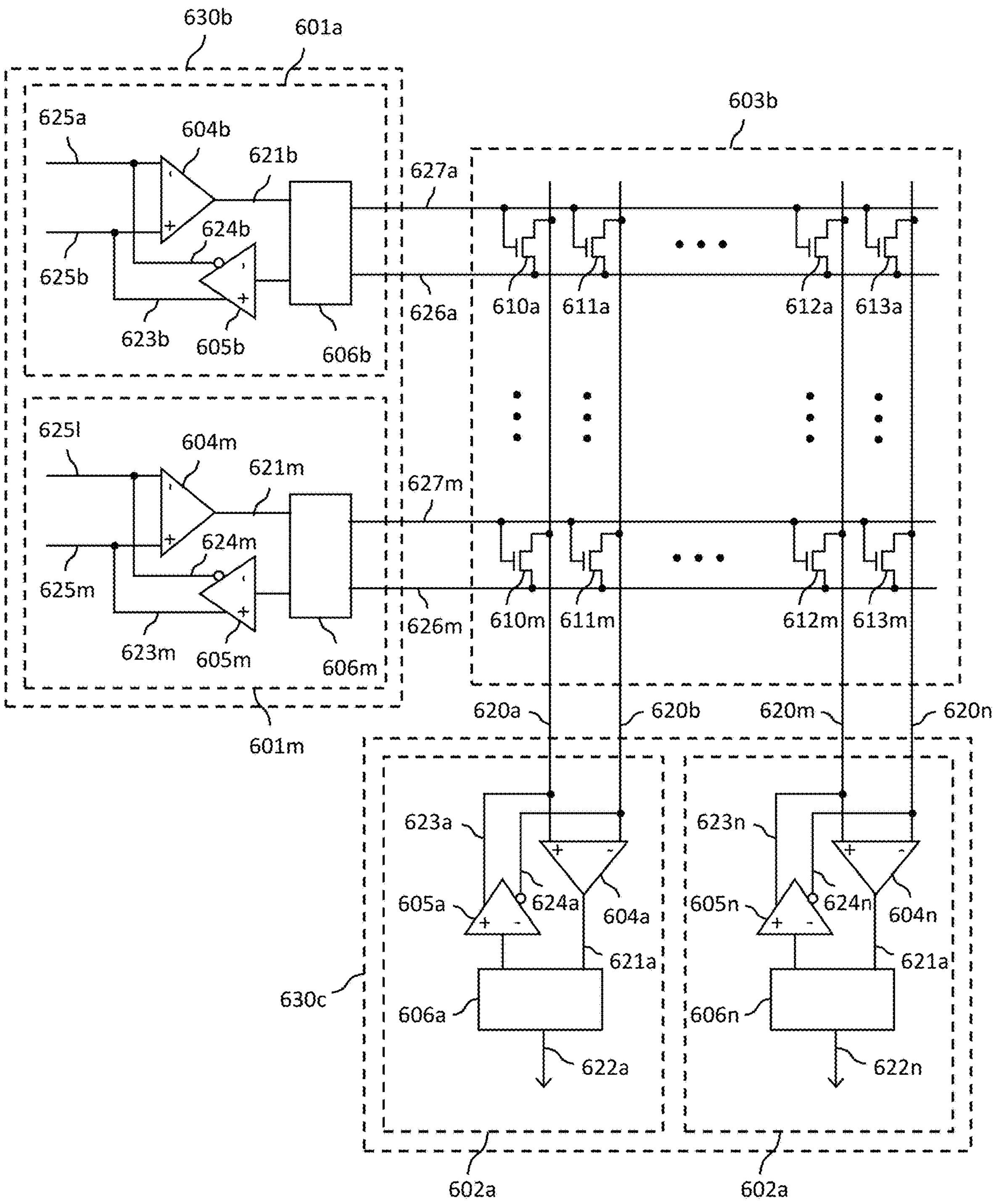
FIG. 36B shows an embodiment of the memory array implemented using exemplary memory cell technologies.

FIG. 36B shows an embodiment of the memory array 603*b* implemented using exemplary memory cell technologies, such as floating body cells, flash memory cells, ferroelectric random-access memory cells, memristor cells, or 3D floating body cells shown in FIGS. 1A-7B. In one embodiment, the output lines 620*a-n* are connected to the bit lines and the input lines 626*a-m* are connected to the source lines of the memory cells 610*a-m*. In another embodiment, the output lines 620*a-n* are connected to the source lines and the input lines 626*a-m* are connected to the bit lines of the memory cells 610*a-m*. The gates of the memory cells 610*a-m* are connected to the word lines 627*a-m*. The word lines 627*a-m* are connected to the control circuits 606*b-m* or another decoder circuit.

Figure 37A:
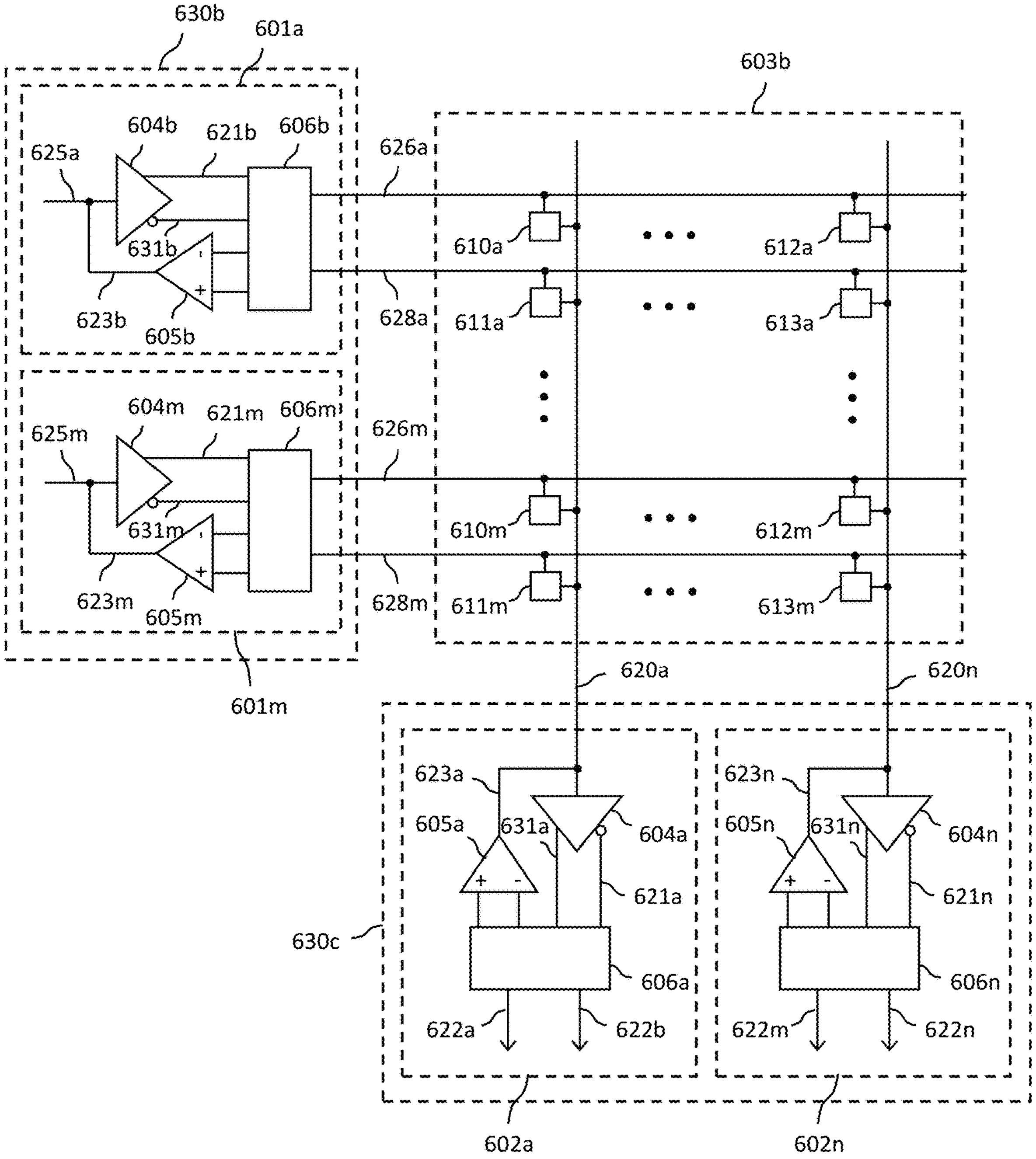
FIG. 37A shows detailed embodiments of a memory array, input neuron circuit, and output neuron circuit shown in FIG. 35.

FIG. 37A shows a detailed embodiment of the memory array 603*b*, input neuron circuit 630*b*, and output neuron circuit 630*c* shown in FIG. 35. This embodiment is similar to the embodiment shown in FIG. 36A except that the memory cells 610*a* to 613*m* are arranged in different ways. In this embodiment, the control circuits 606*b-m* supply input data to the input lines 626*a-m* and the complementary input data to the input lines 628*a-m*. Therefore, the data stored in the memory cells 610*a* to 612*a* and 610*m* to 612*m* represent positive weights, and the data stored in the memory cells 611*a* to 613*a* and 611*m* to 613*m* represent negative weights.

During forward propagation, the comparator 604*b* of the input neuron 601*a* will receive the input 625*a* from the previous memory array to generate complementary outputs 621*b* and 631*b*. The control circuit 606*b* will pass the complementary outputs 621*b* and 631*b* to the input lines 626*a* and 628*a*, respectively. The memory cells 610*a* to 613*m* will generate currents according to the input data and the data weights stored in the memory cells 610*a* to 613*m*. The current will pass through the memory cells 610*a-m* and summed in the output lines 620*a-n*. At the output neuron circuit 602*a*, the output comparator 604*a* will convert the current from the bit line 620*a* into complementary data 621*a* and 631*a*. The output comparator 604*a* performs a selected activation function of neurons in neural networks, like sigmoid, ReLU, Binary, Tanh, and many others. The control circuit 606*a* passes the complementary outputs 621*a* and 631*a* to the input lines 622*a* and 622*b* of the next memory array.

During back-propagation, the control circuit 606*a* inputs the target from the input lines 622*a* and 622*b* of the next memory array and compares the target with the outputs 621*a* and 631*a* to generate the error. The control circuit 606*a* feeds the error to the feedback comparator 605*a* to generate the output 623*a* and applies the output 623*a* to the output line 620*a* to change the data weights stored in the memory cells 610*a-m* and 611*a-m*. A proper bias condition for write operations is applied to the memory cells 610*a-m* and 611*a-m* to change the data of the cells.

The current applied to the bit lines 620*a-n* passes through the memory cells 610*a* to 613*m* and is summed in the input lines 626*a-m* and 628*a-m*. The control circuits 606*b-m* convert these currents into voltages. These voltages are used as the targets of the input neuron circuits 601*a-m*. The control circuits 606*b-m* compare the targets with the outputs 621*b-m* of the output comparators 604*b-m* to generate the errors. Then, the control circuits 606*b-m* feed the errors to the feedback comparators 605*b-m* to generate the outputs 623*b-m*. The outputs 623*b-m* are applied to the output lines 625*a-m* of the previous memory array to update the data of the memory cells in the previous memory array. This back-propagation process is repeated until all the data stored in the memory cells of every memory array are updated.

Figure 37B:
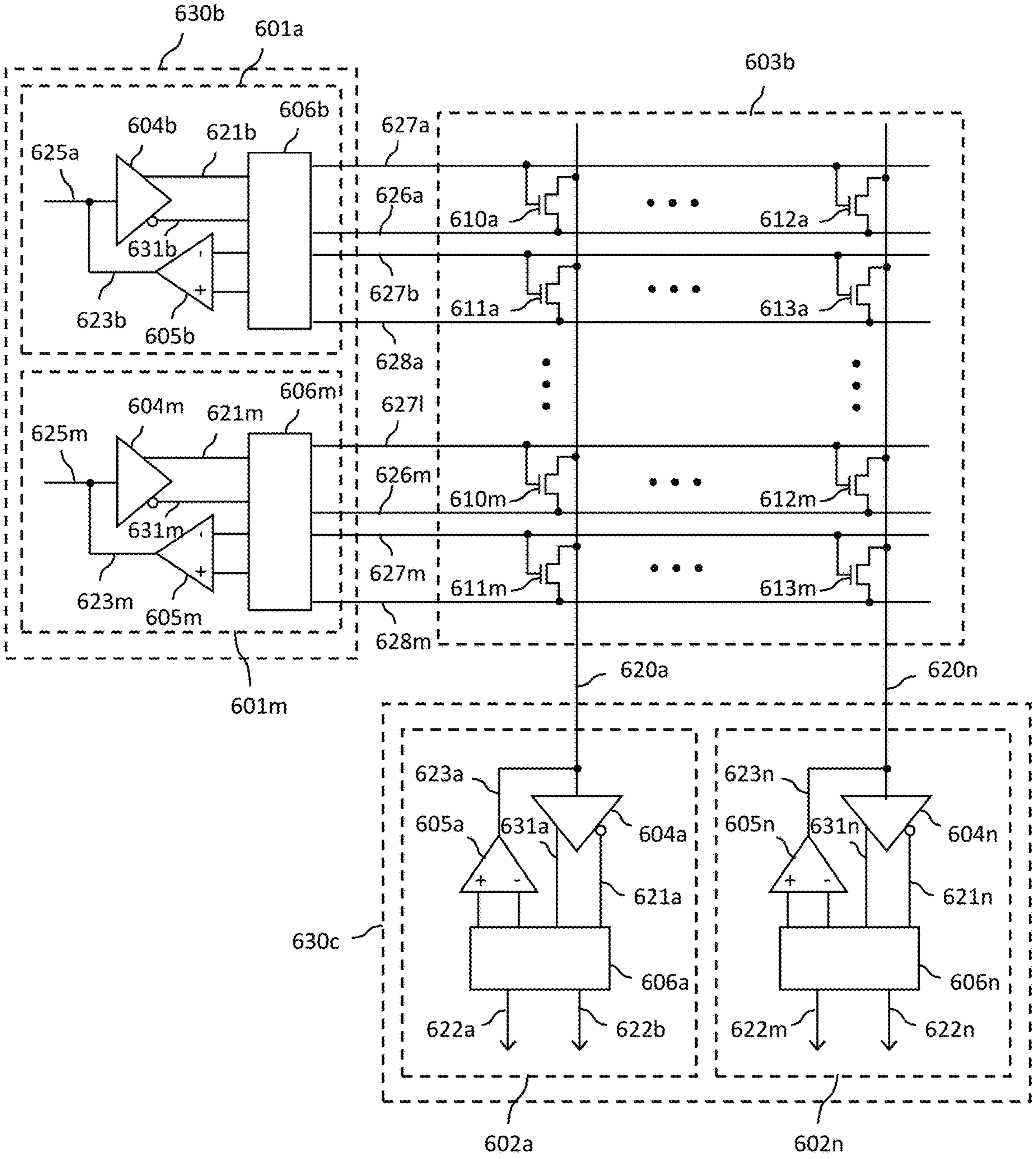
FIG. 37B shows an embodiment of the memory array implemented with exemplary memory cell technologies.

FIG. 37B shows an embodiment of the memory array 603*b* implemented using exemplary memory cell technologies, such as floating body cells, flash memory cells, ferroelectric random-access memory cells, memristor cells, or 3D floating body cells shown in FIG. 1A-3B. In one embodiment, the output lines 620*a-n* are connected to the bit lines of the memory cells 610*a* to 613*m* and the input lines 626*a-m* and 628*a-m* are connected to the source lines of the memory cells 610*a* to 613*m*. In another embodiment, the output lines 620*a-n* are connected to the source lines of the memory cells 610*a* to 613*m* and the input lines 626*a-m* and 628*a-m* are connected to the bit lines of the memory cells 610*a* to 613*m*. The gates of the memory cells 610*a* to 613*m* are connected to the word lines 627*a-m*. The word lines 627*a-m* are connected to the control circuits 606*b-m* or another decoder circuit.

Figure 37C:
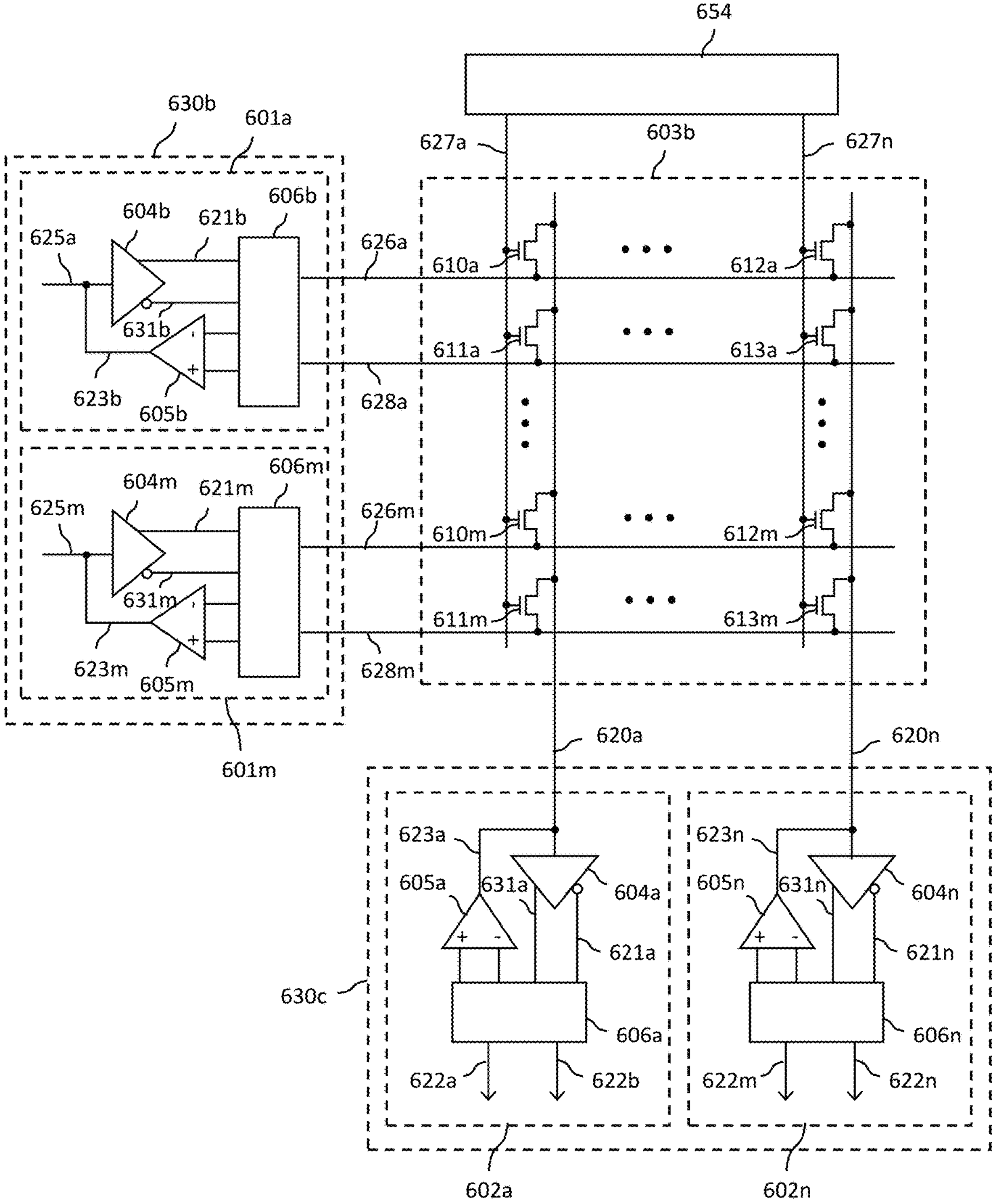
FIG. 37C shows embodiments of a memory array, input neuron circuit, and output neuron circuit.

FIG. 37C shows an embodiment of the memory array 603*b*, input neuron circuit 630*b*, and output neuron circuit 630*c*. The memory array 603*b* is implemented using exemplary memory cell technologies, such as floating body cells, flash memory cells, ferroelectric random-access memory cells, memristor cells, or 3D floating body cells shown in FIG. 1A-3B as an example. This embodiment is similar to the embodiment shown in FIG. 36B except that the word lines 627*a-n* are connected to a decoder circuit 654. The decoder circuit 654 selects partial word lines 627*a-n*, such as 1, 2, 4, 8, 16, or any suitable number of word lines. This process allows current to flow through only the cells of the selected word lines. For example, assuming only the word line 627*a* is selected, the current will only flow from the input lines 626*a-m* and 629*a* to 628*m* to the output line 620*a* to generate the output of the output neuron circuit 602*a*. The decoder circuit 654 sequentially selects partial word lines to generate the outputs of the output neuron circuits 602*a-n* until all the desired word lines are selected. By using this process, the peak current experienced during the operation is greatly reduced.

Figure 37D:
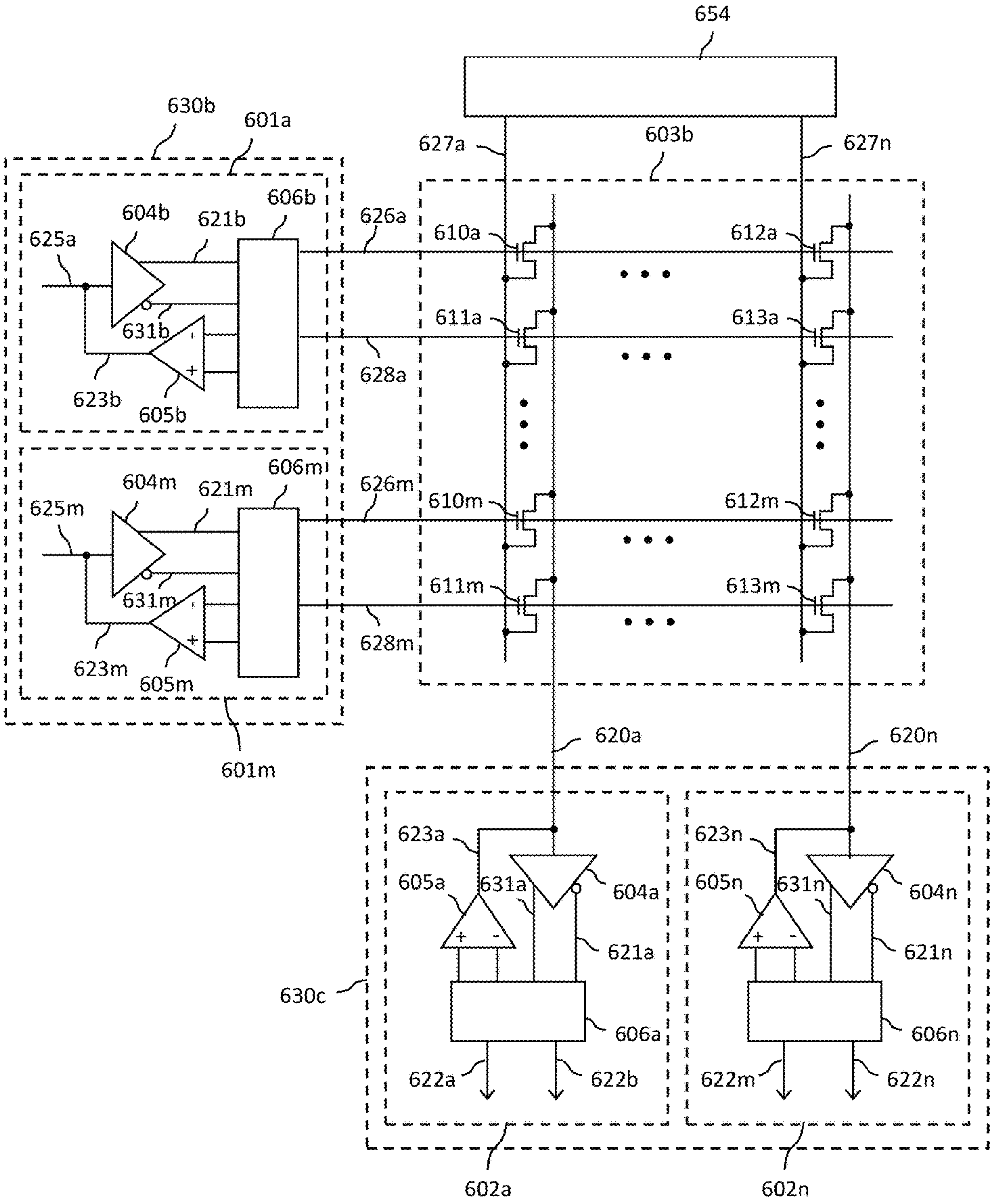
FIG. 37D shows embodiments of a memory array, input neuron circuit, and output neuron circuit.

FIG. 37D shows an embodiment of the memory array 603*b*, input neuron circuit 630*b*, and output neuron circuit 630*c*. This embodiment is similar to the embodiment shown in FIG. 37C except that the word lines 627*a-n* are connected to the source or drain of the cells 610*a* to 613*m*. The input lines 206*a-m* and 208*a-m* are connected to the gates of the cells 610*a* to 613*m*. During operations, the decoder circuit 654 selects partial word lines 627*a-n* to supply current to only the selected cells. The decoder circuit sequentially selects partial word lines to generate the outputs of the output neuron circuits 602*a-n* until all the desired word lines are selected. By using this process, the peak current experienced during the operation is greatly reduced. It should be noted that the architecture of the embodiments shown in FIGS. 30C-D are applicable to other array architectures, such as the one shown in FIG. 36B or any other suitable architectures.

FIGS. 38A-D shows embodiments of the layout arrangement of the memory arrays and neuron circuits according to the invention. These embodiments comprise multiple memory arrays 603*a-i* and neuron circuits 630*a-l* as shown in FIGS. 36A-37D. Referring to FIG. 36A, since the input lines 626*a-m* and the output lines 620*a-n* are arranged in perpendicular directions, the input neuron circuit 630*b* and the output neuron circuit 630*c* are located in two adjacent sides of the memory array 603*b*.

Figure 38A:
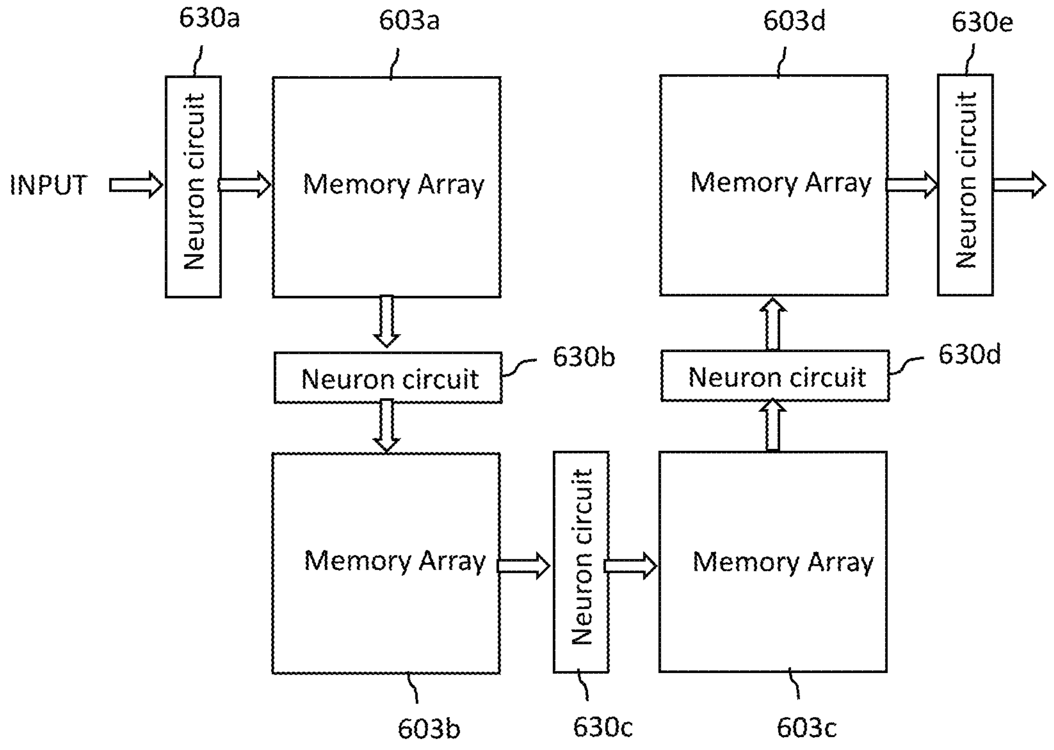
FIGS. 38A-D shows embodiments of the layout arrangement of the memory arrays and neuron circuits according to the invention.

FIG. 38A shows an embodiment of the layout arrangement for multiple memory arrays 603*a-d* and neuron circuits 630*a-e*. The input data is fed into the first neuron circuit 630*a*, and then propagates through the memory arrays 603*a-d* and neuron circuits 630*b-e*. Although the embodiment uses four memory arrays as an example, it is obvious that this arrangement is applicable to any number of memory arrays.

Figure 38B:
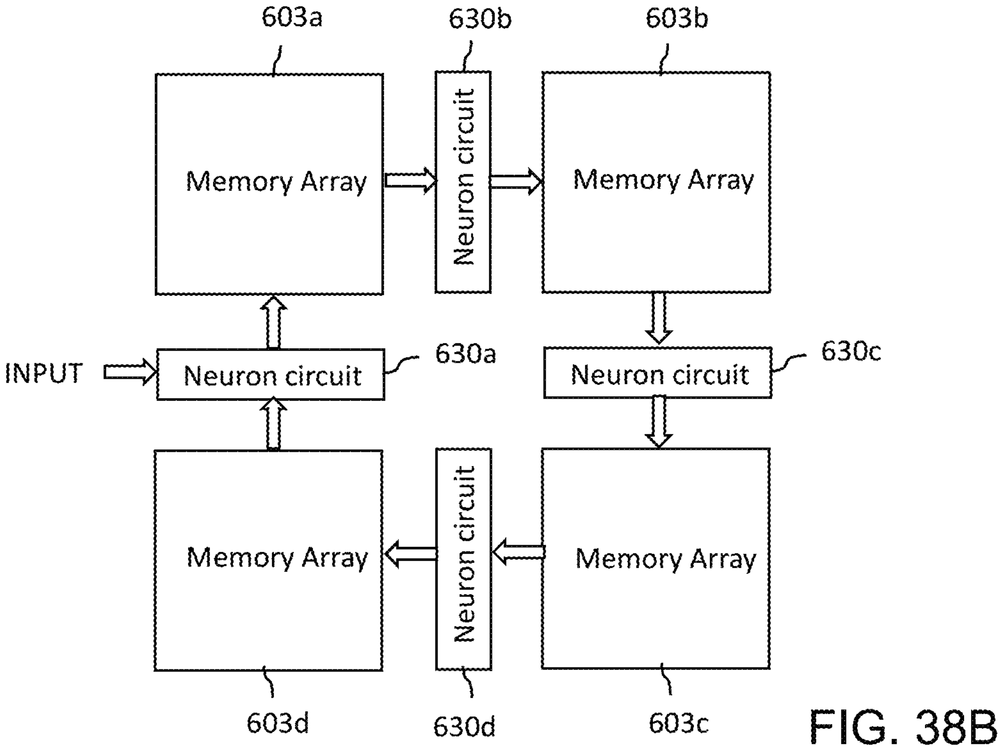

FIG. 38B shows an embodiment of a layout arrangement of memory arrays and neuron circuits according to the invention. In this embodiment, the input data is fed into the first neuron circuit 630*a*, and then propagates through multiple memory arrays 603*a* to 603*d* and neuron circuits 630*b-d*. The output data of the last memory array 603*d* is fed into the first neuron circuit 630*a*. This forms a 'closed loop' neural network architecture. This architecture allows the data to be continuously propagated through the memory array 603*a-d* for multiple rounds. In each round, different memory cells in the memory array 603*a-d* are selected. The propagation is repeated for as many rounds as desired. This architecture provides flexibility to simulate (e.g., provide the same functionality) neural networks with any number of layers. For example, if the architecture comprises M memory arrays, and the propagation repeats N rounds, the architecture simulates M times N layers of a neural network. Although the embodiment shown uses four memory arrays as an example, it would be obvious to one with skill in the art that the close-loop architecture can comprise any number of memory arrays.

Figure 38C:
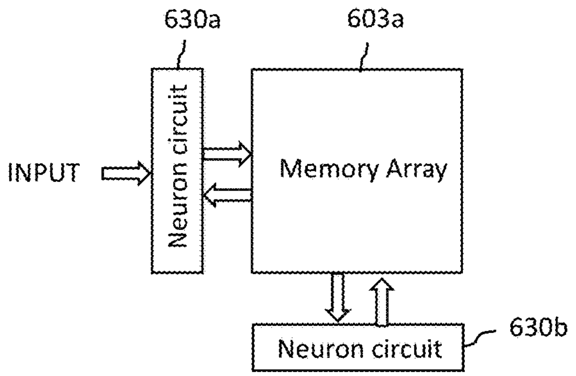

FIG. 38C shows an embodiment of a layout arrangement of memory arrays and neuron circuits according to the invention. In this embodiment, the neuron circuits 630*a* and 630*b* are bi-directional rather than unidirectional. Referring now to FIG. 36A and using the output neuron circuit 602*a* as an example, in a first direction, the comparator 604*a* is used as an output comparator, and the comparator 605*a* is used as a feedback comparator. In this configuration, 620*a* and 620*b* are inputs and 622*a* is output. In a second direction, the comparator 605*a* is used as an output comparator, and the comparator 604*a* is used as a feedback comparator. In this configuration, 622*a* is an input and 620*a* and 620*b* are outputs. The direction is changeable by the control circuit 606*a*.

Referring again to FIG. 38C, in the first propagation direction, the input data is fed into the input neuron circuit 630*a*, and then propagates through the memory arrays 603*a* to the output neuron circuit 630*b*. Then, in the second propagation direction, the direction of the neuron circuits 630*a* and 630*b* are changed to feed the output of the neuron circuit 630*b* back to the memory array 603*a* and then to the neuron circuit 630*a*.

During operation in the second propagation direction, different memory cells in the memory array 603*a* are selected. Then, in a third propagation direction, the direction of the neuron circuits 630*a* and 630*b* are changed again to feed the output of the neuron circuit 630*a* back to the memory array 603*a* and then to the neuron circuit 630*b*. This procedure is repeated as many times as desired to simulate neural networks with any number of layers using only one memory array 603*a*.

Figure 38D:
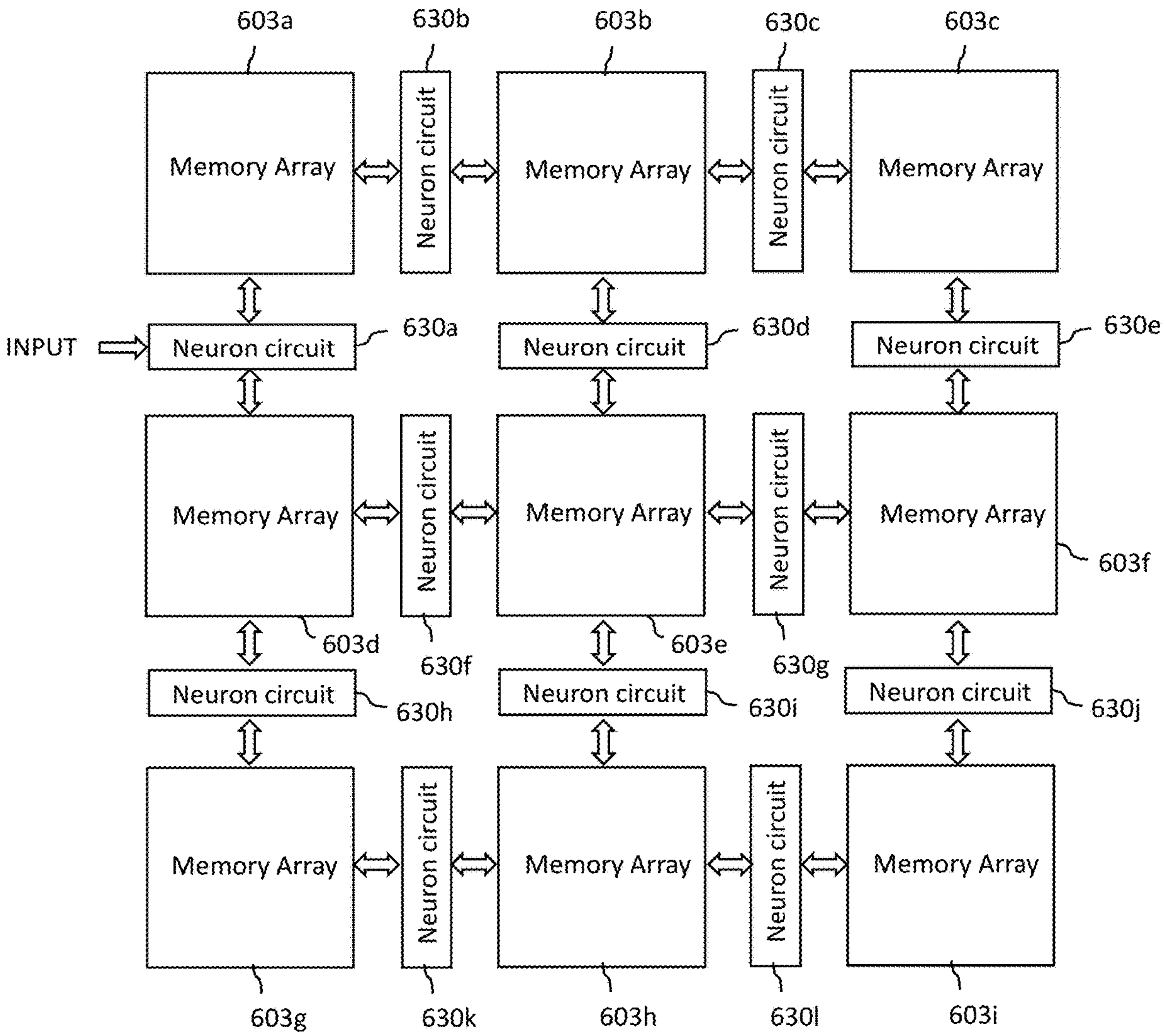

FIG. 38D shows an embodiment of a layout arrangement of memory arrays and neuron circuits according to the invention. In this embodiment, multiple memory arrays 603*a* to 603*i* are connected through neuron circuits 630*a-l* as shown. The neuron circuits 630*a-l* are bi-directional, as described in the embodiment shown in FIG. 38C. The direction of each neuron circuit 630*a*-1 can be freely configured. For example, for the neuron circuit 630*a*, the direction of the outputs can be set from the neuron circuit 630*a* to the memory array 603*a* or 603*d*. Besides, each neuron circuit 630*a*-1 can be independently disabled so no data flows through it. This function is implemented, in one embodiment, by using tri-state buffers. For example, in one embodiment, the neuron circuit 630*c* is disabled, so that the data can be propagated from the neuron circuit 630*b* to the memory array 603*b* to the neuron circuit 630*d*. By using this process, the memory arrays and neuron circuits can be freely configured to form any type of neural networks.

Figure 39A:
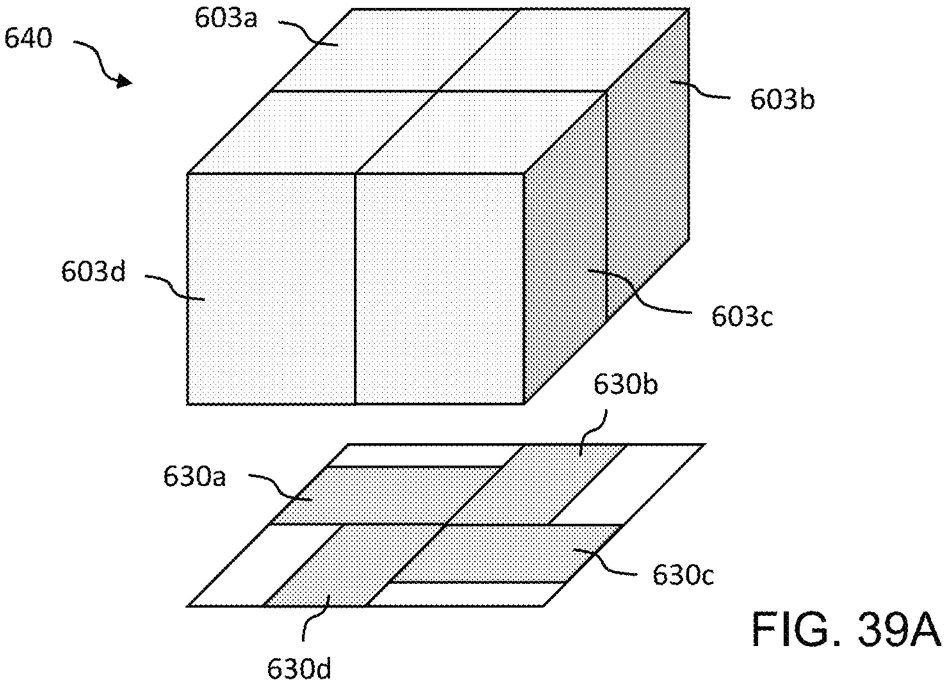
FIG. 39A shows an embodiment of a layout arrangement of 3D memory arrays and neuron circuits for the architecture shown in FIG. 38B.

FIG. 39A shows an embodiment of a layout arrangement of 3D memory arrays and neuron circuits for the architecture shown in FIG. 38B. A block 640 comprising of four 3D memory arrays 603*a-d* is shown as an example. Four neuron circuits 630*a-d* are located under the 3D memory arrays 603*a* to 603*d*, respectively.

Figure 39B:
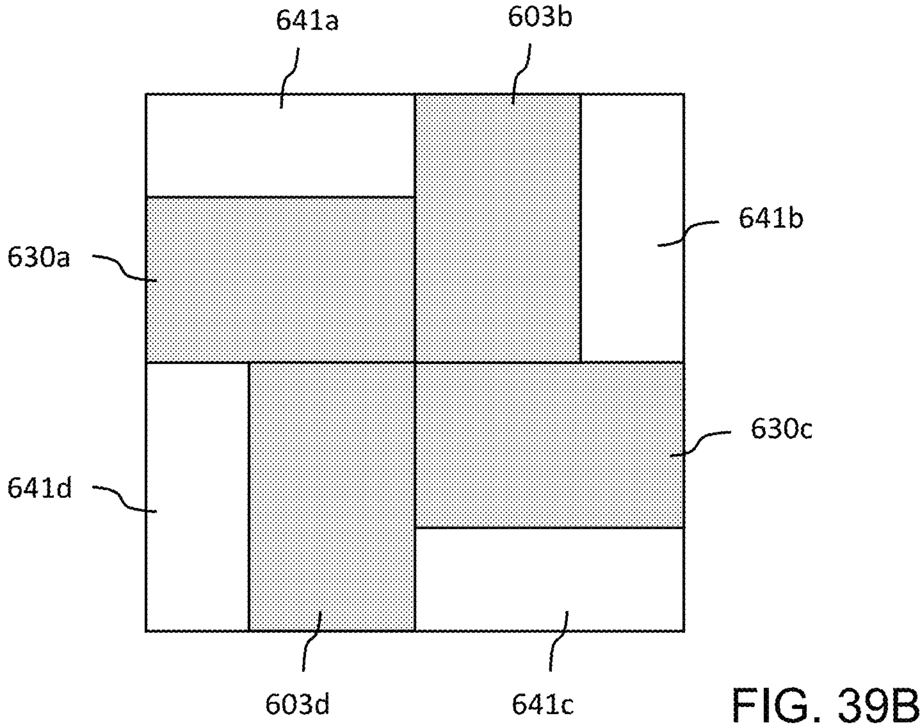
FIG. 39B shows a layout arrangement of neuron circuits shown in FIG. 39A.

FIG. 39B shows a layout arrangement of the neuron circuits 630*a-d* shown in FIG. 39A. Also shown are additional circuits 641*a-d* that comprise circuits such as control logic, decoders, data buffers, and data bus.

Figure 39C:
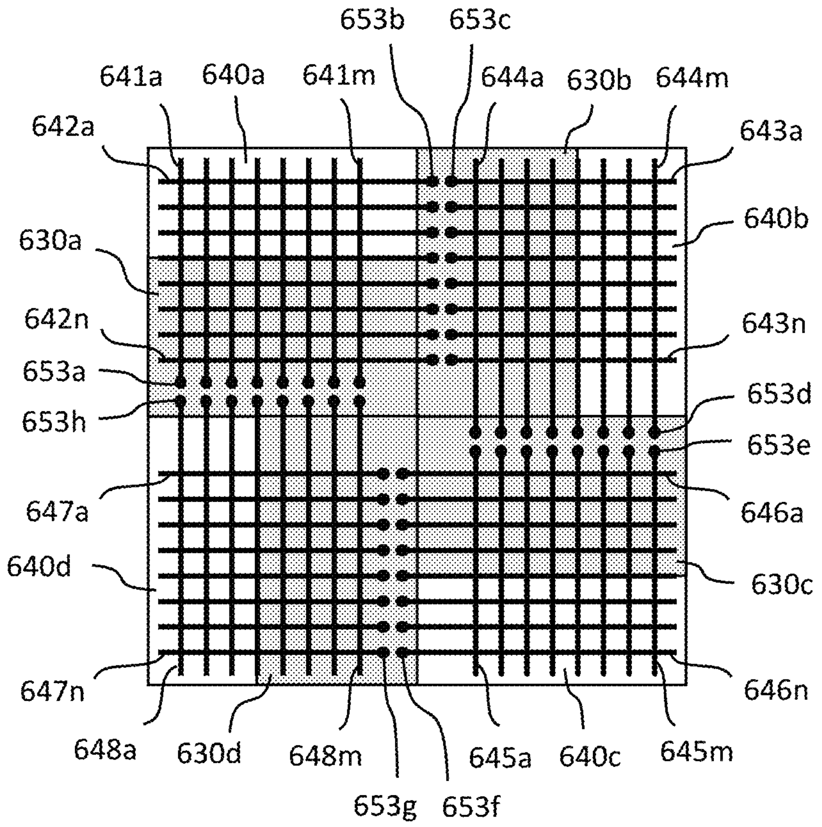
FIG. 39C shows connections between neuron circuits and 3D memory arrays according to the invention.

FIG. 39C shows connections between neuron circuits and 3D memory arrays according to the invention. The 3D memory arrays 603*a-d* not shown are located above the neuron circuits 630*a-d* as shown in FIG. 39A. For the 3D memory array 603*a* not shown, the input lines 641*a-m* are connected to the input neuron circuit 630*a* and the output line 642*a-n* are connected to the output neuron circuit 630*b*. Also shown are contacts 653*a-h* that connect the input lines and output lines to the neuron circuits.

As described above, the output neuron circuit 630*b* is also used as the input neuron circuit of the next 3D memory array 603*b* (not shown). The input neuron circuit 630*b* is connected to the input lines 641*a-m* and the output line 644*a-m* are connected to the output neuron circuit 630*c*. The output neuron circuit 630*c* is also used as the input neuron circuit of the next 3D memory array 603*c* (not shown). The input neuron circuit 630*c* is connected to the input lines 645*a-m* and the output line 646*a-n* are connected to the output neuron circuit 630*d*. The output neuron circuit 630*d* is also used as the input neuron circuit of the next 3D memory array 603*d* (not shown). The input neuron circuit 630*d* is connected to the input lines 647*a-n* and the output line 648*a-m* are connected to the output neuron circuit 630*a*, which is also used as the input neuron circuit of the next 3D memory array 603*a* (not shown).

FIGS. 40A-D show memory arrays that comprise multiple blocks.

Figure 40A:
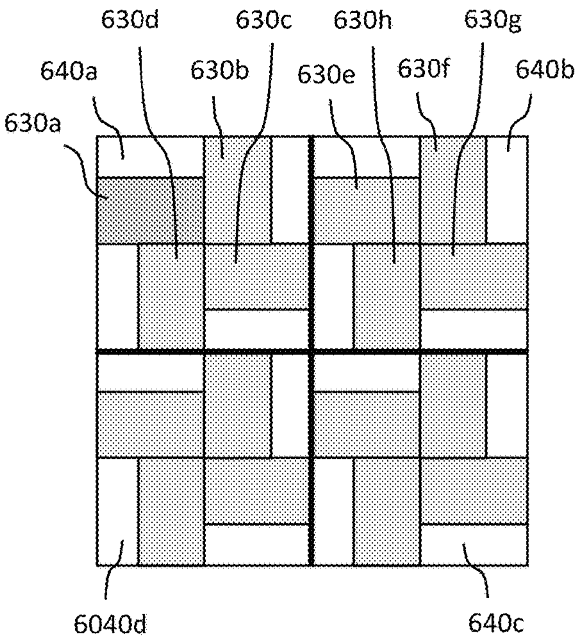
FIGS. 40A-D show memory arrays that comprise multiple blocks.

FIG. 40A shows an embodiment of a memory array that comprises four blocks 640*a-d* (divided by bold lines). The layout arrangement for the neuron circuits in each block 640*a-d*, such as the neuron circuits 630*e-h* in the block 640*b*, are in the same orientation as the neuron circuits 630*a-d* in the block 640*a*.

Figure 40B:
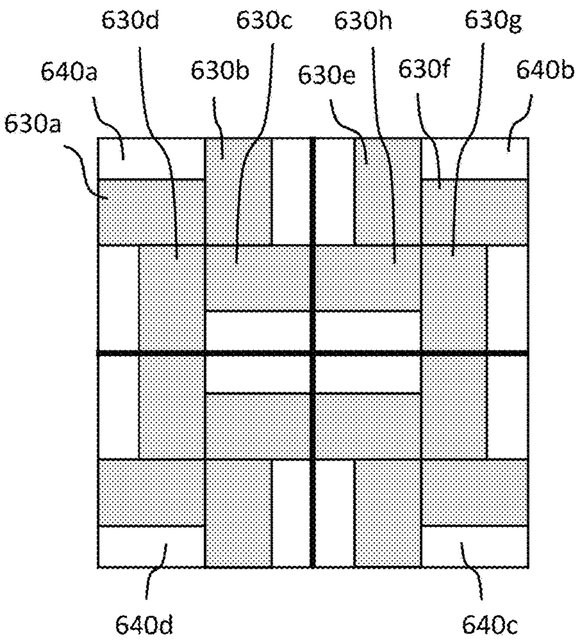

FIG. 40B shows an embodiment in which the orientation of the neuron circuits 630*e-h* in the block 640*b* is different mirrored from the neuron circuits 630*a-d* in the block 640*a*. Similarly, the orientation of the neuron circuits in the blocks 640*c* and 640*d* is mirrored from the neuron circuits in the blocks 640*a* and 640*b*. This layout arrangement provides casier data bus arrangement than the embodiment shown in FIG. 40A.

Figure 40C:
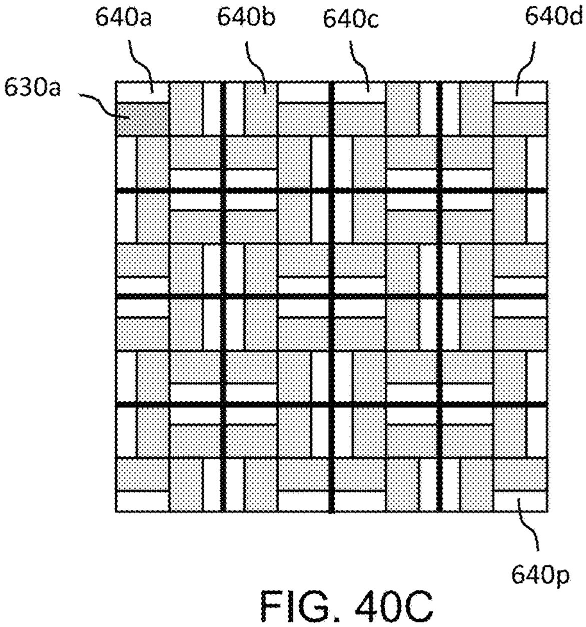

FIG. 40C shows an embodiment of a memory array that comprises 16 blocks 640*a-p* (divided by bold lines).

Figure 40D:
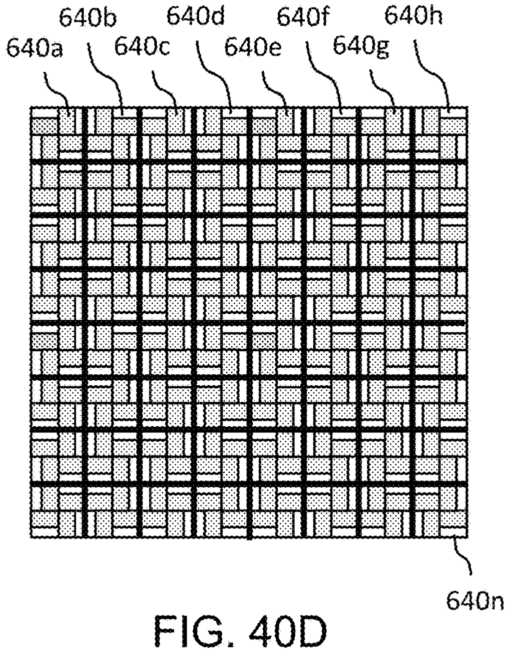

FIG. 40D shows an embodiment of a memory array that comprises 64 blocks 640*a-n* (divided by bold lines). It should be noted that when dividing an array into more blocks, the length of the input lines and output lines become shorter. The shorter lines will reduce the resistance-capacitance (RC) delay of the input lines and output lines to increase the speed performance of the memory array. It should also be noted that when comparing the neuron circuits 630*a* in FIG. 40A and FIG. 40C, the layout width of the neuron circuit 630*a* in FIG. 40C is ½ of that in FIG. 40A, but the layout area of the neuron circuit 630*a* in FIG. 40C is ¼ of that in FIG. 40A. That means the number of the input lines in FIG. 40A is reduced by ½, while the number of the neuron circuit units is reduced to ¼. Therefore, a special design needs to be applied to accommodate this mismatching issue.

Figure 41:
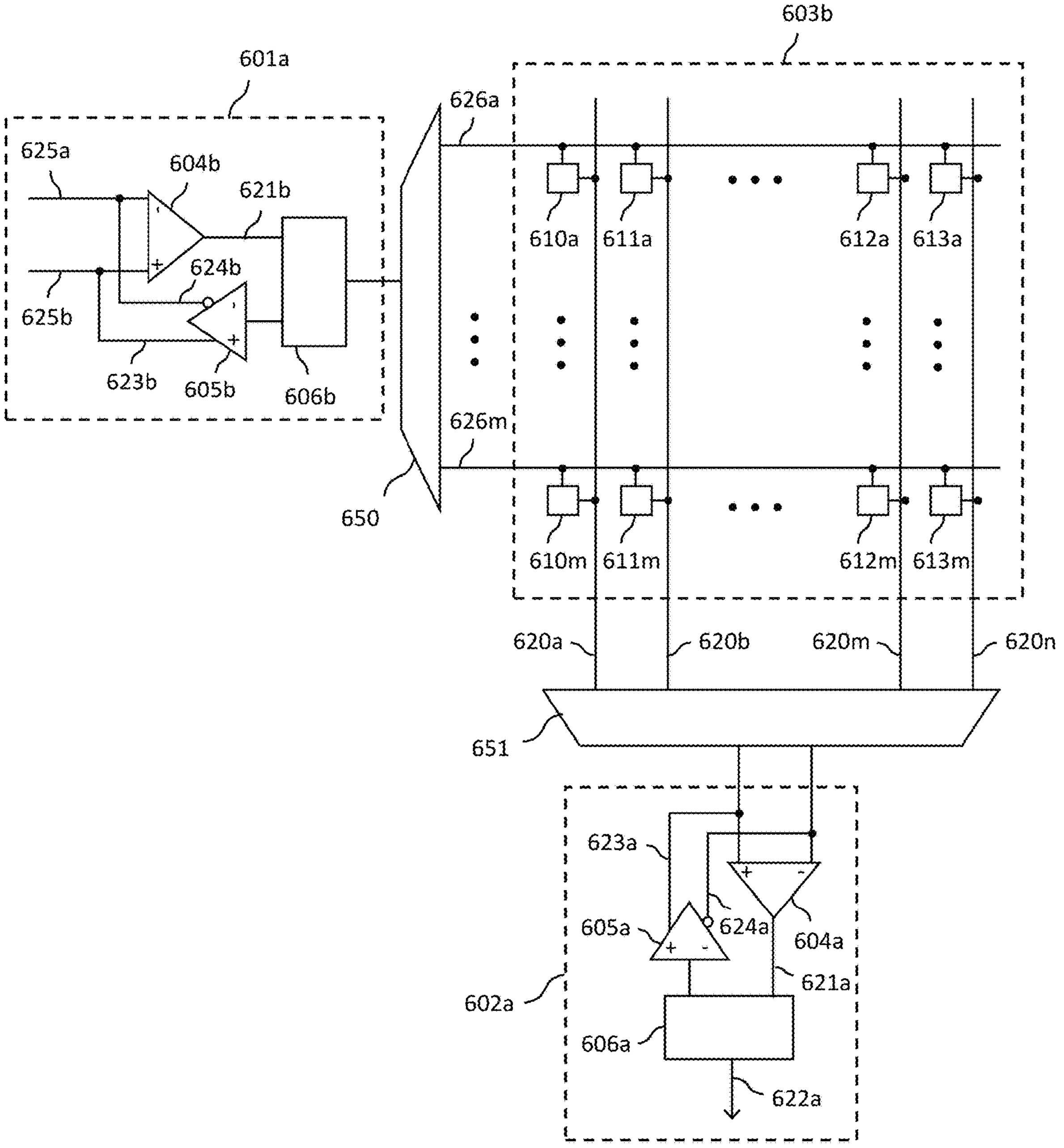
FIG. 41 shows an embodiment according to the invention to solve the mismatching issue described above.

FIG. 41 shows an embodiment according to the invention to solve the mismatching issue described above. This embodiment is similar to the embodiment shown in FIG. 36A except a multiplexer circuit 650 is added between the input neuron circuit 601*a* and the input lines 620*a-m*, and a multiplexer circuit 653 is added between the output neuron circuit 602*a* and the output lines 620*a-n*. It should also be noted that the array may have multiple input neuron circuit such as 601*a-m* and multiple output neuron circuits 602*a-n* as shown in FIG. 36A. FIG. 41 shows just one input neuron circuit 601*a* and one output neuron circuit 602*a* as an example.

The multiplexer circuit 650 selects one input line from multiple input lines 626*a-m* to connect to the input neuron circuit 601*a*. The multiplexer circuit 651 selects one output line from multiple output lines 620*a-n* to connect to the output neuron circuit 602*a*. This configuration resolves the above-mentioned mismatching problem.

Figure 42:
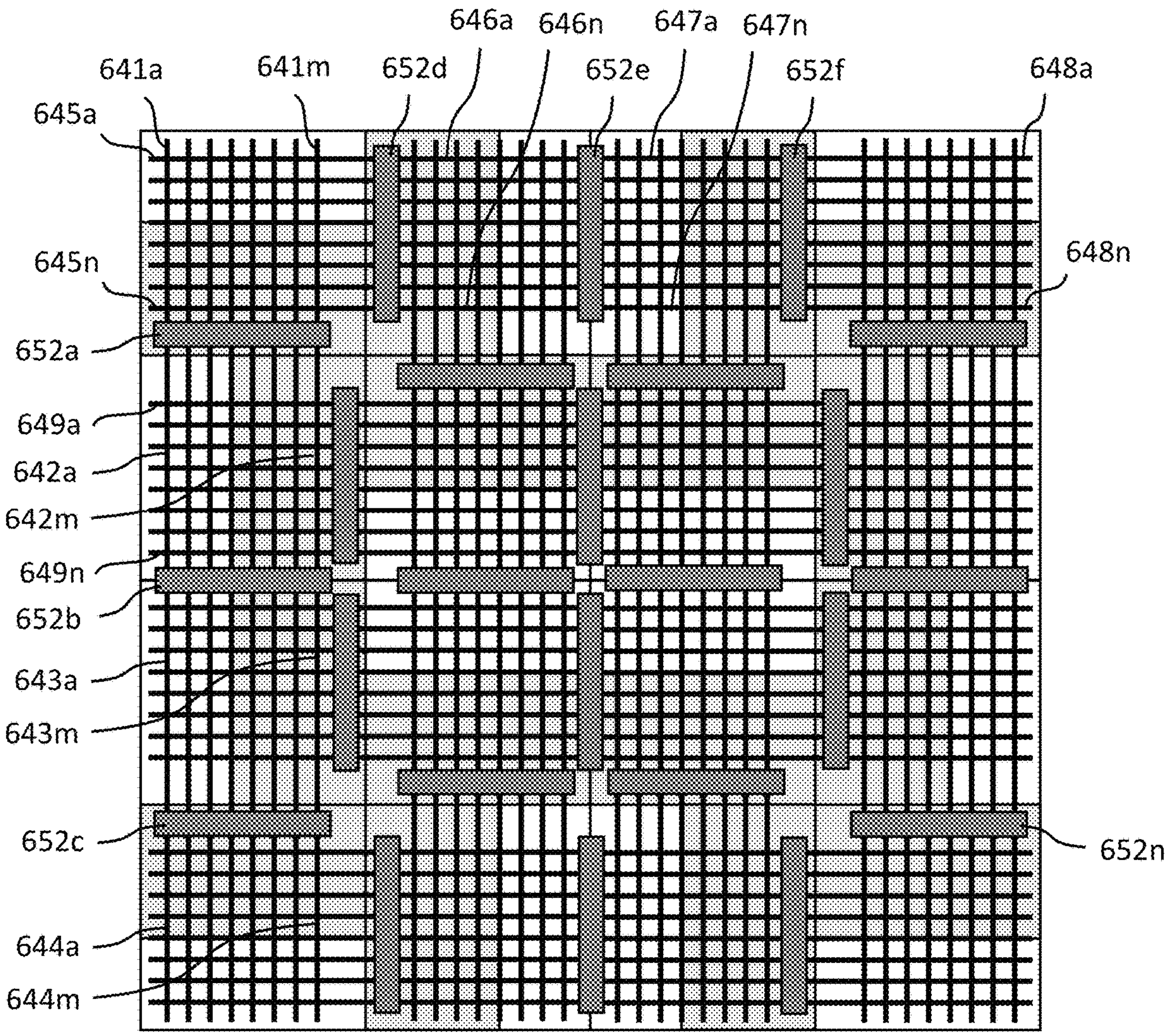
FIG. 42 shows an embodiment of a layout arrangement and connections of neuron circuits according to the invention.

FIG. 42 shows another embodiment of the layout arrangement and connections of the neuron circuits according to the invention. This embodiment is similar to the embodiment shown in FIG. 40C except that additional pass gates such as pass gates 652*a-n* are added between the memory arrays to connect the input lines and the output lines as shown. When the pass gate 652*a* is enabled, the input lines 641*a-m* and 642*a-m* are connected. This configuration extends the output lines from the original 645*a-n* to 645*a-n* and 649*a-n*. Therefore, the number of output lines are doubled. When the pass gates 652*a*, 652*b*, and 652*c* are enabled, the input lines 641*a-m*, 642*a-m*, 643*a-m*, and 644*a-m* are connected. This configuration increases the number of the output lines by four times.

An approach is similar to the approach above can also be applied to extend the number of the input lines. When the pass gate 652*d* is enabled, the output lines 645*a-n* and 646*a-n* are connected. This configuration doubles the number of the input lines. When the pass gates 652*d*, 652*e*, and 652*f* are enabled, the output lines 645*a-n*, 646*a-n*, 647*a-n*, and 648*a-n* are connected. This configuration increases the number of the input lines by four times. By selectively enabling the pass gates 652*a-n*, the number of the input lines and output lines of the neural networks are flexibly configured.

Figure 43A:
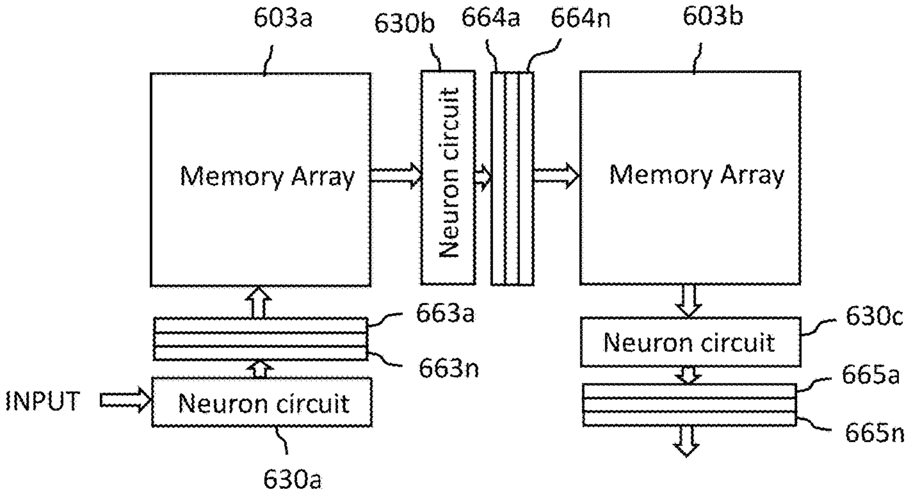
FIG. 43A-E show embodiments of memory array and neuron circuit architectures according to the invention.

FIG. 43A shows an embodiment of a memory array and neuron circuit architecture according to the invention. This embodiment simulates neural networks with the number of input data more than the number of input neuron circuits, like the neural network shown in FIG. 43B.

Figure 43B:
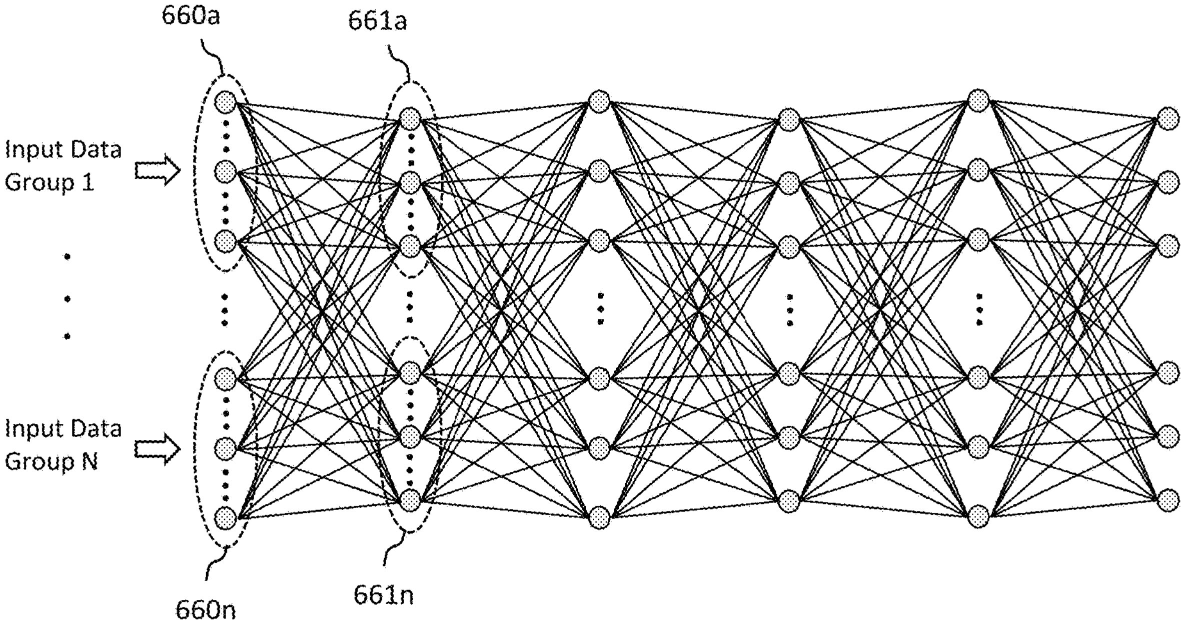

FIG. 43B shows a neural network having a large number of input data. Assume the number of the input data is larger than the number of the input neuron circuits 630*a* shown in FIG. 43A. As illustrated in FIG. 43B, the input data is divided into input data groups 1-N. Each group has the same or a smaller number of data than the number of input neuron circuits 630*a*.

Referring again to FIG. 43A, the input data groups 1-N are sequentially loaded into the input neuron circuit 630*a* and stored in input data buffers also called data registers 663*a-n*, respectively. In one embodiment, the input data buffers 663*a-n* are implemented using static random-access memory SRAM. Then, the input neuron circuit 630*a* feeds the data stored in the input data buffer 663*a* to the memory array to generate the output data in the output neuron circuit 630*b* and stores the data in output data buffer 664*a*. This operation simulates the neural network between the neuron groups 660*a* and 661*a* shown in FIG. 43A. The input neuron circuits 630*a* and 630*b* in FIG. 43A simulate the neuron groups 660*a* and 661*a* in FIG. 43B, respectively.

Next, the input neuron circuit 630*a* repeats the above-described operation to feed the next input data group stored in the input data buffer 663*a-n* to the memory array 603*a* to generate the output data. This operation is repeated until all the input data groups stored in the input data buffers 663*a-n* are processed and the output data are stored in the output data buffers 664*a-n*. For each input data group, different memory cells in the memory array 603*a* are selected to represent the synapses between the neuron groups 660*a-n* and neuron group 661*a* shown in FIG. 43B. The output neuron circuit 630*b* combines the data stored in the data buffers 664*a-n* to generate the final output data for the neuron groups 661*a-n* shown in FIG. 43B.

The above-description demonstrates the operation to simulate the neural network between the first-layer neuron groups 660*a-n* and neuron groups 661*a-n*. This operation is repeated to simulate the next layer of the neural networks until the entire neural network is simulated and the final output data of the last layer of neurons is generated.

The next operation is dependent on the architecture of the memory arrays and neuron circuits. If the architectures shown in FIGS. 38A-B and D are used, the above-described operations are repeated using the data stored in the data buffers 664*a-n* to process the output data based on the cell data weights stored in the memory array 603*b* and store the output data in the output data buffers 665*a-n*.

If the architecture shown in FIG. 38C is used, the next operation reverses the direction of the input and output by using the data stored in the data buffers 664*a-n* to generate the output data based on the cell data weights stored on the memory array 603*a* and stores the output data in the data buffers 663*a-n*.

Figure 43C:
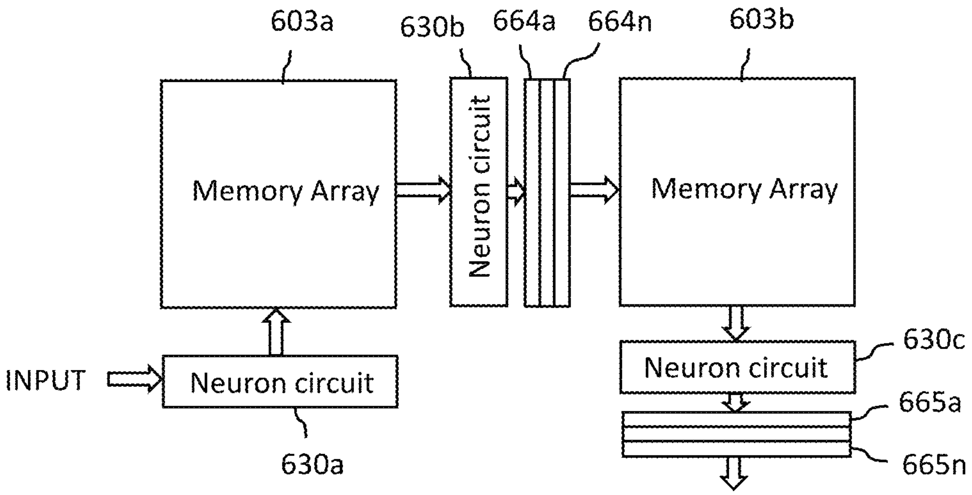

FIG. 43C shows an embodiment of a memory array and neuron circuit architecture. This embodiment is similar to the embodiment shown in FIG. 43A except that the input data buffers 663*a-n* are eliminated. The input data group 1-N shown in FIG. 43B are sequential loaded from the system to the neuron circuit 630*a* to generate the outputs and store the outputs in the output data buffers 664*a-n*, respectively.

Figure 43D:
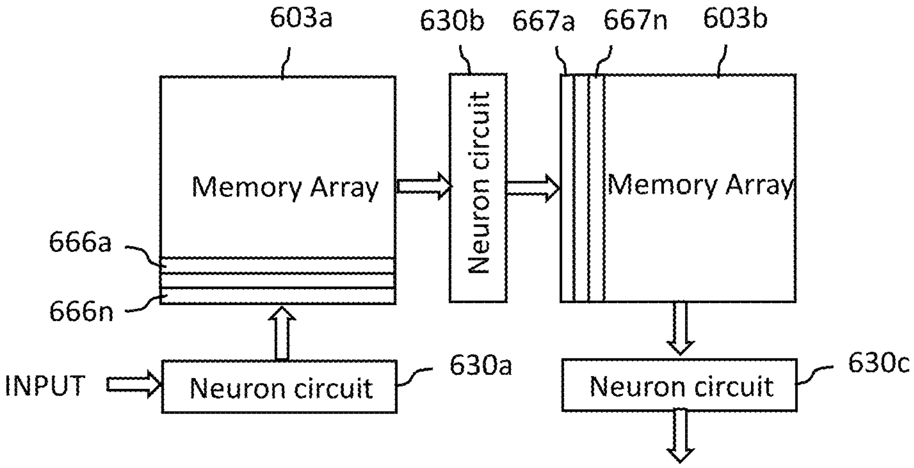

FIG. 43D shows an embodiment of a memory array and neuron circuit architecture. This embodiment is similar to the embodiment shown in FIG. 43A except that the input data groups are stored in the memory cells. For example, the input data groups 1-N are sequentially loaded to the neuron circuit 630*a* and then written to the pages 666*a-n* in the memory array 603*a*, respectively.

Next, the neural circuit 630*a* sequentially loads the data from the pages 666*a-n* to process the output data based on the cell data weights stored in the memory array 603*a* with the output neuron circuit 630*b*. The output neuron circuit

630*b* write the output data of each data group to the pages 667*a-n* in the memory array 603*b*. This operation simulates the first-layer neural network between neuron groups 660*a-n* and neuron groups 661*a-n* shown in FIG. 43B.

Next, the neuron circuit 630*b* reads the data from the pages 667*a-n* and repeats the above-described operation to simulate the next layer of the neural network. This embodiment eliminates the data buffers, such as data buffers 663*a-n*, 664*a-n*, and 665*a-n* shown in FIG. 43A, and thus the layout size and die cost are reduced.

Figure 43E:
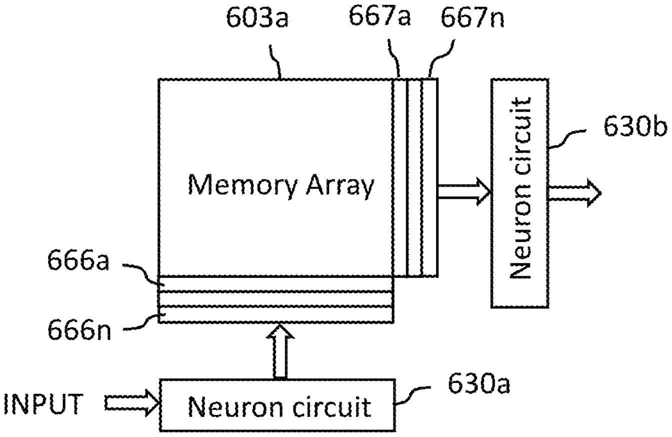

FIG. 43E shows an embodiment of a memory array and neuron circuit architecture. This embodiment is similar to the embodiment shown in FIG. 43D except that the output data groups are stored in the pages 667*a-n* in the same memory array 603*a* as the input data groups. This embodiment is suitable for the single memory array architecture shown in FIG. 38C. In one embodiment, if a 3D memory array is utilized, the input data pages 666*a* to 666*n* and output data pages 667*a-n* are located in different layers of the memory array.

Although 3D cell structures and 3D array structures are shown in some embodiments according to this invention, the application of this invention is not limited to 3D cell and array structures. All the disclosed embodiments, including but not limited to, array architectures, neuron circuit architectures, layout arrangements, operations, bias conditions, and circuit designs can be applied to any suitable memory technologies including two-dimensional (2D) and three-dimensional (3D) cell structures and array structures, especially for the embodiments shown in FIGS. 16A-17B, FIGS. 19A-20D, FIGS. 32A-D, FIGS. 36A-D, FIG. 41, and FIGS. 43A-E.

Figure 44A:
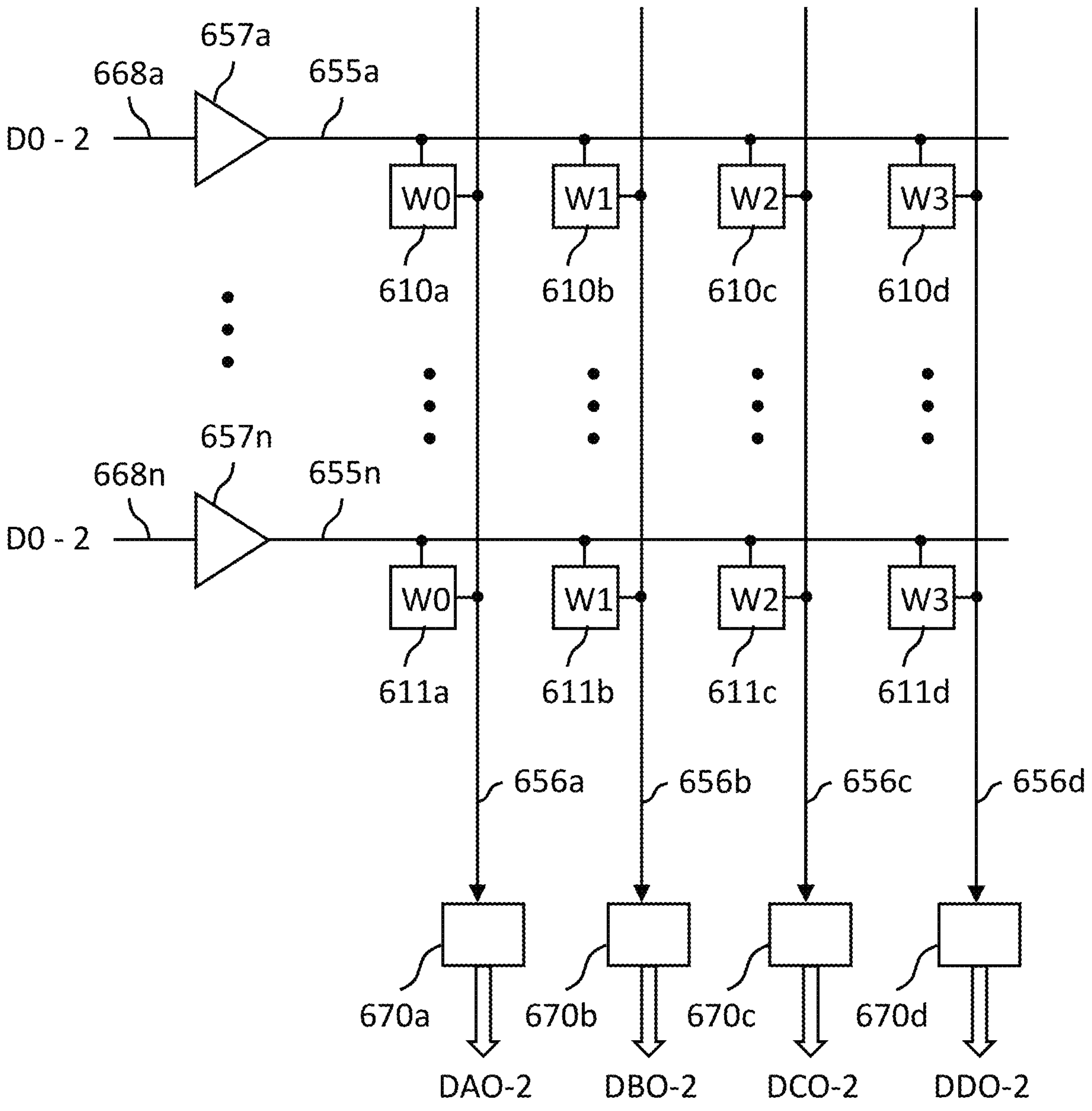
FIG. 44A shows an embodiment of circuit architecture configured to convert cell currents to digital data according to the invention.

FIG. 44A shows an embodiment of circuit architecture configured to convert cell currents to digital data according to the invention. For illustration it will be assumed that each input contains four bits of data, D0-3, such as 668*a-n*, and each synapse contains four bits of weights, W0-2, stored in four cells such as 610*a-d* and 611*a-d*.

The operation of this embodiment is similar to the embodiment shown in FIG. 33D. First, the D0 bit of the input data 668*a-n* are applied to the input neuron circuits 657*a-n* to generate the input signals for input lines 655*a-n*. The input signal comprises a voltage level, such as VR shown in FIG. 32A for data 1 and 0V for data 0. The input signals turn on or turn off the cells 610*a* to 611*a* according to the weights stored in the cells. This operation simulates the multiplication function described in FIG. 13B. The currents of the cells 610*a* to 611*a* are summed in the output line 656*a*, that simulates the summation function 222 described in FIG. 13B.

When the D0 bit is fed to the input neuron circuits 657*a* to 657*n*, the corresponding output neuron circuit 670*a* is enabled to sense the current on the output line 656*a*. Each output neuron circuit 670*a-d* comprises an analog to digital A/D converter circuit. For illustration it will be assumes that 16 input data 668*a-n* are applied. This generates 16 levels of current on the output line 656*a*. Therefore, the A/D converter in the output neuron circuit 670*a* converts the current on the output line 656*a* to four bits of data, DA0-3.

Next, the D1, D2, and D3 bits of the input data 668*a-n* are sequentially applied to the input neuron circuits 657*a-n* to repeat the above-described operation by enabling the corresponding output neuron circuits 670*b-d*, respectively, to generate the other three sets of output data DB0-3, DC0-3, and DD0-3, respectively.

Figure 44B:
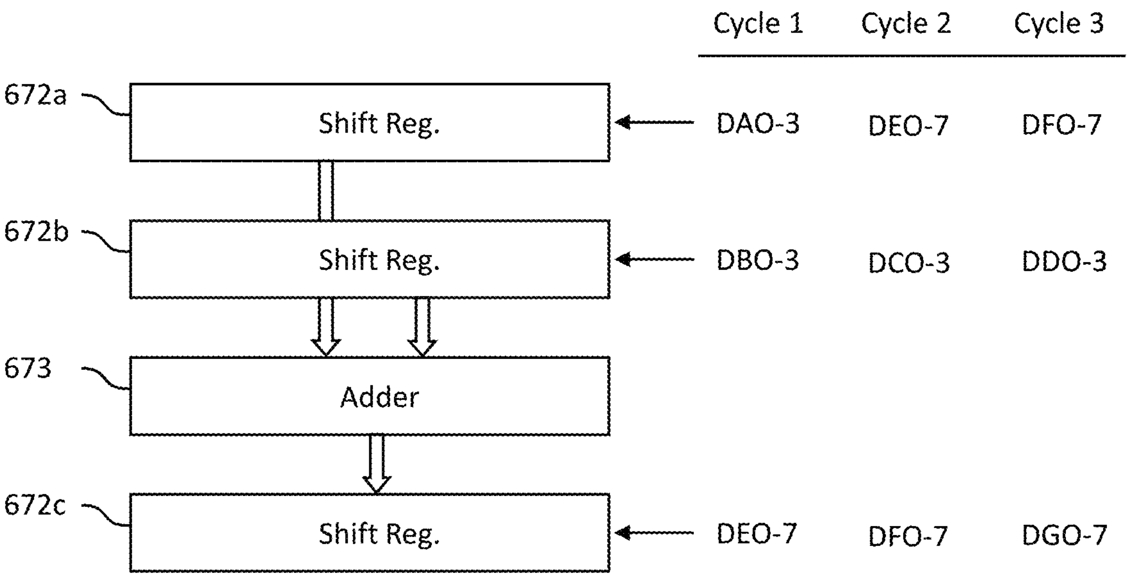
FIG. 44B shows an embodiment of a circuit implementation to convert the four sets of output data to eight-bit data according to the invention.

FIG. 44B shows an embodiment of a circuit implementation to convert the four sets of output data, DA0-3, DB0-3, DC0-3, and DD0-3 to eight-bit data according to the invention. The circuit includes two eight-bit shift registers 672*a* and 672*b*. The operation comprises 3 cycles. In cycle 1, the first set of data, DA0-3, and second set of data, DB0-3, are located into the shift registers 672*a* and 672*b*, respectively.

Figure 44C:
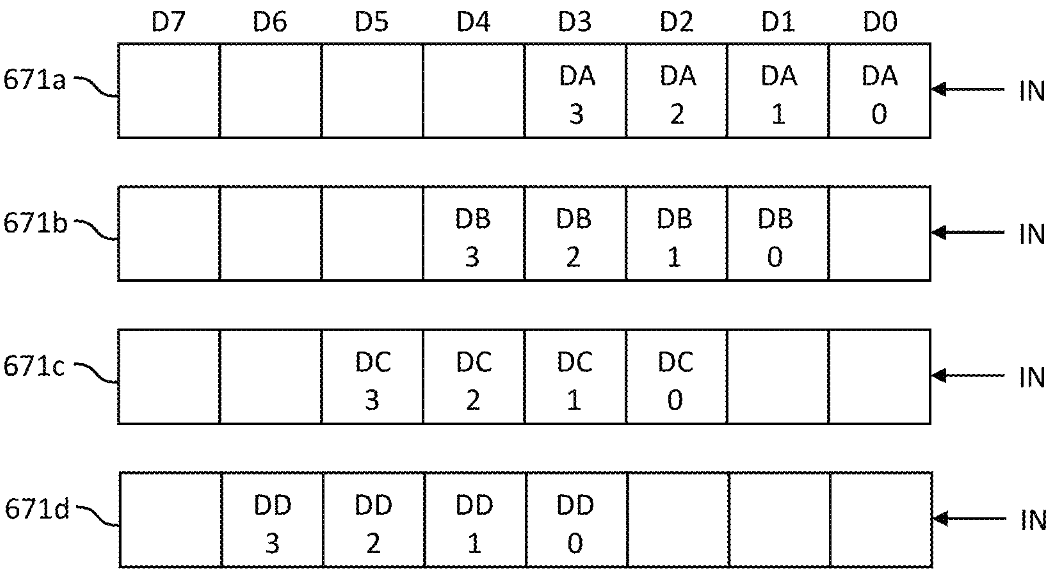
FIG. 44C shows an arrangement of shift register data.

FIG. 44C shows an arrangement of the data in the shift registers 672*a* and 672*b*. Data locations 671*a* and 671*b* show the bit location of DA0-3 and DB0-3 in the shift registers 672*a* and 672*b*, respectively. Because DA0-3 represents the multiplication result of the D0 bit of the input data and the W0 bit of the weights, DA0-3 are shifted into D0-3 bits of the shift register 672*a*. Because DB0-3 represents the multiplication result of the D1 bit of the input data and the W1 bit of the weights, DB0-3 are shifted into D1-4 bits of the shift register 672*b*. Then, referring to FIG. 44B, DA0-3 in the shift register 672*a* and DB0-3 in the shift register 672*b* are added by an adder circuit 673 to generate output data, DE0-7, stored in the third shift register 672*c*.

In cycle 2, the output data, DE0-7, and the next set of data, DC0-3, are loaded into the shift registers 672*a* and 672*b*, respectively. The bit location of DC0-3 in the shift register is shown in 671*c* in FIG. 44C. Because DC0-3 represents the multiplication result of the D2 bit of the input data and the W2 bit of the weights, DC0-3 are shifted into D2-5 bits of the shift register. Then, referring to FIG. 44B, DE0-7 and DC0-3 in the shift register 672*a* and 672*b* are added by an adder circuit 673 to generate output data, DF0-7, stored in the third shift register 672*c*.

In cycle 3, the output data, DF0-7, and the next set of data, DD0-3, are loaded into the shift registers 672*a* and 672*b*, respectively. The bit location of DD0-3 in the shift register is shown in 671*d* in FIG. 44C. Because DD0-3 represents the multiplication result of the D3 bit of the input data and the W3 bit of the weights, DD0-3 are shifted into D3-6 bits of the shift register. Then, referring to FIG. 44B, DF0-7 and DD0-3 in the shift register 672*a* and 672*b* are added by an adder circuit 673 to generate an output data, DG0-7, stored in the third shift register 672*c*. As a result, the data DG0-7 represents the result of multiplication and summation of the 16 input data 668*a-n* and the weights stored in the cells 610*a-d*. Next, the output data DG0-7 is sent to an activation function generator not shown to generate the final output data. In the previous embodiments, the number of input data, the data bits of input, the data bits of weights, and the data bits of shift registers are just examples. In other embodiments, the invention may be applied to any variation of the above-mentioned parameters.

Figure 45A:
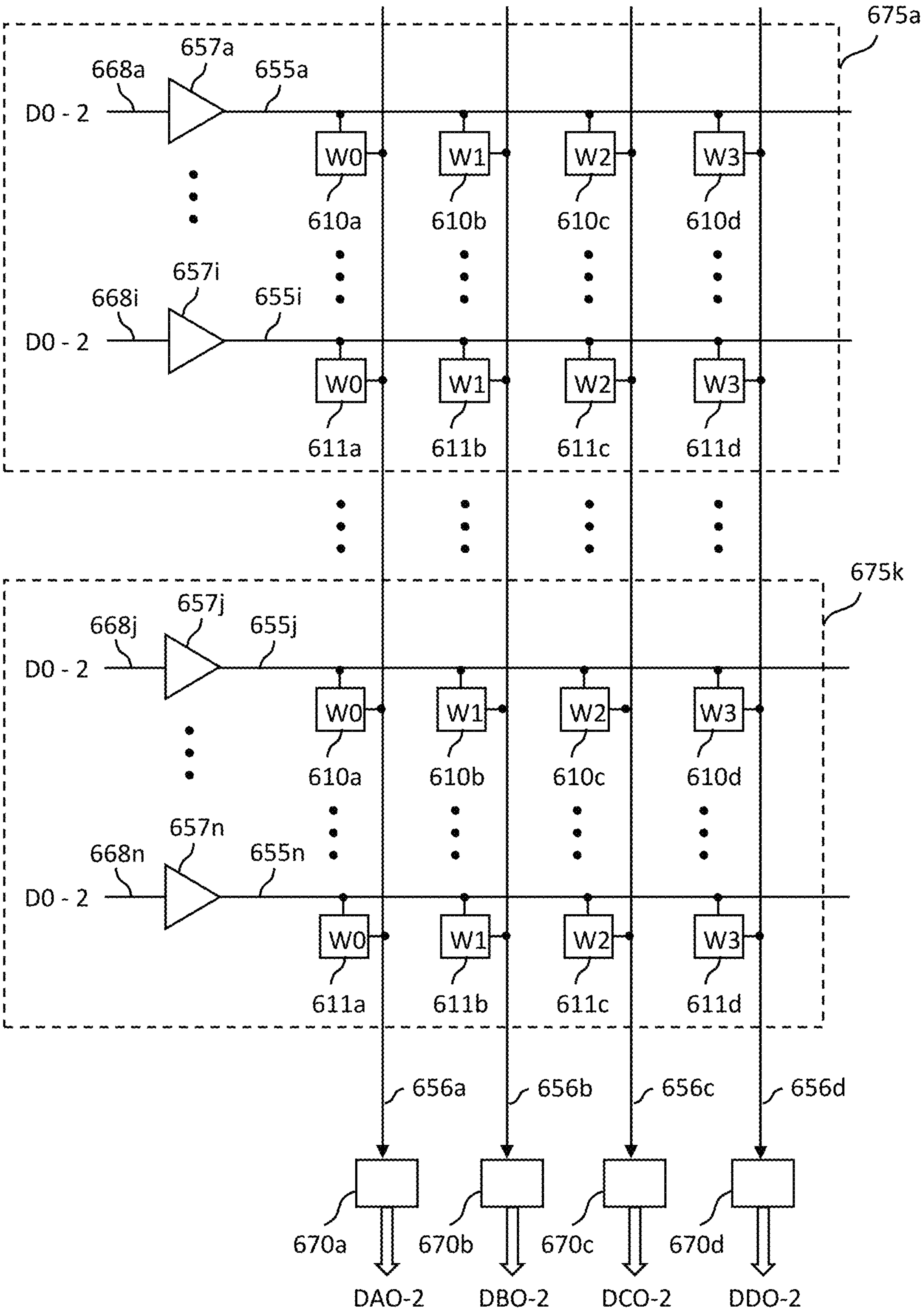
FIG. 45A shows an embodiment according to the invention.

FIG. 45A shows an embodiment according to the invention. In this embodiment, it will be assumed that the simulated neural network contains a large number of input data 668*a-n*. To reduce peak current consumption and error rate caused by cell current variation, the input data 668*a-n* and the corresponding cells are divided into multiple groups such as groups 675*a-k*. Each group has any suitable number of inputs. For illustration, it will be assumed that the number of total input data 668*a-n* is 256. The 256 input data 668*a-n* is divided into 16 groups. Each group has 16 input data such as input data 668*a-i*. It is also assumed that each input data comprises 4 data bits, D0-3, like the embodiments shown in FIGS. 44A-C. Therefore, the description of the embodiments shown in FIGS. 44A-C can be applied to demonstrate the operation of each group of input data in this embodiment.

Figure 45B:
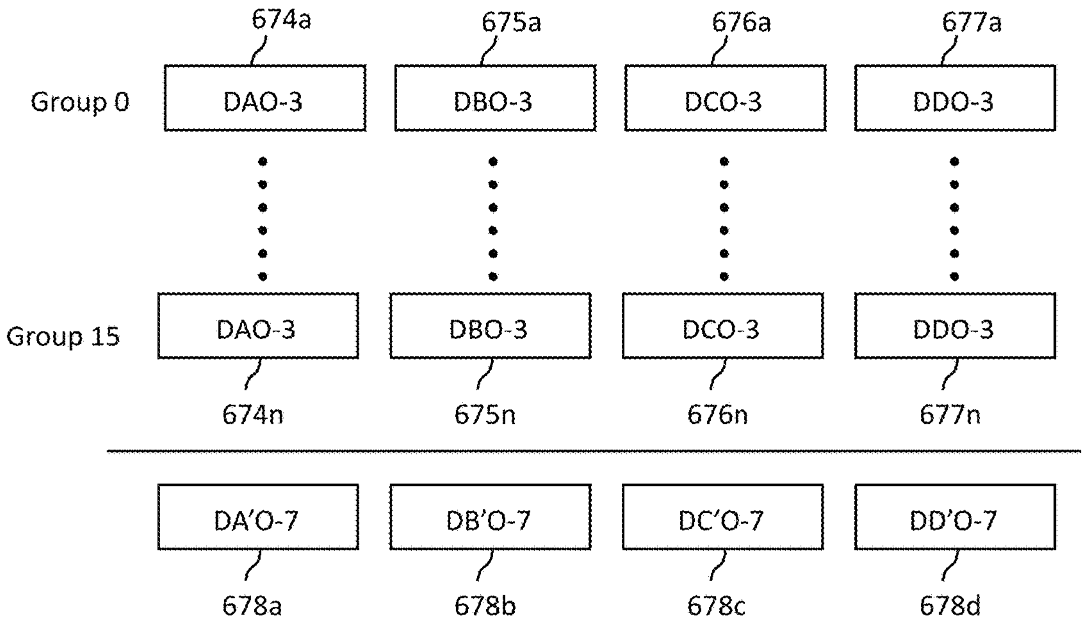
FIGS. 45B-C show exemplary operation of a neural network in accordance with the invention.
Figure 45C:
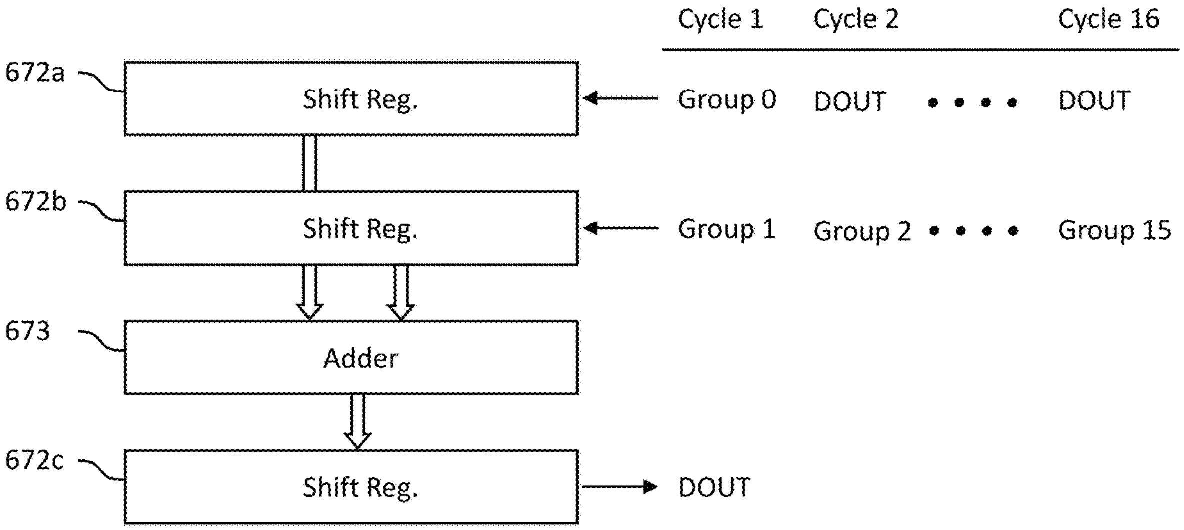

FIGS. 45B-C show exemplary operation of a neural network in accordance with the invention. First, the D0 bit of the 16 groups of input data is sequentially loaded to generate 16 groups of data, DA0-3 674*a-n* as shown in FIG.

45B. The 16 groups of data DA0-3 are sequentially loaded into the shift registers 672*a-b* as shown in FIG. 45C to add the 16 groups of data DA0-3 to generate the output DA'0-7 678*a* shown in FIG. 45B.

The operations shown in FIG. 45C is similar to the operations shown in FIG. 44C. First, data DA0-3 of the group 0 and group 1 are loaded into the shifter registers 672*a* and 672*b* and added by the adder circuit 673 to generate the output, DOUT, stored in the register 672*c*. Then, DOUT is loaded into the shift register 672*a* and added with DA0-3 of the next group 2. This operation is repeated until DA0-3 of all the 16 groups are added. Then, the above-mentioned operation is repeated for D1-3 bits of the input data to generate DB'0-7 678*b*, DC'0-7 678*c*, and DD'0-7 678*d* shown in FIG. 45B.

Figure 45D:
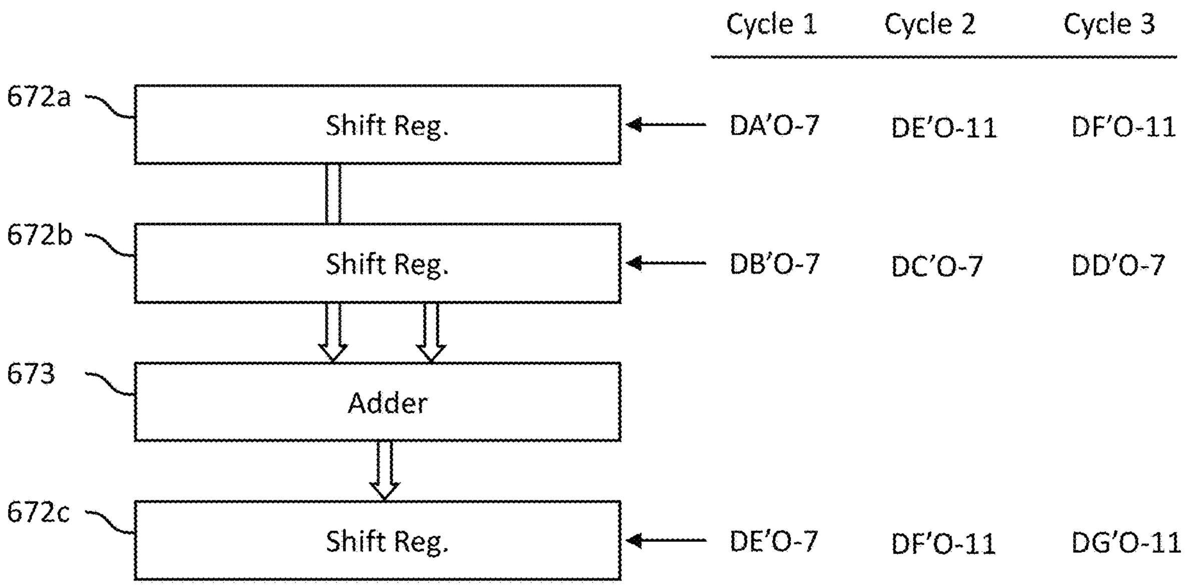
FIG. 45D shows how data are added in a neural network to generate a final output.

FIG. 45D shows how data DA'0-7, DB'0-7, DC'0-7, and DD'0-7 are added to generate a final output, DG'0-11. The operations shown in FIG. 45D are similar to the operations shown in FIG. 44C except that each shift registers 672*a-c* comprises 12 bits. First, DA'0-7 and DB'0-7 are loaded into the shifter registers 672*a* and 672*b* and added by the adder circuit 673 to generate the output, DE'0-11, stored in the register 672*c*. Next, DE'0-11 is loaded into the shift register 672*a* and added with DC'0-7 to generate the output, DF'0-11. Next, that data DF'0-11 is loaded into the shift register 672*a* and added with that data DD'0-7 to generate the final output, DG'0-11. As a result, the operations shown in FIGS. 45A-D perform the multiplication and summation of the 256 input data 668*a-n* and the weights stored in the groups 675*a-k* to generate the final data DG'0-11. After that, DG'0-11 is sent to an activation function generator not shown to generate the final output data.

Figures 46A, 46B:
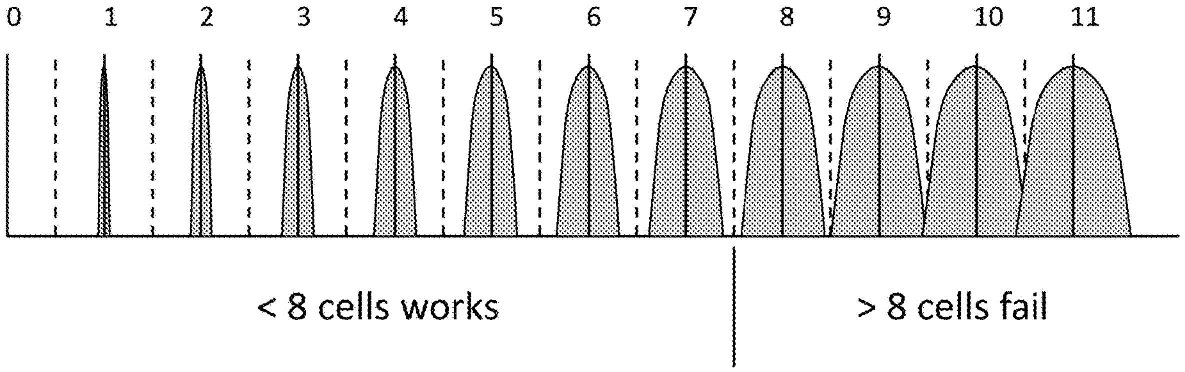
FIG. 46A shows an exemplary current distribution of summation (accumulation) of multiple cells.
FIG. 46B shows a relationship between cell current variation and a number of cells that work.

FIG. 46A shows an exemplary current distribution of summation (accumulation) of multiple cells. It will be assumed that the current of each cell has variations as shown in grey shading. When the currents of more cells are summed, the variations will become larger and cause failures, as shown in cells number 8 to 11.

FIG. 46B shows a relationship between the cell current variation and the number of cells that work. The higher cell current variation, the summation of fewer cells can work.

Figure 47A:
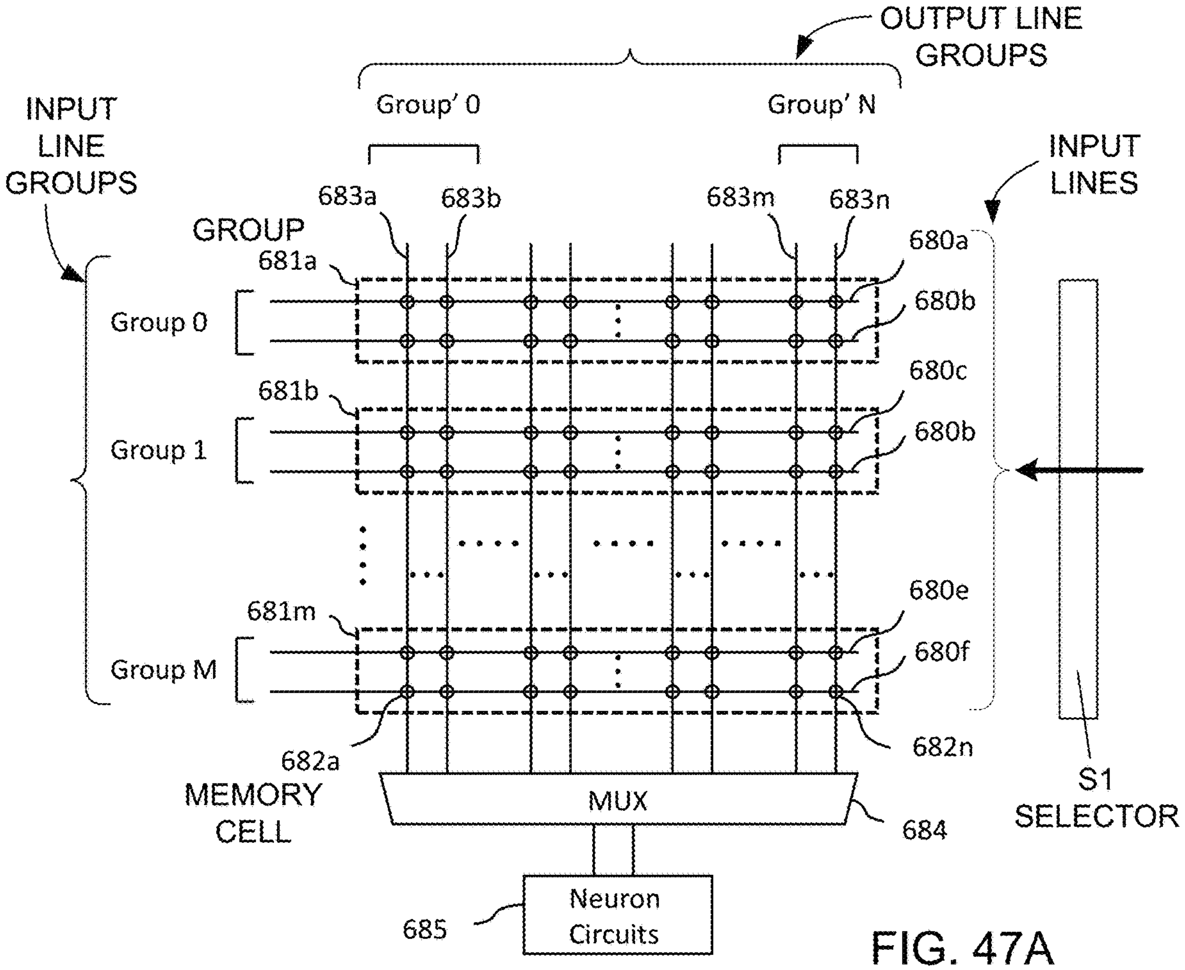
FIG. 47A shows an embodiment of a network that addresses cell summation failures according to the invention.

FIG. 47A shows an embodiment of a memory cell network configured to address cell summation failures in accordance with the invention. FIG. 47A comprises a plurality of memory cells, such as memory cells 682*a-n*. In one embodiment, each memory cell stores one bit of digital data. In another embodiment, memory cells, such as the memory cells 682*a-n* store multiple-level or analog data. The memory cells can be any suitable type of memory cells, such as flash memory cells, floating body cells, ferroelectric random-access memory (FRAM) cells, resistive random-access memory (RRAM) cells, magneto-resistive random-access memory (MRAM) cells, phase-change memory (PCM) cells. It should be noted that the embodiments disclosed herein are not limited to these cell structures and can be applied to any type of memory cell structures, such as planer types of cell structures and cross-point types of cell structures.

Referring to FIG. 47A, the input lines 680*a-f* to the network are divided into multiple (0-M) groups 681*a-m*. Each group comprises multiple input lines, such as group (0) 681*a* comprises input lines 680*a-b*. The number of input lines in each group may not exceed the cell number shown in FIG. 46A. During operation, the groups 681*a-m* are sequentially selected by a selector (S1) (e.g., selects appropriate input lines) to limit the selected number of cells in each output line in the selected output line group, such as group' 0 (683*a-b*) to group' N (683*a-n*). The output lines 683*a-n* are also organized into groups (groups' 0-N).

A multiplexer 684 sequentially selects the output line groups, such as group' 0 comprising output lines 683*a* to 683*b* and passes the summation of the cell currents to neuron circuits 685. The neuron circuits 685 comprise analog-to-digital converters, or operational amplifiers, or comparators to convert the summation of cell currents into digital data. In one embodiment, the above-mentioned converter, amplifier, or comparator circuits also performs an ‘activation function’ such as a sigmoid function.

Figure 47B:
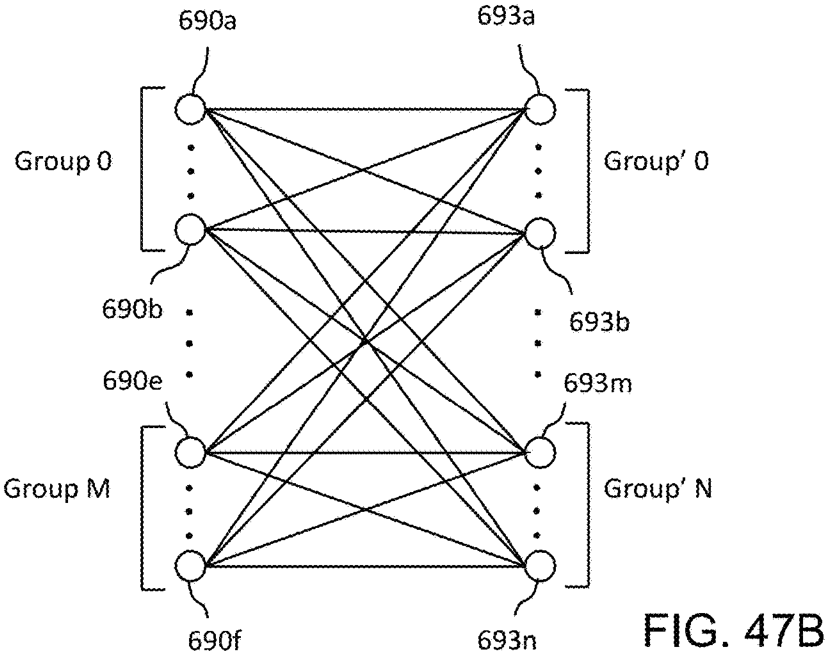
FIG. 47B shows an equivalent neural network architecture simulated by the embodiment shown in FIG. 47A.

FIG. 47B shows an equivalent neural network architecture simulated by the memory cell network embodiment shown in FIG. 47A. The input lines 680*a-b* in FIG. 47A simulate the neurons 690*a-b* shown in FIG. 47B. For example, the input lines 680*e-f* (group M) in FIG. 47A simulate the neurons 690*e-f* (group M) shown in FIG. 47B. The output lines 683*a-b* (group' 0) in FIG. 47A simulate the neurons 693*a-b* (group' 0) shown in FIG. 47B. The output lines 683*m-n* (group' N) in FIG. 47A simulate the neurons 693*m-n* (group' N) shown in FIG. 47B.

Figure 48A:
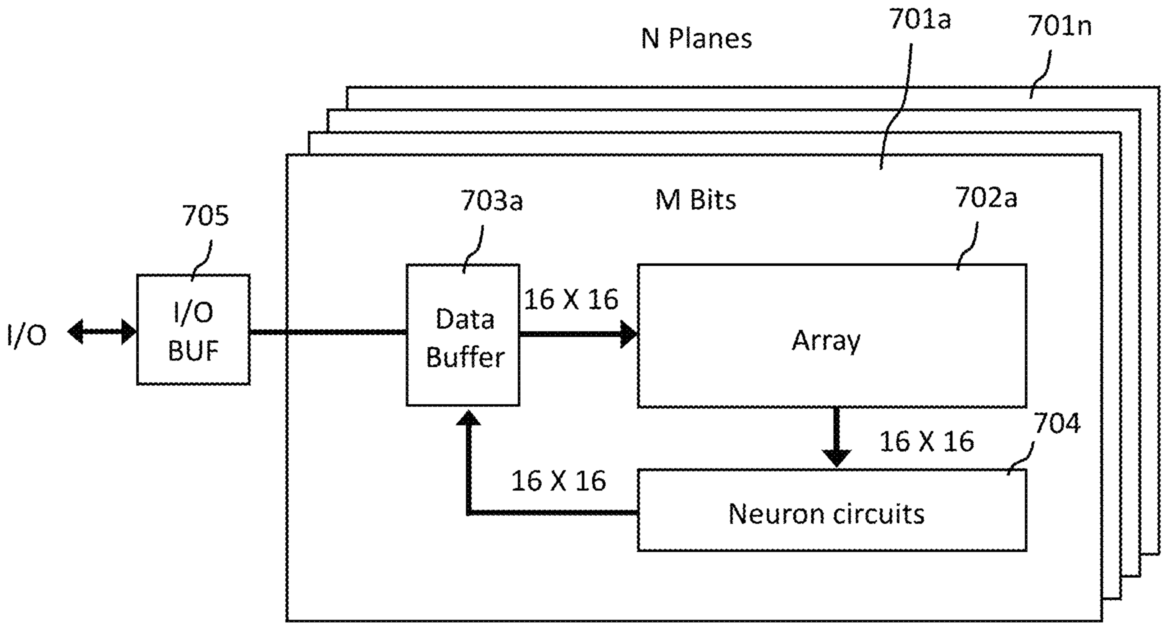
FIG. 48A shows an embodiment of a circuit block diagram of an AI memory chip architecture according to the invention.

FIG. 48A shows an embodiment of a circuit block diagram of an AI memory chip architecture according to the invention. The chip comprises multiple planes 701*a-n*. Each plane comprises single or multiple memory cell arrays such as array 702*a*. The data buffer 703*a* applies input data to the input lines of the array 702*a*. The input data comprises multiple groups, such as 16 groups of 16 inputs (16×16) as an example, as described in FIGS. 47A-B.

The multiplication and summation functions of neural networks are performed by the memory cells to generate a sum of cell currents as described in FIG. 13A-D. The sum of cell currents will be sent to neuron circuits 704. The neuron circuits 704 will convert the current into digital data. In one operating mode, the digital data will be sent to the data buffer 703*a* and then sent to an input/output I/O buffer 705 for data output. The embodiment uses 16 groups of 16 inputs and outputs (16×16) as an example; however, any suitable number of inputs and outputs may be applied.

In another operating mode, the output data sent from the neuron circuits 704*a* to the data buffer 703*a* is sent back to the array 702*a* as the input data of the next layer of the simulated neural network. After the input data is processed in the array 702*a* and the neuron circuits 704, the next output data is sent to the data buffer 703*a* and then sent back to the array 702*a* again to be the input data of the next layer of the simulated neural network. This process is repeated as many times as desired to simulate a multiple-layer neural network, as shown in FIG. 13A.

Figure 48B:
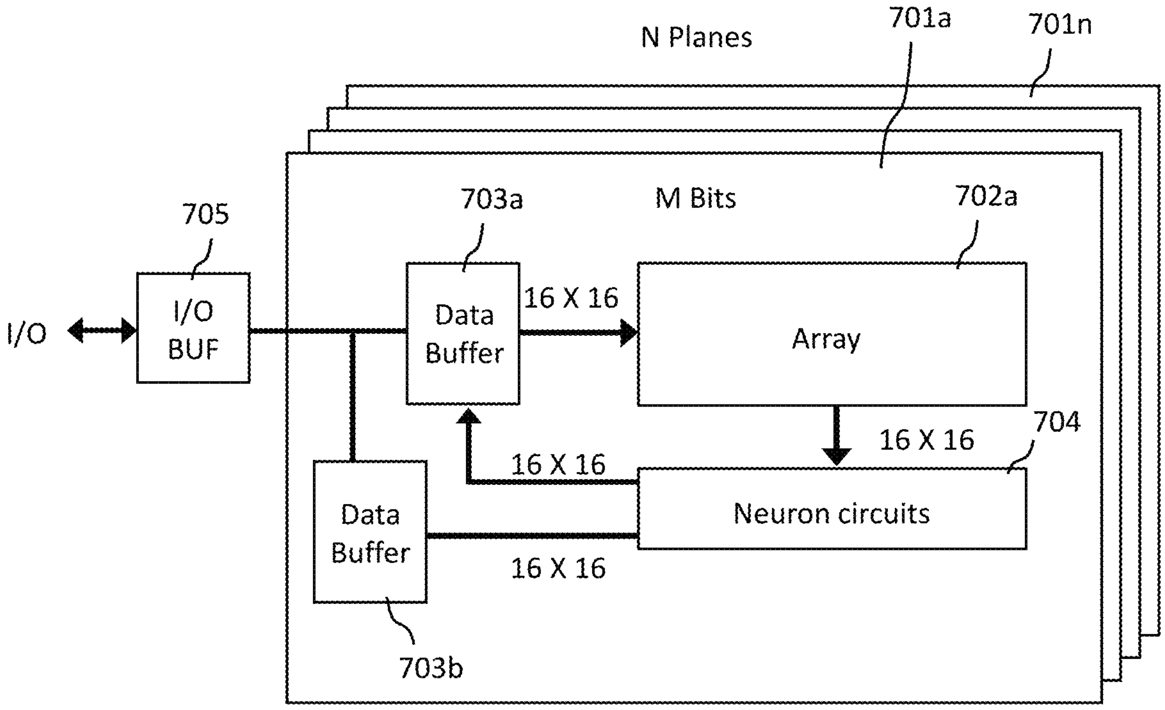
FIG. 48B shows an embodiment of a circuit block diagram of an AI memory chip architecture according to the invention.

FIG. 48B shows an embodiment of a circuit block diagram of an AI memory chip architecture according to the invention. This embodiment is similar to the embodiment shown in FIG. 48A except that an additional data buffer 703*b* is added. The output data is sent from the neuron circuits 704 to the data buffer 703*b* and then sent to the I/O buffer 705 for data output. This embodiment allows the chip to input data to the data buffer 703*a* and output data from the data buffer 703*b* simultaneously.

Figure 49A:
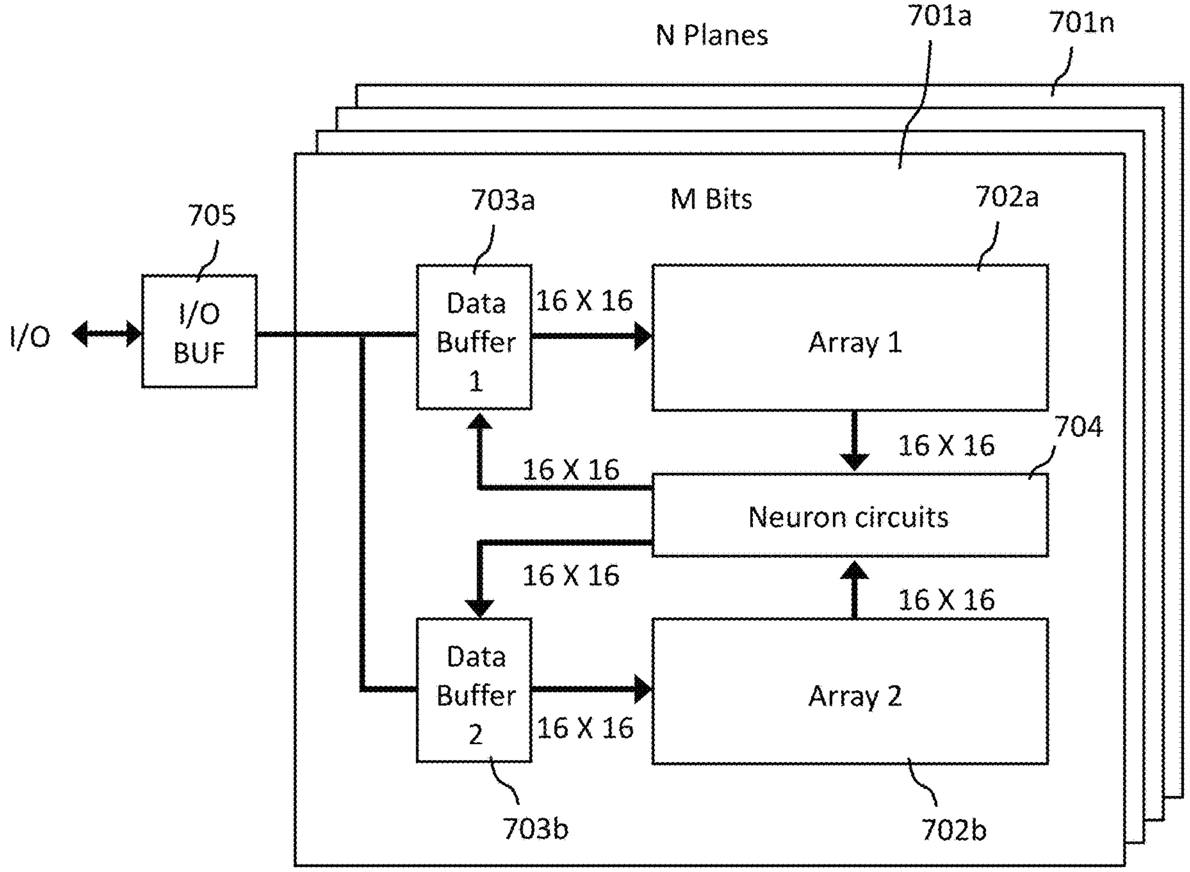
FIG. 49A shows an embodiment of a circuit block diagram of an AI memory chip architecture according to the invention.

FIG. 49A shows an embodiment of a circuit block diagram of an AI memory chip architecture according to the invention. This embodiment is similar to the embodiment shown in FIG. 48A except that an additional array 702*b* is added. This dual-array structure allows the two arrays 702*a* and 702*b* to alternately output data to the neuron circuits 704. When the arrays 702*a* or 702*b* are outputting data to the neuron circuits, the other arrays 702*b* or 702*a* input data from the data buffers 703*b* or 703*a* simultaneously. This process reduces the delay in waiting for data input.

Figure 49B:
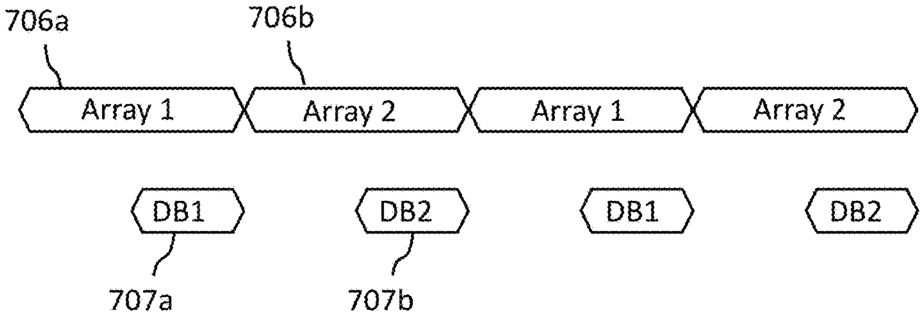
FIG. 49B shows an example of a timing diagram that illustrates the operation waveforms of the embodiment shown in FIG. 49A.

FIG. 49B shows an example of a timing diagram that illustrates the operation waveforms of the embodiment shown in FIG. 49A. Processing intervals 706*a* and 706*b* show intervals of data processing in array 1 702*a* and array 2 702*b* and the outputting of data to the neuron circuits 704, respectively. The intervals 707*a* and 707*b* show intervals when data is output from the neuron circuits 704 to the data buffers 703*a* and 703*b*, respectively.

In another operating mode, data output from the neuron circuits 704 to the data buffers 703*a* and 703*b* is sent back to the arrays 702*a* and 702*b* to be the input data of the next layer of the simulated neural network to simulate a multiple-layer neural network, as described with respect to FIG. 48A.

Figure 50A:
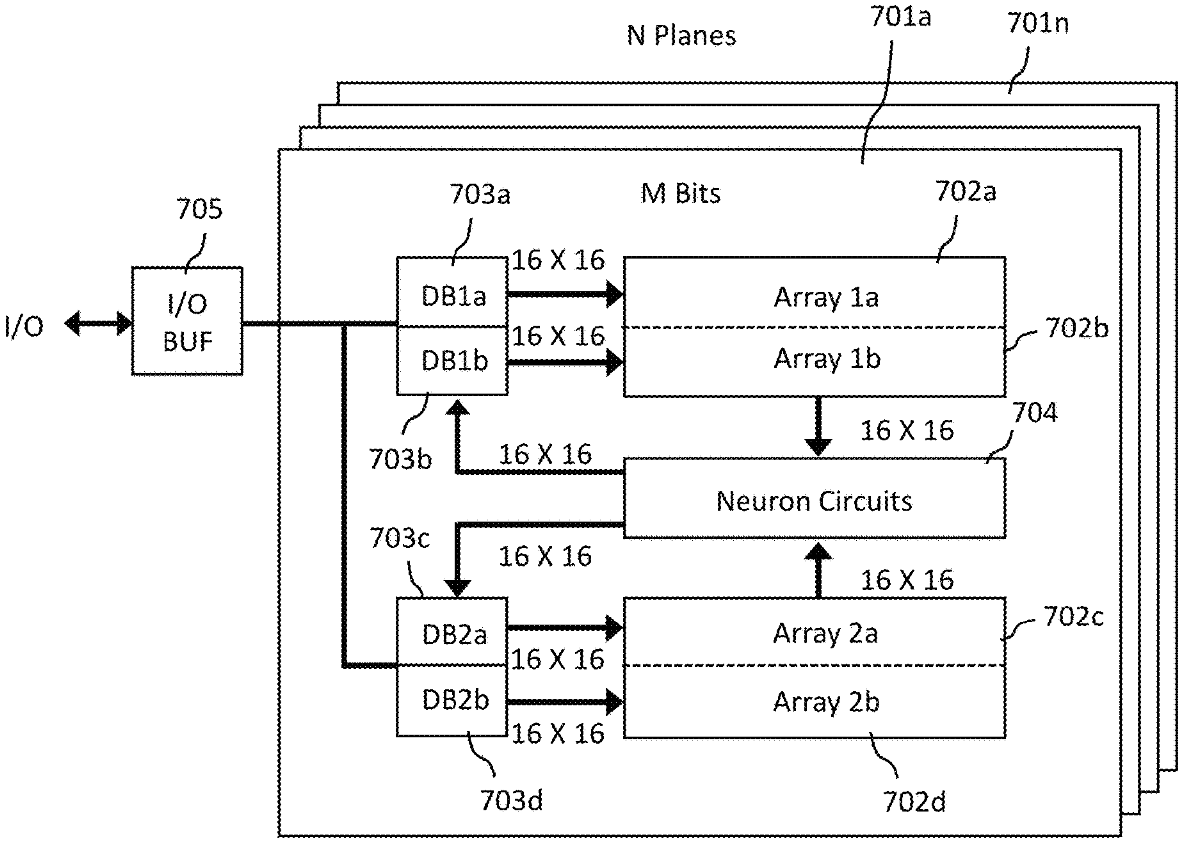
FIG. 50A shows an embodiment of a circuit block diagram of an AI memory chip architecture according to the invention.

FIG. 50A shows an embodiment of a circuit block diagram of an AI memory chip architecture according to the invention. This embodiment is similar to the embodiment shown in FIG. 49A except that each array is divided into two or more sub-arrays, such as sub-arrays 702*a*, 702*b*, 702*c*, and 702*d*. The data buffers 703*a-d* apply the input data to the sub-arrays 702*a-d*, respectively. The neuron circuits 704 output data to the data buffers 703*a-d* independently. This embodiment allows the chip to input data, output data, and process data in parallel.

Figure 50B:
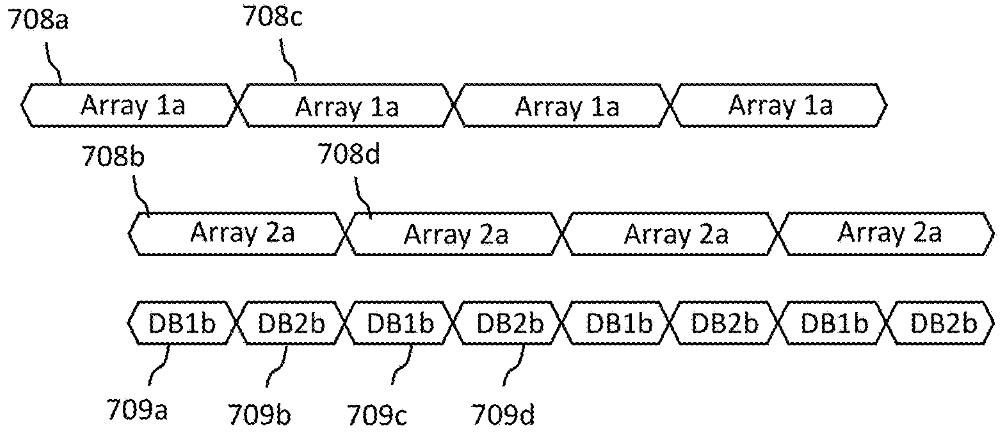
FIG. 50B shows an embodiment of a timing diagram that illustrates operation waveforms for the architecture shown in FIG. 50A.

FIG. 50B shows an embodiment of a timing diagram that illustrates operation waveforms for the architecture shown in FIG. 50A. The interval 708*a* shows a time interval during which array 1*a* 702*a* is processing data and outputting the data to the neuron circuits 704. During interval 709*a*, array 1*a* 702*a* processes input data from the data buffer 703*a*. When the data is ready, the interval 709*a* shows when the data is output to the neuron circuits 704 and then sent to the data buffer 703*b*. Meanwhile, during interval 708*b*, the array 2*a* 702*c* processes input data from the data buffer 703*c*. When the data is ready, as shown during the interval 709*b*, the data is output to the neuron circuits 704 and then sent to the data buffer 703*d*. Meanwhile, the array 1*a* 702*a* processes the next input data from the data buffer 703*a* in parallel, as shown during the interval 708*c*.

The above-described operations can be repeated to input data from the data buffers 703*a-c*, process data in arrays 1*a* 702*a* and array 2*a* 702*c*, and output data to the neuron circuits 704 and then to the data buffers 703*b* and 703*d*, respectively. This embodiment allows the above-mentioned operation to be performed continuously without waiting periods to increase the data processing throughput.

Figure 50C:
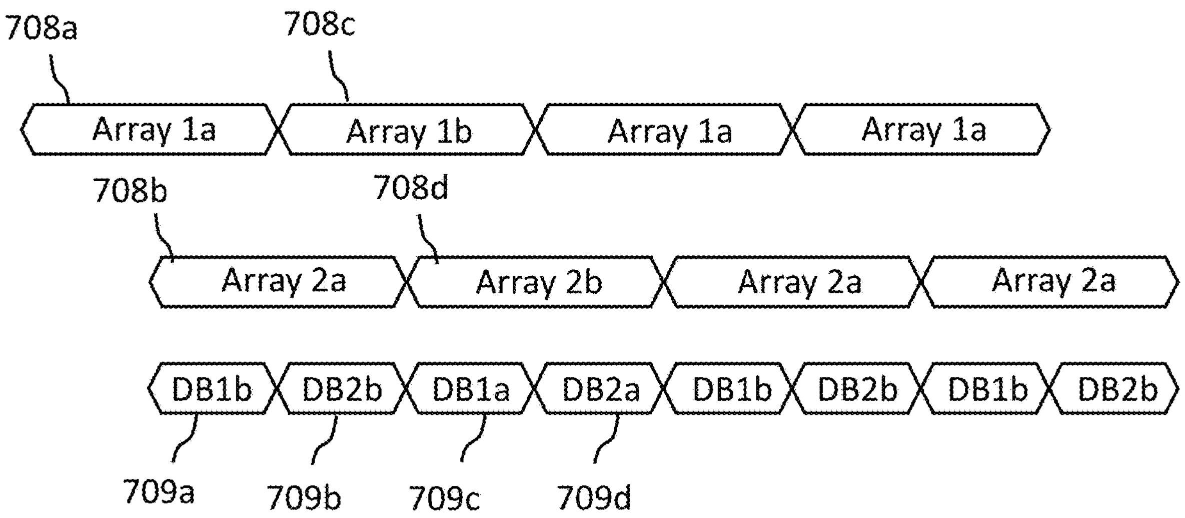
FIG. 50C shows an embodiment of a timing diagram that illustrates operation waveforms for the architecture shown in FIG. 50A.

FIG. 50C shows an embodiment of a timing diagram that illustrates operation waveforms for the architecture shown in FIG. 50A. In another operating mode, the output data from the neuron circuits 704 that is sent to the data buffers 703*b* and 703*d* is sent back to the arrays 702*b* and 702*d*, respectively, to be the input data of the next layer of the simulated neural network to simulate a multiple-layer neural network, as described with respect to FIG. 48A. In this operating mode, the data is alternately processed by arrays 1*a*, 2*a*, 1*b*, and 2*b*, as shown at 708*a*, 708*b*, 708*c*, and 708*d*, respectively, as shown in FIG. 50C.

Figure 51A:
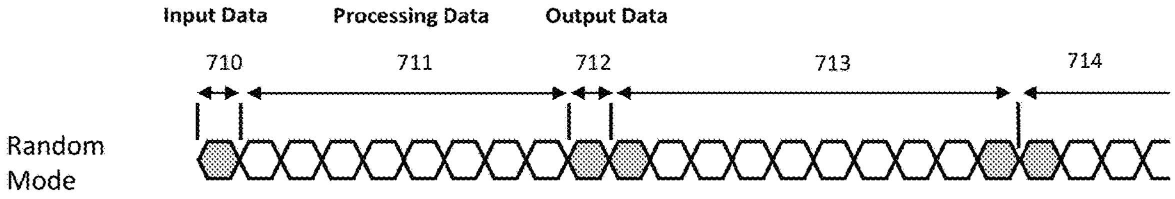
FIG. 51A-C show embodiments of operating waveforms for an architecture according to the invention.
Figure 51B:
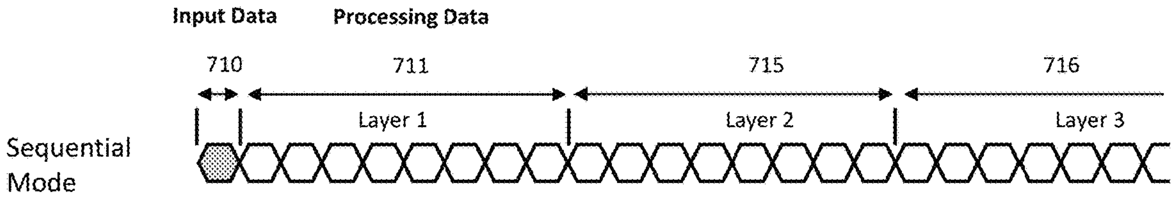
Figure 51C:
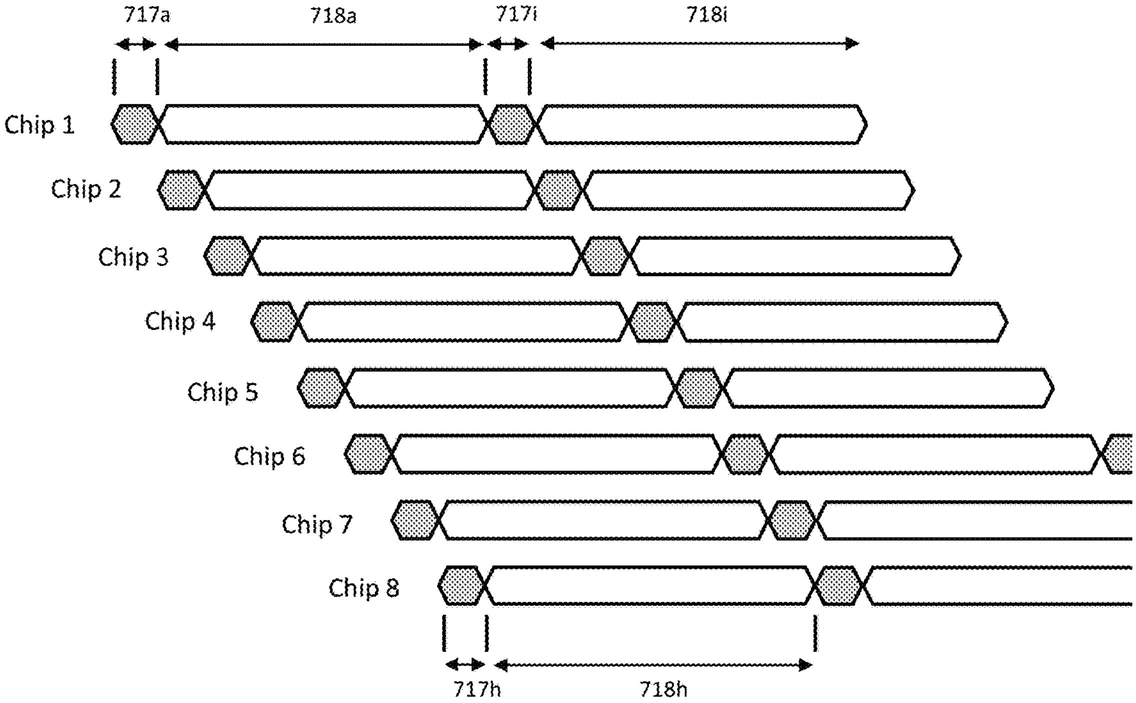

FIG. 51A-C show embodiments of operating waveforms for an architecture according to the invention.

FIG. 51A shows a waveform illustrating a 'random mode' of operation. During interval 710, data is input to the chip. During interval 711, the data is processed inside the chip using the previously described operations shown and described with respect to FIGS. 48A-50B. During interval 712, the chip outputs the data. This operation can be repeated with the next input data, as shown in the intervals 713 and 714.

FIG. 51B shows a waveform illustrating a 'sequential mode' of operation. During interval 710, data is input to the chip. During interval 711, the data is processed inside the chip using the previously described operations shown and described with reference to FIGS. 48A-50B. Next, the output data is sent back to the array as the input data of the next layer of the simulated neural network, as previously described with reference to FIGS. 48A-50B. Therefore, the output period is eliminated. This operation can be repeated to simulate a multiple-layer neural network as shown 715 and 716 in FIG. 51B. When the desired neural network is simulated, the output data can be sent out from the chip not shown.

FIG. 51C shows a waveform illustrating 'multiple chip' operation. This operation is suitable for memory products that contain multiple chips, such as high bandwidth memory (HBM). It will be assumed that the product comprises 8 chips as an example. In the interval 717*a*, the system loads input data into the first chip. Once the data is input, the first chip can start processing the data internally, as shown during the interval 718*a*. This frees up the system data bus. Therefore, the system can continue loading input data into the next chips in parallel until all the chips are loaded, as shown during interval 717*h*. Each chip will start processing the data once the input data is loaded.

When the data processing interval 718*a* of the first chip is finished, the system reads the out data from the first chip or loads the next input data to the first chip, as shown during interval 717*i*. Once the next input data is loaded, the first chip starts processing the data as shown during the interval 718*i*. Then, the operation shown during the intervals 717*a-h* is repeated to load the next input data to all the chips and process the data internally as shown during the intervals 718*a-h*. This operation reduces the waiting period and greatly increase the data processing throughput.

Figure 52A:
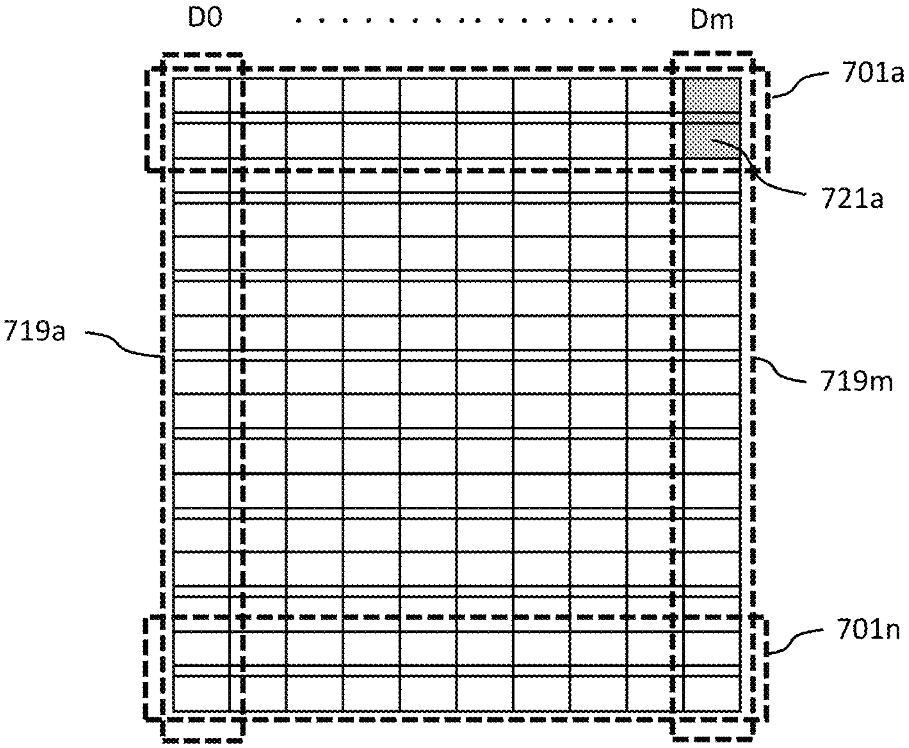
FIG. 52A-B show embodiments of a floorplan layout of a chip according to the invention.
Figure 52B:
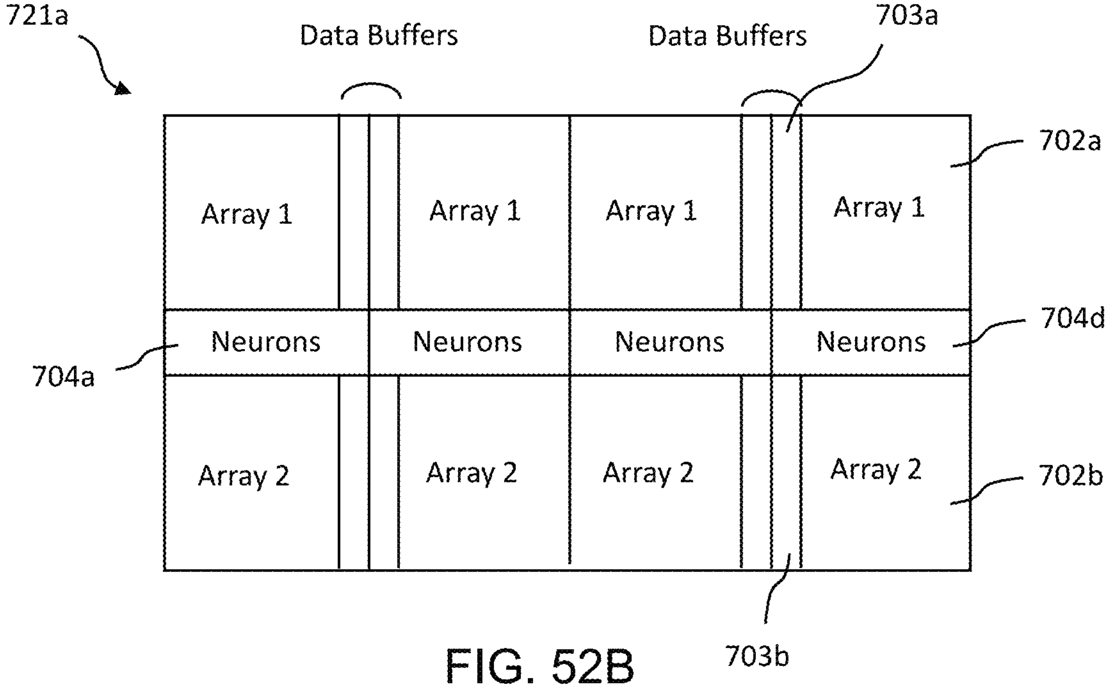

FIGS. 52A-B show embodiments of a layout floorplan of a chip according to the invention.

FIG. 52A illustrates that the chip comprises multiple banks, such as banks 719*a* to 719*m*. Each bank processes one bit of the input data. For example, assuming an input data has M bits such as D0-Dm, the chip can have M banks to process the D0-Dm of the data. The chip comprises multiple planes, such as planes 701*a* to 701*n*. Each plane comprises multiple blocks, such as block 721*a* to process the data in parallel. This configuration greatly increases the data processing throughput.

FIG. 52B shows an embodiment of a layout floorplan of the block 721 shown in FIG. 52A. The block 721 comprises multiple arrays, such as arrays 702*a* and 702*b*, and multiple neuron circuits, such as neurons 704*a-d*, and multiple data buffers, such as buffers 703*a* and 703*b*. This architecture allows multiple arrays to perform the operations shown in FIG. 48A-50B in parallel to greatly increase the data processing throughput.

Figure 53A:
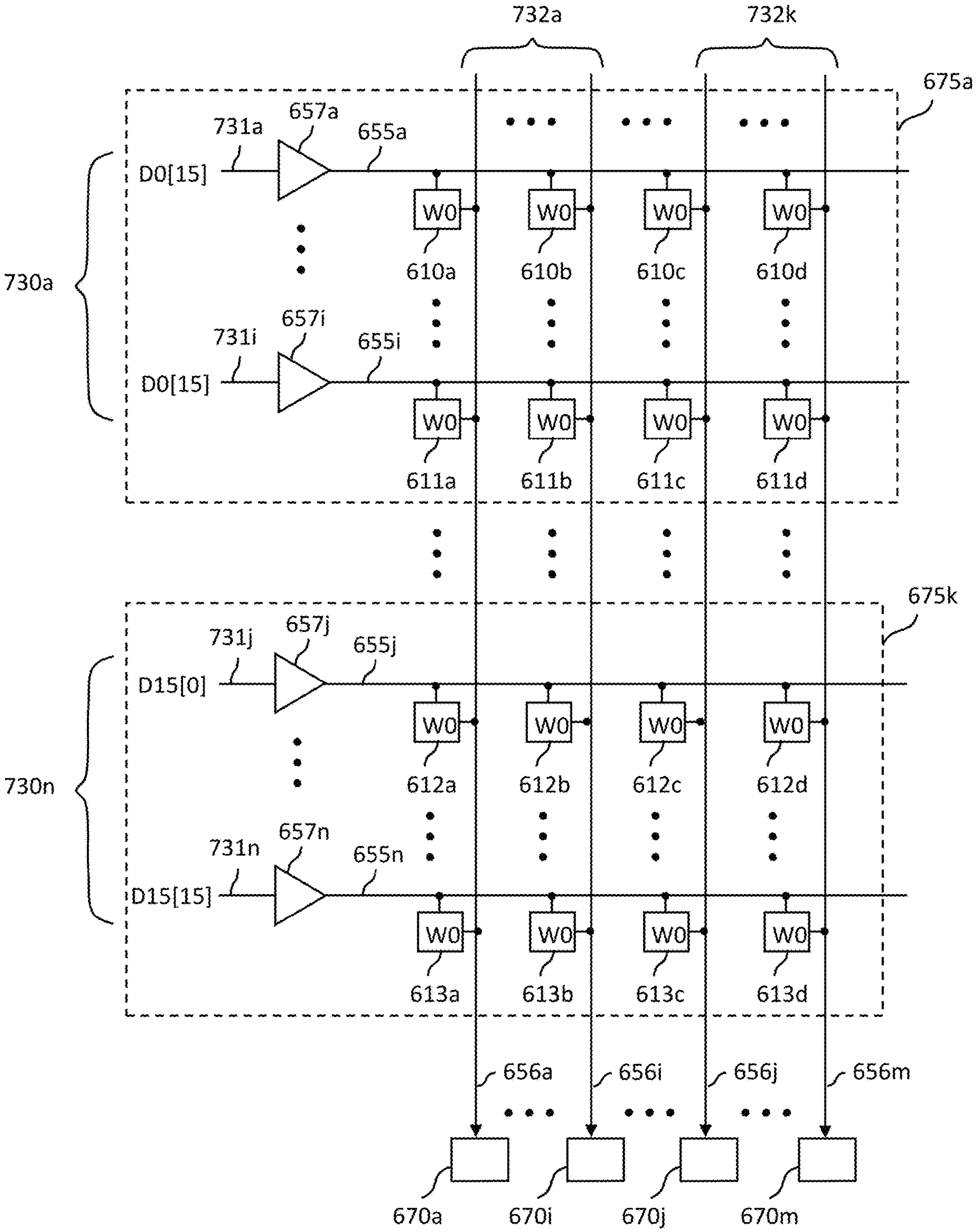
FIG. 53A shows an embodiment of a circuit architecture to convert cell currents to digital data according to the invention.

FIG. 53A shows an embodiment of a circuit architecture to convert cell currents to digital data according to the invention. This embodiment is similar to the embodiment shown in FIG. 52A except that the data bits, such as bits D0-Dm of the input data are processed in different banks, such as bank 719 shown in FIG. 52A. For example, assuming the input data contains 8 bits, D0-7 and the array comprises 8 banks, then each bank will process one-bit data.

FIG. 53A shows an embodiment of an array such as array 702*a* shown in FIG. 52B in a block, such as block 721 shown in FIG. 52A. As an example, it will be assumed that the input contains 16 input data groups 730*a-n*. Each input group contains 16 bits of input data such as bits 731*a-i* and bits 731*j-n*. It will also be assumed that the output contains 16 output line groups 732*a-k*. Each output group contains 16 output lines such as output lines 656*a-i* and output lines 656*j-m*. It should be noted that the above-mentioned numbers for input groups, input data, output groups, and output lines are just examples for demonstration purposes and that any other suitable numbers may be used.

Assuming the array is located in the bank for data bit D0, each input data 731*a-n* is the D0 bit of the input data. The memory cells such as cell 610*a-d* store the W0 bit of the weights. The W0 bit of the weights corresponds to the D0 bit of the input data. During operations, the input data groups 730*a-n* are sequentially applied to the input neuron circuits or input drivers such as circuit 657*a-i* to generate the data for the input lines such as input lines 655*a-i*. This operation limits the number of processed inputs to prevent the resolution loss problem described with reference to FIGS. 46A-B.

The input lines such as input lines 655*a-i* turn on the cells 610*a-b* and the cells 611*a-b* according to the weights stored in the cells. This process simulates the multiplication function of neural networks. The cell currents will sum in the output lines 656*a-m*. This process simulates the summation function of neural networks. The summed currents are sent to the neuron circuits 670*a-m*.

In one embodiment, the neuron circuits 670*a-m* perform an activation function, such as a sigmoid function or any other suitable functions to generate the outputs according to the summed currents. In this embodiment, the neuron circuits 670*a-m* comprise operational amplifiers circuits to generate non-linear outputs for the activation functions.

In another embodiment, the neuron circuits 670*a-m* convert the summed current into digital output data without using activation functions. Then, the output data is output to other chips, such as a graphic processing unit (GPU) to perform the activation functions by the GPU. In this embodiment, the neuron circuits 670*a-m* comprise analog to digital (A/D) converter circuits.

Figure 53B:
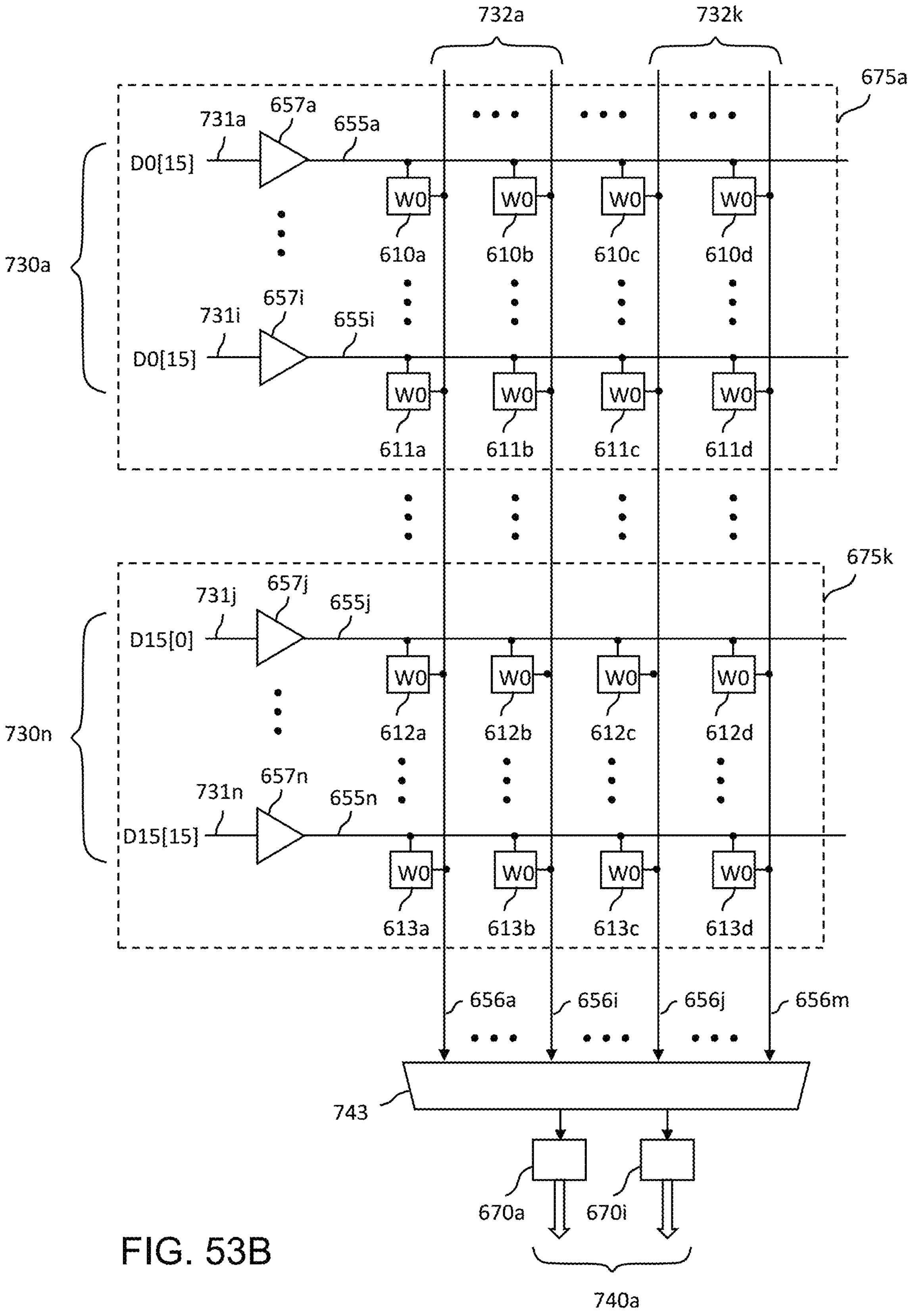
FIG. 53B shows an embodiment of a circuit architecture to convert cell currents to digital data according to the invention.

FIG. 53B shows another embodiment of the array architecture according to the invention. This embodiment is similar to the embodiment shown in FIG. 53A except that a multiplexer 743 is added. The multiplexer 743 selects one output line group, such as group 656*a-i* or group 656*j-m* to connect to the neuron circuits 670*a-i*. This embodiment reduces the circuit size of the neuron circuits.

Figure 54A:
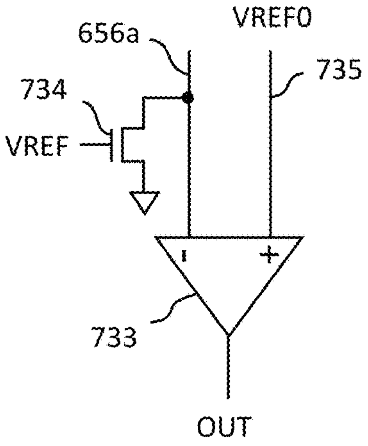
FIGS. 54A-B shows exemplary neuron circuits in accordance with the invention.
Figure 54B:
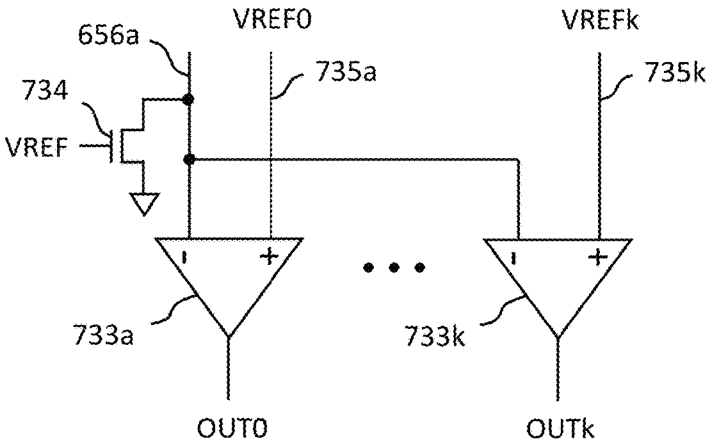

FIGS. 54A-B shows exemplary neuron circuits in accordance with the invention. In one embodiment, the neuron circuits 670*a-m* comprise a single-bit A/D converter, such as the one shown in FIG. 54A. The circuit shows in FIG. 54A comprises a comparator or amplifier circuit 733 and a pull-down or pull-up device 734. The gate of the pull-down device is connected to a reference voltage, VREF, to make the pull-down device conduct a constant current. The current of the pull-down device 734 is ratioed with the sum of the cell currents in the output line 656*a* to generate an input voltage for the comparator 733. The input voltage is compared with a reference voltage, VREF0, in the other input 735 to generate the output data, OUT. Referring to FIG. 53A, a neuron circuit, such as circuit 670*a* converts the summed current from the input group, such as input data group 730*a* and the cells 610*a* to 611*a* into single-bit data.

In another embodiment, the neuron circuits 670*a-m* comprise multiple-bit A/D converters, such as the multiple-bit A/D converter shown in FIG. 54B. This circuit is similar to the circuit shown in FIG. 54A except that the input voltage of the output line 656*a* is applied to multiple comparators or amplifiers 733*a-k*, and then compared with multiple reference voltages, VREF0-VREFk, to generate multiple-bit outputs, OUT0-OUTk.

Please notice, the number of the comparators 733*a-k* used can be any suitable number. For example, it will be assumed that each input data group, such as input data group 730*a* comprise M input data and the neuron circuit, such as circuit 270*a* comprises K comparators. When 2K=M, the outputs of the comparators will have the full resolution of the input group. When 2K<M, the outputs of the comparators will have reduced resolution of the input group. In one embodiment, the number of the comparators is decided according to the tradeoff of the desired resolution and the number of the comparators.

In another embodiment, the neuron circuits 670*a-m* comprise logic circuits, such as the circuit shown in FIG. 45C to combine the multiple output data for the input data groups 730*a-n* into one data. The detailed description of FIGS. 45A-C describe this operation.

Figure 55:
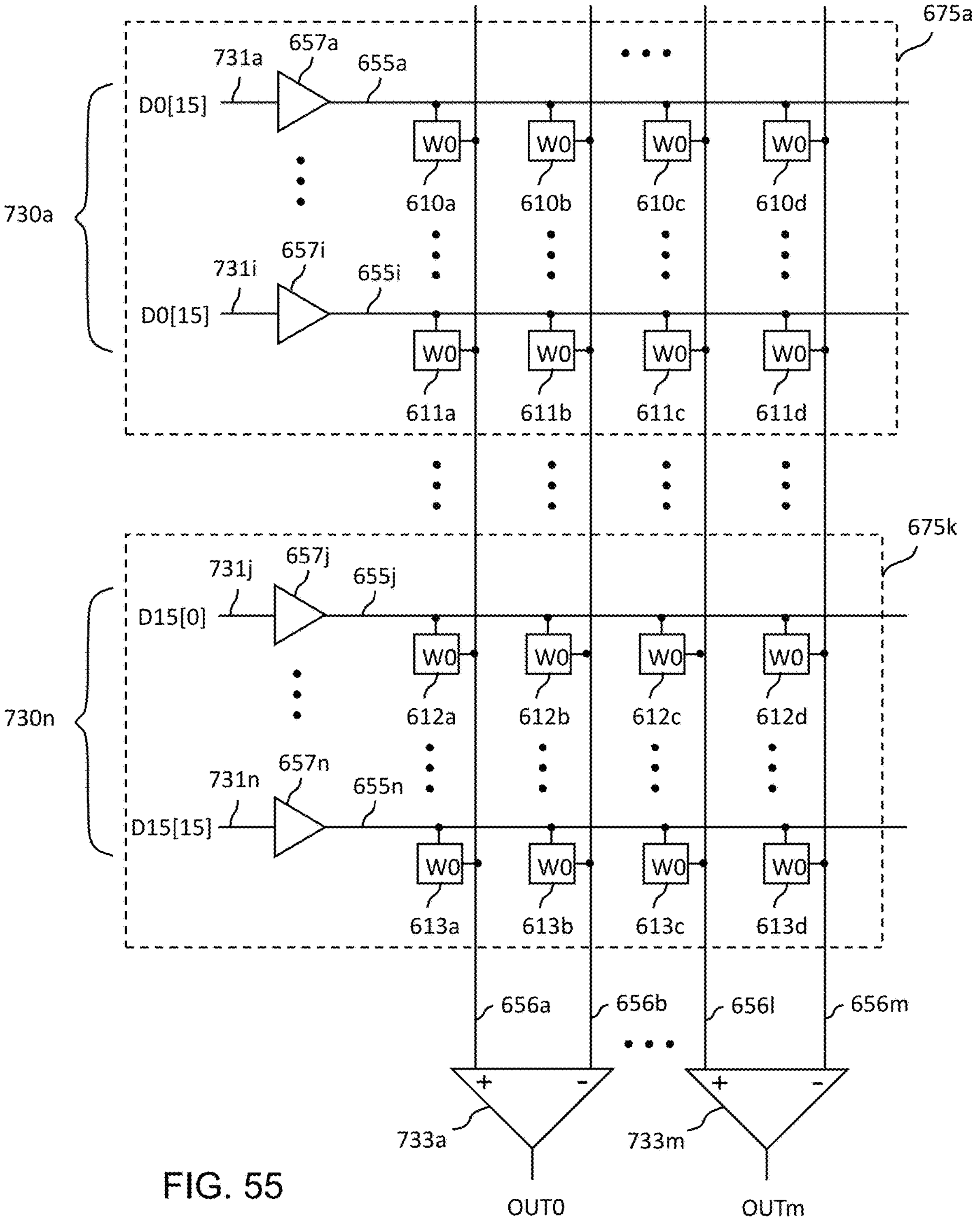
FIG. 55 shows an embodiment of an array that represents a block.

FIG. 55 shows an embodiment of an array, such as array 702*a* shown in a block in FIG. 52B that represents a block, such as block 721 shown in FIG. 52A. This embodiment is similar to the embodiment shown in FIG. 53A except that each comparator 733*a-m* in the neuron circuits are connected to two output lines, such as lines 656*a-b*. The comparator 733*a* compares the voltages of the output lines 656*a* and 656*b* to generate the output, OUT0. The output lines 656*a* and 656*b* are connected to the positive input and negative input of the comparator 733*a*, respectively. Therefore, the weights stored in the cells 610*a* to 613*a* represent positive weights, and the weights stored in the cells 610*b* to 613*b* represent negative weights, respectively.

Figure 56A:
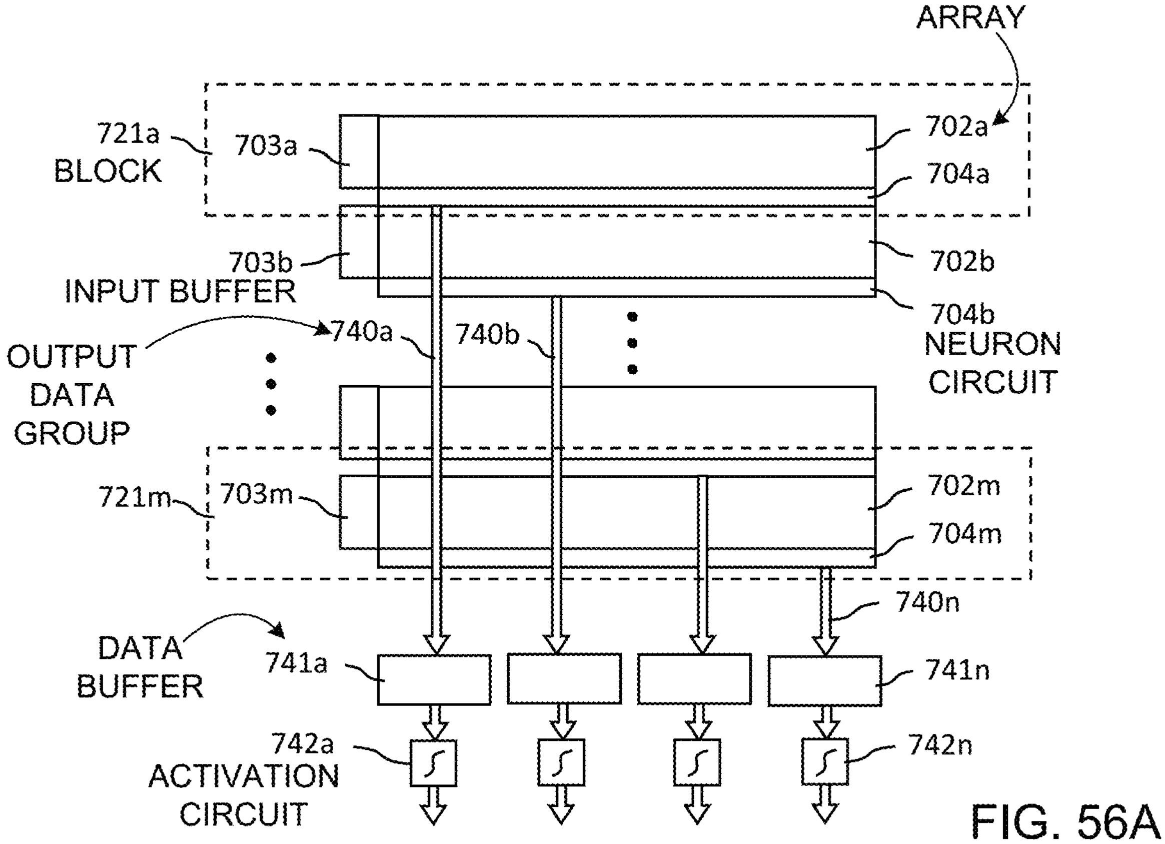
FIG. 56A shows an embodiment of an array architecture according to the invention.

FIG. 56A shows an embodiment of an array architecture according to the invention. The array is divided into multiple blocks, such as blocks 721*a-m*. Each block contains an input data buffer, such as buffers 703*a-m*, an array, such as arrays 702*a-m*, and a neuron circuit, such as circuits 704*a-m*. Each block 721*a-m* is divided into multiple small arrays to reduce the signal delay, similar to the embodiment shown in FIG. 52B.

The blocks 721*a-m* are formed using any suitable array architectures shown in previous embodiments according to this invention. For example, the array architectures shown in FIG. 53A or FIG. 53B are used as examples. Referring to FIG. 56A, the input data buffers 703*a-m* apply different inputs to each array 702*a-m*, such as the input data group 730*a* shown in FIG. 53A to generate the output data groups 740*a* shown in FIG. 53A. A detailed description is provided in the description of FIG. 53A.

The neuron circuits 704*a-m* generate output data groups 740*a-n*. These output groups are sent to output data buffers 741*a-n*, and then sent to activation circuits 742*a-n* to generate the outputs. The activation circuits 742*a-n* contain comparators or operational amplifiers or A/D convertors to generate the desired activation functions.

Figure 56B:
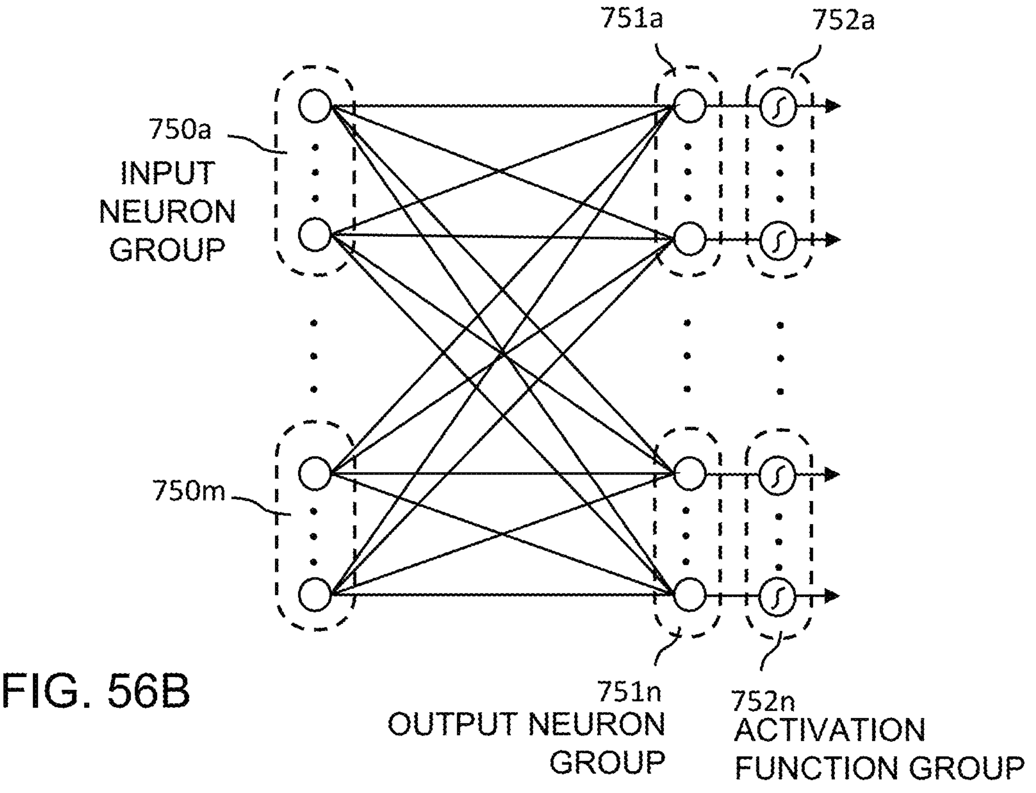
FIG. 56B shows a corresponding neural network layer simulated by the embodiment shown in FIG. 56A.

FIG. 56B shows a corresponding neural network layer simulated by the embodiment shown in FIG. 56A. The input data buffers 703*a-m* shown in FIG. 56A represent the input neuron groups 750*a-m* shown in FIG. 56B. The output data buffers 741*a-n* shown in FIG. 56A represent the output neuron groups 751*a-n* shown in FIG. 56B. The activation circuits 742*a-n* shown in FIG. 56A represent the activation function groups 752*a-n* shown in FIG. 56B.

In another embodiment, the output data groups 740*a-n* sent to the output data buffers 741*a-n* use the embodiment shown in FIGS. 45B-D to combine multiple groups of output data into one group of output data. Moreover, the output data in different banks such as bank 719*a-m* shown in FIG. 52A, can be combined into one data, D0-*m*, by using the embodiment shown in FIGS. 44B-C.

Figure 57A:
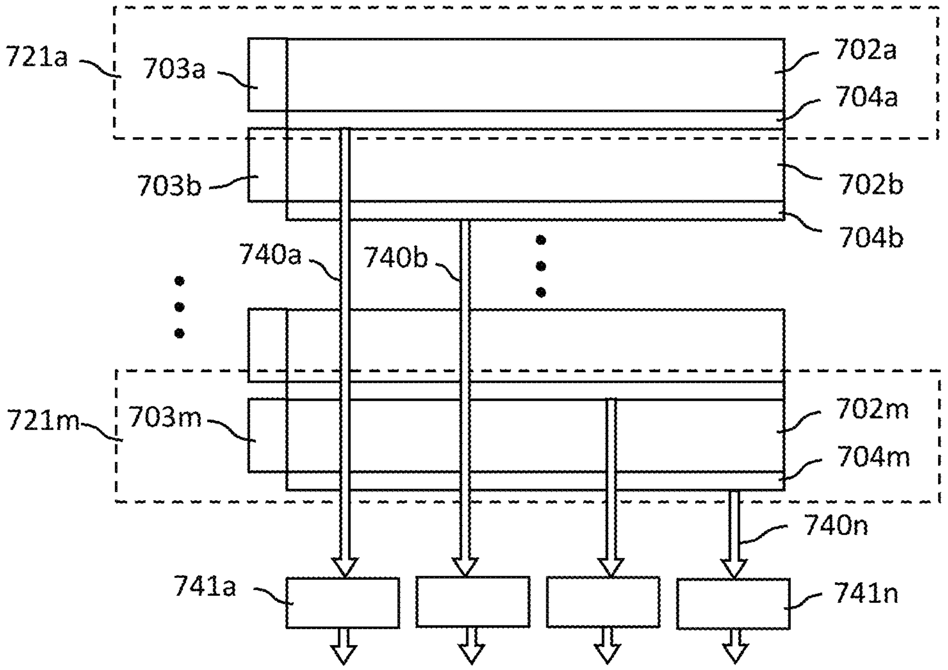
FIG. 57A shows an embodiment of an array architecture according to the invention.

FIG. 57A shows another embodiment of an array architecture according to the invention. This embodiment is similar to the embodiment shown in FIG. 56A except that the activation circuits 742*a-n* are eliminated. In this embodiment, the output data buffers 741*a-n* output the data to an external chip, such as a graphic processing unit (GPU) chip or central processing unit (CPU) chip to perform the activation function in those chips.

Figure 57B:
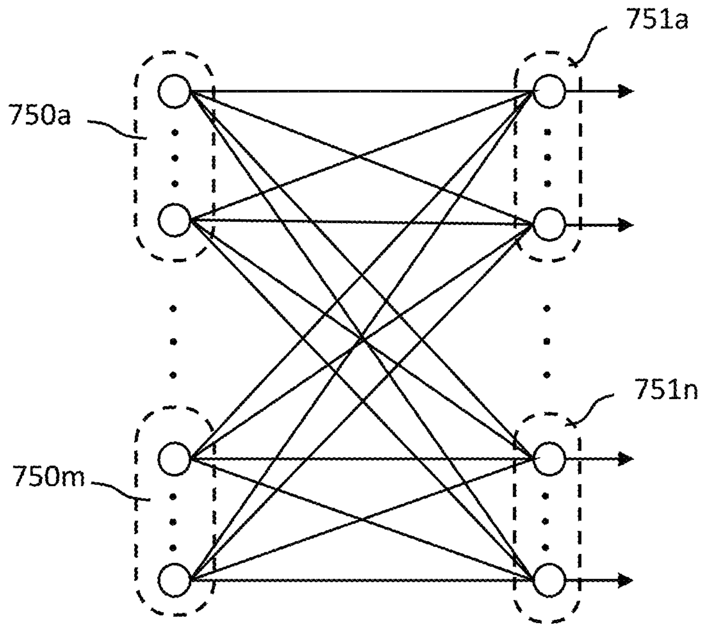
FIG. 57B shows a corresponding neural network layer simulated by the embodiment shown in FIG. 57A.

FIG. 57B shows a corresponding neural network layer simulated by the embodiment shown in FIG. 57A. The input data buffers 703*a-m* shown in FIG. 57A represent the input neuron groups 750*a-m* shown in FIG. 57B. The output data buffers 741*a-m* shown in FIG. 57A represent the output neuron groups 751*a-m* shown in FIG. 57B.

Figure 58A:
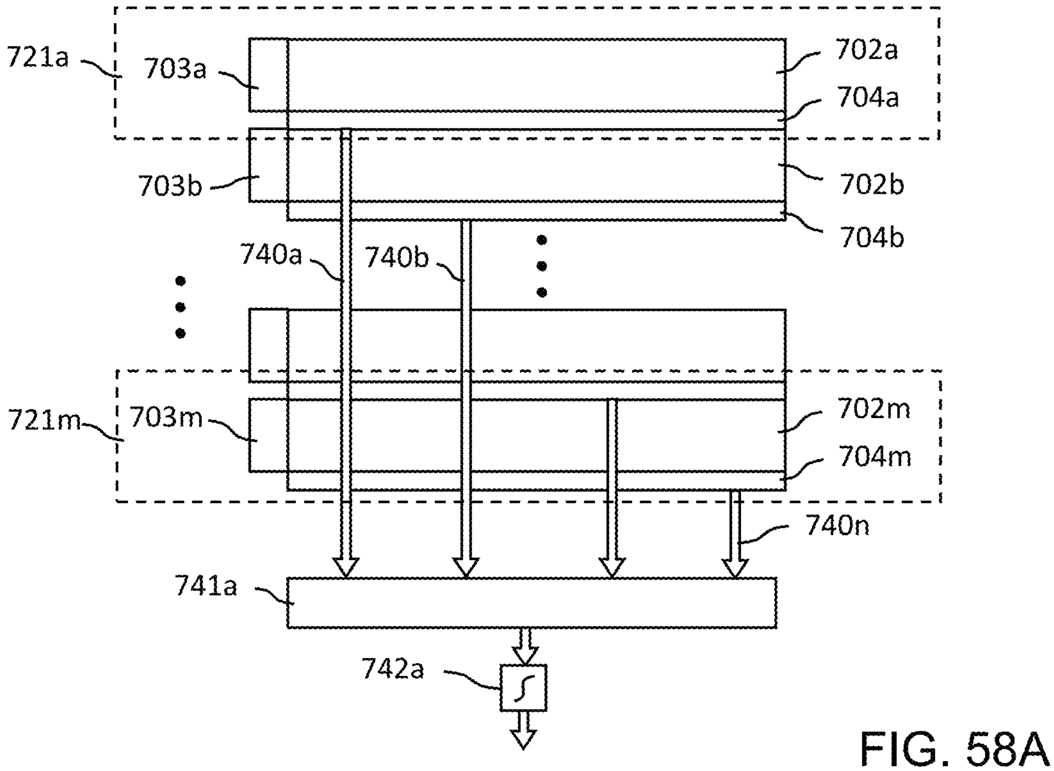
FIG. 58A shows an embodiment of an array architecture according to the invention.

FIG. 58A shows an embodiment of an array architecture according to the invention. This embodiment is similar to the embodiment shown in FIG. 56A except that this embodiment only has one output data buffer 741*a* and one activation circuit 742*a*. In this embodiment, the output data groups 740*a-n* are sequentially loaded from the neuron circuits 704*a-m* to the output data buffer 741*a*. The output data buffer 741*a* outputs the previous data group to the activation circuit 742*a* and loads the next data groups 704*a-n* in parallel. In this configuration, the circuit size of the output data buffer and the activation circuit is reduced.

Figure 58B:
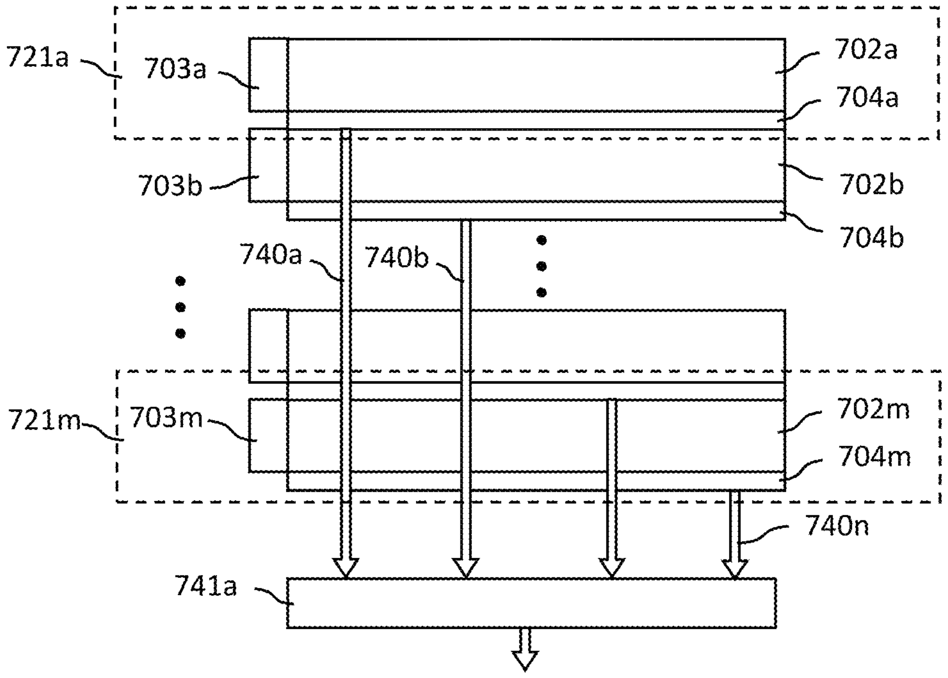
FIG. 58B shows an embodiment of an array architecture according to the invention.

FIG. 58B shows an embodiment of an array architecture according to the invention. This embodiment is similar to the embodiment shown in FIG. 58A except that the activation circuit 742*a* is eliminated. The output data buffer 741*a* outputs the data to an external chip, such as a graphic processing unit GPU chip or central processing unit CPU chip, to perform the activation function in those chips.

Figure 59A:
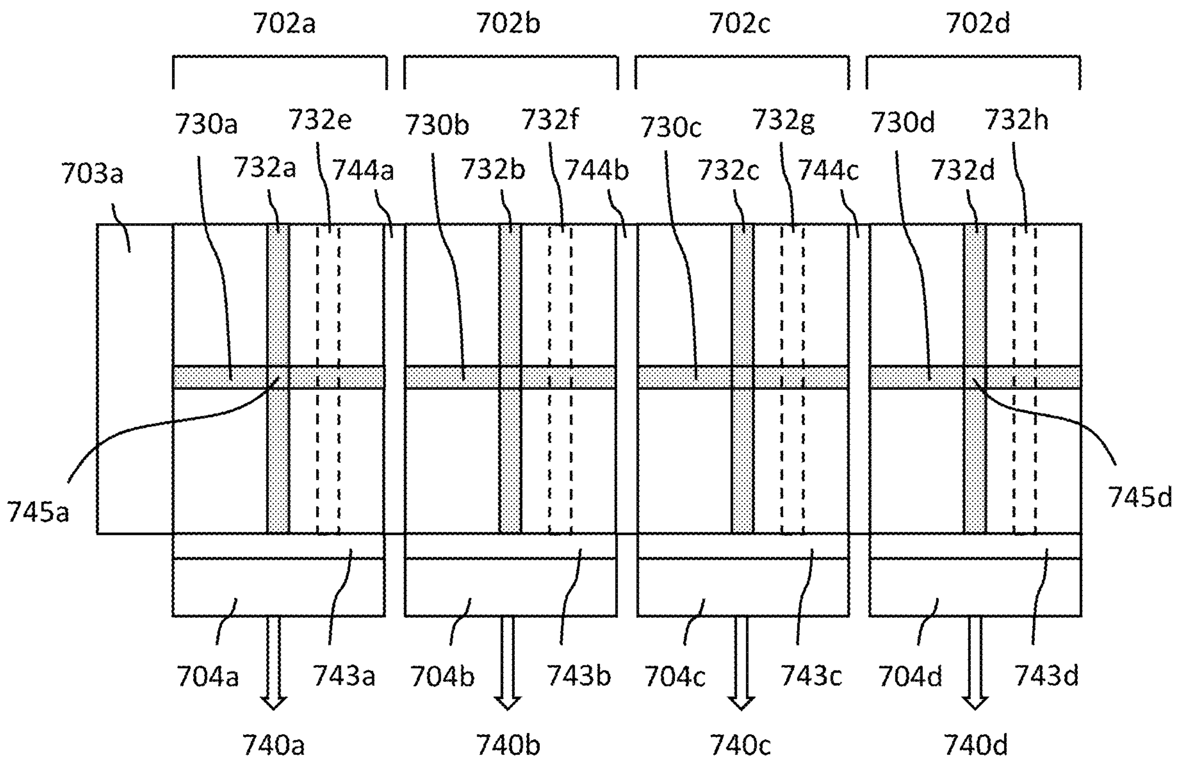
FIG. 59A shows a detailed embodiment of block architecture according to the invention.

FIG. 59A shows an embodiment of detailed architecture for a block, such as the block 721*a* shown in FIG. 58A according to the invention. This embodiment uses the array architecture shown in FIG. 57B as an example. Please notice, this embodiment may be applied to other array architectures embodiments with minor changes according to the array architecture.

The block comprises a memory array that is divided into multiple sub-arrays 702*a-d* to reduce the signal delay. An input data buffer 703*a* applies multiple input data, such as the input data group 730*a* to the selected input lines. Input drivers 744*a-c* are provided for the sub-arrays 702*b-d*. The input drivers 744*a-d* receive the data from the input data buffer 703*a* and apply the same data of the input data group 730*a* to the input data groups 730*b-d*.

Each sub-array, such as sub-array 702*a* comprises multiple output line groups such as output line groups 732*a* and 732*e*. Each output line group comprises multiple output lines. The cells in the intersections of each input data group and output line group, such as cells 745*a-d*, are selected. The selected cells 745*a-d* perform the multiplication function described with reference to FIG. 57A to generate output currents for the output line groups 732*a* to 763*d*. Multiplexer circuits 743*a-d* select and connect the output line groups 732*a* to 752*d* to the neuron circuits 704*a-d*. The neuron circuits 704*a-d* convert the currents of the output line groups 732*a-d* to output data groups 740*a-d*.

Next, the output data groups 740*a-d* are sent to the output data buffer 741*a* shown in FIG. 57A and FIG. 58A collectively as the output data group 740*a*. Then, the multiplexers 743*a-d* select the next output line groups, such as output line groups 732*e-h* to be connected to the neuron circuits 704*a-d* to generate the next output data groups. This process is repeated until all the desired output data groups are generated.

Figure 59B:
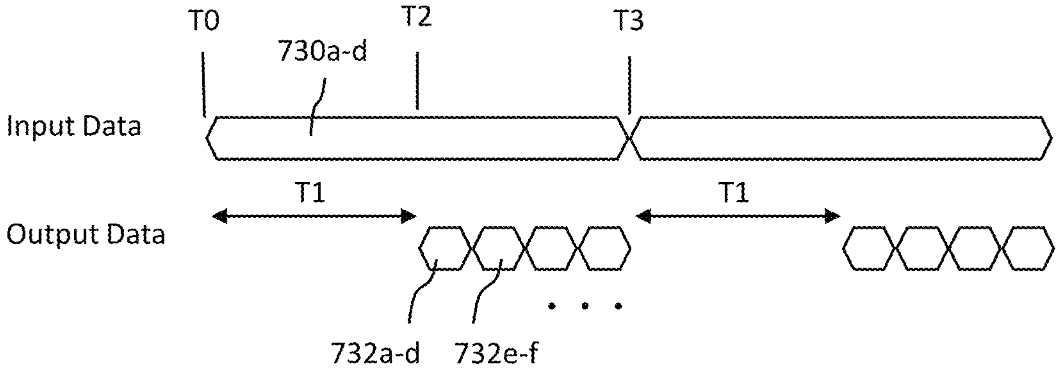
FIG. 59B shows an embodiment of an operation waveform for the array architecture shown in FIG. 59A.

FIG. 59B shows an embodiment of an operation waveform for the array architecture shown in FIG. 59A. At time T0, the input data groups 730*a-d* are applied to the selected cells. After a delay time T1, the selected cells generate the currents according to the input data and the stored data. From time T2, the multiplexers 743*a-d* shown in FIG. 59A sequentially select the first output line groups 732*a-d* and the second output line groups 732*e-h*, and so on, to be connected to the neuron circuits 704*a-d* to generate the output data. After all the desired output groups are selected, at time T3, the next input data is applied to start the next cycle.

Figure 60A:
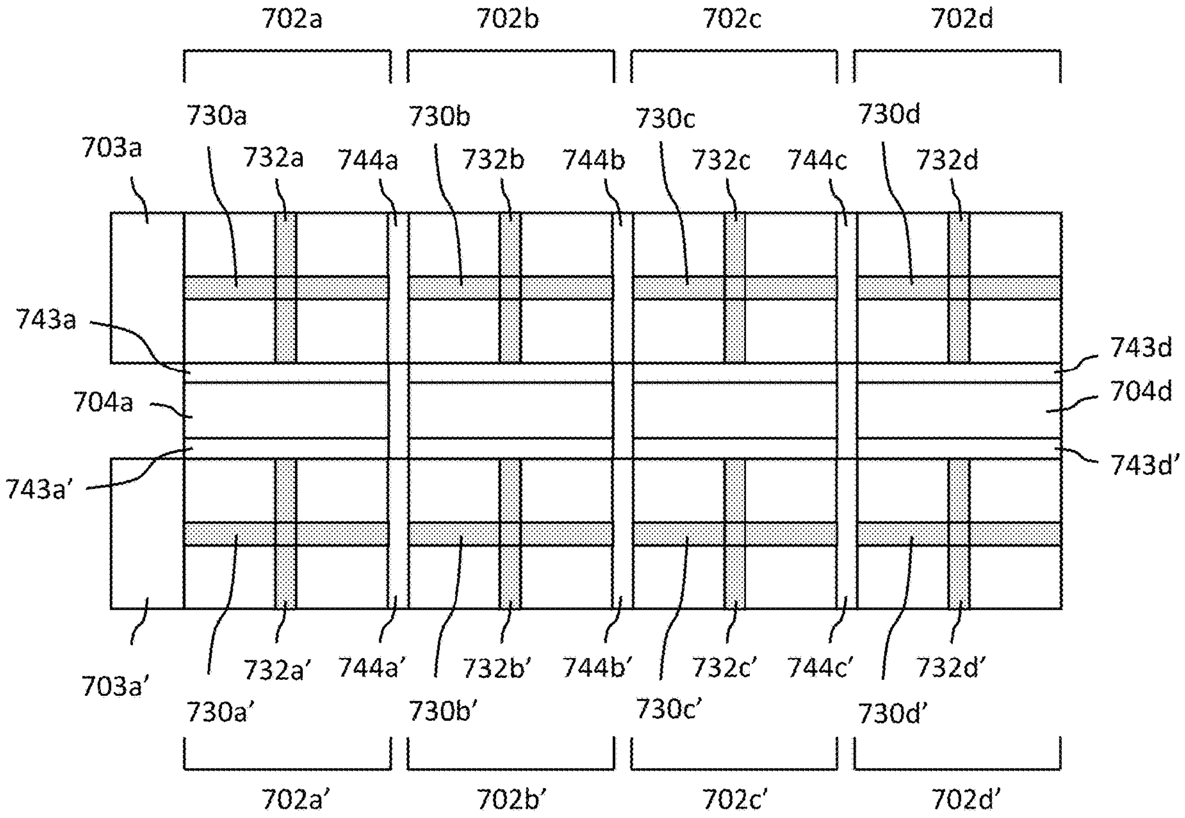
FIG. 60A shows a detailed embodiment of block architecture according to the invention.

FIG. 60A shows an embodiment of detailed architecture for a block, such as block 721*a* shown in FIG. 58A according to the invention. This embodiment is similar to the embodiment shown in FIG. 59A except that the neural circuits 704*a-b* are located in the middles of two groups of sub-arrays 702*a-d* and sub-arrays 702*a*' and 702*d*' and shared by the two groups of sub-arrays. This embodiment allows the two groups of sub-arrays to output data to the neuron circuits 704*a-d* alternately, thus the data can be continuously output without idle time.

Figure 60B:
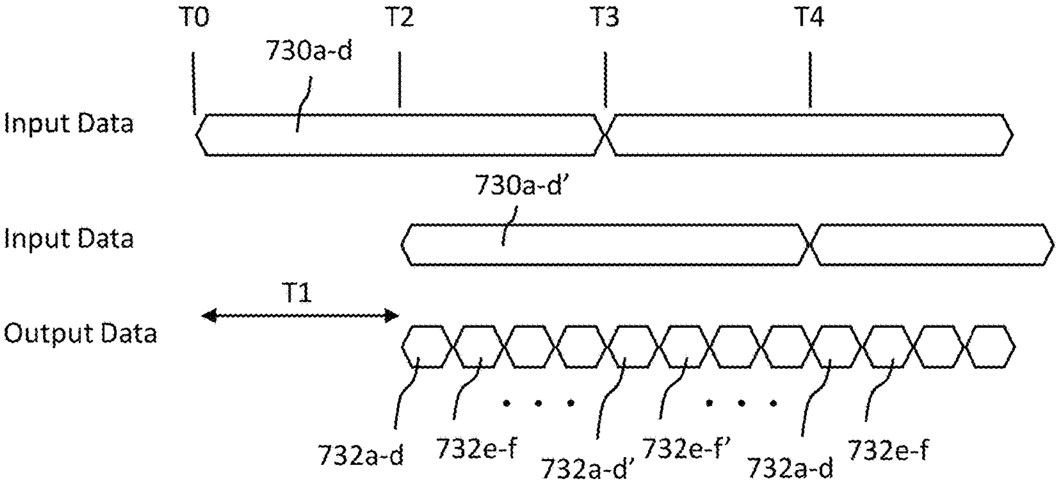
FIG. 60B shows an embodiment of the operation waveform for the array architecture shown in FIG. 59B.

FIG. 60B shows an embodiment of the operation waveform for the array architecture shown in FIG. 59B. At time T0, the first input data groups 730*a-d* are applied to the selected cells in the first group of sub-arrays 702*a-d*. After a delay time T1, the selected cells generate the currents according to the input data and the stored data. From time T2, the multiplexers 743*a-d* sequentially connect the output line groups 732*a-d* and the next groups to the neuron circuits 704*a-d* to generate output data.

Meanwhile, the second input data groups 730*a*' to 730*d*' are applied to the selected cells in the second group of sub-arrays 702*a*' to 702*d*' to generate output currents for the second output line groups 732*a*' to 732*d*'. Therefore, at time T3, after the outputs of the first group of sub-arrays 702*a-d* are all generated, the second group of multiplexers 743*a*' to 743*d*' sequentially connect the second output line groups 732*a*' to 732*d*' and the next groups to the neuron circuits 704*a-d* to generate output data. Meanwhile, the next input data group is applied to the first group of sub-arrays to repeat the process. By using this process, the neuron circuits 704*a-d* continue generating output data from the two groups of sub-arrays without idle time.

Figure 61A:
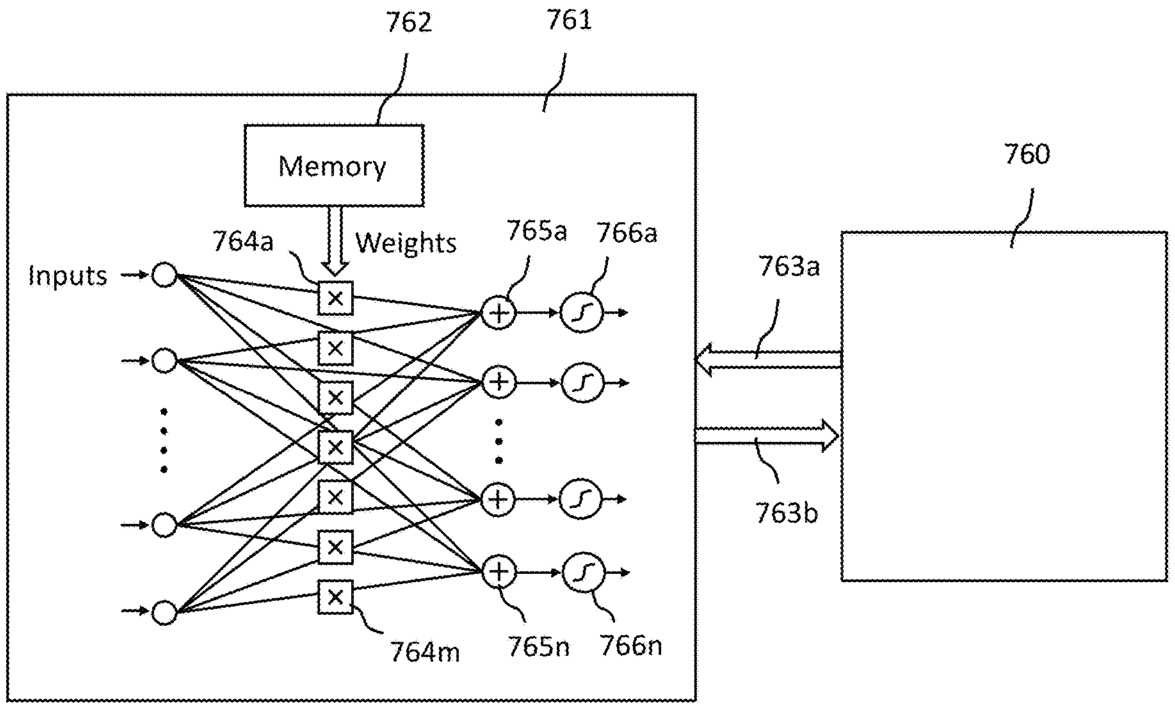
FIG. 61A shows an embodiment of an artificial intelligent AI chip or AI system architecture according to the invention.

FIG. 61A shows an embodiment of an artificial intelligent AI chip or AI system architecture according to the invention. The AI chip or AI system comprises at least one data processing chip 760, such as graphic processing unit GPU chips, central processing unit CPU chips, microprocessor chips, or application-specific integrated circuit ASIC chips. The AI chip or system also comprises at least one memory chip 761 that comprises at least one memory cell array 762 that stores data or called weights or models for synapses. The data processing chip 760 sends input data to the memory chip 761 through a data bus as shown in 763*a*.

The memory chip 761 performs multiplication functions for the input data and the weights stored in the memory 762, as shown 764*a-m*. Next, the memory chip 761 performs summation functions, as shown by functions 765*a-n* and activation functions as shown by activation functions 766*a-n* to generate output data. After that, the output data is sent from the memory chip 761 to the data processing chip 760 through the data bus as shown in 763*b*. The above-described processes can be repeated as desired to simulate a large multiple-layer neural network.

Figure 61B:
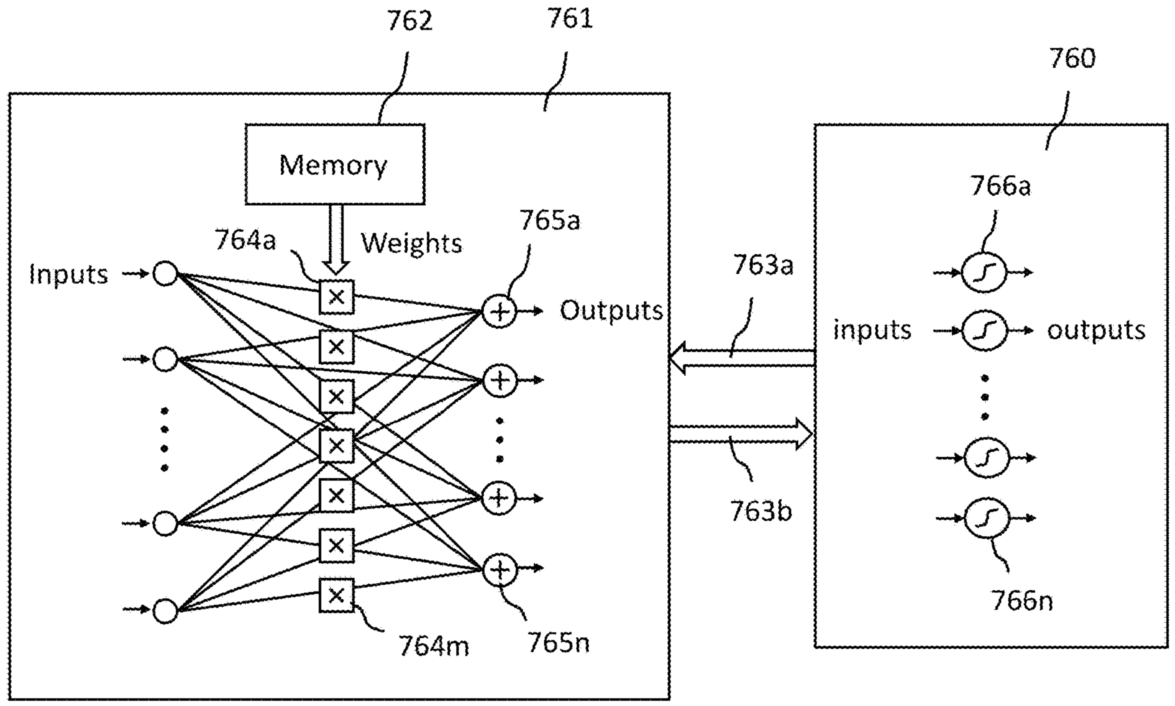
FIG. 61B shows an embodiment of an artificial intelligent AI chip or AI system architecture according to the invention.

FIG. 61B shows an embodiment of an artificial intelligent AI chip or AI system architecture according to the invention. This embodiment is similar to the embodiment shown in FIG. 61A except that the activation functions 766*a-n* are performed in the data processing chip 760. After the memory chip 761 performs the summation functions 765*a-n* to generate the output data, the output data is sent to the data processing chip 760 through the data bus as shown in 763*b*. The data processing chip 760 performs the activation functions 766*a-n* for the data from the memory chip 760 to generate the output data. The above-described process can be repeated as desired to simulate a large multiple-layer neural network.

Figure 62:
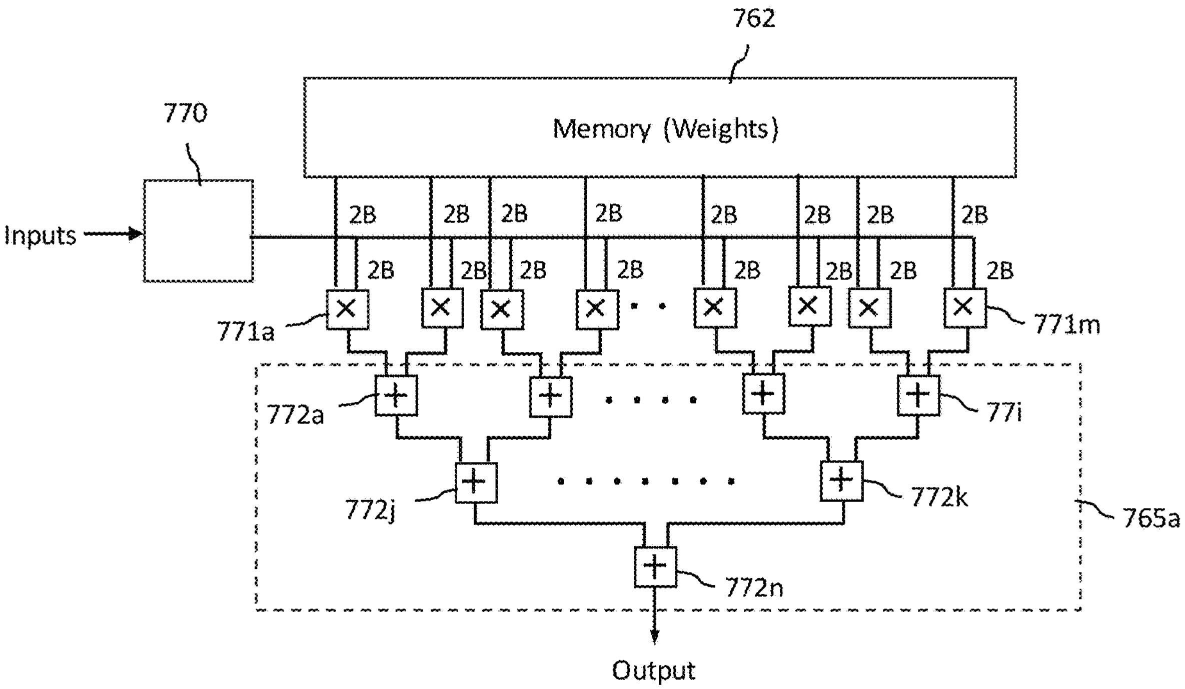
FIG. 62 shows multiple blocks of the circuits that simulate summation functions of multiple output neurons.

In one embodiment, the input data is stored in an input data buffer or data cache or a SRAM 770. The data is multiplied with the weights stored in memory array 762 using multiplier circuits 771*a-m*. This configuration simulates the multiplication functions 764*a-m* in the memory chip 761 shown in FIG. 61B. The output data of the multiplier circuits 771*a-m* are summed by using adder circuits 772*a-n*. This simulates the summation function 765*a* of one output neuron in the memory chip 761 shown in FIG. 61B. The memory chip 761 in FIG. 61B comprises multiple blocks of the circuits shown in FIG. 62 to simulate the summation functions 765*a-n* of multiple output neurons. Then, the outputs are transferred to the data processing chip 760 to perform the activation functions, such as functions 766*a-n* shown in FIG. 61B.

It should be noted that in this embodiment, the multiplier circuits 771*a-m* and the adder circuits 772*a-n* use any commonly used multiplier and adder logic circuits. Moreover, because memory array 762 does not perform multiplication and summary functions, the memory array 762 uses any type of memory, such as DRAM, SRAM, flash memory, RRAM, FRAM, MRAM, and/or PCM.

For a more detailed illustration, it will be assumed that the inputs comprise 16 input data. Each input data size is two bytes (2B). The multipliers circuits 771*a-m* will multiply the 16×2 bytes of input data with 16×2 bytes of weights to obtain 16×16×2 bytes of output data. Then, the adder circuits 772*a-n* add these 16×16×2 bytes of data to becomes 8-bit-wide×2 bytes of data. Then, these data are transferred to the data processing chip 760 shown in FIG. 61B to perform the activation functions. This configuration greatly reduces the amount of transferred data when compared with transferring the 16×2B weights to the data processing chip 760 as in the conventional system.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A memory cell array structure, comprising:

a plurality of memory cells organized into a plurality of rows and columns, wherein each memory cell is configured to generate a cell current based on a received input signal and stored data;

a plurality of input lines, wherein each input line is connected to memory cells in a selected row, and wherein the plurality of input lines form a plurality of input line groups;

a plurality of output lines, wherein each output line is connected to memory cells in a selected column, and wherein the plurality of output lines form a plurality of output line groups;

a selector configured to sequentially select the input line groups to limit a number of selected memory cells per output line in an output line group;

a multiplexer having multiplexer inputs and multiplexer outputs, wherein the multiplexer inputs are connected to the output line groups, wherein the multiplexer is configured to sequentially select which of the output line groups are connected to the multiplexer outputs;

neuron circuits connected to the multiplexer outputs, wherein the neuron circuits are configured to convert a summation of cell currents in a selected output line group into digital data; and wherein the memory cell array simulates a neural network in which the plurality of input lines simulate input layer neurons of the neural network, and the plurality of output lines simulate output layer neurons of the neural network.

2. The memory cell array structure of claim 1, wherein the plurality of memory cells comprise one of floating body cells, flash memory cells, resistive random-access memory cells, ferroelectric random-access memory cells, magneto-resistive random-access memory cells, phase-change memory cells, and mem-transistor cells.

3. The memory cell array structure of claim 1, where the neuron circuits comprise at least one of an analog-to-digital converter, operational amplifier, or a comparator to convert the summation of cell currents into digital data.

4. The memory cell array structure of claim 3, where the analog-to-digital converter, operational amplifier, or comparator circuits also perform an 'activation function'.

5. The memory cell array structure of claim 1, wherein the multiplexer sequentially selects the output line groups and passes the summation of the cell currents to the neuron circuits.

6. A 3D cell structure, comprising:

a plurality of blocks, wherein each block comprises an input buffer, an array comprising memory cells configured to generate a cell current based on a received input signal and stored data, and a neuron circuit, and wherein each neuron circuit outputs an output data group by converting a summation of cell currents into digital data;

a plurality of data buffers having buffer inputs and buffer outputs, wherein the plurality of buffer inputs are configured to receive the output data groups from the plurality of neuron circuits, respectively, and wherein the plurality of data buffers are configured to sequentially load the output data groups;

a plurality of activation circuits having circuit inputs and circuit outputs, wherein the plurality of circuit inputs are connected to the plurality of buffer outputs, respectively, and wherein the plurality of circuit outputs are configured to output activation results; and wherein the 3D cell structure simulates a neural network in which the plurality of input buffers simulate input neuron groups of the neural network, the plurality of data buffers simulate output neuron groups of the neural network, and the plurality of activation circuits simulate activation functions of the neural network.

7. The 3D cell structure of claim 6, wherein the memory cells comprise one of floating body cells, flash memory cells, resistive random-access memory cells, ferroelectric random-access memory cells, magneto-resistive random-access memory cells, phase-change memory cells, and memtransistor cells.

8. The 3D cell structure of claim 6, wherein the neuron circuit comprises at least one of an analog-to-digital converter, operational amplifier, or a comparator to convert the summation of cell currents from the memory cells into the digital data.

9. The 3D cell structure of claim 8, wherein the analog-to-digital converter, operational amplifier, or comparator also perform an activation function.

10. The 3D cell structure of claim 6, wherein the array in each block is divided into a plurality of sub-arrays to reduce signal delay, and wherein the input buffer applies input data groups to selected input lines in the sub-arrays.

11. The 3D cell structure of claim 6, further comprising multiplexers connected to output line groups in the array, wherein the multiplexers sequentially select the output line groups and pass the summation of the cell currents to the neuron circuit.

12. The memory cell array structure of claim 1, wherein the memory cells are configured to provide negative weights for synapses of the neural network using differential pairs of memory cells connected to the input lines and output lines.

13. The memory cell array structure of claim 1, wherein the memory cell array is divided into a plurality of sub-arrays to reduce signal delay, and wherein the input line groups apply input data to selected sub-arrays sequentially.

14. The memory cell array structure of claim 1, wherein the neuron circuits are configured to support analog neural networks by processing multi-level cell currents or digital neural networks by processing binary threshold levels.

* * * * *